United States Patent [19]
Tanaka et al.

[11] Patent Number: 6,115,034
[45] Date of Patent: Sep. 5, 2000

[54] STEP MANAGING APPARATUS AND METHOD

[75] Inventors: Hirota Tanaka, Kawasaki; Hideki Sawada, Inagi; Mari Kuruma; Hiroshi Kochiya, both of Yokohama; Akiko Kawazome, Utsunomiya; Kouichi Sato, Tokyo; Hidetoshi Miyamoto, Yokohama; Kenichi Inaho, Tokyo, all of Japan

[73] Assignee: Canon Kabushiki Kaisha, Tokyo, Japan

[21] Appl. No.: 09/015,798

[22] Filed: Jan. 29, 1998

[30] Foreign Application Priority Data

| Jan. 31, 1997 | [JP] | Japan | 9-018792 |
| Apr. 16, 1997 | [JP] | Japan | 9-099082 |
| Apr. 16, 1997 | [JP] | Japan | 9-099130 |

[51] Int. Cl.[7] .............. G06F 3/00; G06F 7/00; G06F 7/60
[52] U.S. Cl. ............ 345/326; 345/331; 345/329; 707/103; 395/500.12; 395/500.13
[58] Field of Search ............ 707/103; 345/326, 345/335, 329, 969; 395/500.12, 500.19

[56] References Cited

U.S. PATENT DOCUMENTS

| 5,471,399 | 11/1995 | Tanaka et al. | 395/500.12 |
| 5,551,028 | 8/1996 | Voll et al. | 707/103 |
| 5,801,958 | 9/1998 | Dangelo et al. | 395/500.19 |

OTHER PUBLICATIONS

P. van der Wolf, et al., "An Enhanced Flow Model for Constraint Handling in Hierarchical Multi–View Design Environments", IEEE/ACM International Conference on Computer–Aided Design. Digest Technical Papers (ICCAD), 1994, pp. 500–507.

O. ten Bosch, et al., "A Flow–Based User Interface for Efficient Execution of the Design Cycle", IEEE/ACM International Conference on Computer–Aided Design. Digest of Technical Papers (ICCAD), 1993, pp. 356–363.

*Primary Examiner*—Krisna Lim
*Attorney, Agent, or Firm*—Fitzpatrick, Cella, Harper & Scinto

[57] ABSTRACT

The steps for designing a complex object of design are centralized, and the setting for processing programs started with the steps is greatly simplified, so that the load on the designer is reduced, and errors in design are also reduced. To that end, in the event of designing an object of design by a plurality of steps, the plurality of steps are displayed on a CRT display, judgment is made whether execution thereof is possible, and based on that judgment, executable steps are displayed in green, and non-executable steps are displayed in red. Setting of the parts necessary for design, and the setting of CAD tools started in the steps is performed by keyboard or mouse, and the steps of which the state has change are identified, and the color thereof is changed.

81 Claims, 90 Drawing Sheets

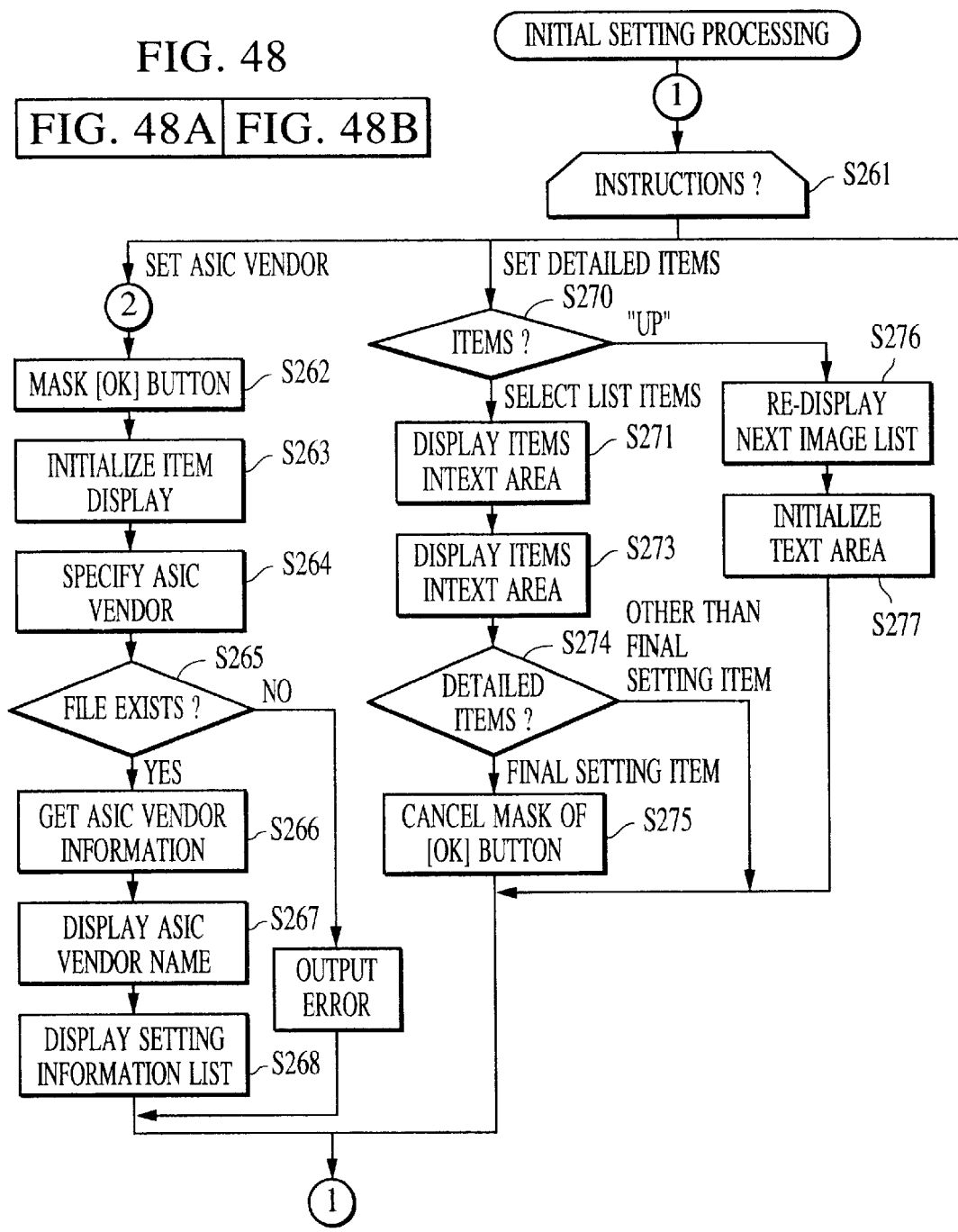

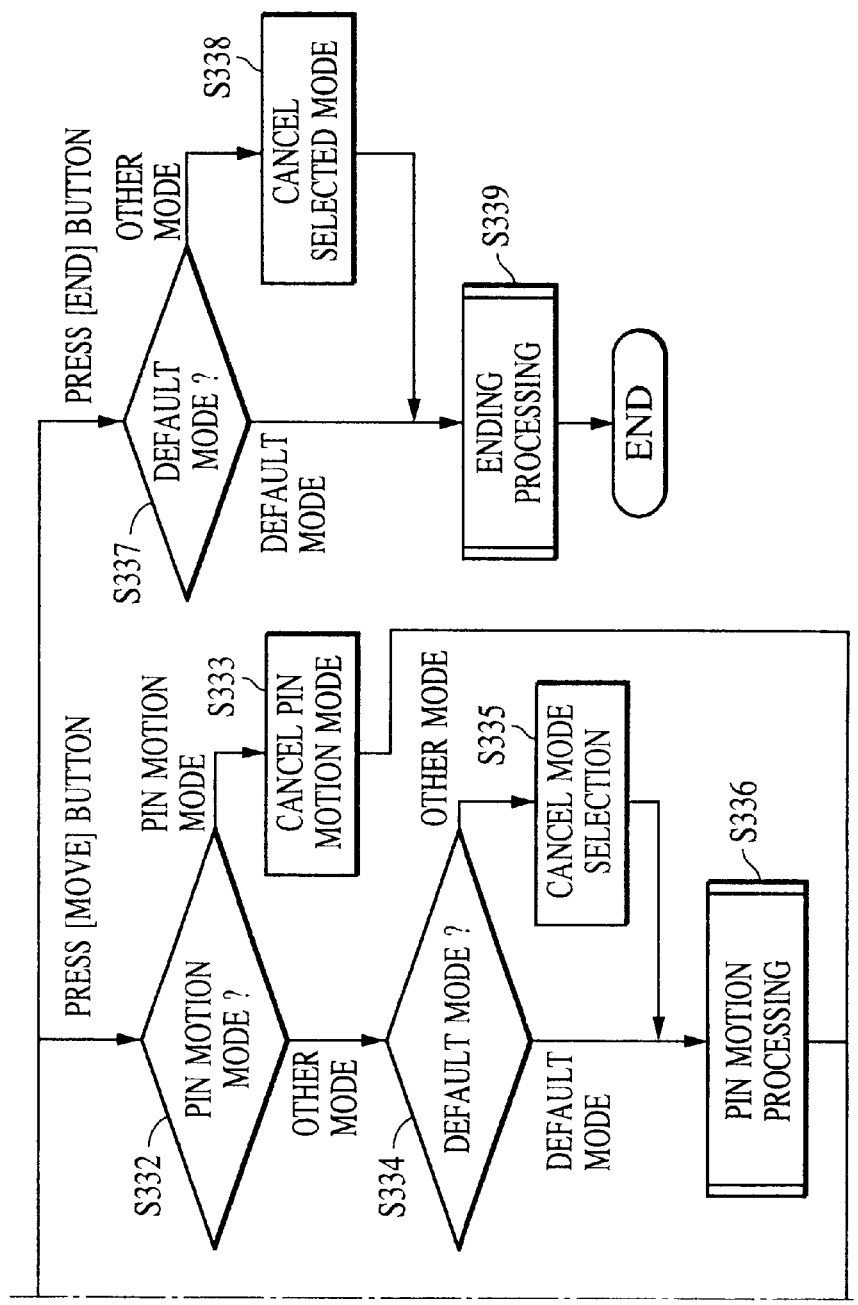

STEP MANAGING APPARATUS AND METHOD

BACKGROUND OF THE INVENTION

1. Field of the Invention

The present invention relates to a step managing apparatus and a method of managing a plurality of steps, and more particularly to a step managing apparatus and method for managing a plurality of steps regarding work performed by a plurality of users on a network.

2. Description of the Related Art

Regarding systems for designing objects of design, particularly circuits on substrates, using interactive image processing apparatuses such as CAD apparatuses, known design methods can be generally separated into the two following groups:

The first design method involves inputting a circuit device, verifying the circuit device generated by the inputting, performing design layout of wiring and so forth on the substrate, thus generating the desired object of design.

The second design method involves designing a circuit function level, verifying the function level, creating a circuit diagram based on the verification results, verifying the created circuit diagram, performing design layout of wiring and so forth on the substrate, thus generating the desired object of design.

Now, upon designing an object, there is the need to follow processing through a plurality of steps, and with the known methods, different designers each undertake separate processes for each separate step, and thus it has been difficult to manage the overall design process that include a plurality of steps.

Now, "management" as referred to here can be generally grouped into the following two categories:

First, there is "management" of each step. This involves confirmation of processing programs started for executing each step, control of startup, management of design data to be employed, and so forth.

Also, there is "management" between the plurality of steps. This is for moving from one step to another step following completion of a step, making reference to design data between steps, and so forth.

At present, there is clearly a limit to management of the ever-increasingly complex design steps by the designer himself/herself. Accordingly, there recently has arisen a need for an apparatus for managing the plurality of steps in an integrated manner.

In order to manage the plurality of steps in such an integrated manner in the designing of an object, there are two elements which are of particular importance for determining the contents of design, i.e., the processing programs started at the point of executing each step, and information relating to the object to which design is to be performed so as to yield the object of design.

First, the processing programs which are started at the time of executing each of the steps are programs for performing various types of data processing, and in the field of electricity, there are input tools for electric parts, various verification tools, and more recently, tools for expression of a function using block diagrams and state transfer diagrams. For example, an example of a function level designing tool is "Visual HDL" by SUMMIT Inc., and an example of a function level verification tool is "V-System/VHDL" by Antares Inc. There are many processing programs which do the same work as these, so it is not easy to select which to use.

Also, as for the object for which design is to be performed, there are ASIC (Application-Specific Integrated Circuit) and so forth, and it is necessary to set the vendor name (name of manufacturer), type, form information, and so forth. Accordingly, in the event that the object of the design changes, the processing programs started at each step also need to be changed.

Accordingly, in the designing of an object, the processing programs started at the point of executing each step, and information relating to the object for which design is to be performed, are extremely crucial elements, and it is becoming extremely important to perform step management with much thought given to these two elements.

Also, according to known methods, in the event of designing an object such as an ASIC, a plurality of designers each undertaking separate steps and performing design work separately, meaning that it has not been easy to manage the overall design of a single object in a centralized manner. Accordingly, it has been standard practice for design management of the object of design to be performed separately for each step.

However, objects of design, particularly ASICs, are increasing in both complexity and size, making the processes for design extremely complicated, and known art has been placing a great load on the designer to manage such steps.

Also, according to known art, in the event that the object of design or the processing programs started at each step are to be changed, the designer has had to take the trouble to perform all sorts of related setting operations, each time such a change is made.

Also, in the known art, setting of information for the object of design so as to yield the object of design has been performed from the stage of starting design, so the designer has not been able to change information relating to the object of design during the process of designing, and accordingly, it has been necessary to redesign the object from the stage of starting designing the event that the information is changed.

Also, in the known art, design of a plurality of differing patterns could not be performed in parallel for the object of the design.

Further, the increase in complexity and size of ASICs in particular necessitates a great many designers to undertake designing tasks, and accordingly, in the event that centralized management of a complex object of design such as an ASIC is attempted, this places a great burden on the final design manager. The arrangement is not time-efficient, and there have been problems with precision, as well.

SUMMARY OF THE INVENTION

Accordingly, it is an object of the present invention to integrate the complex designing processes for designing an object, vastly simplifying setting up the object design so as to yield the object of design, and setting up of the processing programs to be started at the time of executing each step, thus reducing the load on the designers, and also reducing error in design.

It is another object of the present invention to enable change the design to be performed so as to yield the object of design during the process of designing.

It is yet another object of the present invention to enable a plurality of differing design processes to be performed in parallel, upon performing the design so as to yield the object of design.

It is a further object of the present invention connect a plurality of information processing devices to a network, thereby enabling sharing of data relating to design between the devices, realizing cooperative work by a plurality of users on the network, and making easier centralized managing of the overall design performed by the plurality of users.

In order to achieve the above objects, the step managing apparatus according to the present invention includes: first displaying unit for displaying the plurality of steps by symbols; a judging unit for judging the state of at least a portion of the plurality of steps; and a second displaying unit for displaying the plurality of steps in an identifiable manner based on the state judged by the judging unit.

According to a preferred arrangement, the present invention includes: a storing unit for storing each of the plurality of steps and processing programs started when executing the steps, in a manner related one to another; a relational displaying unit for displaying the relation between each of the plurality of steps and the processing programs, stored in the storing unit; a first changing unit for changing the processing program in the relation displayed by the relational displaying unit; and a second changing unit for changing the relation between each of the plurality of steps and the processing programs, stored in the storing unit, based on the changes made to the processing program by the first changing unit; wherein the judging unit judges the aforementioned step regarding which the state changes are due to relational change by the second changing unit, and wherein the second displaying unit changes the display form of the aforementioned step regarding which the state has been judged to change by the judging unit.

According to another preferred arrangement, the plurality of steps includes steps for designing an object, and the present invention includes: a storing unit for storing information used for the designing; a displaying unit for displaying information stored in the storing unit; first changing unit for changing information displayed by the information displaying unit; and a second changing unit for changing information stored in the storing unit based on change of information by the first changing unit, wherein the judging unit judges change in state due to change of information by the second changing unit, and wherein the second displaying unit changes the display form of the aforementioned step regarding which the state has been judged to change by the judging unit.

Also, the present invention which is a step managing apparatus for managing a plurality of steps for designing an object, includes: a symbol displaying unit for displaying the plurality of steps by symbols; a storing unit for storing information used for the designing; an execution instructing unit for instructing the execution of a step for changing the information stored in the storing unit, in the event that such a step is included in the plurality of steps; an information displaying unit for displaying information stored in the storing unit, according to instructions by the execution instructing unit; a first changing unit for changing information displayed by the information displaying unit; a second changing unit for changing information stored in the storing unit based on change of information by the first changing unit; a judging unit for judging the aforementioned step regarding which the state changes due to information change by the second changing unit; and a display form changing unit for changing the display form of the aforementioned step regarding which the state has been judged to change by the judging unit.

Also, the present invention which is a step managing apparatus for managing a plurality of steps for designing an object includes: a first displaying unit for displaying the plurality of steps by symbols; a storing unit for storing names of work units of the design and first design data used by the work units; a first displaying unit for displaying the names of work units stored in the storing unit; a changing unit for changing the first design data stored in the storing unit into second design data; a judging unit for separately judging the state of the aforementioned step upon using the first design data and the state of the aforementioned step upon using the second design data; and a third display unit for displaying each of the plurality of steps in an identifiable manner, separately for the case in which the first design data is used and the case in which the second design data is used.

Also, in order to achieve the above objects, the present invention which is a step managing method for managing a plurality of steps includes: a first displaying step for displaying the plurality of steps by symbols; a judging step for judging the state of at least a portion of the plurality of steps; and a second displaying step for displaying the plurality of steps in an identifiable manner based on the state judged in the judging step.

According to another preferred arrangement, the present invention includes: a storing step for storing each of the plurality of steps and processing programs started when executing the steps, in a manner related one to another; a relational displaying step for displaying the relation between each of the plurality of steps and the processing programs, stored in the storing step; a first changing step for changing the processing program in the relation displayed in the relational displaying step; and a second changing step for changing the relation between each of the plurality of steps and the processing programs, stored in the storing step, based on the changes made to the processing program in the first changing step; wherein the judging step judges the aforementioned step regarding which state changes are due to relational change in the second changing step, and wherein the second displaying step changes the display form of the aforementioned step regarding which state has been judged to change in the judging step.

According to yet another preferred arrangement, the plurality of steps includes steps for designing an object, and the present invention further includes: an information displaying step for displaying information stored in the storing unit; a first changing step for changing information displayed in the information displaying step; and a second changing step for changing information stored in the storing step based on change of information in the first changing step; wherein the judging step judges change in state due to change of information in the second changing step, and wherein the second displaying step changes the display form of the aforementioned step the state of which has been judged to change in the judging step.

Also, the present invention which is a step managing method for managing a plurality of steps for designing an object, includes: a symbol displaying step for displaying the plurality of steps by symbols; an execution instructing step for instructing the execution of a step for changing the information stored in the storing unit, in the event that such a step is included in the plurality of steps; an information displaying step for displaying information stored in the storing unit, according to instructions by the execution instructing step; a first changing step for changing information displayed by the information displaying step; a second changing step for changing information stored in the storing unit based on change of information by the first changing step; a judging step for judging the aforementioned step regarding which state changes are due to information change by the second changing step; and a display form changing step for changing the display form of the aforementioned step regarding which state has been judged to change by the judging step.

Also, the present invention which is a step managing method for managing a plurality of steps for designing an object, includes: a first displaying step for displaying the plurality of steps by symbols; a first displaying step for displaying the names of work units stored in the storing unit; a changing step for changing the first design data stored in the storing unit into second design data; a judging step for separately judging the state of the aforementioned step upon using the first design data and the state of the aforementioned step upon using the second design data; and a third displaying step for displaying each of the plurality of steps in an identifiable manner, separately for the case in which the first design data is used and the case in which the second design data is used.

Also, in order to achieve the above objects, the present invention is a storage medium storing programs for causing a computer to execute the following procedures upon managing a plurality of steps: a procedure for displaying the plurality of steps by symbols; a procedure for judging the state of at least a portion of the plurality of steps; and a procedure for displaying the plurality of steps in an identifiable manner based on the judged state.

Also, the present invention, which stores programs for causing a computer to execute the following procedures upon managing a plurality of steps, includes: a procedure for displaying the plurality of steps by symbols; a procedure for displaying the relation between each of the plurality of steps stored in the storing unit and the processing programs started when executing the steps; a procedure for changing the processing program in the displayed relation; a procedure for changing the relation between each of the plurality of steps stored in the storing unit and the processing programs, based on the changes made to the processing program; and a procedure for changing the display form of a step regarding which the state is judged to change by the judging means, as a result of a change in relation.

Further, the present invention, which stores programs for causing a computer to execute the following procedures upon managing a plurality of steps, includes: a process for displaying the plurality of steps by symbols; a process for displaying information stored in the storing unit, according to the instructions; a process for changing the displayed information; a process for changing information stored in the storing means based on the change of information; and a process for judging the aforementioned step regarding which state changes are due to information change by the second changing unit and changing the display form of the step upon the state changing.

Further, the present invention, which stores programs for causing a computer to execute the following procedures upon managing a plurality of steps, includes: a process for displaying the plurality of steps by symbols; a process for instructing the execution of a step for changing the information stored in the storing unit, in the event that such a step is included in the plurality of steps; a process for displaying information stored in the storing unit, according to the instructions; a process for changing the displayed information; a process for changing information stored in the storing unit based on the change of information; and a process for judging the aforementioned step regarding which state changes are due to information change by the second changing unit and changing the display form of the step upon the state changing.

Also, the present invention, which stores programs for causing a computer to execute the following procedures upon managing a plurality of steps, includes: a process for displaying the plurality of steps by symbols; a process for displaying the names of work units stored in the storing unit; a process for changing the first design data stored in the storing unit into second design data; a process for separately judging the state of the aforementioned step upon using the first design data and the state of the aforementioned step upon using the second design data; and a process for displaying each of the plurality of steps in an identifiable manner, separately for the case in which the first design data is used and the case in which the second design data is used.

Further, the present invention, which stores programs for causing a computer to execute the following procedures upon managing a plurality of steps, includes: an interface unit for connecting to a network; a specifying unit for specifying a desired information processing device as the information processing device of the same group, out of information processing devices connected to the network; a device registering unit for registering the information processing device specified by the specifying unit; reference unit for making reference to generated data generated by the information processing device registered by the device registering unit, via the interface unit and the network; and a deriving unit for deriving unified data, based on the generated data referred to by the reference unit.

Also, preferably, the present invention includes: a managing unit for managing a plurality of steps; a first displaying unit for displaying the plurality of steps managed by the managing unit by symbols; a judging unit for judging the state of at least part of the plurality of steps based on generated data referred to by the reference unit, in the event that the generated data generated by an information processing device within the group is used; and a second displaying unit capable of displaying each of the plurality of steps in an identifiable manner, based on the state judged by the judging unit.

Also, in order to achieve the above objects, the present invention includes: a specifying step for specifying a desired information processing device as the information processing device of the same group, out of information processing devices connected to the network; a device registering step for registering the information processing device specified in the specifying step; a reference step for making reference to generated data generated by the information processing device registered in the device registering step, via the network; and deriving step for deriving unified data, based on the generated data referred to in the reference step.

According to another preferred arrangement, the present invention includes: a step managing step for managing the plurality of steps for the designing of the object; a first displaying step for displaying the plurality of steps managed in the managing step by symbols; a judging step for judging the state of at least part of the plurality of steps based on generated data referred to in the reference step, in the event that the data generated by an information processing device within the group is used; and a second displaying step capable of displaying each of the plurality of steps in an identifiable manner, based on the state judged in the judging step.

Also, in order to achieve the above objects, the present invention is a group managing system configured of a plurality of information processing devices including a first information processing device and a second information processing device connected to a network, which includes the first information processing device including a generating unit for generating data based on work allotment which has be appropriated beforehand; and a second information processing device, including: a specifying unit for specifying the first information processing device as the information processing device of the same group, out of information processing devices connected to the network; a device registering unit for registering the first information processing device specified by the specifying unit; a reference unit for making reference to data generated by the first information processing device registered by the device registering unit, via the network; and a deriving unit for deriving unified data, based on the generated data referred to by the reference unit.

According to another preferred arrangement, the second information processing device includes: a managing unit for managing a plurality of steps; a first displaying unit for displaying the plurality of steps managed by the managing unit by symbols; a judging unit for judging the state of at least part of the plurality of steps based on generated data referred to by the reference unit, in the event that the data generated by an information processing device within the group is used; and a second displaying unit capable of displaying each of the plurality of steps in an identifiable manner, based on the state judged by the judging unit.

Also, in order to achieve the above objects, the present invention is a storage medium storing programs for causing a computer to execute the following procedures: a procedure for specifying a desired information processing device as the information processing device of the same group, out of information processing devices connected to a network; a procedure for registering the specified information processing device; a procedure for making reference to data generated by the registered information processing device, via the network; and a procedure for deriving unified data, based on the referred to generated data.

Also, the present invention stores programs for causing a computer to execute the following procedures: a procedure for managing a plurality of steps; a procedure for displaying the plurality of steps managed by the managing unit by symbols; a procedure for specifying a desired information processing device as the information processing device of the same group, out of information processing devices connected to a network; a procedure for registering the specified information processing device; a procedure for making reference to data generated by the registered information processing device, via the network; a procedure for judging the state of at least part of the plurality of steps based on referred to generated data, in the event that the data generated by an information processing device within the group is used; a procedure for displaying each of the plurality of steps in an identifiable manner, based on the judged state; and a procedure for deriving unified data, based on the referred to generated data.

BRIEF DESCRIPTION OF THE DRAWINGS

FIGS. 48, 48A and 48B are flowcharts of initial setting processing;

FIGS. 55, 55A and 55B are flowcharts for changing processing of input/output buffer information;

DETAILED DESCRIPTION OF THE PREFERRED EMBODIMENTS (Hardware configuration of the design managing apparatus)

First, the hardware configuration of the design managing apparatus relating to the present invention will be described in detail.

Figure 1:
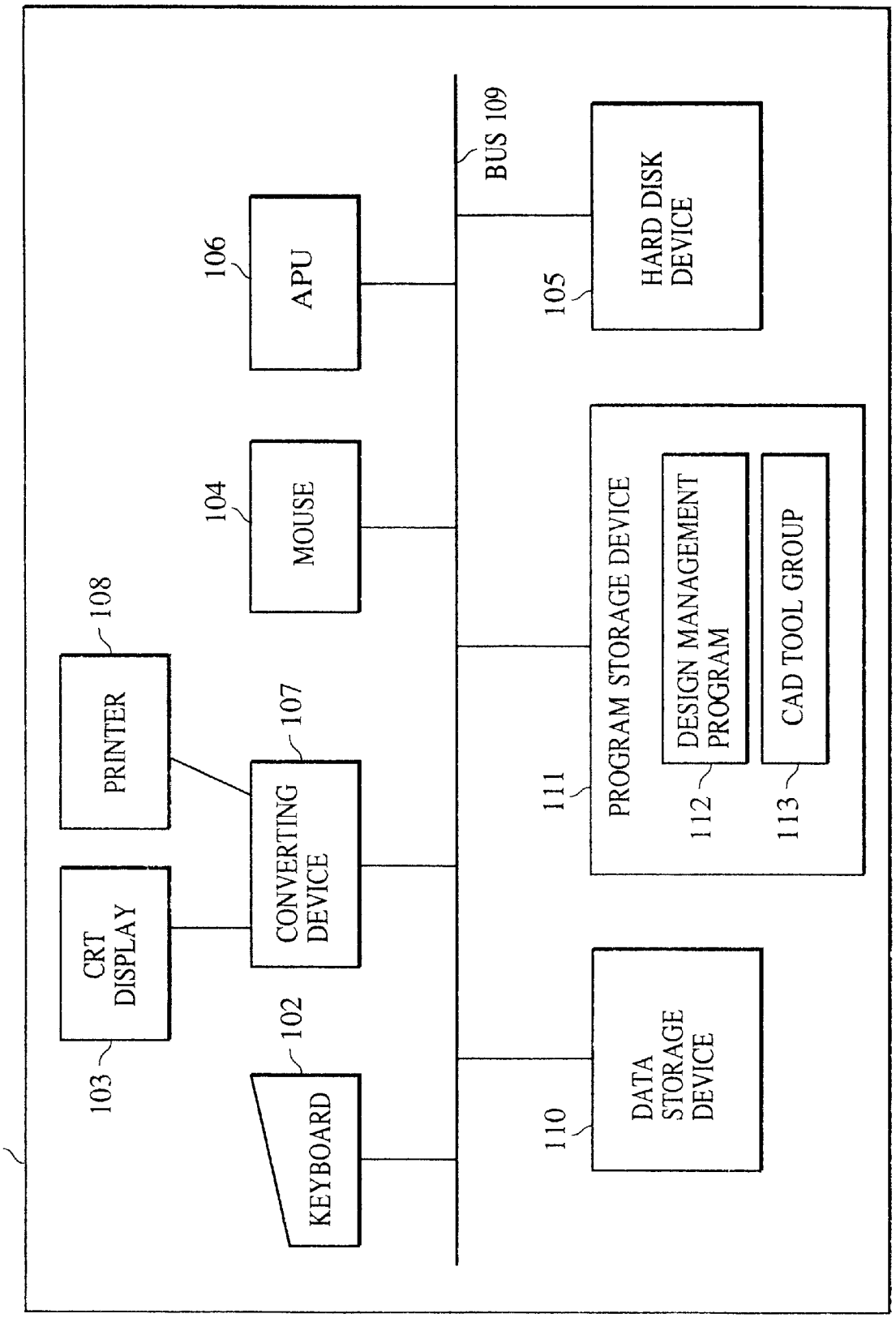
FIG. 1 is a constructional diagram of the hardware of a design managing apparatus.

FIG. 1 is a constructional diagram of the hardware of a design managing apparatus 101. The components of the design managing apparatus 101 will be described with reference to FIG. 1.

In FIG. 1, reference numeral 102 denotes a keyboard, which is used for converting various types of information, such as character command information, operation instruction information, and so forth, into electronic signals, thus inputting this information. Reference numeral 103 denotes a CRT display, which is used for displaying the various types of information input from input devices such as the keyboard 102 and the later-described mouse 104. The designer can confirm the operation of the design management program 112 and CAD tool group 113 used for carrying out the present invention, by looking at the CRT display 103. Particularly, in the present invention, the CRT display 103 is extremely important as a component for judging what is happening and what should be done next. Reference numeral 104 denotes a mouse which is a pointing device for instructing a desired position on the CRT display 103.

Reference numeral 111 denotes a program storing device, which has a memory such as a ROM, with programs such as the design management program 112 and CAD tool group 113 stored therein. These programs are executed by an APU 106. Also, reference numeral 110 denotes a data storing device, which has a memory such as a RAM, with data stored therein. This data may include the data which is used by the design management program 112 and CAD tool group 113 and data generated by processing performed by the APU 106. Also, reference numeral 105 denotes a hard disk device, which is used for storing programs stored by the program storing device 111 and data stored by the data storing device 110, as well as various types of databases. Of course, programs to be executed or data to be read and written at the time of executing the program may be stored on the hard disk device 105 beforehand.

Reference numeral 106 denotes a APU, which performs executing of programs such as the design management program 112 and CAD tool group 113 stored by the program storing device 111, and reading and writing of data to the data storing device 110, based on electronic information received from the keyboard 102 and mouse 104.

Reference numeral 107 denotes a converting device, which may include a graphic board, video board, and the like, and is used for converting information transferred from the APU 106 into information for display on the CRT display 103.

Also, the present embodiment is arranged such that a printer 108 is provided as an output device, for performing print output from the converting device 107.

Reference numeral 109 denotes a bus which electrically connects each of the components.

Hence, exchange of information is carried out between the components upon the designer performing desired operations, thus realizing the desired design of the object of design.

(Schematic description of the design management program)

Figure 2:
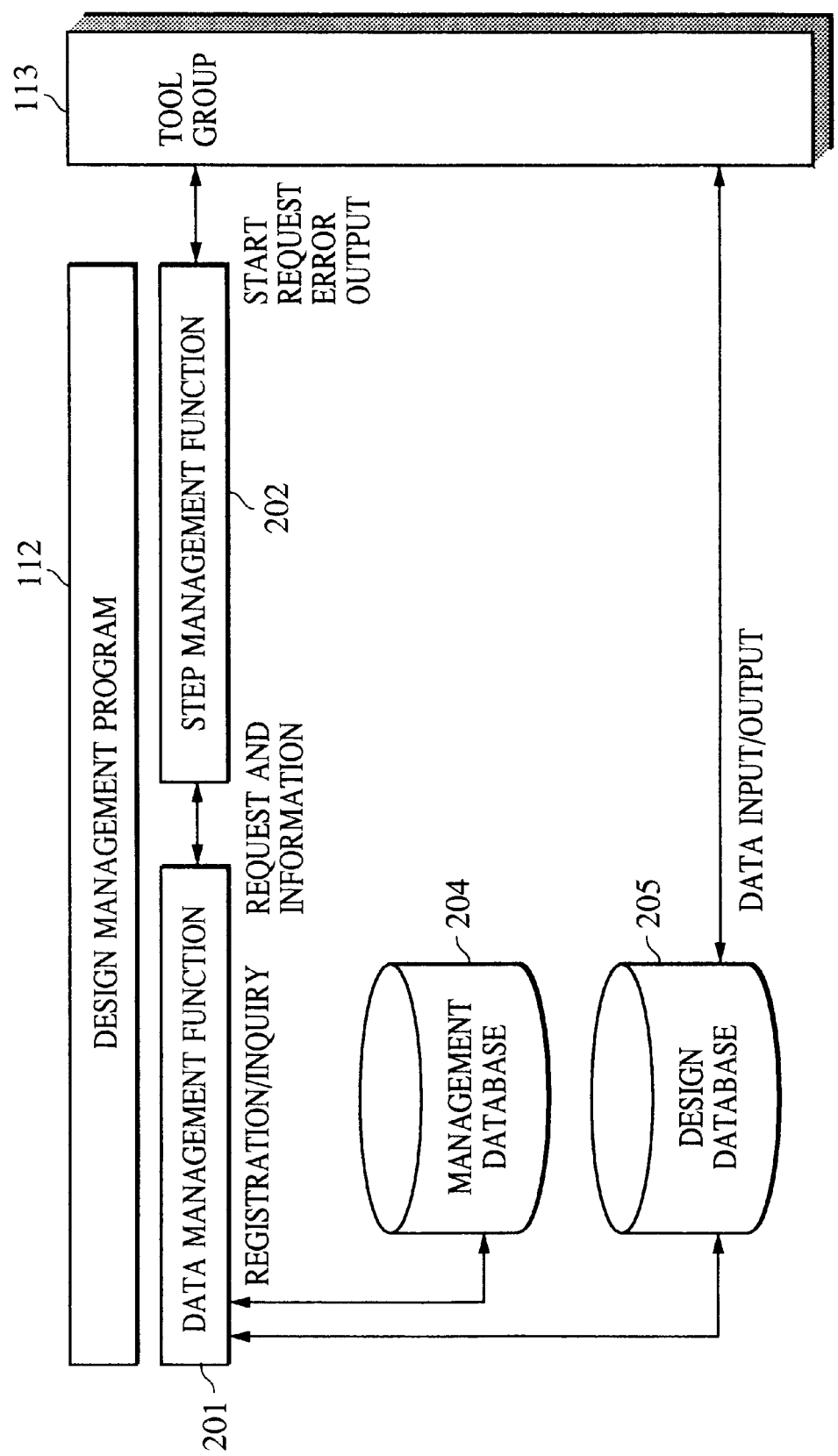
FIG. 2 is a conceptual diagram representing processing by a design management program.

FIG. 2 is a conceptual diagram representing functions realized by the design management program 112 stored in the program storing device 111 shown in FIG. 1.

In the present embodiment, the design management program 112 is a program which manages a plurality of steps relating to the design of an object of design, and is the basis for the operation of the present design managing apparatus 101. Description now will be made regarding the functions of the design management program 112 with reference to FIGS. 2 through 10.

In a large sense, the design management program 112 includes two functions, data management function 201 and step management function 202.

First, the data management function 201 is a function that manages a management database (hereafter referred to as management D/B 204) and a design database (hereafter referred to as design D/B 205) stored in the hard disk 105. Now, the management D/B 204 is a collection of unique data used by the design management program 112. More specifically, the files and data stored therein include: the initial information data file 501, group information data file 502, CAD tool information data file 503, vendor data file 504, group management data 505, ASIC data 506, message log data file 507, lock information data file 508, and so forth (see FIG. 5). Also, stored within the design D/B 205 are: all data generated by the CAD tools, and the history management information data file 401.

Now, data which is used by the CAD tools or generated thereby is referred to as "design data", this including CAD tool environment-related data and log files.

The step management function 202 is a function for managing the design operations and design work steps (work flow) according to the design management program 112.

The CAD tool group 113 is also a program group stored within the program storing device 111 in the same manner as the design management program 112, as described above.

Now, description will be made regarding the processing which the data management function 201 and step management function 202 perform with respect to the CAD tool group 113, management D/B 204, and design D/B 205.

First, when a request to get data stored in the management D/B 204 or the design D/B 205 is made from the step management function 202 to the data management function 201, the data management function 201 gets the requested data from the D/B 204 or the design D/B 205 and returns it to the step management function 202. In the event that the step management function 202 performs desired CAD tool setting and environment setting to the CAD tool group 113, the step management function 202 gets the specified error codes for execution and ending codes from the CAD tool group 113. Further, the data management function 201 makes a query to each of the D/Bs about stored data, and in the event that such data is in the D/Bs, the data management function 201 gets the data from the D/Bs. Also, the CAD tool group 113 gets data design stored in the design D/B 205, and the CAD tool group 113 outputs design data generated by executing the selected CAD tool, to the design D/B 205.

Figure 3:
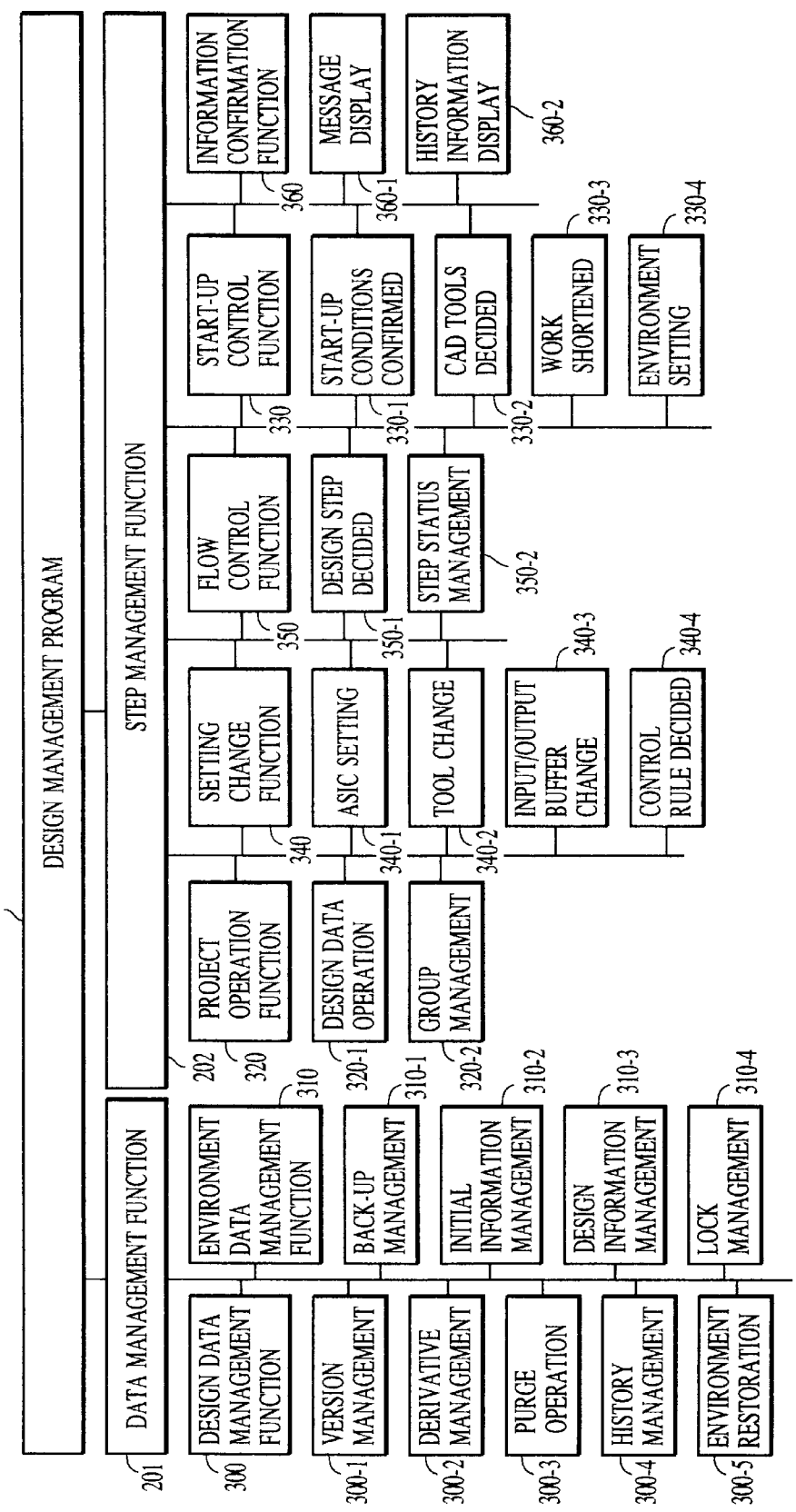
FIG. 3 is a figure illustrating the principal functions of the design management program.

FIG. 3 is a figure illustrating the principal functions of the design management program.

The data management function 201 and step management function 202 will be described in further detail with reference to FIG. 3.

The data management function 201 has a design data managing function 300 and an environment data managing function 310, and the step management function 202 has a project operation function 320, a setting change function 340, a flow control function 350, a start-up control function 330, and an information confirmation function 360.

Each of the functions which make up the "data management function 201" and "step management function 202" further include a plurality of functions.

First, the design data managing function 300 is a function of the data management function 201, and performs a variety of processes for each piece of data within the design D/B 205. Specific functions are: version management function 300-1, derivative management function 300-2, purge operation function 300-3, history management function 300-4, and environment restoration function 300-5.

Figure 4:
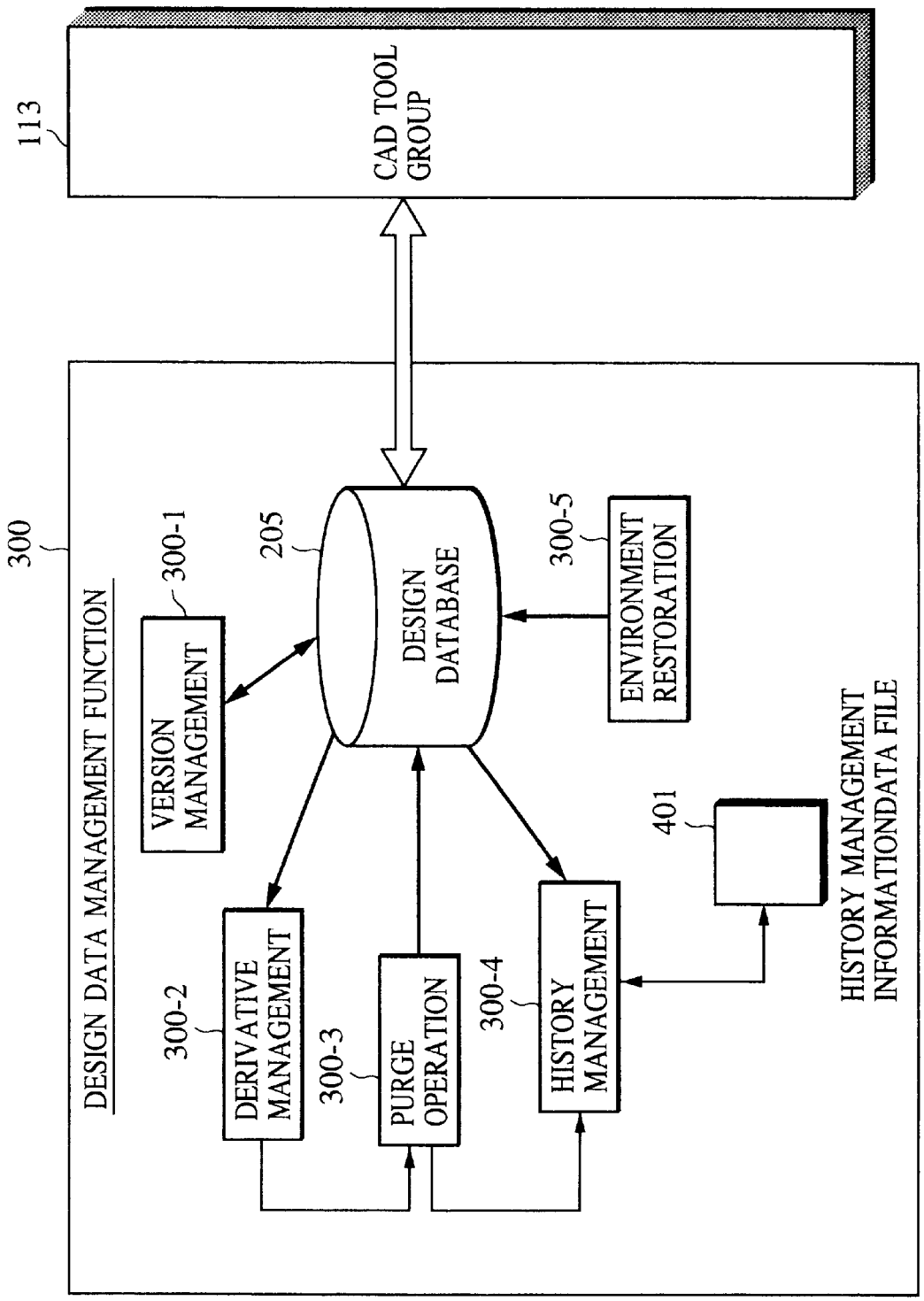
FIG. 4 is a diagram schematically illustrating the design data management function 300.

FIG. 4 is a diagram schematically illustrating the design data management function 300.

The version management function 300-1 is a function for providing design data within the design D/B 205 with a so-called version, and saves the design data generated by the CAD tools and the design environment including design data. At this time, the design environment prior to start-up is registered as an old version, and the design environment after start-up is registered as a new version. Thus, the version management function 300-1 saves the design environment each time upon start-up, and also provides the design data generated by the CAD tools with serial numbers in the order of generation, in an ascending fashion. Of course, the order of the numbers provided here is by no means restricted to an ascending order; rather, the order may be any order.

The derivative management function 300-2 is a function that ties the design data within the design D/B 205 together, and if the version management function 300-1 is understood to be a vertical management function, it can be said that the derivative management function 300-2 is a horizontal function. This derivative management function 300-2 indicates what design data was used to base the design data generated by the CAD tools of the CAD tool group 113 on, and manages the derivative relation between the design data (the arrangement allows for reading of the derivative relation from the history management information data file 401).

Generation of derivative information for each design data is performed immediately following the version management performed by the version management function 300-1. The generated derivative information thus becomes a key for the purge operation function 300-3 and history management function 300-4.

The purge operation function 300-3 is a function for ordering design data within the design D/B 205, and in the event that the version data value exceeds the value set by the initial information file 501 at the time of raising the version by the version management function 300-1, the design data of the oldest version is deleted. The number of versions which can be managed can be set as a variable to be used by the design management program 112.

The history management function 300-4 is a function which manages history information of the design data by using the history management in formation data file 401 stored within the design D/B 205, and manages the overall history of the design data used by the version management function 300-1, the derivative management function 300-2, and the purge operation function 300-3. The information of each piece of design data is stored in the history management information data file 401, and the history management function 300-4 also performs input/output processing to the history management function 300-4, and further outputs history information of the design data to the step management function 202.

The environment restoration function 300-5 functions to restore environment information including design data of the design D/B 205, and more specifically, is a functions to restore the CAD tool start-up environment of the previous generation (of course, this may be two or three generations ago). Accordingly, this function executes direct file operations for the design D/B 205.

Next, the environment data managing function 310 is a part of the data management function 201, and manages unique data referred to by the step management function 202. Specific functions are a back-up management function 310-1, an initial information management function 310-2, a design information management function 310-3, and a lock management function 310-4.

Figure 5:
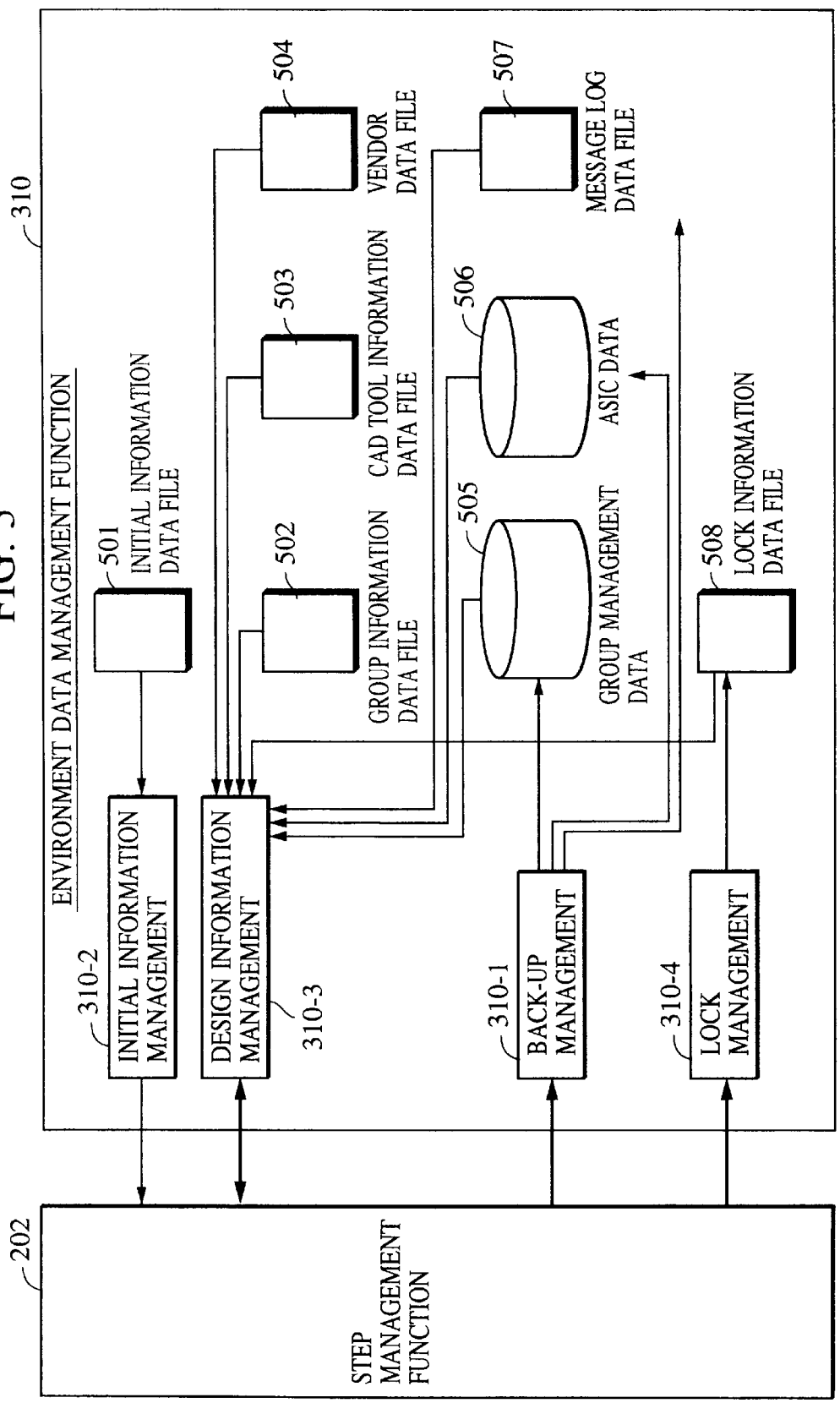
FIG. 5 is a diagram schematically illustrating the environment data management function 310.

FIG. 5 is a diagram illustrating the relation between the functions and environment data in the environment data management function 310.

The back-up management function 310-1 is a function which manages the following items which are objects of back-up (a process which saves the state prior to updating) within the management D/B 204: group management data 505, ASIC data 506, and message log data file 507. At the time of saving the environment data to the management D/B 204 by setting processing of the step management function 202, the back-up management function 310-1 makes a back-up of data prior to saving (i.e., copies data).

The initial information management function 310-2 is a function for setting default values to screen display on the CRT display 103 and data the value of which is settable, based on values stored in the initial information file 501 within the management D/B 204, at the time of starting up the design management program 112.

The design information management function 310-3 is a function for managing the various types of information within the management D/B 204, such as the group information data file 502, CAD tool information data file 503, vendor data file 504, group management data 505, ASIC data 506, and so forth, which are used in the event the target setting function 340-1 and CAD tool setting function 340-2 of the setting change function 340 of the step management function 202, group-related functions, and so forth are used. Here, the term "group" in the present embodiment refers to a collection of a plurality of designers for executing a single project.

The lock management function 310-4 is a function which uses the lock information data file 508 within the management D/B 204 to specify to the step management function 202 or design information management function 310-3 to forbid change of the contents. The lock information data file 508 created by the lock management function 310-4 keeps such information relating to forbidden changes in content.

Next, the project operation function 320 is a function of the step management function 202 that executes creation and selection of projects. Actual processing is performed by getting data necessary for processing from the environment data management function 310, according to text input by the designer or by selection, thus performing processing of the design data or group information. Specific functions are the design data operation function 320-1 and the group management function 320-2. Now, in the present embodiment, the term "project" refers to a unit of design for designing an object of design.

Figure 6:
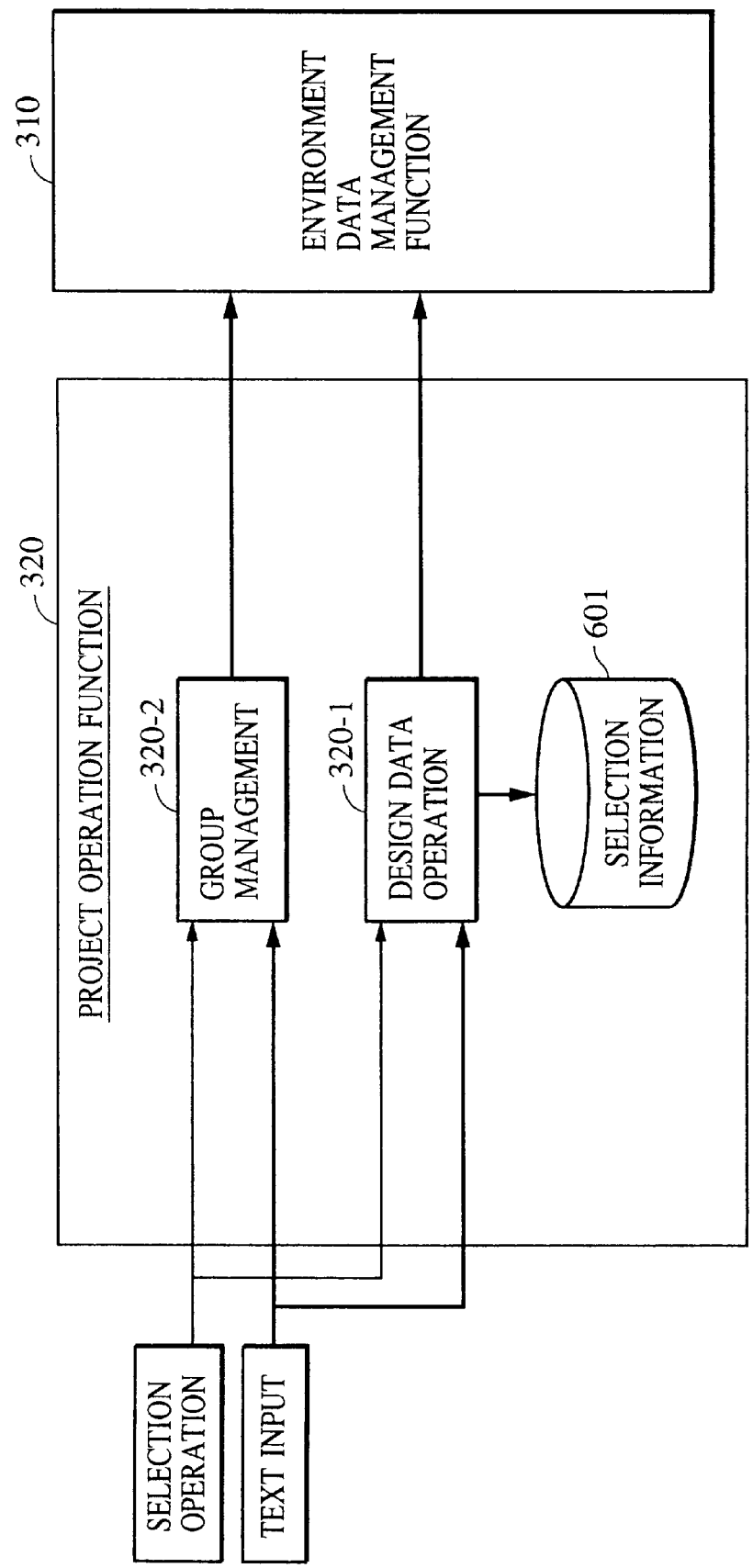
FIG. 6 is a diagram schematically illustrating the project operation function 320.

FIG. 6 is a diagram schematically illustrating the functions in the project operation function 320.

The data design data operation function 320-1 is a function for performing input and output of data regarding selection data 301 stored on the hard disk 105 and used on the later-described flow control function 350 and start-up control function 330, and more specifically, performs new creation, duplication, deletion, etc. of projects, according to text input by the designer or by selection. The selected data is then stored as selection information 601.

The group management function 320-2 is a function corresponding to the network of the project operation function 320, and performs process ing to deal with group design and so forth.

Next, the start-up control function 330 is a function of the step management function 202 that performs a series of operations for the start-up of the CAD tools.

Figure 7:
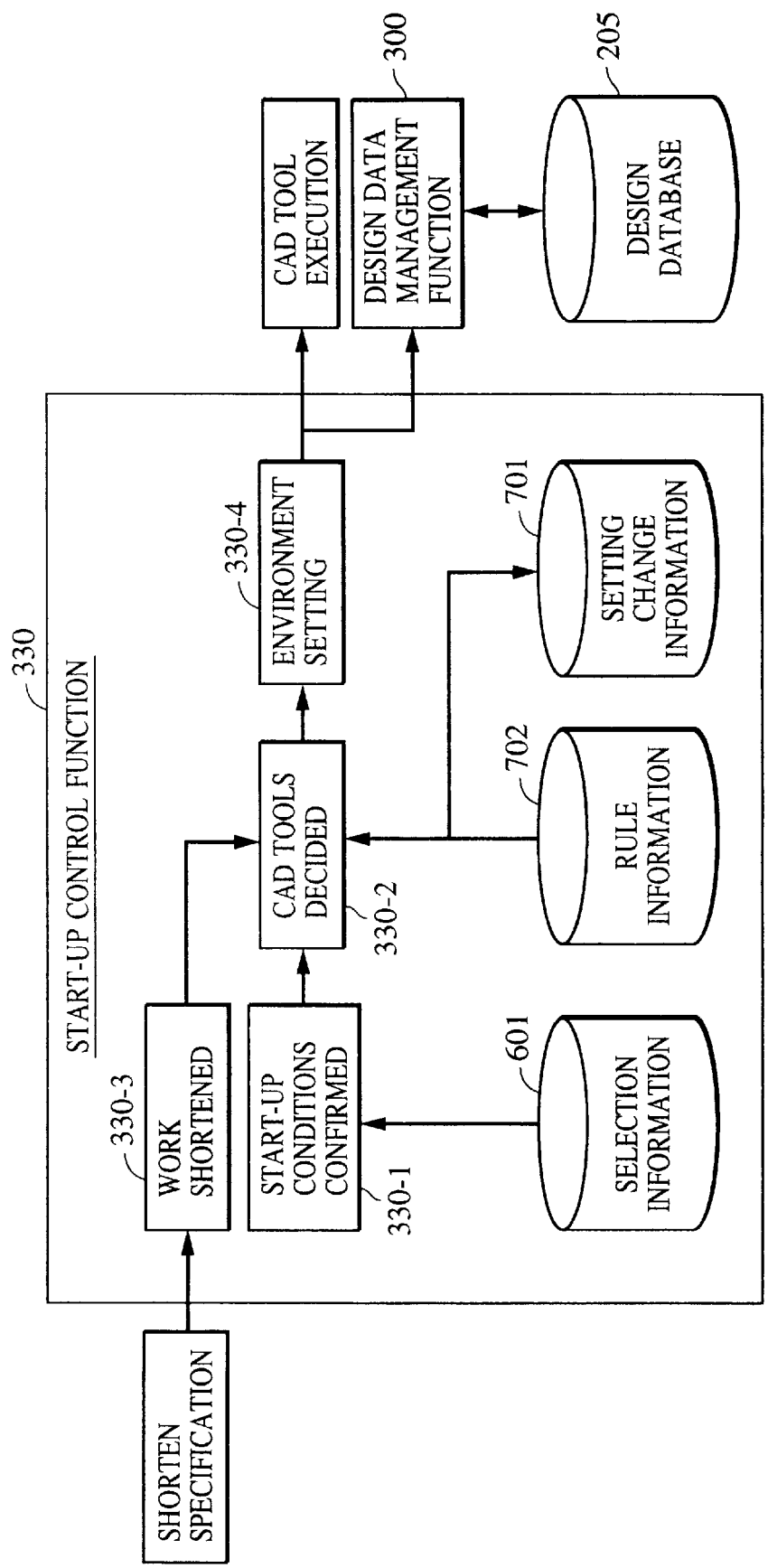
FIG. 7 is a diagram schematically illustrating the start-up control function 330.

FIG. 7 is a diagram schematically illustrating the function s of the start-up control function 330.

The start-up conditions confirmation function 330-1 is a function for confirming the conditions of CAD tool start-up from the selected information 601 selected from the project operation function 320 with the start-up conditions confirming existence of design data to serve as input data, and so forth.

The CAD tool decision function 330-2 is a function for determining the types of CAD tools to be started, and the contents of processing, from the setting change information 701 and rule information 702 determined in the later-described setting change function 340.

The work shortening functio n 330-3 is a process which executes the necessary work out of a plurality of pieces of work collected within a single step (the relation between "step" and "work" will be described later). It should be understood that a single step includes a plurality of pieces of work. That is, this is a function which allows reduction in the number of pieces of work within the step. Normally, all work contents within a step are executed, but excess time can be saved by using this work shortening function 330-3. The designer's specification determines which work is executed.

The environment setting function 330-4 is a function for building a start-up environment, as pre-processing for start-up of the CAD tools. Processing for requesting restoration of environment data using the environment restoration function 300-5 of the "design data management function 300", and confirming design data, are also conducted here.

Next, the setting change function 340 is a function of the step management function 202, and is a function for performing various types of work setting (also referred to as "re-targeting function"). Specific functions of the setting change function 340 are: the target setting function 340-1, the CAD tool changing function 340-2, the input/output buffer changing function 340-3, and the control rule determining function 340-4.

The functions of this setting change function 340 indicate that the design management program 112 has flexibility to change in information relating to ASICs, and so forth. Such flexible functions of the design management program 112 allow for improved efficiency in a great many ways, such as shortening the design period, improving operability, and so forth.

Figure 8:
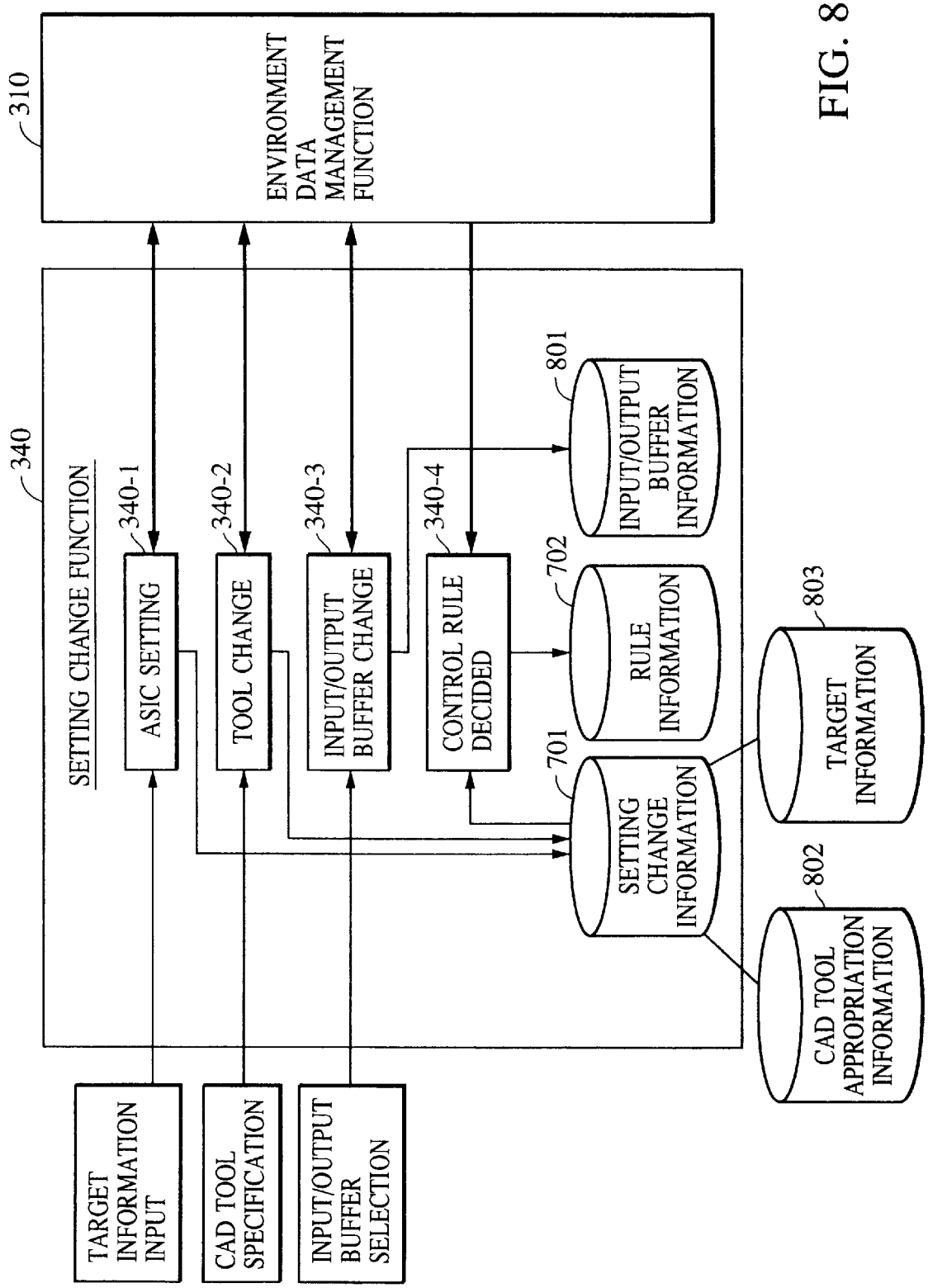
FIG. 8 is a diagram schematically illustrating the setting change function 340.

The following is a description of the target setting function 340-1, the CAD tool changing function 340-2, the input/output buffer changing function 340-3, and the control rule determining function 340-4, in detail, with refer ence to FIG. 8.

FIG. 8 is a diagram schematically illustrating the functions of the setting change function 340.

The target setting function 340-1 is a function for setting data relating to an ASIC that serves as a base in order to design an ASIC as a completed designed item (the latter ASIC hereafter referred to as "target"). The information necessary for data setting is provided by the environment data management function 310. Incidentally, information relating the target (hereafter referred to as "target information 803") set by the designer and the later-described CAD tool appropriation information 802 are jointly referred to as "setting change information" 701.

The CAD tool changing function 340-2 is a function for appropriating the CAD tools which are started at each step of the design process, to each step. The CAD tools corresponding to each step are limited, and this limited CAD tool information is provided from the environment data management function 310. The CAD tool appropriation information 802 obtained here, as described with regard to the target setting function 340-1, is joined with the target information 803, and becomes a part of the setting change information 701.

The input/output buffer changing function 340-3 is a function for changing the input/output buffer regarding which temporary input has been conducted in a prior step, and the change contents thereof are stored as input/output buffer information 801. This input/output buffer changing function 340-3 is executable only in certain specified steps.

The control rule determining function 340-4 is a function for determining rules for each step controlled by the design management program 112, based on the setting change information 701 obtained from the target setting function 340-1 and CAD tool changing function 340-2. The information relating to these rules is provided from the environment data management function 310. Also, the determined rules are handled as rule information 702, and effect determining of the state of the step following start-up of the CAD tools.

Next, the flow control function 350 is a function of the step management function 202, which relates to the steps managed by the design management program 112, and performs control of the state of the step and management of the state of the step. There are two specific functions: the design step deciding function 350-1 and step status management function 350-2. In order to realize this flow control function 350, the aforementioned selection information 601, setting change information 701, and rule information 702 and so forth are necessary.

Figure 9:
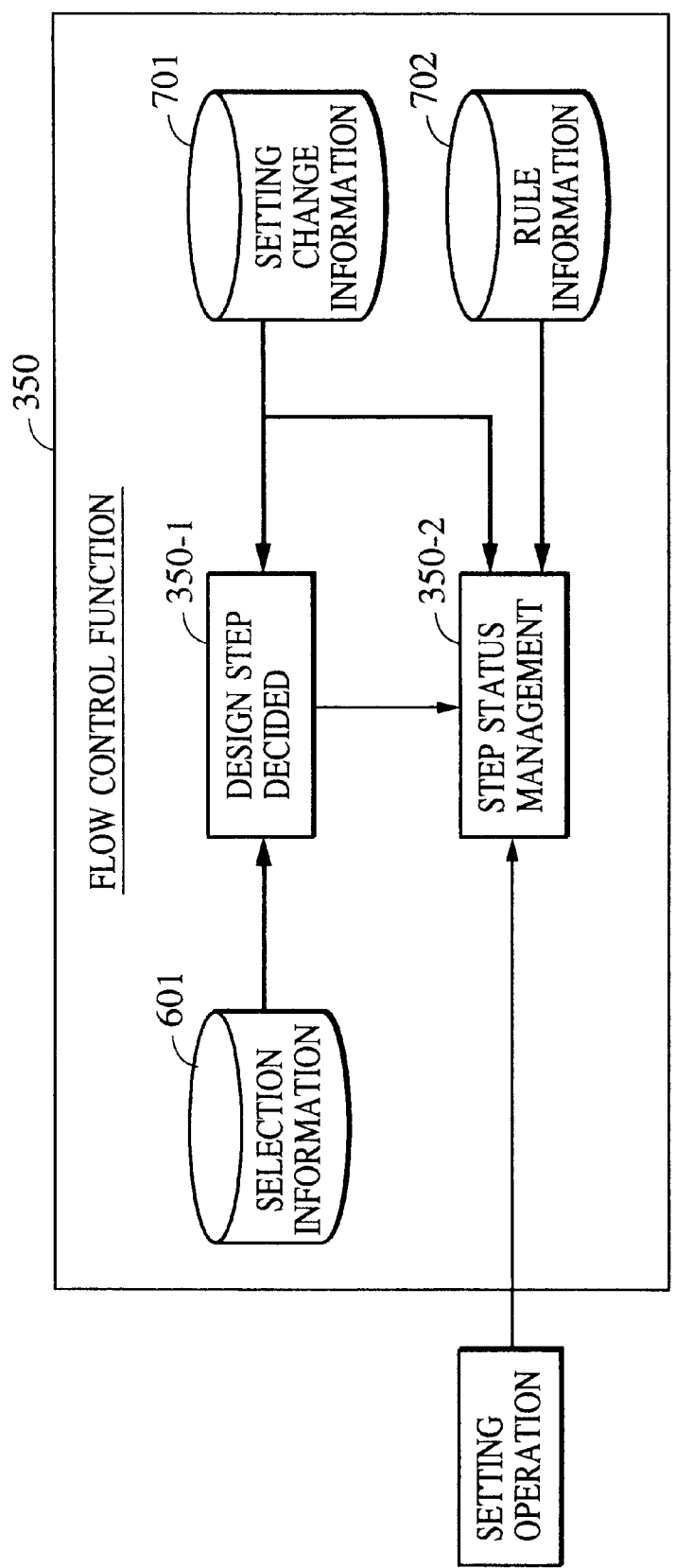
FIG. 9 is a diagram schematically illustrating the flow control function 350.

FIG. 9 is a diagram schematically illustrating the functions in the flow control function 350.

The design step deciding function 350-1 is a function for determining all steps for designing the ASIC, based on the setting change information 701 and selection information 601. Design of the desired ASIC can be realized by the designer designing along these determined steps.

The step status management function 350-2 is a function for determining the state of each step from the setting change information 701 and rule information 702, with four states existing for this step state: i.e., an executable state, a non-executable state, a selected state, and an executing state.

Finally, the information confirmation function 360 is a function of the step management function 202, and is an auxiliary function. The functions thereof are primarily for confirming progress, such as the message display function 360-1, the history information display function 360-2, and so forth. This function is not absolutely necessary for design, but is employed in the present design management program 112 as a function necessary for the designer to design ASICs in an effective manner.

Figure 10:
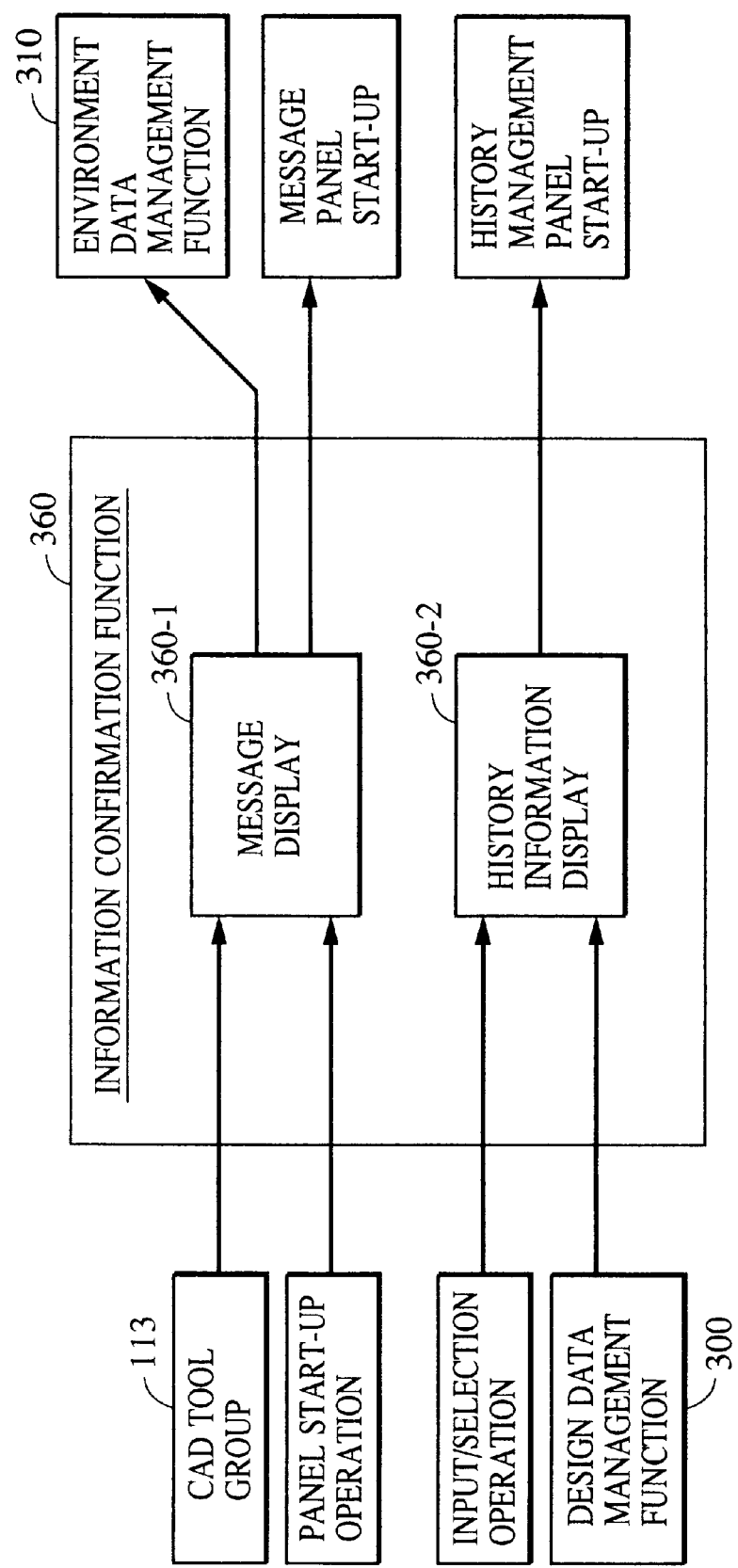
FIG. 10 is a diagram schematically illustrating the information confirmation function 360.

FIG. 10 is a diagram schematically illustrating functions in the information confirmation function 360.

The message display function 360-1 is a function for receiving direct messages from the CAD tools and displaying the information thereof on a later-described panel on the CRT display. The messages displayed on the message panel are transferred to the environment data management function 310. The transferred messages are then managed as a message log data file 507.

The history information display function 360-2 is a function for displaying history information from the "design data management function 300" on a later-described history management panel on the CRT display, and at the same time, performing lock setting to the purge operation function 300-3. Also, reference can be made to the target information 803 at the history management panel.

Now, the present invention will be described in detail, with the above-described hardware configuration of the design managing apparatus 101 and the conceptual descriptions of the design management program 112.

(First Embodiment)
<Flow of design process>

First, an overview will be given regarding the design of an object of design using the design managing apparatus 101.

In order to design a desired object it is necessary to proceed with the stages of design following a certain designing method. In the present embodiment, each stage of design will be referred to as a "step", and the overall flow of work of a plurality of such "steps" will be referred to as a "project". The steps in the project include: system design, function design, logic design, circuit design, mounting design, layout design, testing design, and so forth. Also, generally, these setting steps are followed by steps of manufacturing, testing, and so forth, thus completing the object of design.

In actual practice, such design methods as described above are often used for designing integrated circuits developed for specific usage, such as ASICs. The term "ASIC" in the present embodiment includes all of full-custom ICs and semi-custom ICs, ASSP (Application-Specific Standard Product), PLD (Programmable Logic Array), FPGA (Field-Programmable Gate Array). However, it should be noted that this can indicate only a gate array, or it may indicate all non-general-purpose items.

The present embodiment manages all of the steps of the project with a single program, the design managing program 112.

Figure 11:
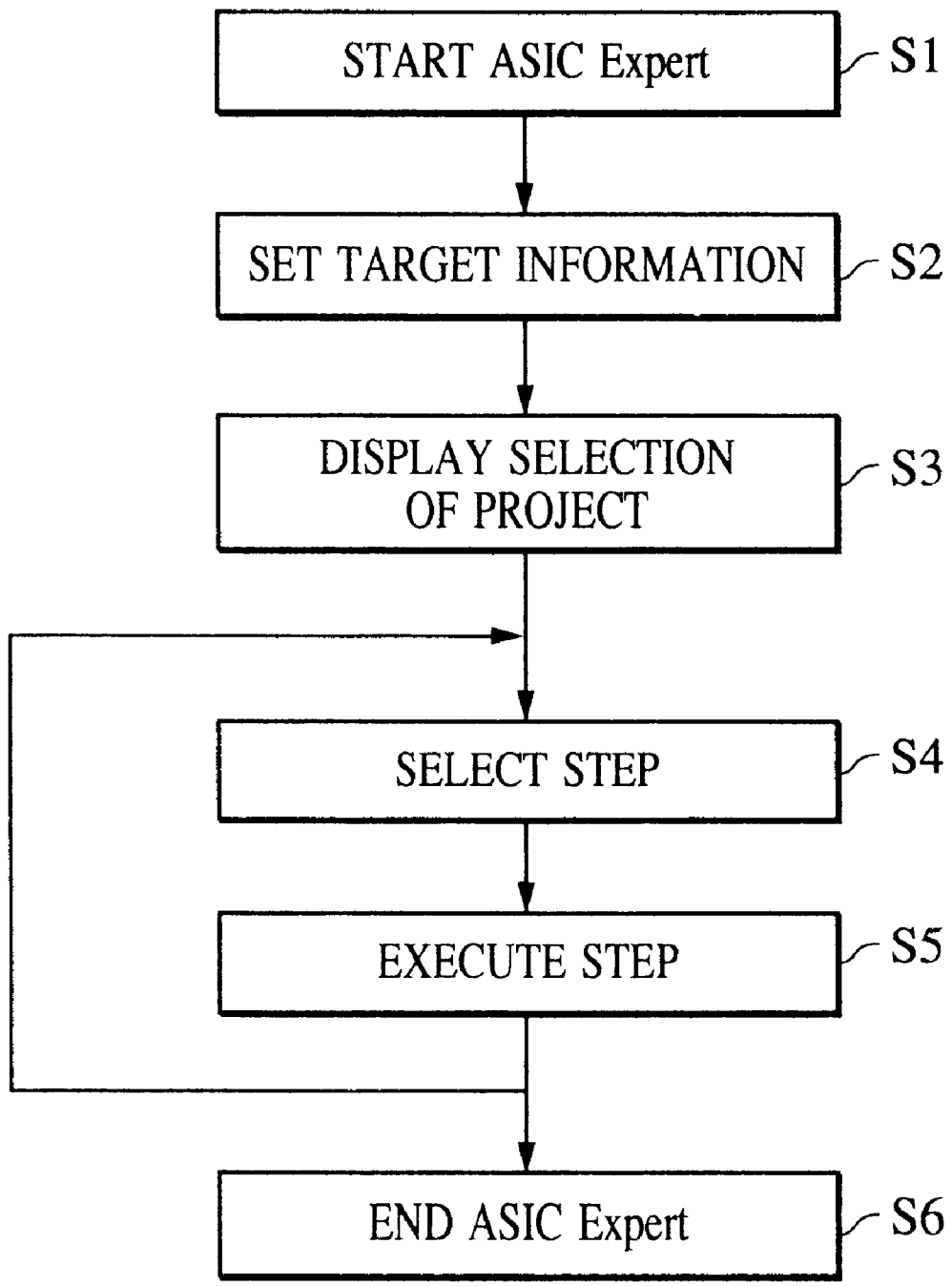
FIG. 11 is a diagram schematically illustrating the flow of design processing.

Now, the basic flow of processing in the case of designing using this design managing program 112 will be described, with reference to FIG. 11.

Following starting the design managing program 112 (S1), the designer sets the ASIC to be used for design, i.e., the information relating to the target (S2), whereby the certain project corresponding with that target is selected, and the step group is shown in the CRT display 103 (S3). (At the same time, rule information 702 for controlling this is determined.) Then, the user s elects a desired executable step (S4), whereby processing of the selected step is executed (5). Thus, performing selection and execution (S4 and S5) of executable steps, from the first step through the final step (S6), completes the desired design process.

Now, with the above flow in mind, detailed description will now be made regarding an embodiment of the present invention.

<Display of state of step>

Figure 12:
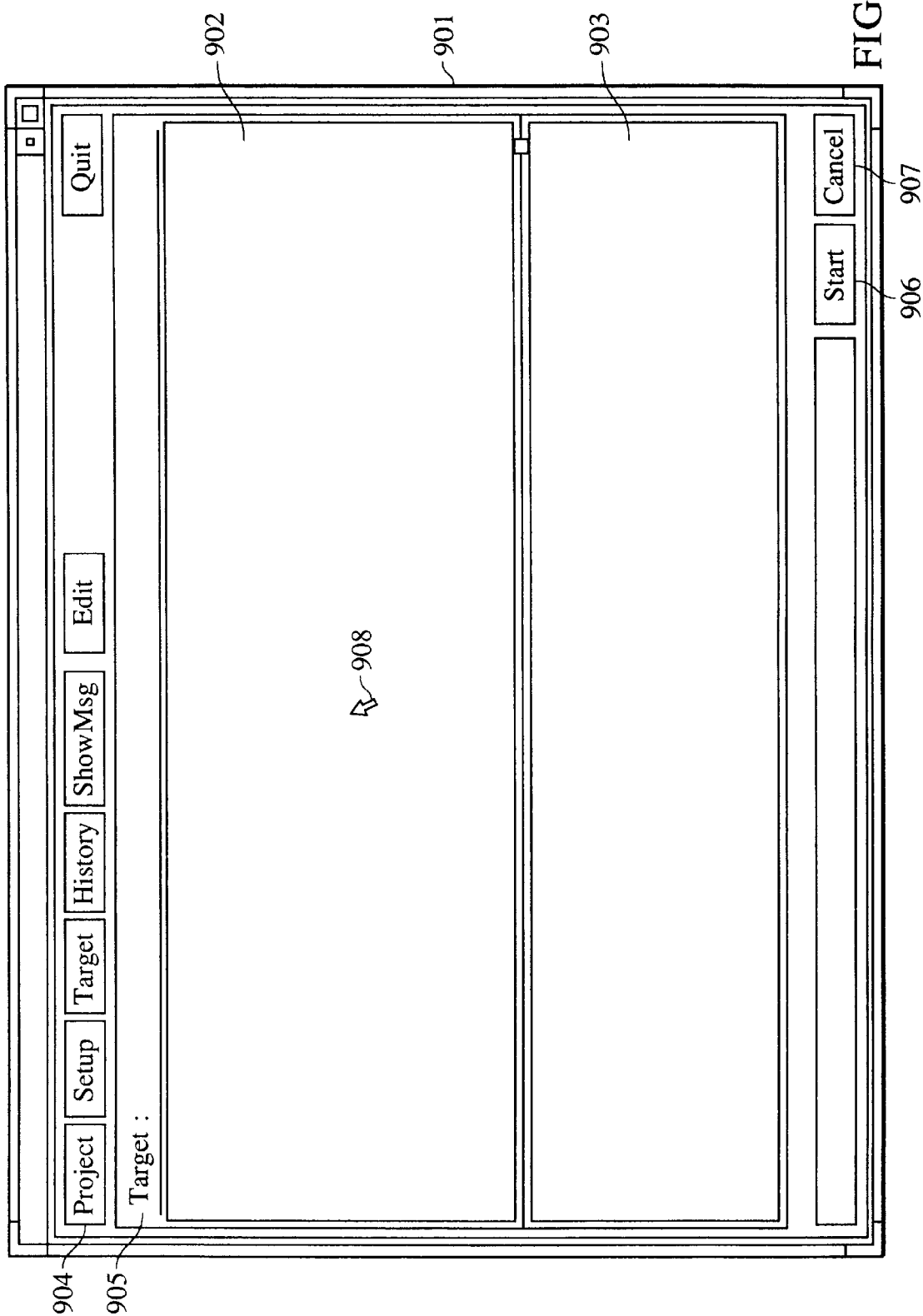
FIG. 12 is a diagram illustrating the main panel displayed on the CRT display.

First, in the design managing apparatus 101, inputting a start-up command from the keyboard 102 causes the design managing program 112 to start up, and a main panel 901 such as shown in FIG. 12 is displayed on the CRT display 103. Also, the design managing program 112 can be started and the main panel 901 displayed on the CRT display 103 in the same way, by keyboard input or by instructing an icon representing the design managing program 112 on the CRT display 103 using the mouse 104. Of course, the design managing program 112 may be started up using means other than these.

FIG. 12 is a diagram illustrating the main panel 901 displayed on the CRT display 103 with the design managing program 112 started up.

In FIG. 12, reference numeral 902 denotes an area wherein a group of steps managed by the design managing program 112 is displayed and reference numeral 903 denotes an area wherein the work contents comprising the selected step are displayed. (Although described later, each step further includes a group of steps. Such a step within a step is referred to as "work".)

Reference numeral 904 denotes a group of buttons for inputting commands, with commands being input by this button group, the mouse 104, and so forth. Reference numeral 905 denotes a target display area, for displaying target information 803. Also, reference numeral 906 denotes a Start button to instruct execution, and reference numeral 907 denotes a Cancel button to cancel instructions.

Reference numeral 908 denotes a mouse cursor, which moves over the screen according to instruction by the mouse 104, and instructs desired positions. In the diagrams subsequent to this FIG. 9, display of the mouse cursor 908 will be omitted.

Figure 13:
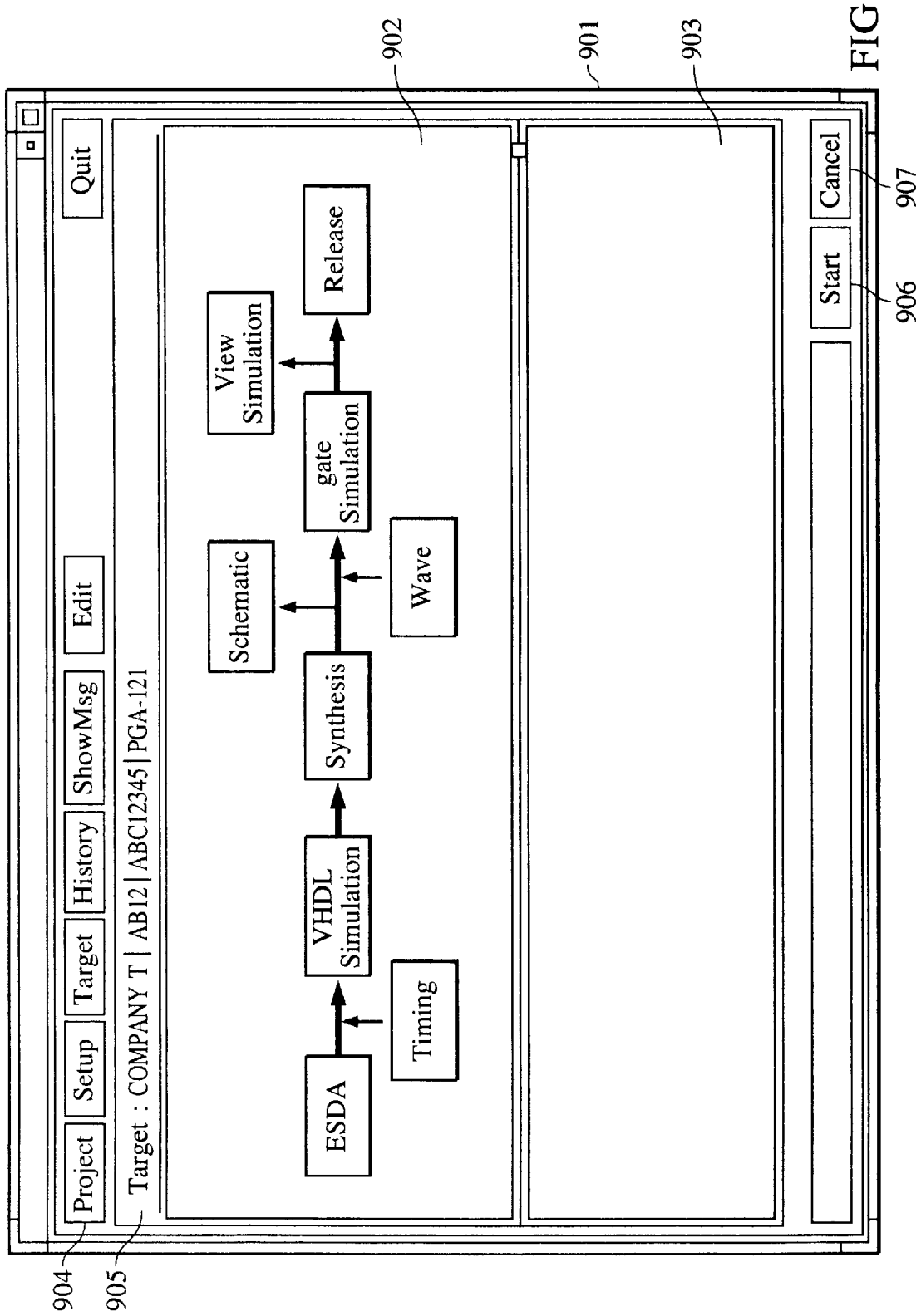
FIG. 13 is a diagram illustrating an example of a plurality of processes being displayed on the main panel.

Next, input processing by the keyboard 102 and mouse 104 to the main panel 901 such as shown in FIG. 12 determines the contents of the steps and the target information 803, and an image of the flow of steps managed by the design managing apparatus 101 is displayed on the area 902 on the main panel 901, as shown in FIG. 13.

FIG. 13 is a diagram illustrating an example of a plurality of processes being displayed on the area 902.

In FIG. 13, blocks shown in the area 902 provided with names such as "ESDA" or "VHDL Simulation" indicates steps which are collections of various work contents. In FIG. 13, the steps are shown as blocks, but there is no need for the display to be limited to such. Rather, square shapes, round shapes, representations using only text, or any other mode may be used, so long as the steps can be expressed. According to the present embodiment, an arrangement with characters within rectangles has been employed in that input of rectangles is relatively simple. The arrangement easily allows the designer to recognize that some sort of processing is being carried out within the step, and the text further enables the user to grasp an idea of the work within the step.

The arrows displayed between the steps have been employed here since the designer can readily understand the connections between the steps and transfer of data between the steps, and since arrows are easily input. Of course, means of expression other than arrows may be used instead.

Now, the diagram in this area 902 expressed with blocks and arrows will in the present invention be referred to as a "step relation diagram".

Figure 14:
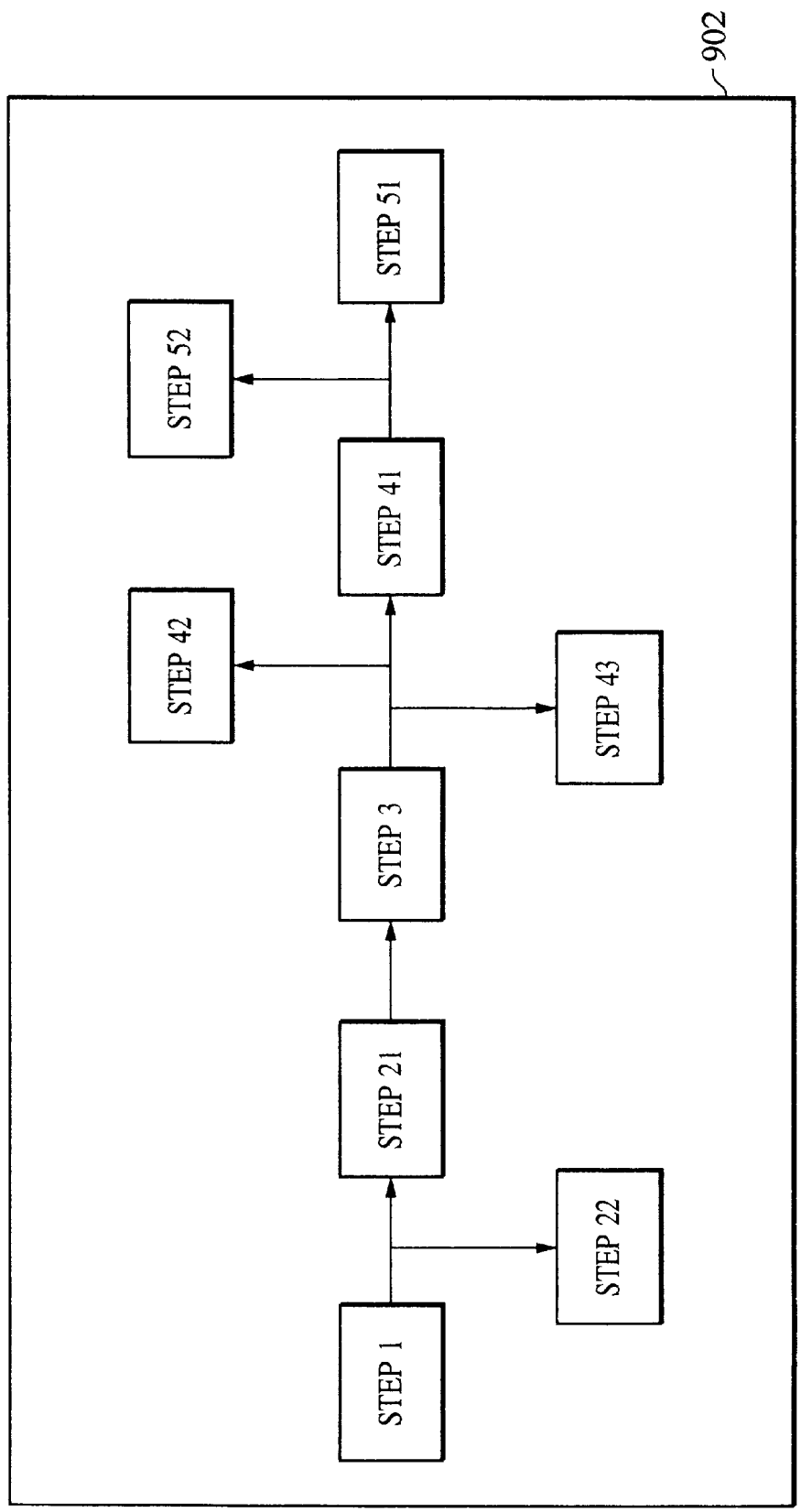
FIG. 14 is a step relation diagram used with a first embodiment.

FIG. 14 shows another example of a step relation diagram as an example closely resembling that of FIG. 13.

Description of the present embodiment will be made based on the step relation diagram shown in FIG. 14, regarding the processing in each of the steps, and the change in state therein. In FIG. 14, each step is expressed in a simple manner, such as step 1, step 21, step 22, and so forth. For example, "ESDA" in FIG. 13 corresponds to step 1 in FIG. 14.

In FIG. 14, the reason that the direction of arrows between step 1 and step 22 is not the same as that in FIG. 13, is that the flow of generated data is not the same. In the step relation diagram in FIG. 13, the arrow from "Timing" is pointing upwards, since data generated in the step labeled as "Timing" is to be used in a step labeled "VHDL Simulation". In FIG. 14, data is not generated in step 22, but rather is only referred to, or, generation of data not used in subsequent steps is performed, so the arrow is pointing in the opposite direction. The reason why the arrow between step 3 and step 43 in FIG. 14 is different than in FIG. 13 is the same.

Of course, it is apparent that there can be a great many more processes than those using the step relation diagrams shown in FIGS. 13 and 14.

Regarding the steps represented by the blocks in FIG. 14, there are four states: i.e., an executable state, a non-executable state, a selected state, and an executing state. Here, an executable step means a step in the state that the step can be executed in the case that the designer instructs execution of that step. Conversely, a non-executable state means a step in the state that the instruction is ignored and the step is not executed in the ca se that the designer instructs execution of that step. A selected state means that the step is currently selected by the designer, and an executing state means that the step is currently being executed.

Now, the CRT display 103 is a color display, so the objects in the step relation diagram are displayed in four colors, with the aforementioned non-executable state in "red", the executable state in "green", the selected state in "yellow", and the executing state in "white".

Of course, any combination of color s will work, but in this example, the above colors were decided upon for ease of expression, ease of recognition, effects of the colors (e.g., red has inhibitory effects, such as "caution" or "forbidden"), and so forth. Also, an arrangement for identification other than using color is also possible, i.e., displaying objects above or in the proximity of the blacks indicating steps, these objects clearly representing the state of that step. Also, the states of the steps need not be classified into the above four; rather, the classification may be of three or less, or of five or more.

Also, whether each step is executable or not is determined by whether or not each step fulfills conditions necessary for execution, these conditions being called "executable conditions".

The idea of "executable conditions" in the present embodiment generally indicates conditions determined by the rule information 702, and generally refers to conditions such as whether or not the step before the step in question is executable or not, or conditions such as whether or not data generated in a step earlier than the step in question is data which is to be used in executing that step, or not.

Also, whether or not there is a "derivative relation" between the data to be used when executing the step in question and the data generated in a step earlier than the step in question, is an executable condition. This "derivative relation" will be further described with regard to the sixth embodiment.

Now, the state of the steps illustrated in the step relation diagram shown in area 902 will be described in detail regarding the sequential verifying process from the first process through the final process, with reference to FIG. 15.

Figure 15:
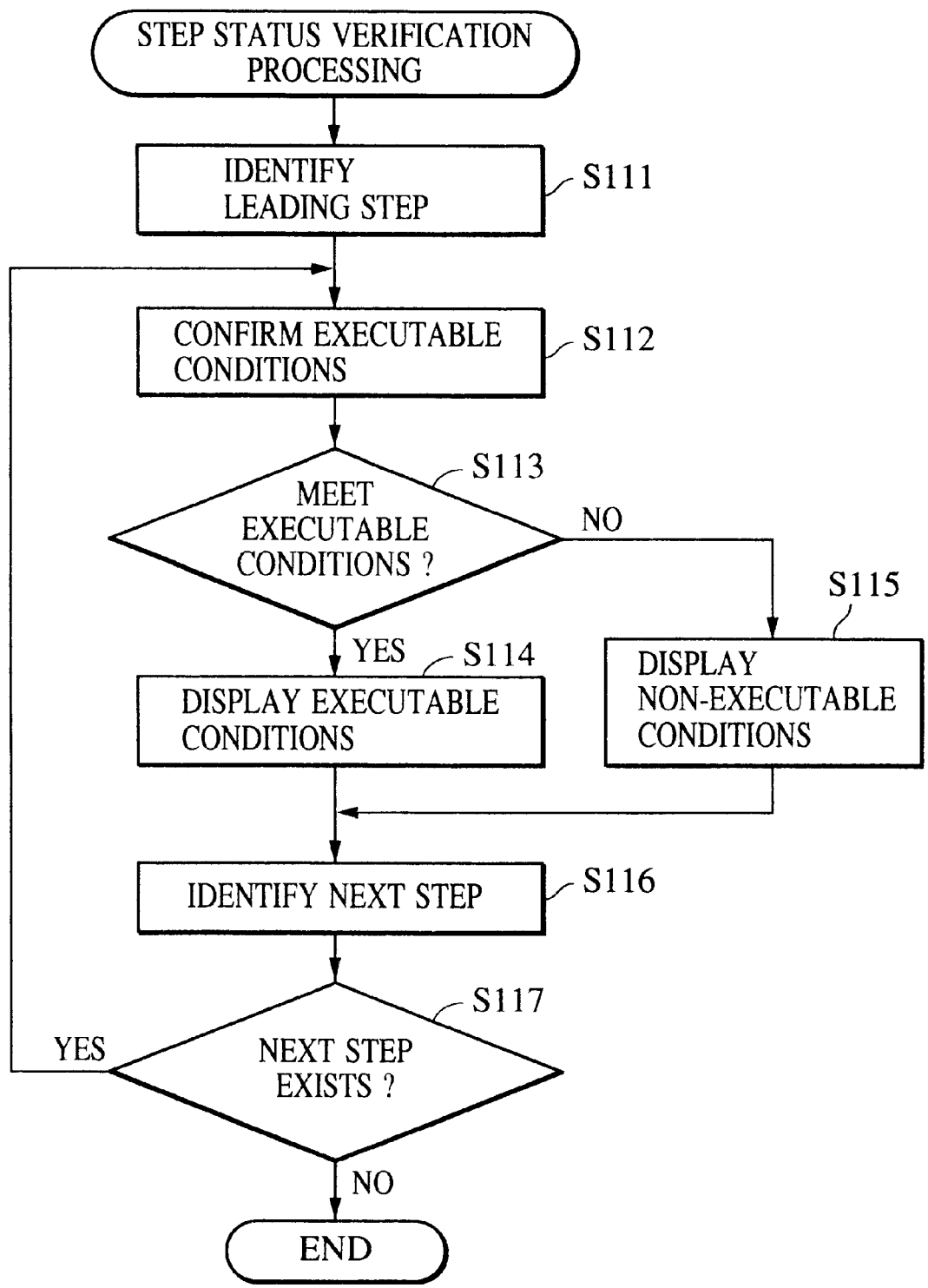
FIG. 15 is a flowchart for verifying processing of the state of the steps.

FIG. 15 is a flowchart for verifying processing of the state of the steps.

First, in Step S111, the leading (first) step is confirmed. Next, in Step S112, the executable conditions for that step are confirmed, and in Step S113, judgment is made whether or not the conditions for executing that step are met or not. In the event that the conditions are fulfilled, the flow proceeds to Step S114, and the step display is changed to a display indicating start-up enabled (generally, an unverified step is displayed in a default colorless state). Then, in Step S116, the next step is confirmed. Following Step S116, judgment is made in Step S117 whether or not existence of the next step has been recognized, and in the event that the next step has been recognized, re-processing is performed from Step S112. In the event that the next step is not recognized, the flow judges that all steps have been completed, and the verification process of the steps is ended. In the event that the executable conditions are not met in Step S112, the flow proceeds to Step S115, wherein the state of the step is changed to a non-executable display, following which the flow proceeds to Step S116, and processing is performed in the same way as with the case wherein the executable conditions are met.

The execution processing shown in this FIG. 15 is processing to be undertaken in the case that the states are not set for the steps due to being in the initial state, or cases wherein a step in an executable state may change into a non-executable state owing to setting of target information or setting of CAD tools (described later). The reason is that in such cases, all steps, beginning with the first step must be verified.

However, in the event that a certain step is executed, the only steps affected by that execution are the subsequent steps, so it is unnecessary to perform verification from the first step. Accordingly, a simplified process will be described in detail with reference to the flowchart shown in FIG. 16.

Figure 16:
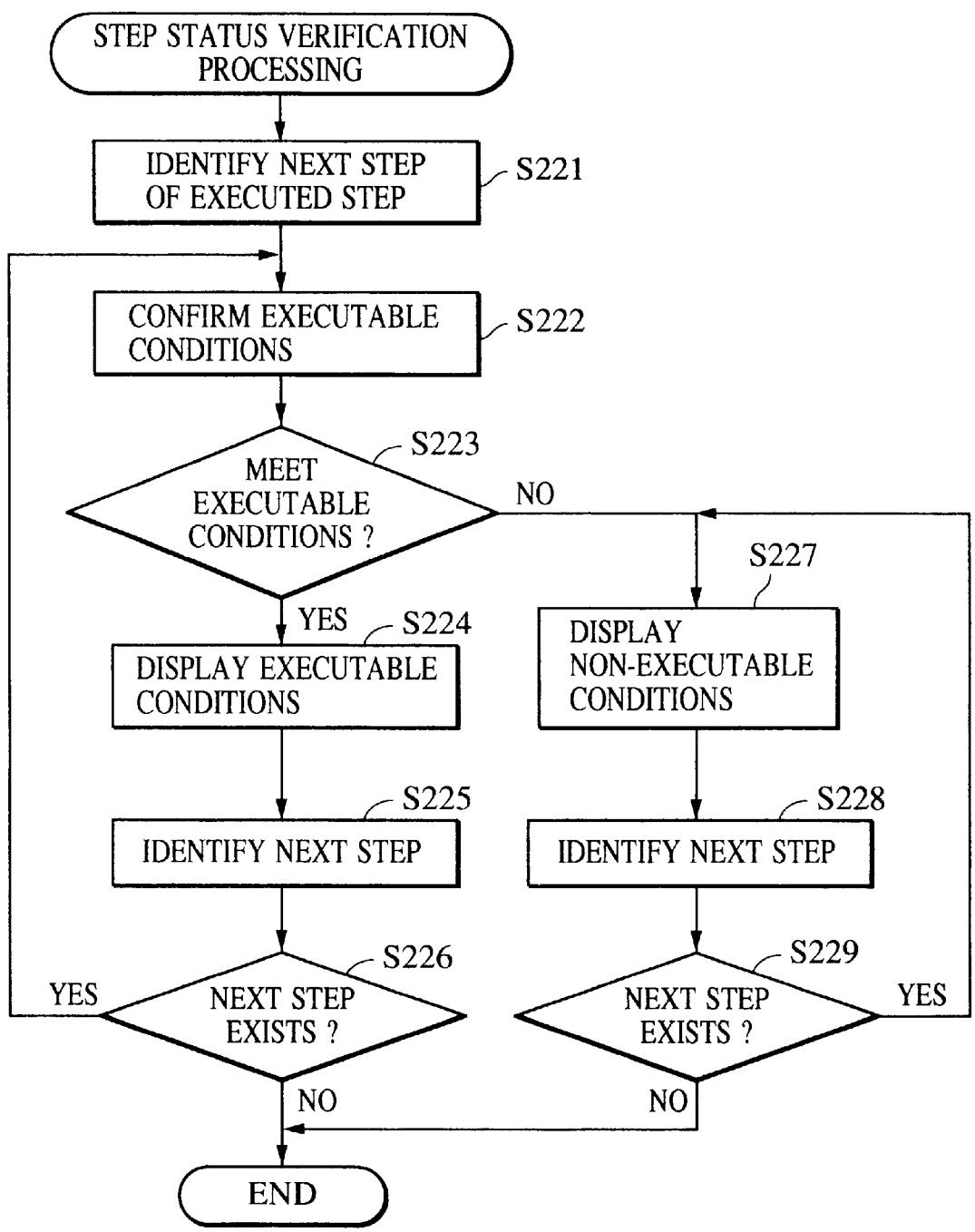
FIG. 16 is a simplified flowchart for verifying processing of the state of the steps.

FIG. 16 is a simplified flowchart for verifying processing of the state of the steps.

First, in Step S221, the step subsequent to the executed step is recognized. Next, in Step S222, the executable conditions for that step are confirmed, and judgment is made in Step S233 whether or not the executable conditions of that step are met or not. In the event that the conditions are met, the flow proceeds to Step S224, and the state display is changed to that indicating an executable state. Then, in Step S225, the next step is recognized. After Step S225, judgment is made in Step S226 whether or not the existence of the next step has been recognized, and in the event that the next step has been recognized, processing is performed once more from Step S222. Also, in the event that the next step is not recognized, the flow judges that all steps have been completed, and the verification process of the steps is ended.

Also, in Step S223, in the event that the executable conditions are not met, the flow proceeds to Step S227, where the state of the step is changed to a display indicating the non-executable state, and the next step is recognized in Step S228. After Step S228, judgment is made in Step S229 whether or not existence of the next step has been recognized, and in the event that it has been recognized, processing is performed again from Step S227. In the event that the step is not recognized, the flow judges that all steps have been completed, and the verification process of the steps is ended.

The verification process shown in FIG. 16 manages the design steps such that the flow cannot proceed to the next step unless the step preceding it is completed, so as to manage the design steps in a unidirectional manner, thereby preventing the designer from making mistaken operations.

Thus, processing in accord with the conditions can be executed, by selectively performing these two step status verification processes.

<Execution of steps and change in state>

Now, description will be made regarding several examples wherein one step is selected from the plurality of steps and executed, in the state that the step relation diagram is displayed in the area 902 on the main panel 901 First, description will be made regarding change in the state of step 21 and step 22 in the event of executing step 1 in FIG. 14, i.e., change in the state of the plurality of subsequent steps in the event one step is selected and executed, with reference to FIG. 17.

Figure 17:
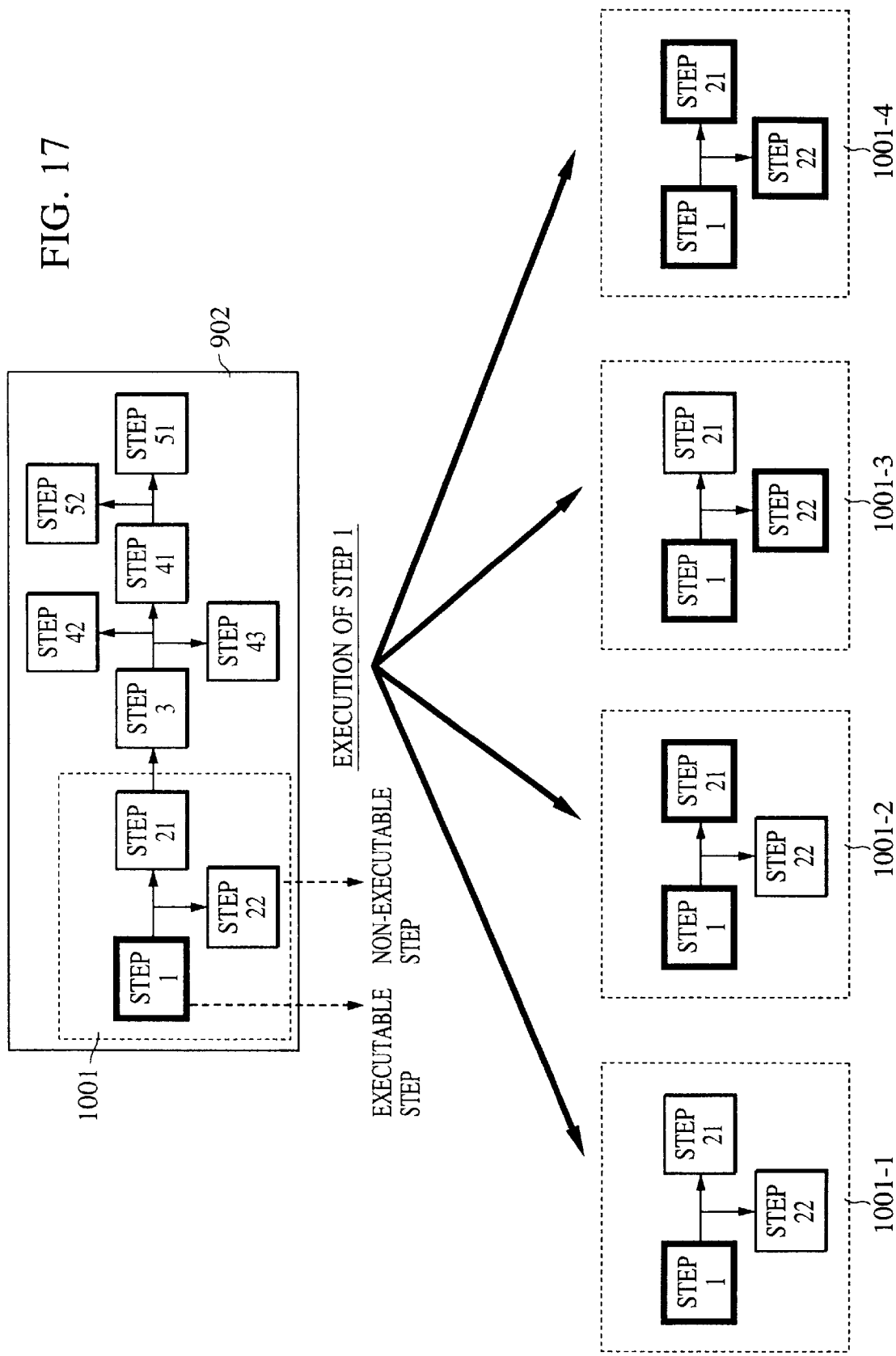
FIG. 17 is a diagram illustrating the change in the state of the steps in the event that step 1 is executed.

FIG. 17 is a diagram illustrating the change in the state of the steps in the event that step 1 is executed.

In FIG. 17, the steps enclosed with bold lines indicate that the steps are executable as step 1, and the steps enclosed with thin lines indicate that the steps are not executable as step 21. This is a simple display method employed here, since color cannot be displayed in the drawings. In FIG. 17, the block for step 1 is instructed by an input device such as the mouse 104, thus putting the block of the step 1 in a selected state. Selecting the Start button 906 on the main panel 901 in FIG. 13 executes the executable step 1 which has been placed in the selected state. In order to change the selection, the user selects the Cancel button 907 also on the main panel 901. The selection can be redone by selecting another step, as well. For example, in the event that step 1 is presently selected, and the selected state is to be changed to step 21, selecting the step 21 with the mouse cancels the selected state of step 1, and step 21 is thus put in the selected state.

This method is also used in the subsequent execution methods. Of course, selection and execution of the steps can be done by other executing methods, as well.

Now, in the event that the step 1 in the executable state is executed, the states of the steps 21 and 22 which are the steps after the step 1 change to the four states shown at the bottom of FIG. 17, by means of changes occurring in the executable conditions thereof, owing to execution of step 1. Displayed at the bottom of FIG. 17 is the step 21 and step 22 portions of the area 902 on the main panel 901, extracted and shown as area 1001.

First, in the event that step 1 could not be properly completed for some reason or another (hereafter referred to as "abnormal end"), or in the event that the executable conditions of step 21 and step 22 are not met even though execution of step 1 has been completed in a normal manner (hereafter referred to as "normal end"), the step states of step 21 and step 22 are not changed as shown in box 1001-1.

Next, in the event that the step 1 ends normally and only step 21 meets executable conditions, only step 21 changes to an executable state as shown in box 1001-2, and in the event that only step 22 meets executable conditions, only step 22 changes to an executable state as shown in box 1001-3. In the event that both meet executable conditions, both change to an executable state as shown in box 1001-4.

Of course, change to the executable state may occur in the order of first step 21 and then step 22, or visa versa.

Now, a specific example will be described regarding change of state due to the executable conditions. For example, in the event that step 1 is capable of generating two types of data, i.e., data A which is the executable condition of step 21 and data B which is the executable condition of step 22, and step 1 has ended abnormally, or in the case that step 1 has ended normally but neither data A nor data B have been generated, the states of the steps 21 and 22 are not changed. In the event that the step 1 ends normally and generates only data A, only step 21 changes to the executable state, and in the event that step 1 ends normally and generates only data B, only step 22 changes to the executable state. In the event that step 1 generates both data A and data B, both steps change to the executable state.

Now, change in state can be determined by such verification of execution conditions of the steps in the same manner, with cases whether there are three or more next steps. In the present embodiment, in the event that there are a plurality of next steps following the step being executed, the state of the steps can be determined at all times according to the above-described procedures.

Also, change to the state of step 3 in the event that processing of step 21 in FIG. 14 is executed, i.e., change in the state of the next one step upon executing processing of a certain step, will be described with reference to FIG. 18.

Figure 18:
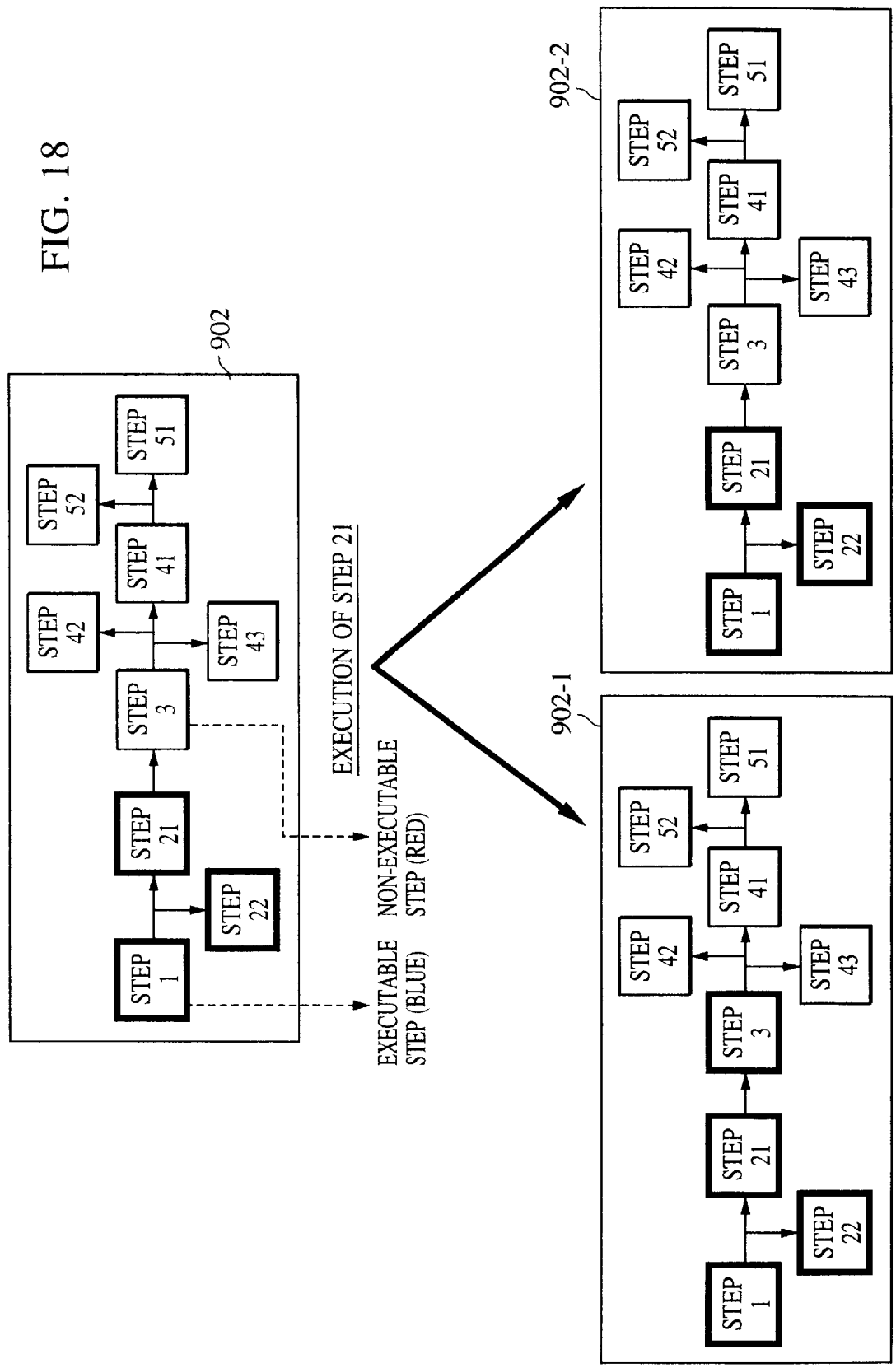
FIG. 18 is a diagram illustrating the change in the state of the steps in the event that step 21 is executed.

FIG. 18 is a diagram illustrating the change in the state of the steps in the event that step 21 is executed.

Now, in the relation between the step 21 in the step relation diagram of FIG. 18, and step 3 which is the following step, executing the block of step 21 in the step relation diagram changes the state of step 3.

First, in the event that step 21 has ended normally and the executable conditions of steps 3 are met, step 3 changes to an executable state as shown in box 902-1. Conversely, in the event that step 21 ends abnormally, or in the event that the executable conditions of step 3 is not met even though execution of step 21 has been completed in a normal manner, the step state of step 3 is not changed as shown in box 902-2.

Also, change in the states of the steps 41, 42, and 43 in the event that step 3 has been executed, is described with reference to FIG. 29.

Figure 29:
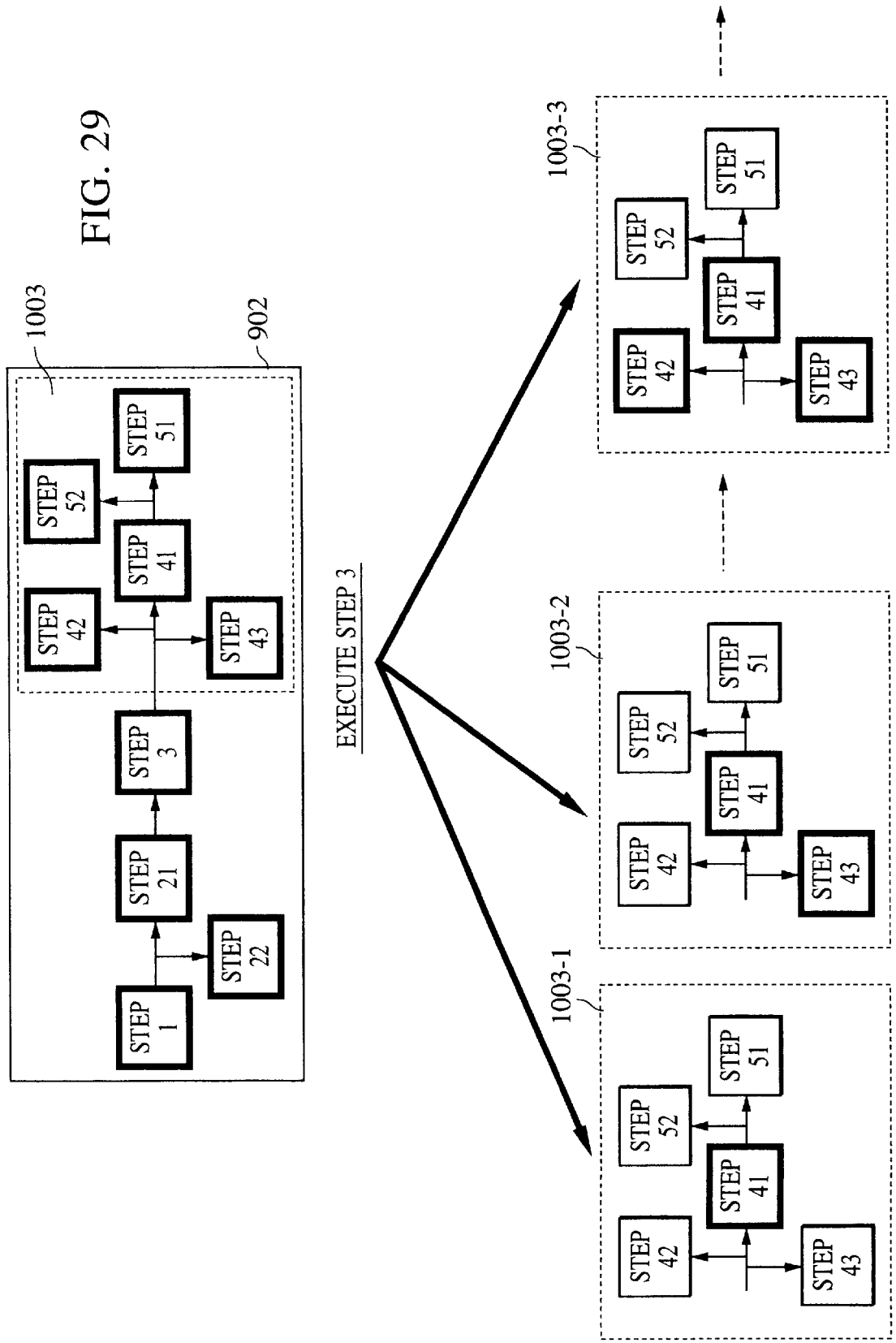
FIG. 29 is a diagram illustrating the change in the state of the steps in the event that step 3 is executed.

FIG. 29 is a diagram illustrating the change in the state of the steps in the event that step 3 is executed.

Displayed at the top of this FIG. 29 is the step 41, 42, 43, 51, and 52 portions of the area 902 on the main panel 901, extracted and shown as area 1003.

First, changes to the executable condition of the steps following step 3, i.e., steps 41, 42, and 43, owing to execution of step 3, are verified as indicate in boxes 1003-1, 1003-2, and 1003-3. The method of verification is the same as the aforementioned method, so detailed description will be omitted. In the event that all of the steps are executable, the further subsequent steps 51 and 52 are verified.

Thus, there is no restriction on the number of the steps to be executed nor the number of subsequent steps, so as many executable conditions as the number of next steps are verified at the point of each step ending.

<Overview of work in the steps>

Now, each step represented by a block consists of further steps (referred to "work" in the present embodiment).

Figure 19:
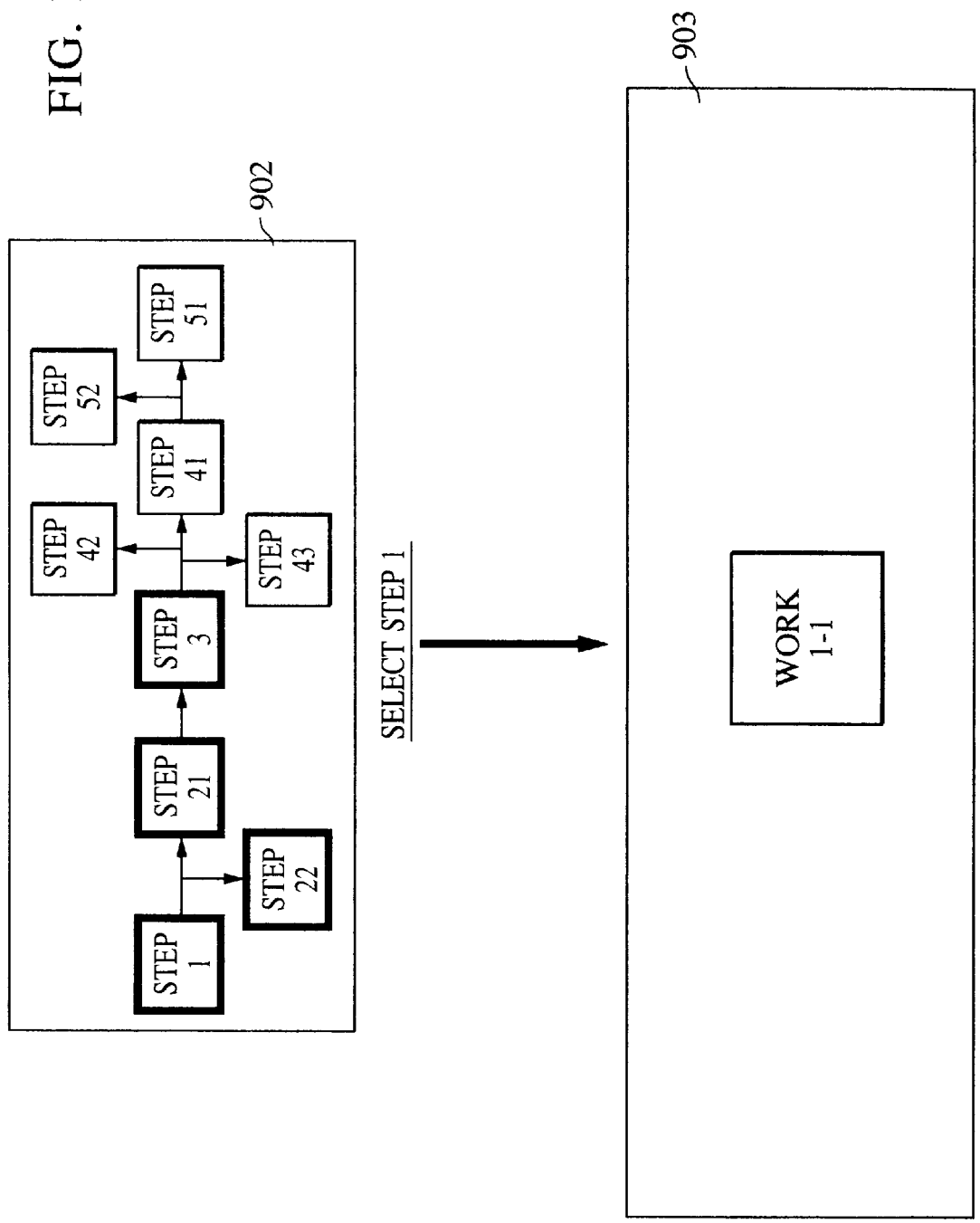
FIG. 19 is a diagram illustrating a schematic work diagram in the case that there is one piece of work in step 1.

FIG. 19 is a diagram illustrating a schematic example of work contents within a step.

For example, in the event that an executable step 1 in the step relation diagram of area 902 such as shown at the top of FIG. 19 is selected by the keyboard 102 or mouse 104, a schematic work diagram shown at the bottom of FIG. 19 is displayed at the lower open space 903 of the area 902 on the main panel 901 as shown in FIG. 13.

This diagram illustrates the contents of work within the step 1, and in this case, clearly indicates that execution of step 1 processes work 1-1. For example, in step 1, if the APU 106 executing the program stored within the program storing device 111 generates data, Work 1-1 represents that program.

The symbol displayed for Work 1-1 in this schematic work diagram is not restricted to a block; rather, this may be any form as with the case of displaying steps, by no means restricted to characters printed on rectangles.

In FIG. 19, in the state of step 1 being selected, in the event that a step other than step 1 is selected on the screen by a input device such as the keyboard 102 or mouse 104, a schematic display of the selected step is displayed, replacing the schematic representation of the work of step 1.

Figure 20:
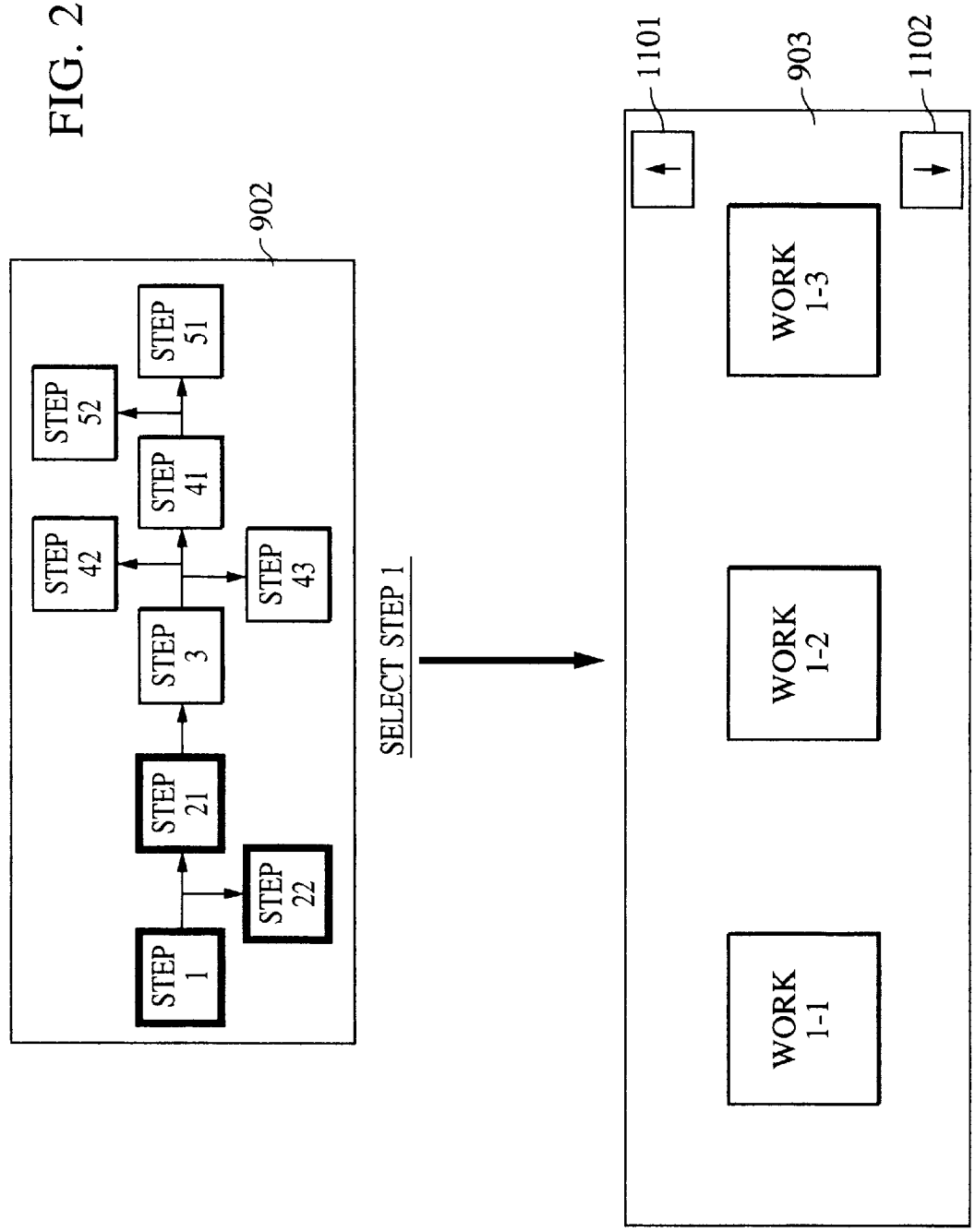
FIG. 20 is a diagram illustrating a schematic work diagram in the case that there are three pieces of work in step 1.

Next, FIG. 20 is a diagram illustrating a schematic work diagram in the case that there are a plurality of pieces of work in one step.

For example, in the event that there are three pieces of work collected within an executable step 1, selecting step 1 displays blocks in the schematic work diagram in the area 903 which represent the three pieces of work, and later-described arrow buttons "↑ button 1101" and "↓ button 1101" for shortening operations are vertically displayed to the right thereof. Operating these arrow buttons enables shortened processing of the work contents. Incidentally, these buttons may be placed anywhere, and the arrow images may be replaced with other images. The display example in this FIG. 20 has been employed with consideration of operability and ease of recognition.

A specific example of the contents of work shown in this schematic work diagram might be such wherein data is converted in Work 1-1, the data converted in Work 1-1 is read and separate data is generated in Work 1-2, and the data generated in Work 1-2 is converted once more in Work 1-3.

Schematic representations of the other steps can be done in the same manner.

Figure 21:
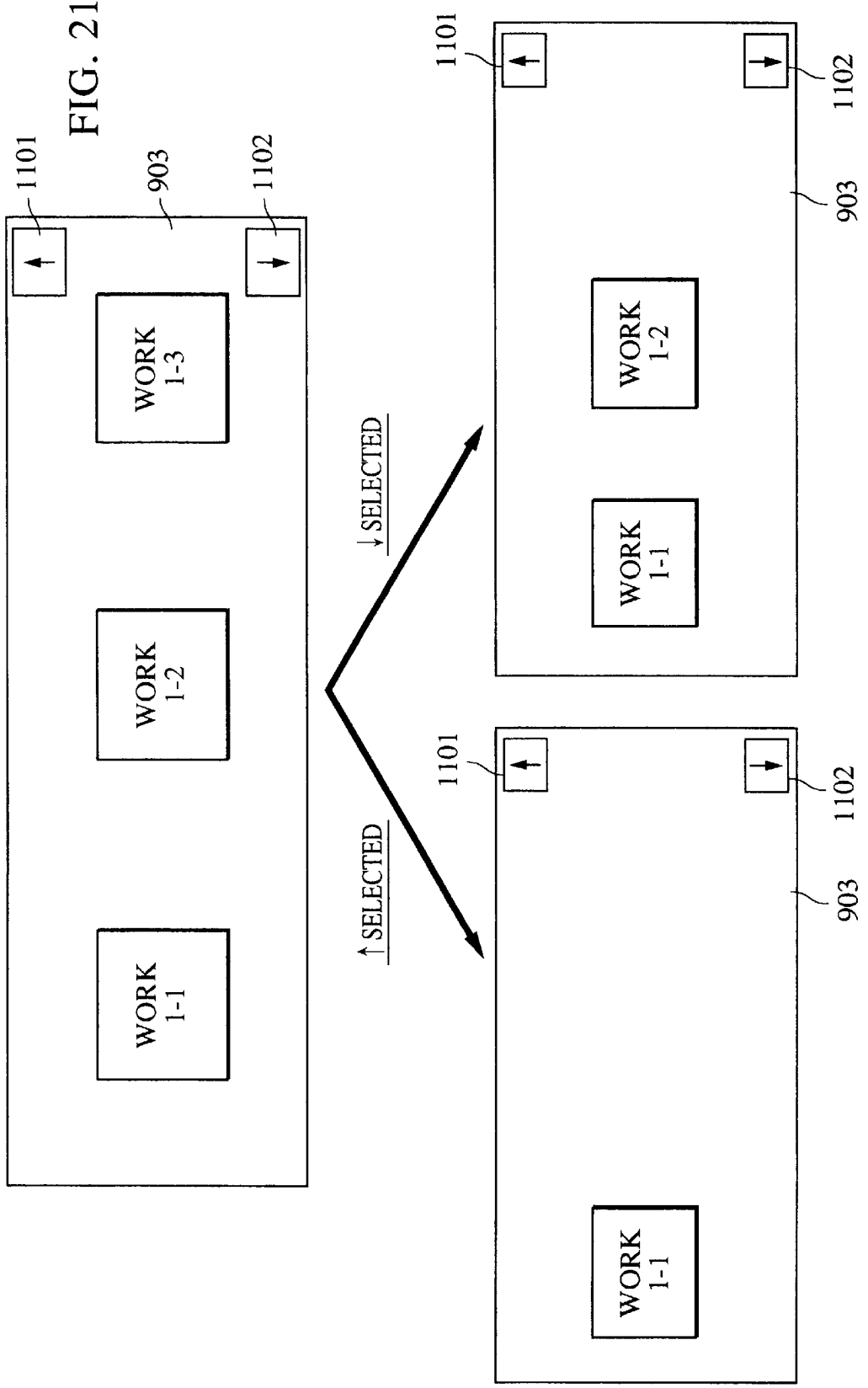
FIG. 21 is a diagram illustrating processing for adjusting the number of pieces of work in step 1.

Next, FIG. 21 is a diagram illustrating an example of display wherein the work schematically shown in the example in FIG. 20 is changed by work shortening processing.

The schematic work diagram at the top of FIG. 21 is the same as that shown at the bottom of FIG. 20. When the designer instructs the "↑ button 1101" using the keyboard 102 or mouse 104, the above work contents change to a state displaying only Work 1-1, as shown to the lower left side of FIG. 21. This indicates that the work executed within step 1 has been reduced to Work 1-1. Although the "↑ button 1101" is a button for increasing the number of pieces of work, the maximum number of pieces of work which can exist at this time is three, so using the "↑ button 1101" changes the schematic work diagram to a display showing the minimum number of pieces of work.

Conversely, instructing the "↓ button 1101" changes the above schematic work diagram to such as shown to the lower right of FIG. 21. The "↓ button 1101" is a button for reducing the number of pieces of work, so the number of pieces of work decreases from three to two.

Further instructing the "↑ button 1101" in the state shown to the lower left in FIG. 21 results in the state shown to the lower right, and instructing the "↓ button 1101" changes the display state such that all work contents are displayed as in the above diagram, since the number of pieces of work are already minimal. Further instructing the "↑ button 1101" in the state shown to the lower right in FIG. 21 changes the state to that shown above, and instructing the "↓ button 1101" changes the state to that shown to the lower left.

Of course, change of the number of pieces of work by the shortening process is by no means restricted to cases wherein the maximum number of pieces of work within the step are three; rather, there is no restriction on the number whatsoever. Also, in the event that the step is to be executed following such shortening process, only the work displayed in the schematic work diagram in area 903 is executed.

Now, referring to FIG. 17 once more, an example will be given regarding a case wherein this shortening process and change in the step state are related.

In FIG. 17, step 1 has three work contents, Work 1-1, Work 1-2, and Work 1-3, wherein Work 1-1 converts original data into data A, Work 1-2 creates data B based on data A, and Work 1-3 generates data C by converting data B. Also, the executable conditions for step 21 are data A and data B, and the executable conditions for step 22 is data B.

Under such conditions, in the event that the work contents of step 1 are changed into the state of Work 1-1 alone as shown to the lower left of FIG. 21, for example, by using the shortening function, and step 1 is subsequently started, in the event that step 1 ends normally and outputs data A, the executable conditions of neither step 21 nor step 22 are met, so the state of step 1 following execution is that to the far lower left in FIG. 17.

Also, in the event that the work contents of step 1 are changed into the state of Work 1-1 and Work 1-2 as shown to the lower right of FIG. 21, for example, by using the shortening function, and step 1 is subsequently started, in the event that step 1 ends normally and outputs data A and data B, the executable conditions of both step 21 and step 22 are met, so the state of step 1 following execution is that of box 1001-4 in FIG. 17.

Figure 23:
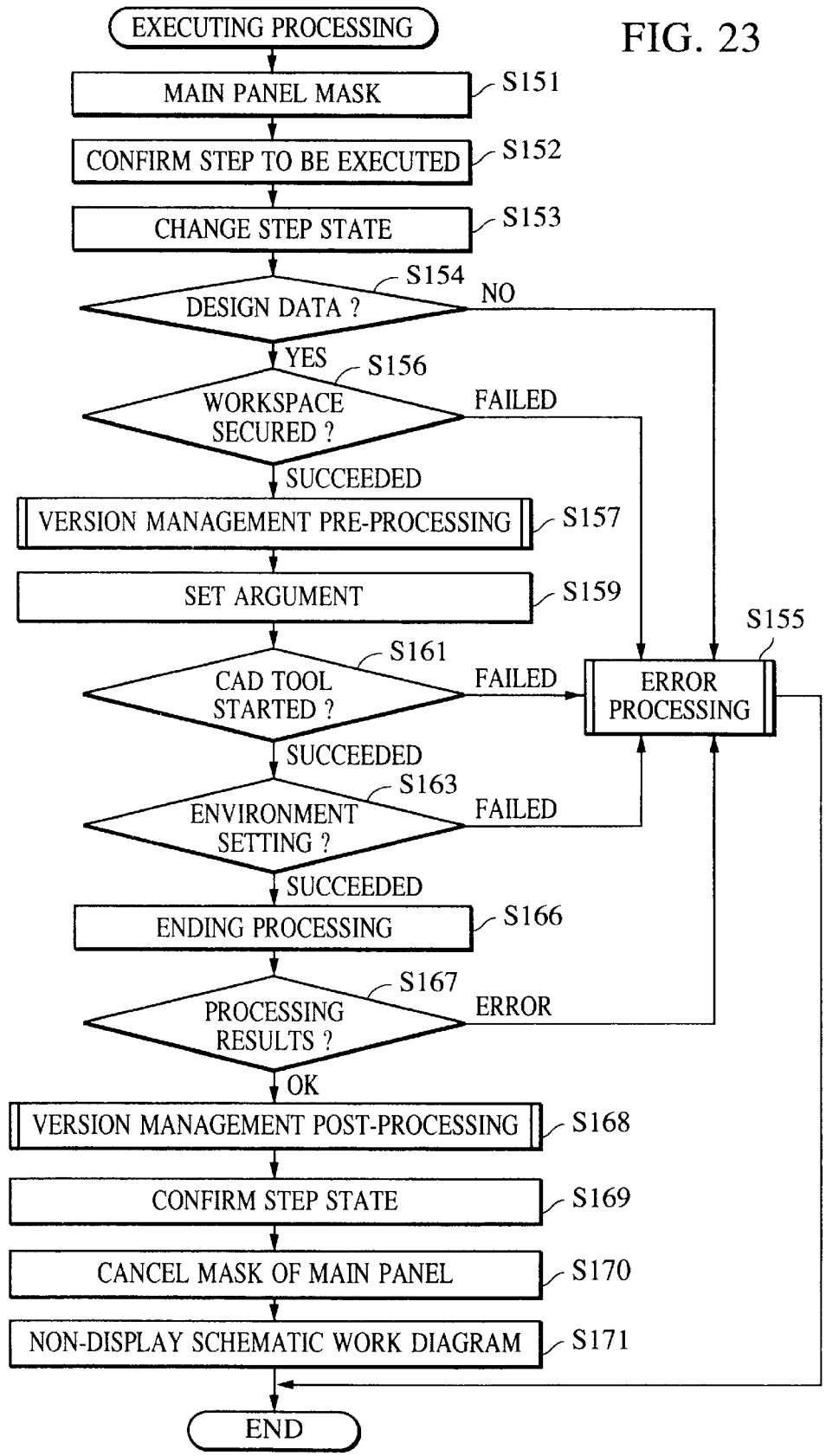
FIG. 23 is a flowchart for execution processing.
Figure 24:
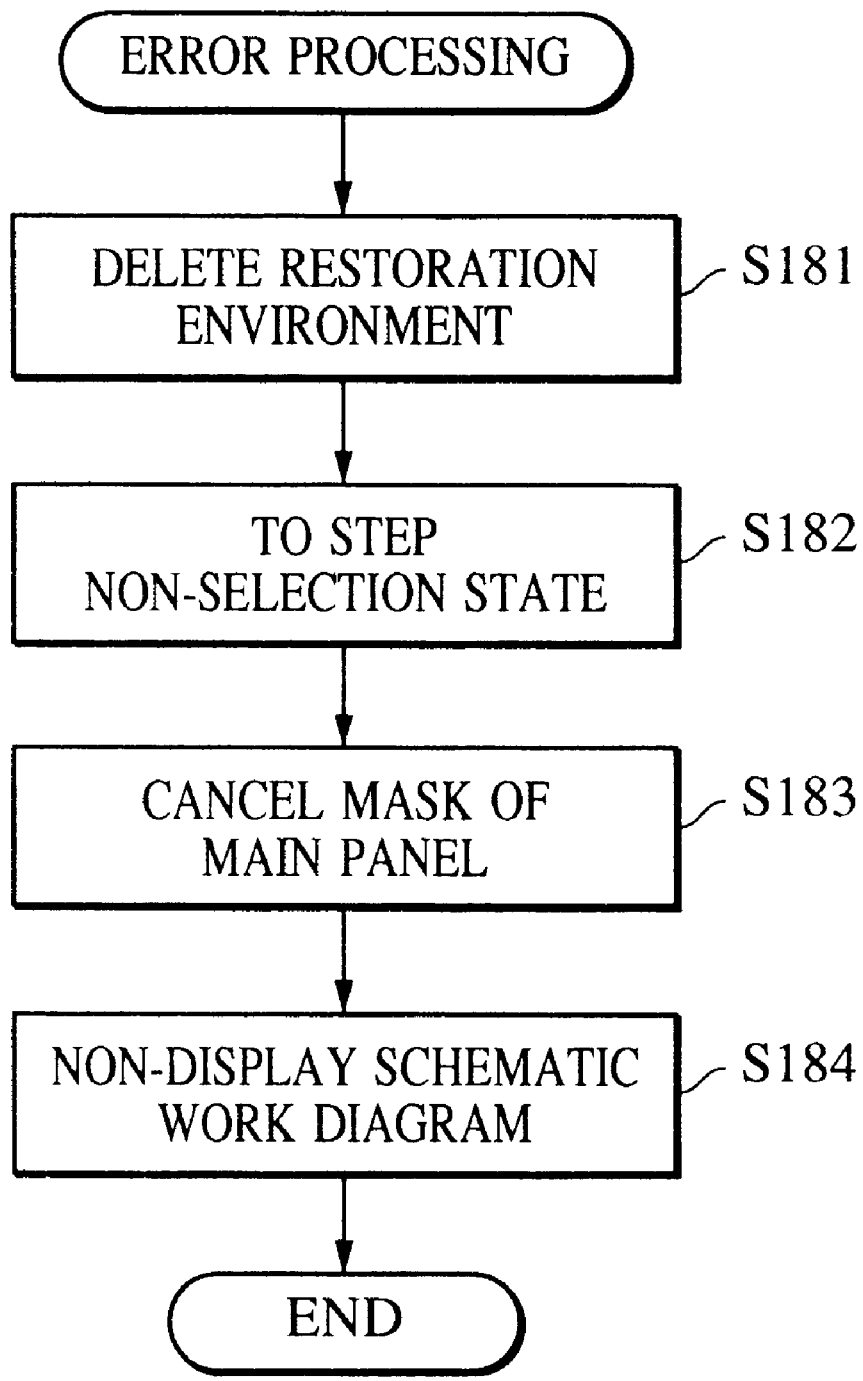
FIG. 24 is a flowchart for error processing.

Now, the flow of processing related to the abovedescribed execution of steps and the change of status in steps will be described in further detail with reference to the flowcharts in FIGS. 22, 23, and 24.

Figure 22:
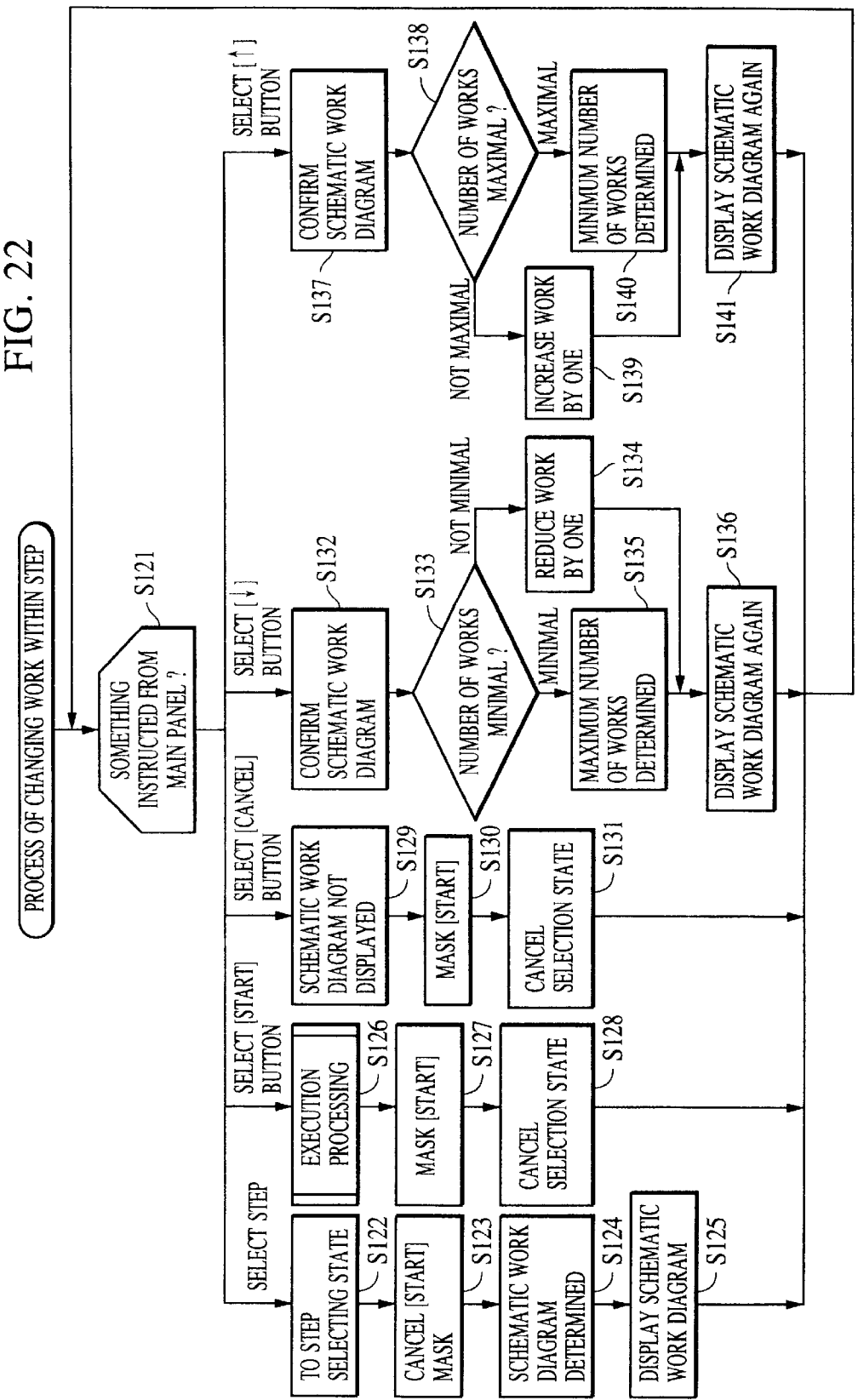
FIG. 22 is a flowchart for adjustment of the number of pieces of work within the step.

First, FIG. 22 is a basic flowchart relating to selection and execution of steps by designer operations, and processing for changing the number of pieces of work within a step.

A plurality of steps are displayed in the area 902 on the main panel 901 as a work relation diagram. In Step S121, judgment is made regarding what has been indicated in area 902. In the event that one of the steps has been indicated by the mouse 104 or the like, the flow proceeds to Step S122, wherein instructed step is set in a selected state, and in Step S123, the mask for the Start button 906 is canceled. Then, determining the schematic work diagram of the instructed step in Step S124 brings the flow to Step S125, where the schematic work diagram is displayed.

In the state where the schematic work diagram is displayed, selecting the Start button 906 in Step S121 causes execution of processing in Step S126, the Start button 906 is masked in Step S127, and the selected state of the step is canceled in Step S128. Also, selecting the Cancel button in Step S121 causes the schematic work diagram not to be displayed in Step S129, following which the Start button 906 is masked in Step S130, and the selected state of the step is canceled in Step S131.

Also, in the event that a plurality of pieces of work exists within the selected step, in the event that the "↓ button 1101" is selected in Step S121, the schematic work diagram is confirmed in Step S132 and judgment is made in Step S133 whether or not the number of pieces of work within the schematic work diagram is one or not (i.e., minimal). In the event that the number of pieces of work is one, the number of pieces of work in Step S135 is maximized, and in the event that the number of pieces of work is not one, the number of pieces of work in Step S134 is decreased by one, and the schematic work diagram is re-displayed in Step S136. In the event that the "↑ button 1101" is selected in Step S121, the schematic work diagram is confirmed in Step S137, and judgment is made in Step S138 whether or not the number of pieces of work within the schematic work diagram is maximum. In the event that the number of pieces of work is maximum, the number of pieces of work in Step S140 is set to one, and in the event that the number of pieces of work is not maximum, the number of pieces of work in Step S139 is increased by one, and the schematic work diagram is re-displayed in Step S141.

Now, the execution processing of Step S126 will be described in further detail, with reference to the flowchart in FIG. 23.

Since other processing cannot be performed while performing execution processing, the main panel 901 is masked in Step S151. Masking the main panel 901 means that the panels and buttons are locked so that other operations cannot be conducted during execution processing. In Step S152, confirmation is made as to which step is selected, and in Step S153, the step is changed from the selected state to the executing state. Then, in Step S154, judgment is made whether or not design data to be used when starting CAD tools exist, and in the event that design does not exist, error processing is performed in Step S155, and the process is ended. In the event that the design data does exist, confirmation is made in Step S156 as to whether or not workspace (directory to feed output data to) is secured. If this fails, error processing is performed in Step S155, and in the event this succeeds, pre-processing of version management (version management processing before start-up of CAD tools) is performed in Step S157. Next, in Step S159, arguments necessary for starting the CAD tools are set. The information and arguments for the CAD tools are obtained from the rule information 702.

Next, in Step S161, judgment is made whether or not CAD tools have started up. In the event that this has failed, error processing is performed in Step S155, and in the event that start-up has succeeded, judgment is made in Step S163 whether or not environment settings have been made. If this has failed, error processing is performed in Step S155, the same as above, and in the event that the settings are successful, CAD tool ending processing is performed in Step S166, and the results of processing are confirmed in Step S167. In the event that the result is an error, error processing is performed in Step S155, otherwise, the flow proceeds to Step S168.

Next, in Step S168, post-processing of version management (version management processing following CAD tool start-up) is performed, the state of the step is confirmed in Step S169, and the mask on the main panel 901 is canceled in Step S170. Finally, in Step S171, the schematic work diagram is hidden from display.

Next, the error processing in Step S155 will be described in further detail, with reference to the flowchart in FIG. 24.

Deletion of restoration environment is performed in Step S181, the step selected in Step S182 is set in a non-selected state, the mask on the main panel 901 is canceled in Step S183, and the schematic work diagram is hidden from display in Step S184.

Figure 25:
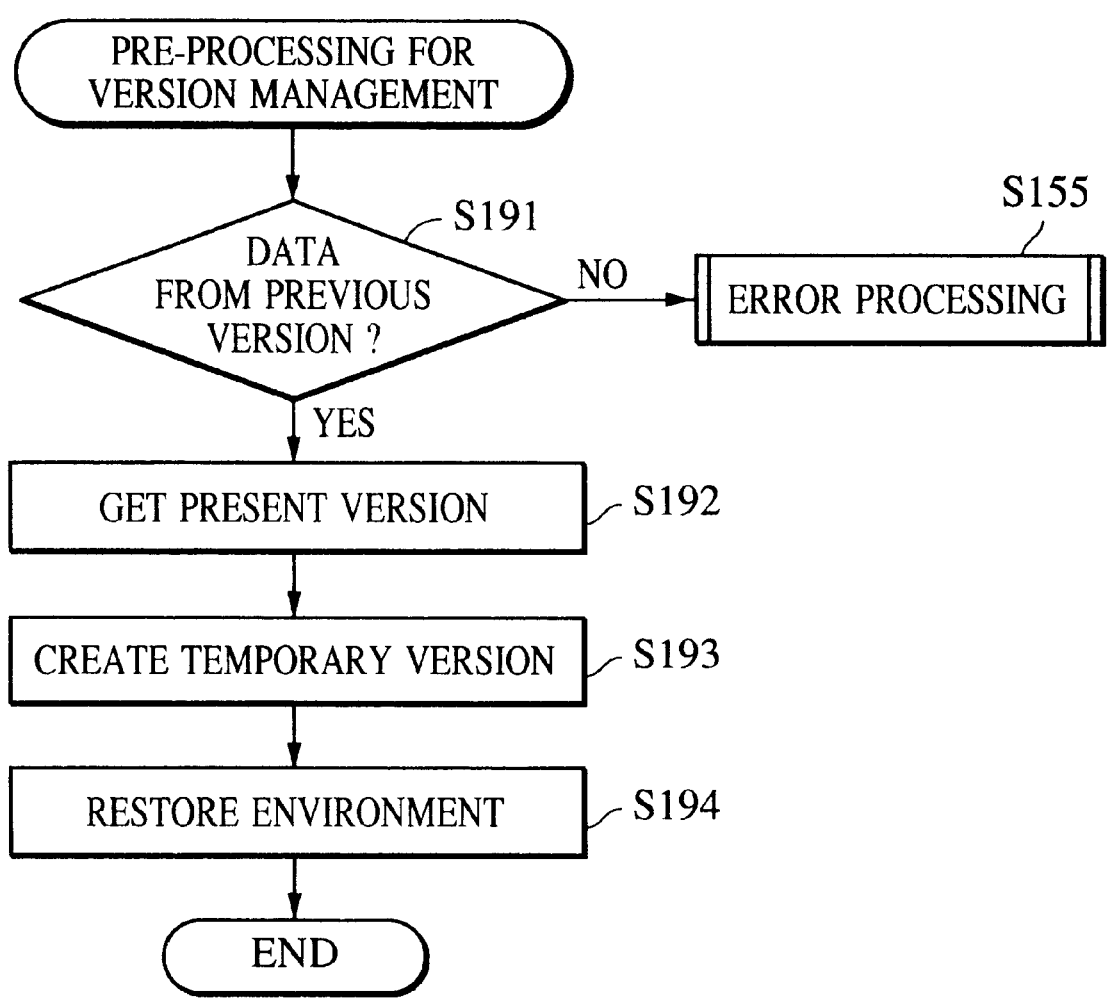
FIG. 25 is a flowchart for pre-processing of version management.

Next, pre-processing of version management in Step S157 will be described in further detail, with reference to the flowchart in FIG. 25.

In Step S191, confirmation is made to determine whether or not previous version data which is the object of input of the CAD tool to be started exists. In the event that no previous version data exists, error processing is performed in Step S155, and in the event that such previous data does exist, the flow proceeds to Step S192 to get the current version. Then, in Step S193, a temporary version which is one generation newer than the current version is created, and in Step S194, environment restoration is performed, mainly by duplicating design data. This is not true only in the case of creating the first version; in such a case, the only processes are creating a temporary version and creating a start-up environment.

Figure 26:
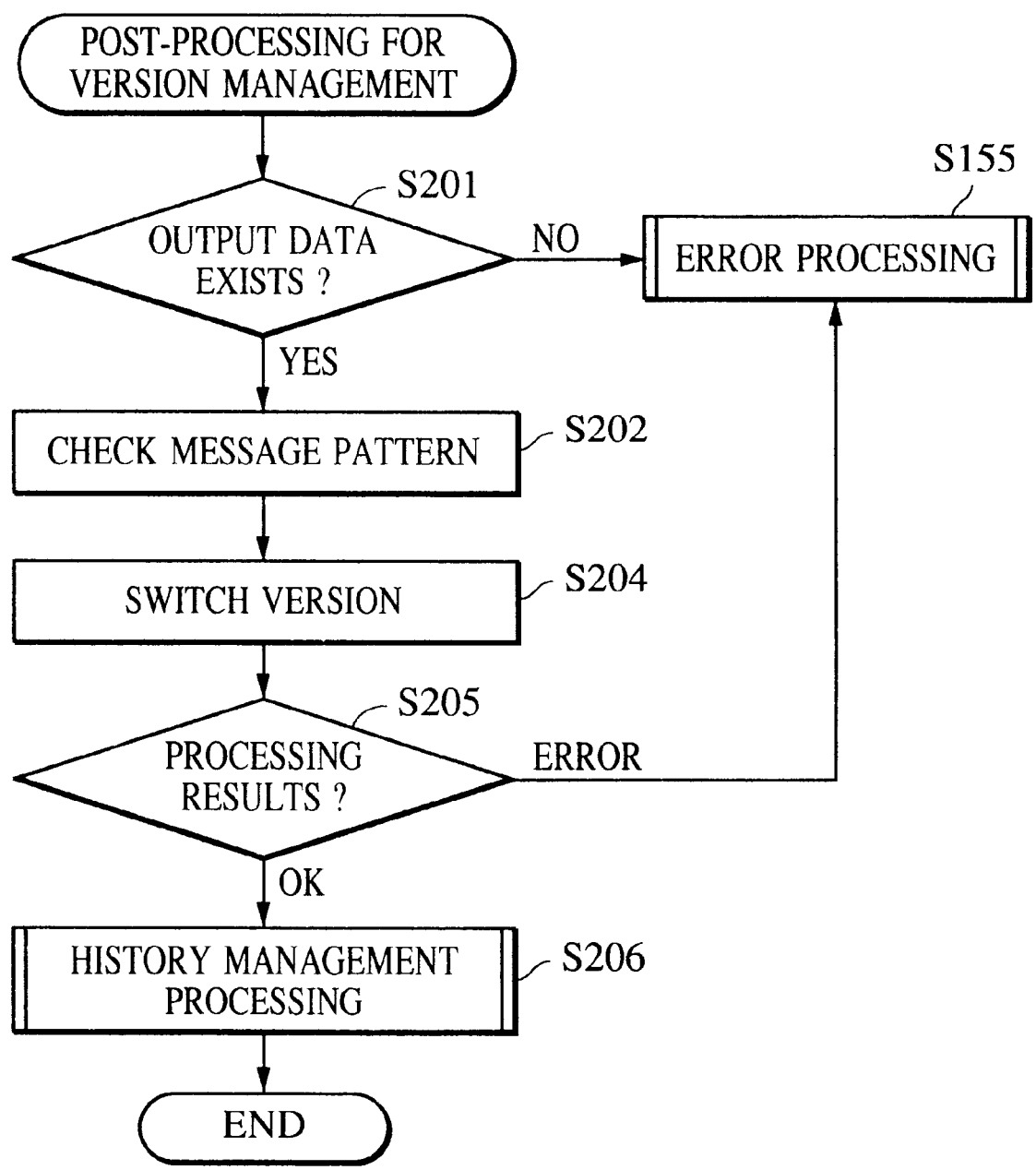
FIG. 26 is a flowchart for post-processing of version management.

Further, more detailed description will be made regarding post-processing of version management in Step S168, with reference to the flowchart in FIG. 26.

In Step S201, confirmation is made whether or not there is design data to be output by start-up of CAD tools. In the event that there is no output data, error processing is performed in Step S155, and in the event that such design data exists, the flow proceeds to Step S202, where confirmation is made whether or not the message output by start-up of the CAD tool is a certain message. In the present embodiment, checking is performed with two patterns of a normally ending message. Then, switching is performed in Step S204 to raise the temporary version created in the previous Step S193 to the current version, and the processing results are confirmed in Step S205. In the event that the result is an error, error processing is performed in Step S155, otherwise, the flow proceeds to Step S206, where history management processing is performed.

Figure 27:
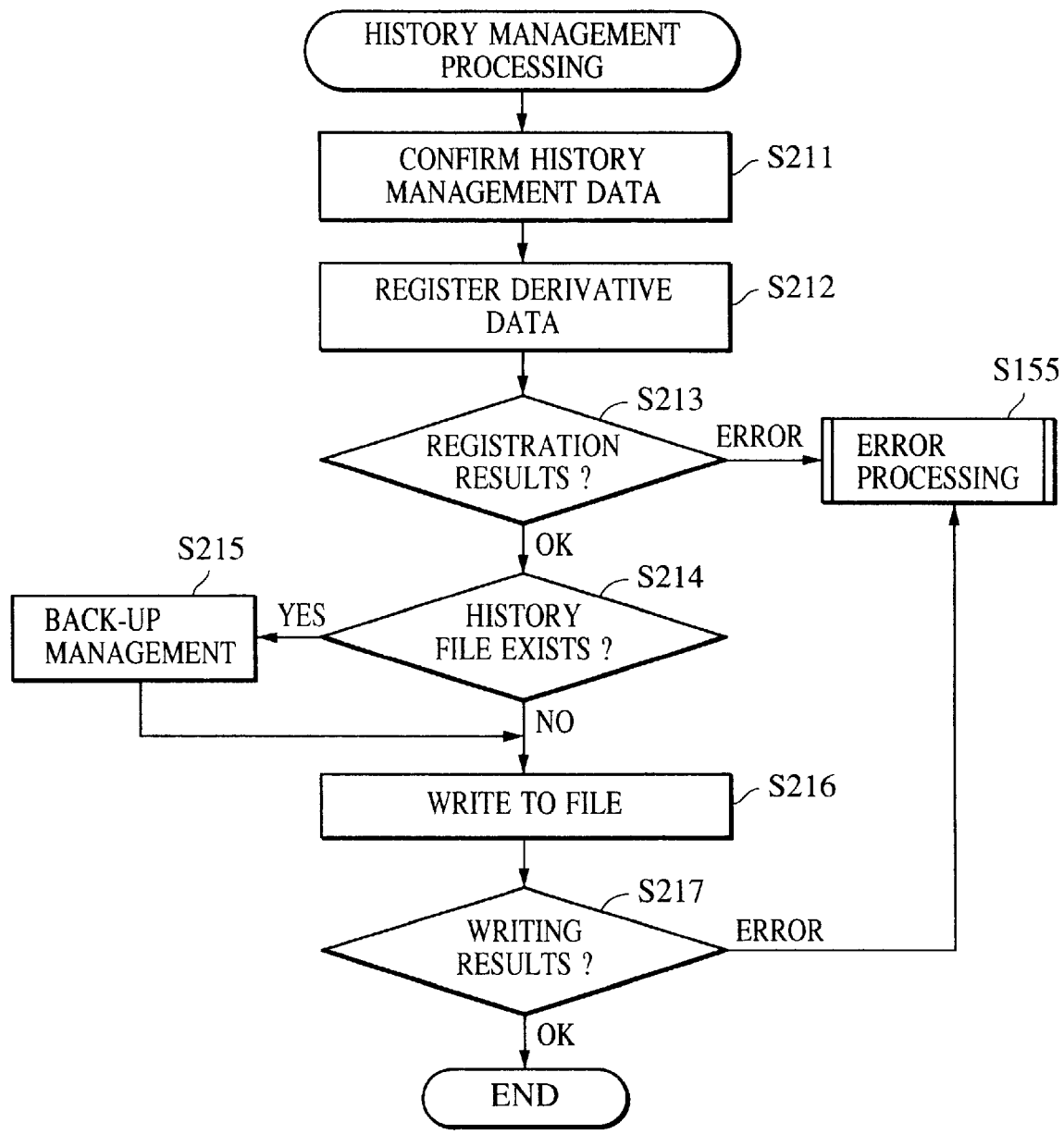
FIG. 27 is a flowchart for hysteresis management processing.

Next, history management processing in this Step S206 will be described in detail, with reference to the flowchart in FIG. 27.

In Step S211, the state of the history management data which is the currently registered history information is checked. In the Step S212, the relation with the design data output from the CAD tools and the input derivative data is correlated, registration processing of the derivative data is performed, and in Step S213, the registration results are judged. In the event that the registration results in an error, error processing is performed in Step S155, otherwise, the flow proceeds to Step S214, where judgment is made whether or not a history management information data file 401 exists. In the event that the file exists, back-up management processing is performed in Step S215, and is written to the file in Step S216. This back-up management processing is a process performed on the history file, and is conducted through the environment data management function 310. In the event that there is no history file, the flow continues to proceed to Step S216 and writes to the file, and in Step S217, judges the writing results. In the event that the writing results in an error, error processing is performed in Step S155, otherwise, processing is ended.

Thus, according to the present embodiment, a plurality of steps can be collectively managed, and the designer can easily identify the state of each of the steps.

Also, the designer can easily identify the change of state of the steps by changing the color of display of the steps which change in status owing to execution.

Also, work setting can be performed within the step, thus enabling designing with greater flexibility.

(Second Embodiment)

Next, a variation relating to the first embodiment will be described as a second embodiment of the present invention.

With the first embodiment, in the event that a non-executable step came up, that step was always in a non-executable state. The second embodiment is an embodiment in which that does not hold true.

A case wherein the arrow between step 1 and step 22 in FIG. 14 is made to point upwards so that the data generated in step 1 and step 22 is used in step 21, i.e., wherein a plurality of steps are processed, will be described with reference to FIG. 28, regarding change to one of the next steps.

Figure 28:
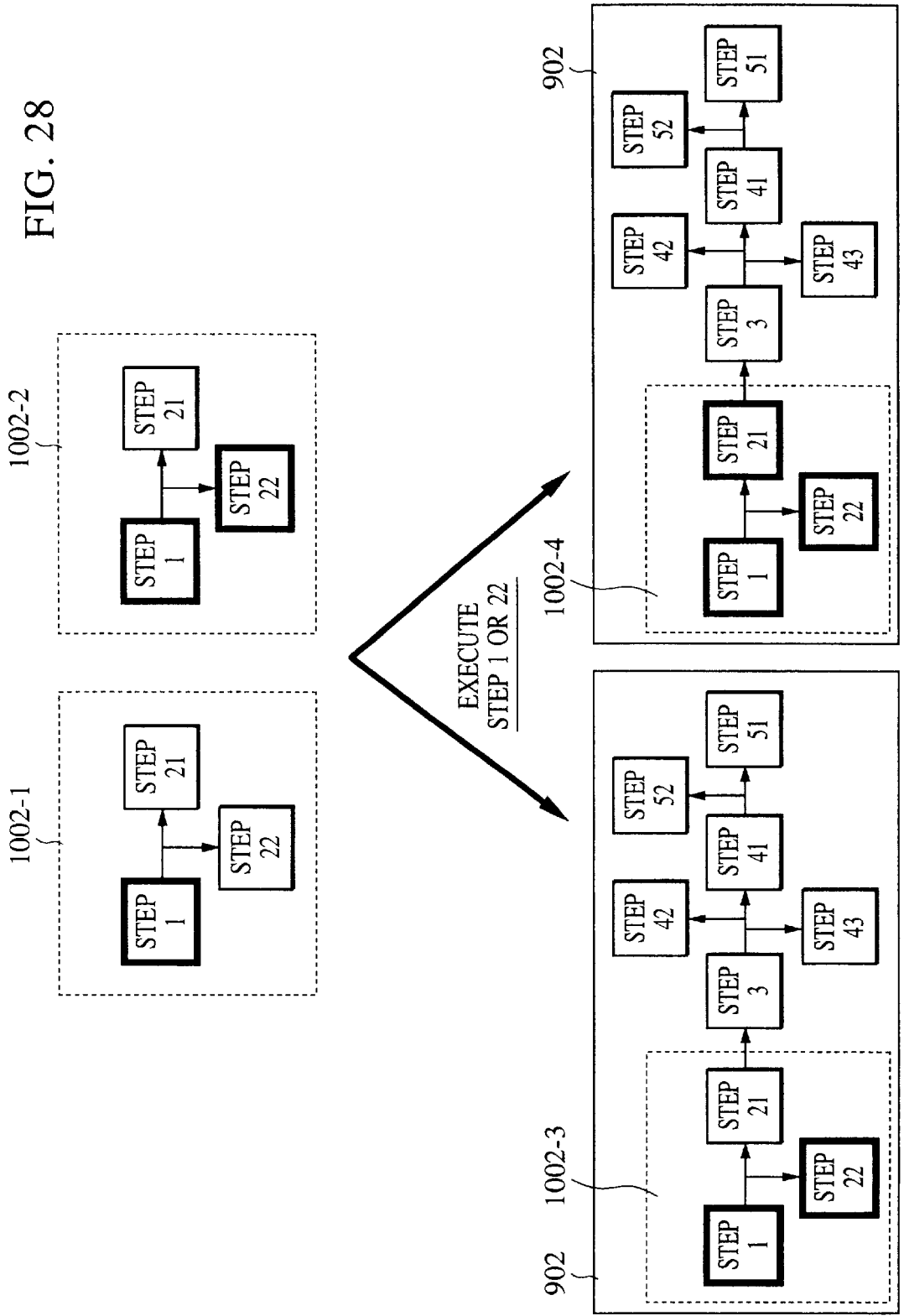
FIG. 28 is a diagram illustrating change in the state of the steps with a second embodiment.

FIG. 28 is a diagram illustrating change in the state of the steps in the case that step 1 and step 22 are executed.

Displayed at the bottom of this FIG. 28 is the step 1, 21, and 22, in the area 902 on the main panel 901, extracted and shown as area 1002.

In the relation between steps 1 and 22, and the next step 21, executing of steps is possible from two states. To the upper side of FIG. 28, the left (1002-1) shows a case where only step 1 is executable, the right (1002-2) shows a case where both Steps S1 and 22 are executable. Incidentally, there is no way for a situation to occur such as wherein the step 1 is non-executable but step 22 is executable, since this would overstep the concept of design processing which has a single directionality from left to right. Accordingly, this case is omitted.

Then, in the two states, at the time of normal ending of execution of each of the steps 1 and 22, or of both of the steps, the executable conditions of step 21 are verified. At the point that the execution conditions are met owing to the verification of step 21, step 21 changes to an executable state as indicated in box 10024.

Specifically, first, in the case wherein step 1 is executable and step 22 is non-executable, step 1 ends normally, at the point that the execution conditions of step 21 are met, step 21 changes to the executable state, and in the event that both step 1 and step 22 are in an executable state, in the case where step 1 and step 22 end normally and the executable conditions of step 21 are met, step 21 changes to the executable state.

(Third Embodiment)

Next, a variation relating to the first embodiment will be described as a third embodiment of the present invention.

The third embodiment is an embodiment regarding a case wherein execution of a plurality of steps changes the state of a plurality of next steps. There is nothing different about the step state verification method in this embodiment as compared with the previous embodiments.

Description will now be made regarding change in the state of steps in such a case wherein the arrow between step 3 and step 42 in FIG. 14 is turned downwards and the arrow between step 3 and step 43 is turned upwards, so that the data generated by steps 41, 42, and 43 is used by steps 51 and 52, via step 41, with reference to FIG. 30.

Figure 30:
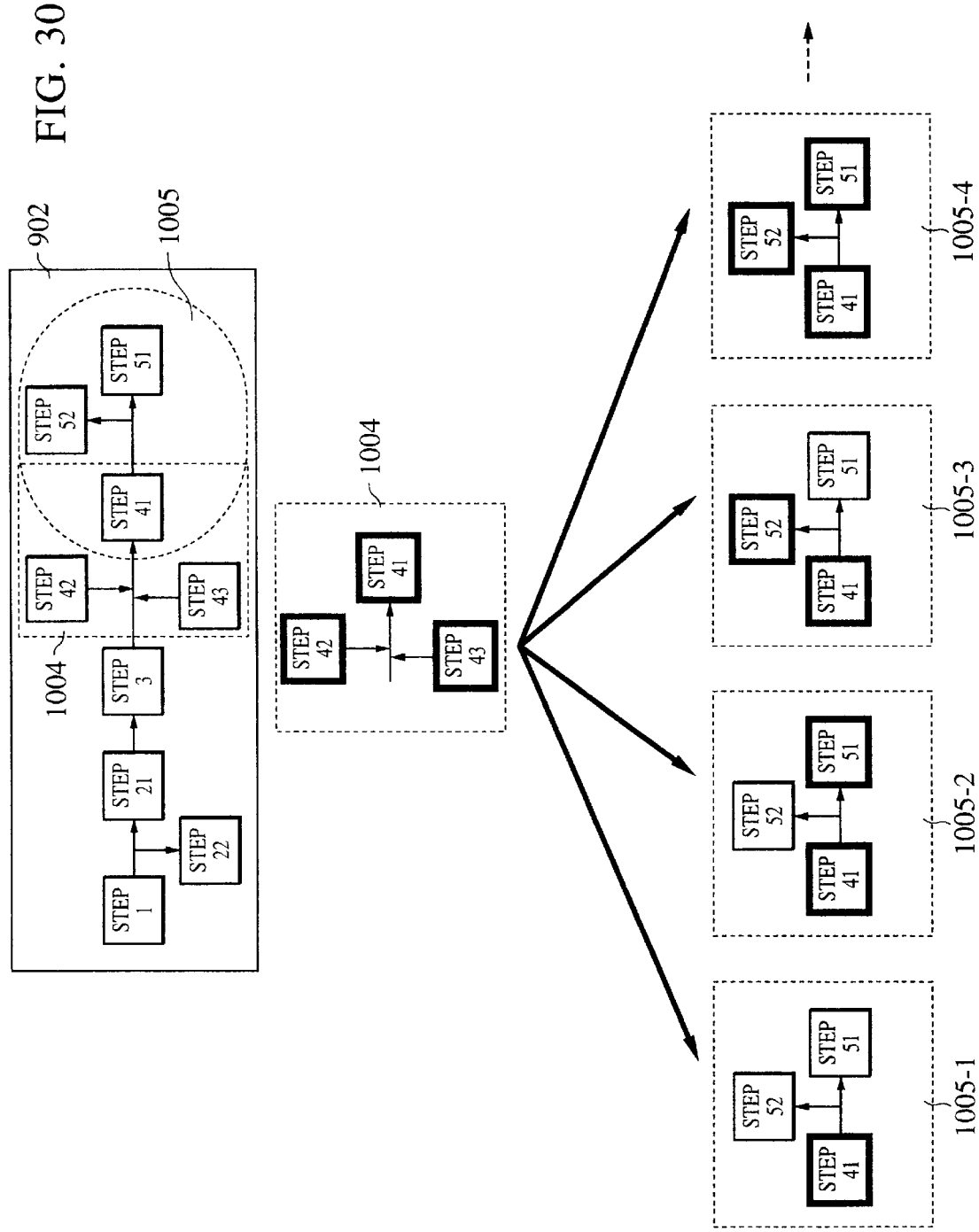
FIG. 30 is a diagram illustrating change in the state of the steps with a third embodiment.

FIG. 30 is a diagram illustrating change in the state of the steps in the case that steps 41, 42, and 43 are executed.

Displayed at the top of this FIG. 30 are the steps 41, 42, and 43, in the area 902 on the main panel 901, extracted and shown as area 1004, and the steps 41, 51, and 52 extracted and shown as area 1005.

In the event that step 41 is executable, the data generated in the steps 42 and 43 is used in step 41, so both of the steps 42 and 43 must be in executable states. FIG. 30 shows change in the state of an area 1005 wherein the steps 41, 42, and 43 are all in an executable state.

Now, in the event that execution of each of the steps 41, 42, and 43 ends normally, the executable conditions of the steps 51 and 52 are verified. At the point that the executable conditions of both steps 51 and 52 are met, the steps change to an executable state. This change in state can be handled in the same way as the above-described.

(Fourth Embodiment)

The work within the above-described steps comprises so-called programs, with the programs which are to be used as work being provided within the program sorting device 111 in a selectable manner. Such programs are referred to as "CAD tools" in the present embodiment. The following is a detailed description of selection processing of these CAD tools.

Figure 33:
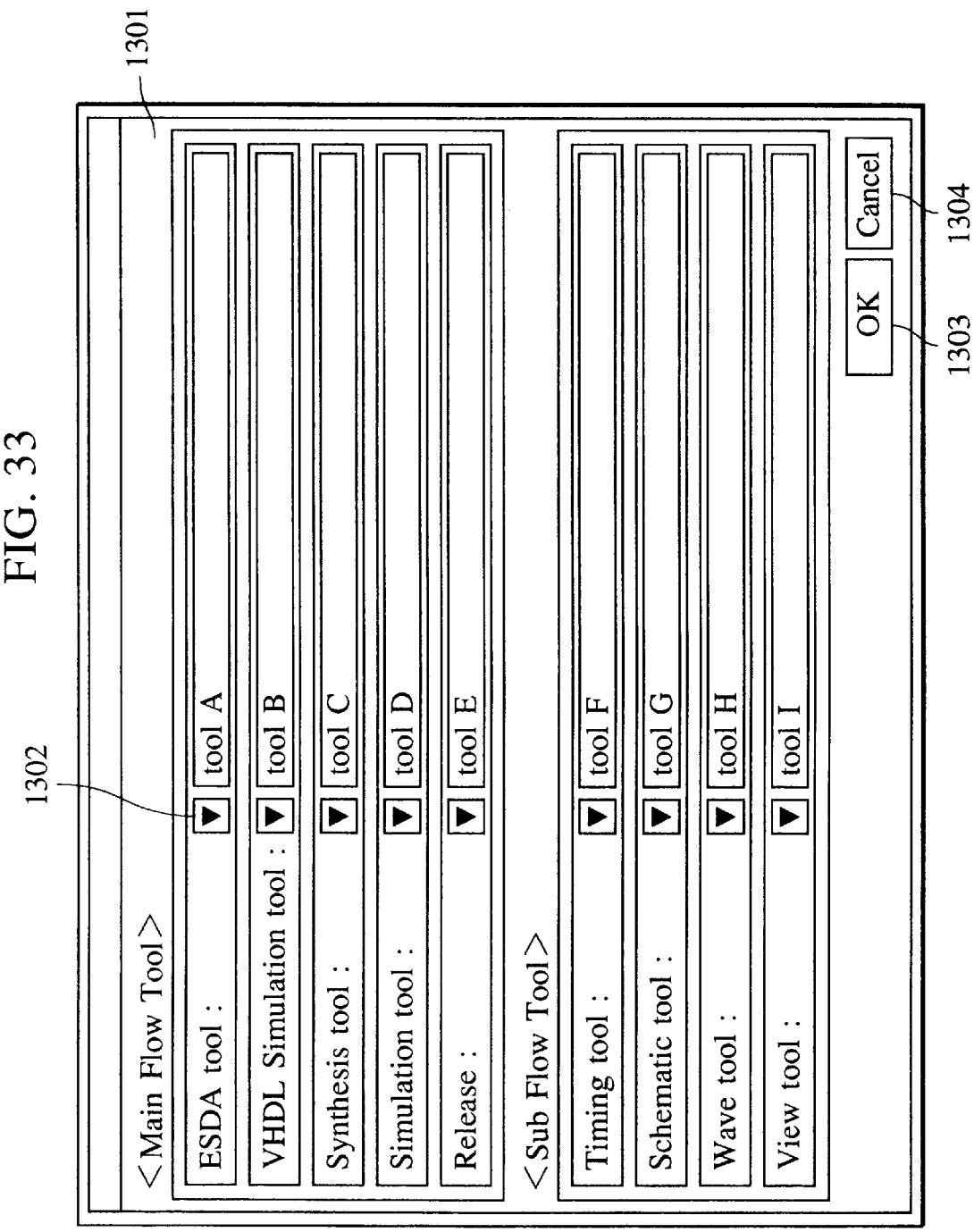
FIG. 33 is a diagram illustrating a CAD tool setting panel.

First, in order to select the CAD tools, input from an input device such as the keyboard 102 or mouse 104 is used to display a CAD tool selection panel 1301 such as shown in FIG. 33 on the main panel 901 on the CRT display 103. Upon this CAD tool selection panel 1301, selection and changing of the various CAD tools corresponding with the steps is performed. Generally, default CAD tools are specified for the steps beforehand.

FIG. 33 is a diagram illustrating a CAD tool setting panel 1301 displayed on the main panel 901.

Figure 34:
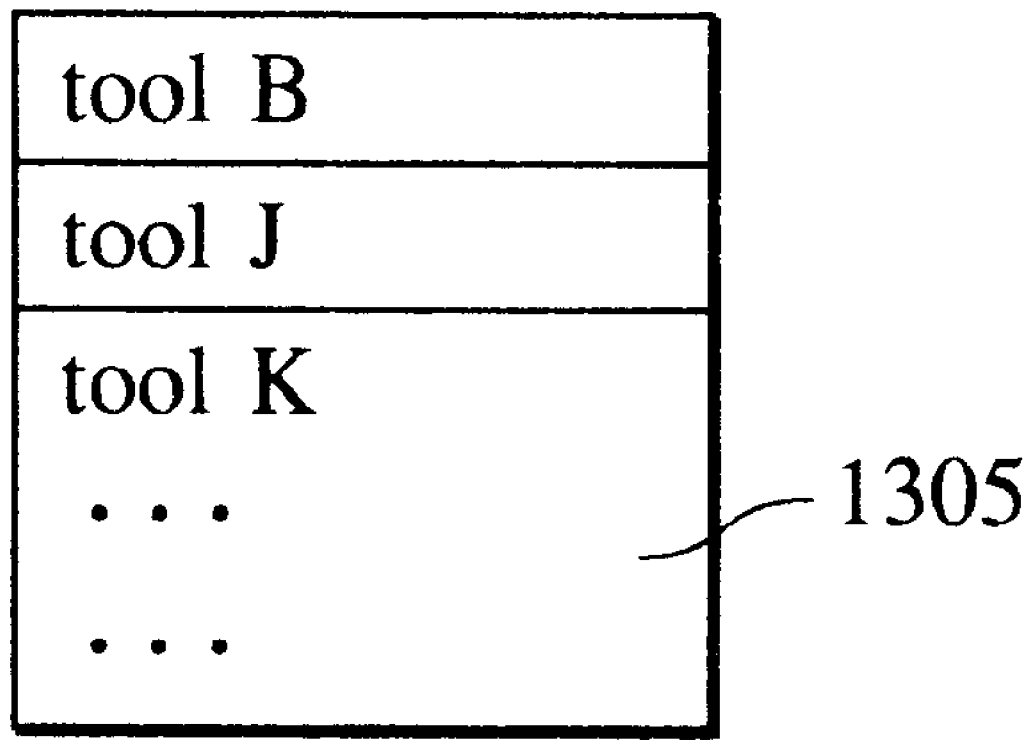
FIG. 34 is a diagram illustrating a CAD tool setting sub-window.
Figure 35:
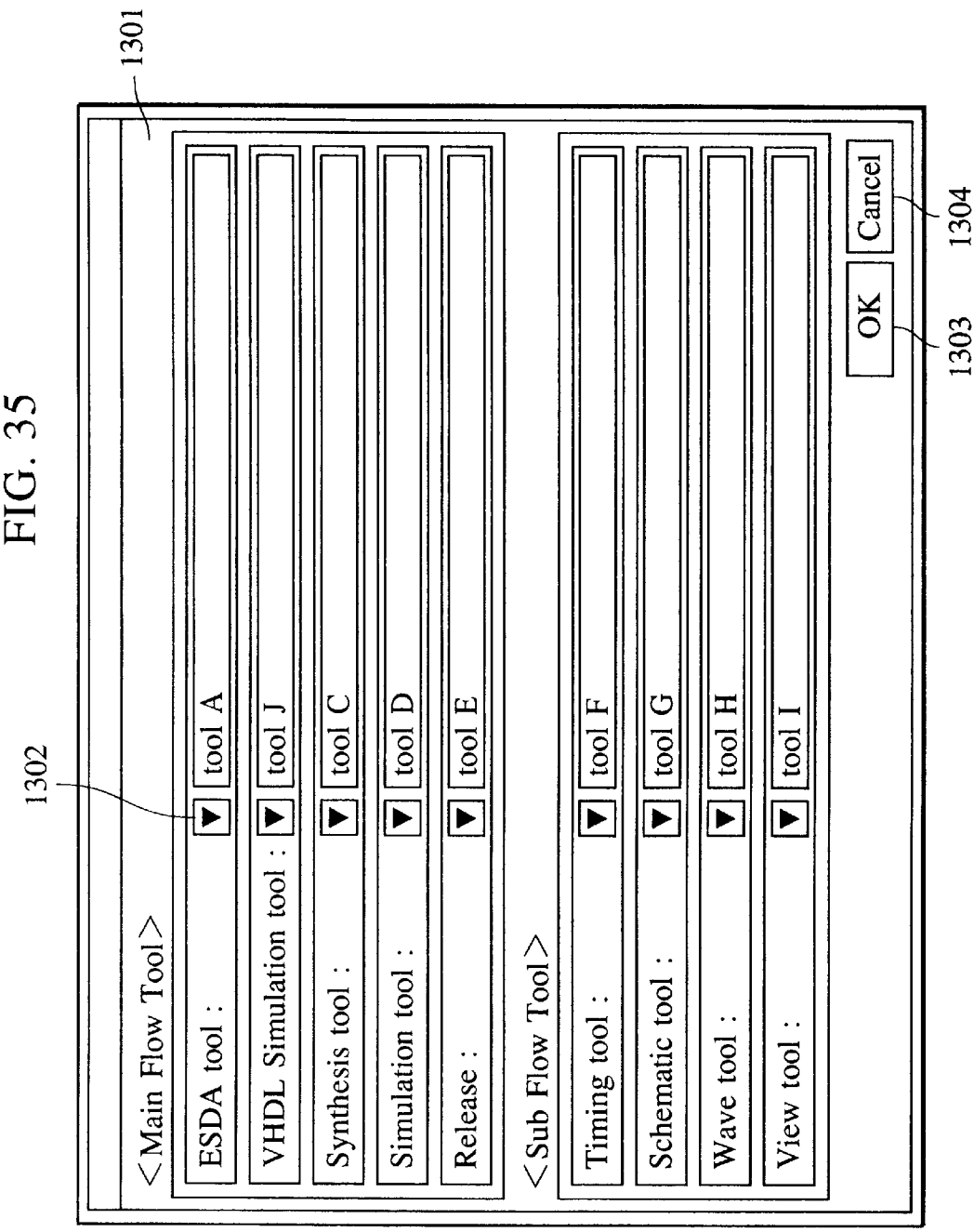
FIG. 35 is a diagram illustrating a CAD tool setting panel after CAD tool setting.

In this FIG. 33, the triangular button 1302 on the CAD tool selection panel 1301 is a sub-window display button. Instructing this window button by use of an input device such as the mouse 104 displays a sub-window 1305 such as shown in FIG. 34 at a desired position on the CAD tool selection panel 1301, displaying a plurality of CAD tool candidates in the text area to the right of the button.

Also, 1303 denotes an OK button for determining the selection, and 1304 denotes a Cancel button for instructing cancellation.

Now, the plurality of CAD tools displayed on the CAD tool selection panel 1301 are divided into "<MainFlow Tool>" and "<SubFlow Tool>". For example, in FIG. 13, The series of steps leading from "ESDA" to "Release" are "Main Flow", and the auxiliary group of steps such as "Timing" is "Sub Flow".

The items to the left on the CAD tool selection panel 1301 show the steps displayed on the screen in FIG. 13.

Also, the items to the left side of the CAD tool selection panel 1301 are displayed on the text area at the right of the sub-window display button 1302, and programs for executing the work within the steps are started.

An example of operation will now be described, regarding a case wherein the CAD tool corresponding to "VHDL-Simulation tool" on the CAD tool selection panel 1301 in FIG. 33 is changed. The sub-window display button 1302 to the right of the "VHDLSimulation tool" is instructed, displaying the setting sub-window 1305 as shown in FIG. 34, and the CAD tool to be changed with this operation is instructed using an input device such as the keyboard 102 or mouse 104. For example, in the event that "toolJ" is instructed as shown in FIG. 34, the setting sub-window 1305 is not displayed, and "toolJ" appears in the text area of the row of "VHDLSimulation tool" on the CAD tool selection panel 1301. Also, changing processing can be realized according to the same processing, when changing CAD tools for other steps, as well.

After ending the CAD tool, the content of change is updated and the changing operation is ended by instructing the OK button 1303 to the lower right on the CAD tool selection panel 1301. After instructing the OK button 1303, changing processing of the CAD tool appropriation information 802, and re-inspection processing of the step state is executed.

Conversely, in order to ignore the changed contents and end the changing operations, the Cancel button 1304 to the lower right on the CAD tool selection panel 1301 is instructed. After instructing the Cancel button 1304, the panel is not displayed, and the original CAD tool is displayed in the text area.

Then, changing operation of the CAD tool appropriation information 802 is executed. However, in the event that no change of CAD tool is performed at all in the CAD tool selecting process, this is not performed.

Figure 36:
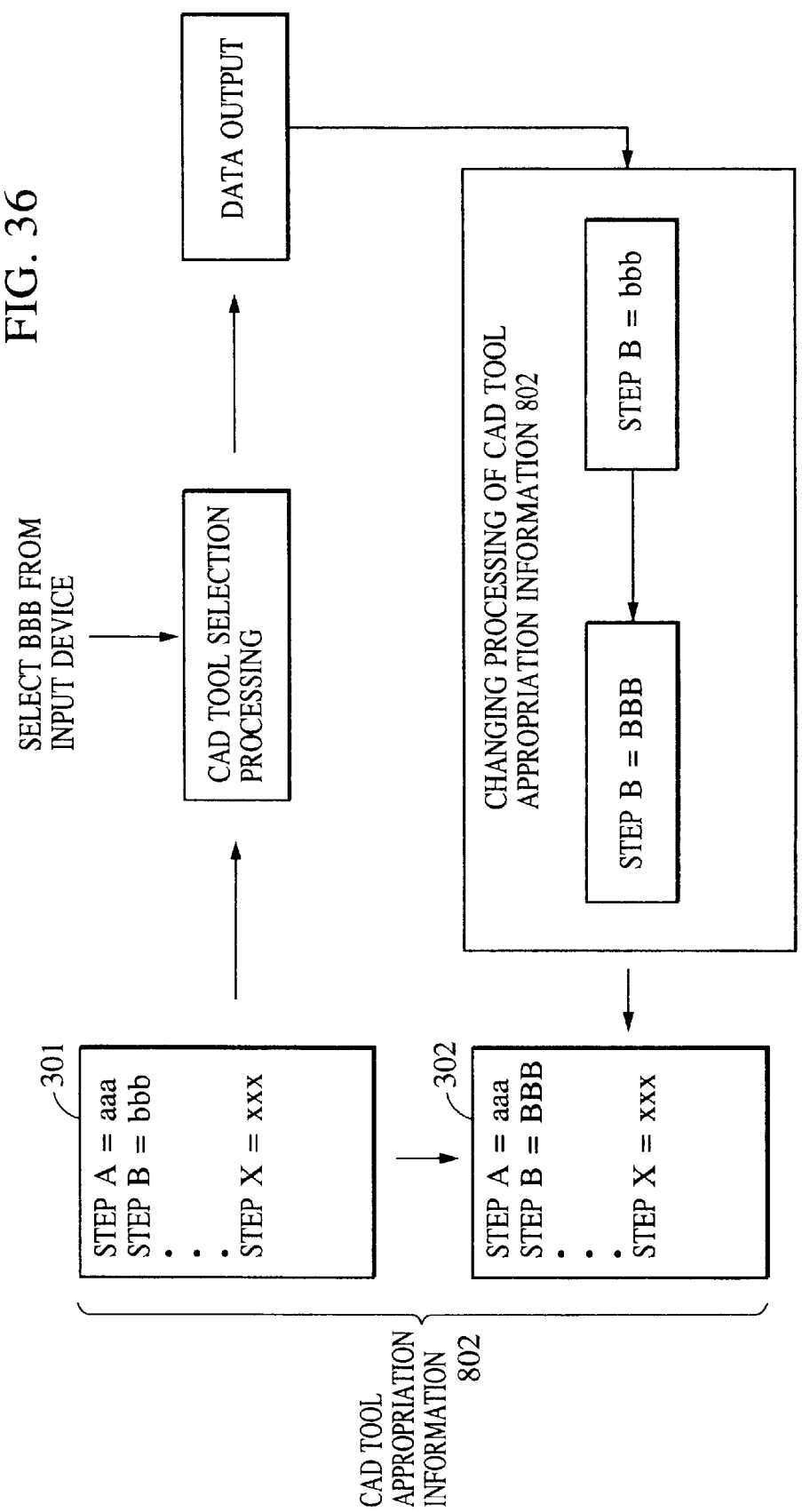
FIG. 36 is a diagram illustrating changing processing of CAD tool appropriation information.

FIG. 36 is a schematic diagram illustrating the flow relating to the selecting process of a CAD tool and changing processing of CAD tool appropriation information 802.

The CAD tool appropriation information 802 stored within the hard disk device 105 is such as shown to the upper left of FIG. 36. Which tool starts which CAD tool can be easily understood due to this CAD tool appropriation information 802. Accordingly, changing processing of CAD tool information is a process which changes this CAD tool appropriation information 802 based on change of the CAD tools by the aforementioned CAD tool changing processing.

In FIG. 36, the CAD tool appropriation information 802 is somewhat like a table indicating the relation between the step and the CAD tool, wherein the top drawing shows the state before change, and the lower drawing shows the state after change. Also, for sake of simplicity in making description here, the steps comprising the step relation diagram are denoted by characters, step A, step B, and so forth, through step X.

In the event that the CAD tool of step B is changed from "bbb" to "BBB" by the aforementioned CAD tool selection processing, the data output at the time of ending the CAD tool selection processing relating to the step and the CAD tool is changed from the relation of "step B=bbb", as shown in FIG. 36, to "step B=BBB". Then, the changing results are written to the CAD tool appropriation information 802, and as shown in FIG. 36, the CAD tool appropriation information 802 is changed from the state shown in the upper drawing 301 to that shown in the lower drawing 302.

Also, in the event that CAD tools have been changed in a certain step by means of the aforementioned CAD tool selecting process, but data necessary in the next step has not been generated, the state of the subsequent steps will change. Accordingly, in the event that CAD tools are changed within a step, there is the need to re-execute state inspection processing of each step. The following is a detailed description of state inspection processing, with reference to FIG. 37.

Figure 37:
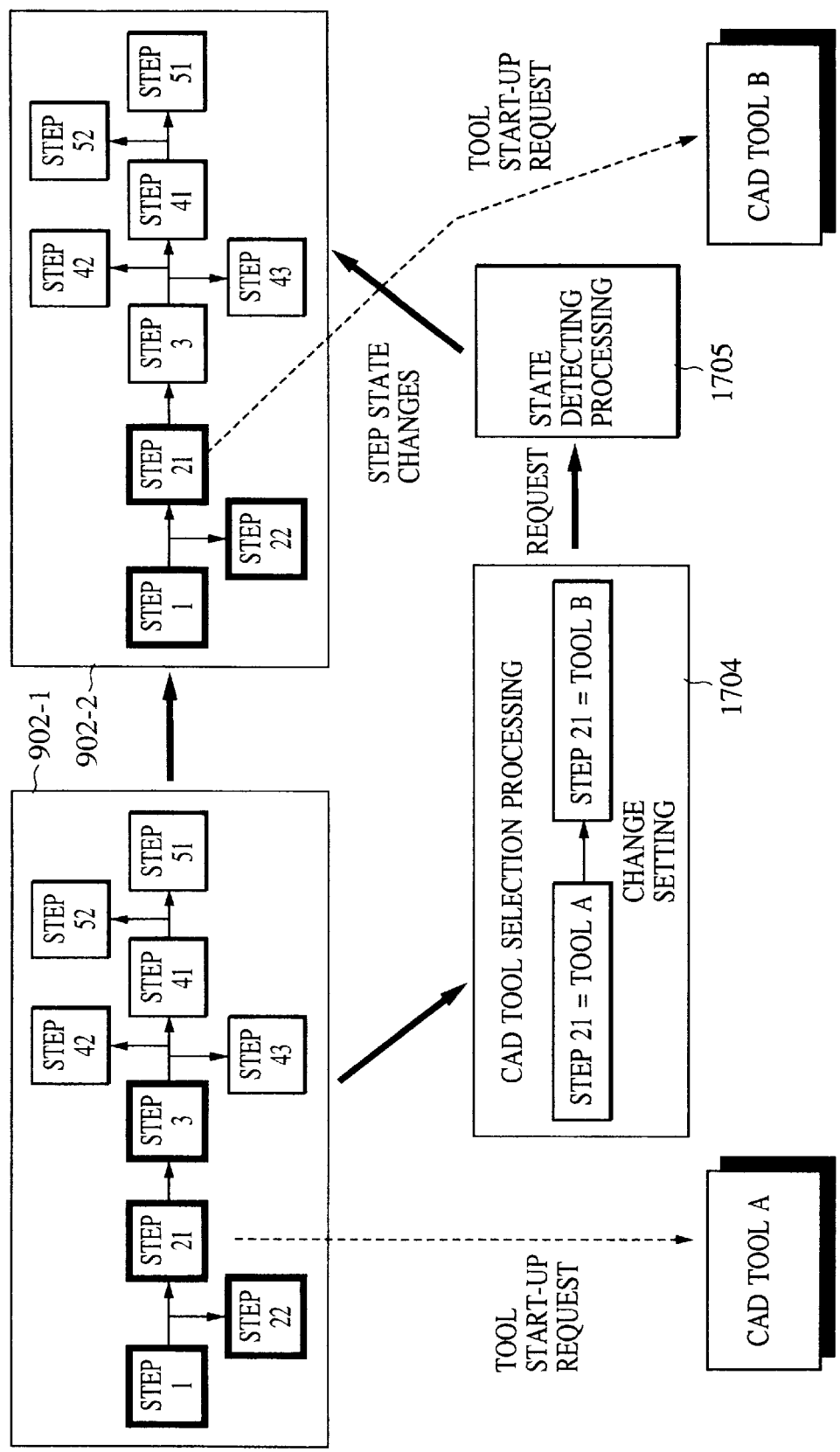
FIG. 37 is a diagram illustrating state inspection processing following CAD tool setting.

FIG. 37 is a diagram illustrating state inspection processing following CAD tool setting.

First, in the state to the upper left of FIG. 37 (902-1), the CAD tool which is started in step 21 is CAD tool A. Now, step 3 is in the executable state, with data A generated in step 21, i.e., CAD tool A, being the executable condition for step 3.

Now, in the event that the CAD tool to be started in this step 21 is changed from CAD tool A to CAD tool B, by the aforementioned CAD tool selecting processing, state inspection processing of each step is performed again, in order from step 1. In the event that the CAD tool B started in step 21 is not generating data A, the execution conditions of step 3 cannot be met, so step 3 is in a non-executable state (902-2).

Now, detailed description of the flow of processing relating to selection and changing of CAD tools corresponding to these steps will be made with reference to FIG. 38.

Figure 38:
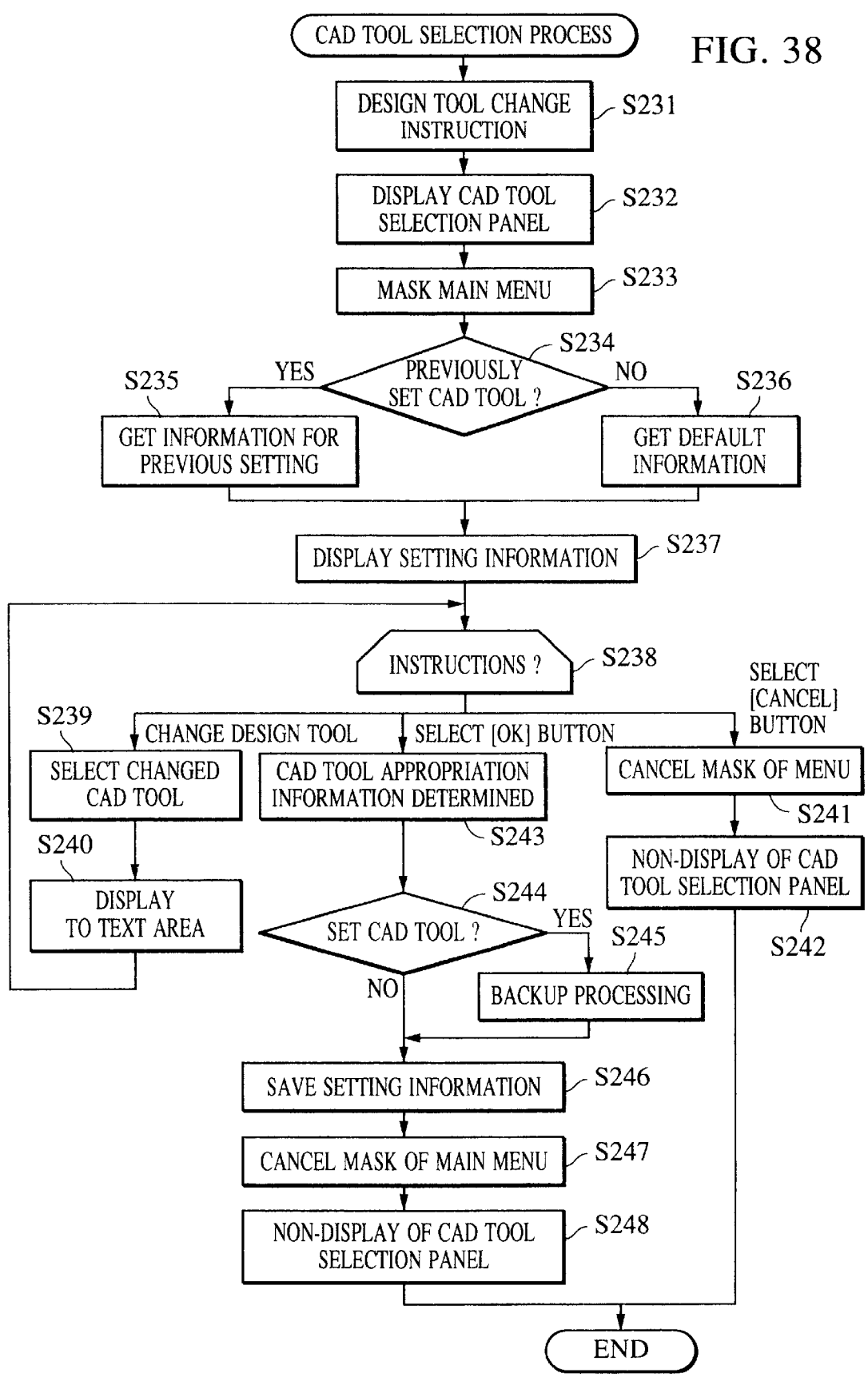
FIG. 38 is a flowchart of CAD tool setting processing.

FIG. 38 is a flowchart relating to CAD tool setting and changing.

In Step S231, upon receiving a tool changing instruction by the designer, the CAD tool selecting panel 1301 is displayed in Step S232, and the main panel 901 is masked in Step S233. Then, judgment is made in Step S234 whether or not a CAD tool is already set, and in the event that there is a CAD tool set, the already-set CAD tool is obtained in Step S235, otherwise, a default CAD tool is obtained via the environment data management function 310 in step S236. The flow then proceeds to step S237, and the obtained CAD tool is displayed.

Then, in step S238, judgment is made regarding what sort of instruction has been made, and in the event that CAD tool changing has been instructed, the flow proceeds to step S239, the CAD tool to change to is selected from the CAD tool selecting panel 1301, and the selected CAD tool name is displayed in the text area in step S240. The flow the returns to a standby state in step S238 to a wait instructions.

Also, in the event that the OK button is selected in step S238, the flow proceeds to Step S243, the CAD tool setting information is set, and the CAD tool appropriation information 802 is updated. Next, in Step S244, confirmation is made whether or not there are already-set CAD tools, and in the event that there are such, back-up processing is performed and the flow proceeds to Step S246; in the event that there are none, the flow proceeds straight to Step S246. Next, in Step S246, the updated CAD tool appropriation information 802 is stored in the hard disk device 105, the masking of the main panel 901 is canceled in Step S247, and the CAD tool selecting panel 1301 is hidden from view.

Also, in the event that the Cancel button 1304 is selected in Step S238, the flow proceeds to Step S241, wherein the masking of the main panel 901 is canceled, and the CAD tool selecting panel 1301 is hidden from view in Step S242. In other words, the CAD tool regarding which setting was once attempted is discarded.

Thus, according to the present embodiment, setting of CAD tools within each of the steps can be performed in an extremely simple manner.

Also, by means of displaying the main flow and sub flow separately, the designer can easily identify each.

Also, the desired item can be selected from a list of candidates, so selecting efficiency is improved.

Further, the state of the steps following changing of the CAD tool are immediately verified, so the designer can easily identify the change in state of each step.

Moreover, the panel is masked during the selecting process, so mistaken operations can be prevented.

(Fifth Embodiment)

The ASIC (referred to as "target" in the present embodiment) used in the processing within the steps as described above can be selected from candidates provided beforehand in the hard disk device 105. The following is a detailed description of information relating to this target, so-called setting processing of the so-called target information 803.

Figure 39:
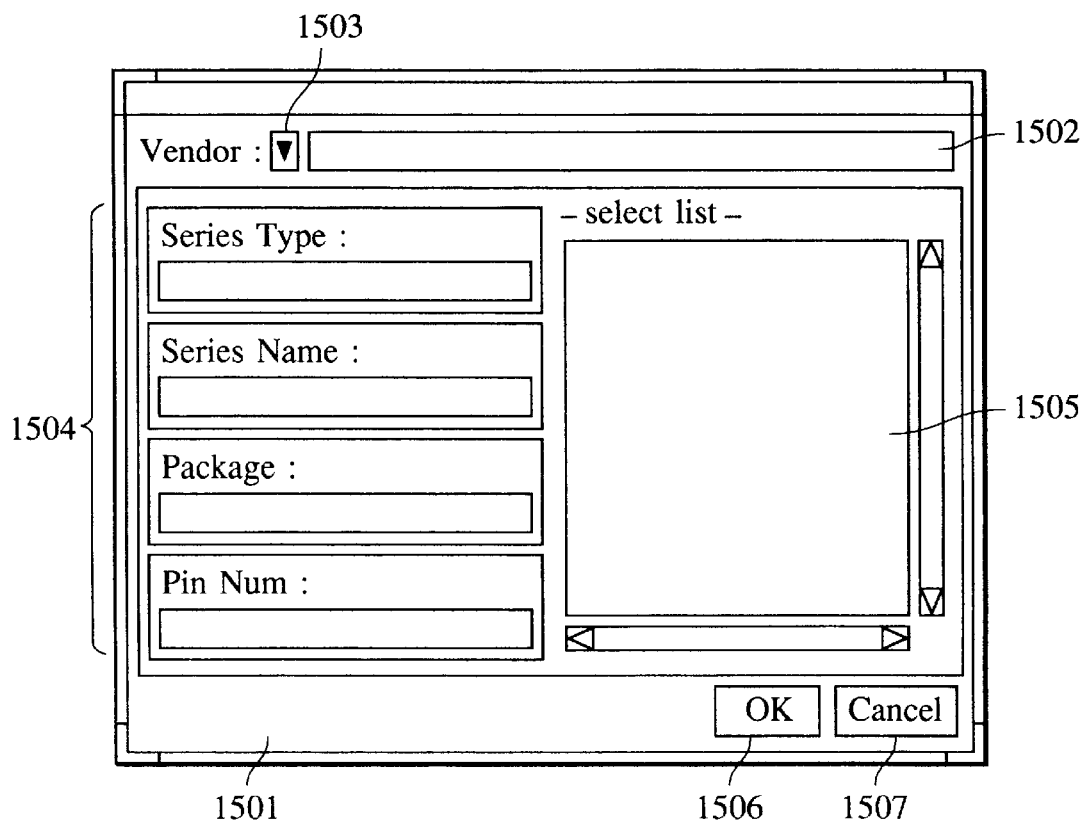
FIG. 39 is a diagram illustrating a target information setting panel.

First, in the case of setting the target information 803, a target information setting panel 1501 such as displayed in FIG. 39 is displayed by means of instruction by an input device such as the keyboard 102 or mouse 104. In the present embodiment, this is initiated in cases such as when the Target button in the button group 904 on the main panel 901 is selected, or when target information is not set for new registration of a project.

FIG. 39 is a diagram illustrating a target information setting panel 1501 displayed upon the main panel 901.

Figure 40:
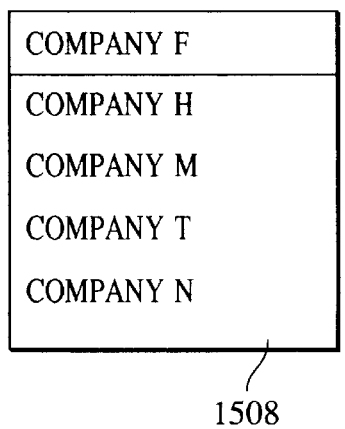
FIG. 40 is a diagram illustrating a target information setting sub-window.

In FIG. 39, the area 1502 at the upper portion of the target information setting panel 1501 is a vendor name setting area, and the open space to the right side is a text area for displaying the vendor name selected from a later-described sub-window 1508. Also, the triangular button 1503 to the right of "Vendor:" is a sub-window displaying button, and a setting sub-window 1508 such as shown in FIG. 40 is displayed at a desired position on the target information setting panel 1501, by means of this button being selected by an input device such as the mouse 104, this setting sub-window 1508 lists a plurality of candidates for the vendor name.

Also, 1504 denotes a detailed item display area for displaying the following five detailed items regarding the target: "Vendor", "Series Type", "Series Name", "Package", and "Pin Num". 1505 is an auxiliary display area for displaying candidates of the detailed items displayed in the area 1504.

Also, 1506 is an OK button for determining the selection, and 1507 is a Cancel button for instructing canceling.

The target information setting panel 1501 shown in FIG. 39 is a panel for use in the event that target information is not yet set. The target to be used is determined by setting the following elements in this state. The detailed items for the target are the five shown in the area 1504; i.e., "Vendor", "Series Type", "Series Name", "Package", and "Pin Num". These are to be set in this order. The following is a description of the setting procedures thereof.

The label "Vendor" in the area 1502 indicates the ASIC vendor. Instructing the sub-window display button 1503 to the right of "Vendor" using an input device such as a mouse 104 displays a setting sub-window 1508 displaying a plurality of ASIC vendors, such as shown in FIG. 40, on the target information setting panel 1501.

Figure 41:
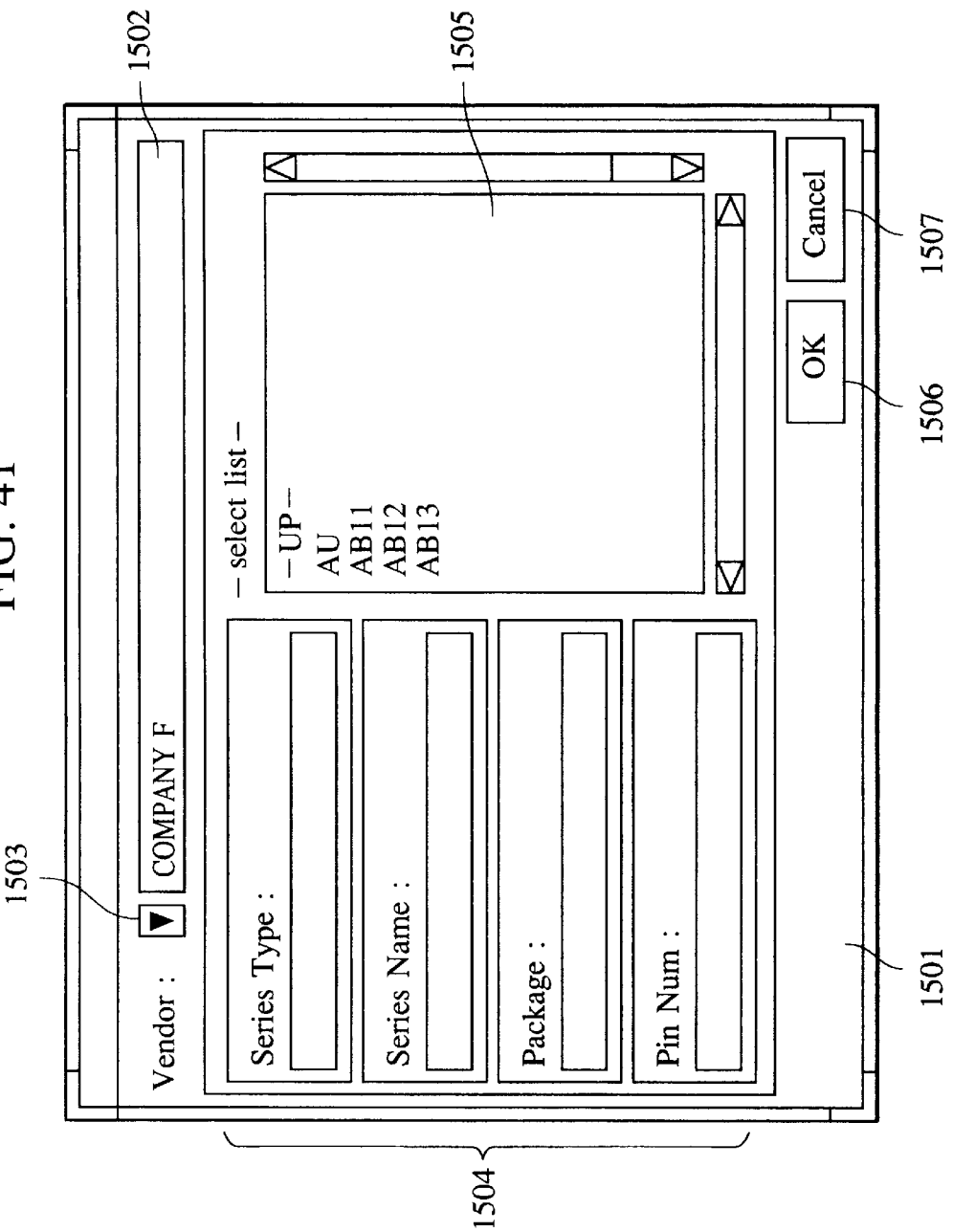
FIG. 41 is a diagram illustrating a target information setting panel after determining the vendor name.

Now, in the event that COMPANY F is instructed, as shown in FIG. 40, the setting sub-window 1508 is hidden from view, and as shown in FIG. 41, the characters "COMPANY F" are displayed on the text area to the right of the area 1502 toward the top of the target information setting panel 1501.

Figure 42:
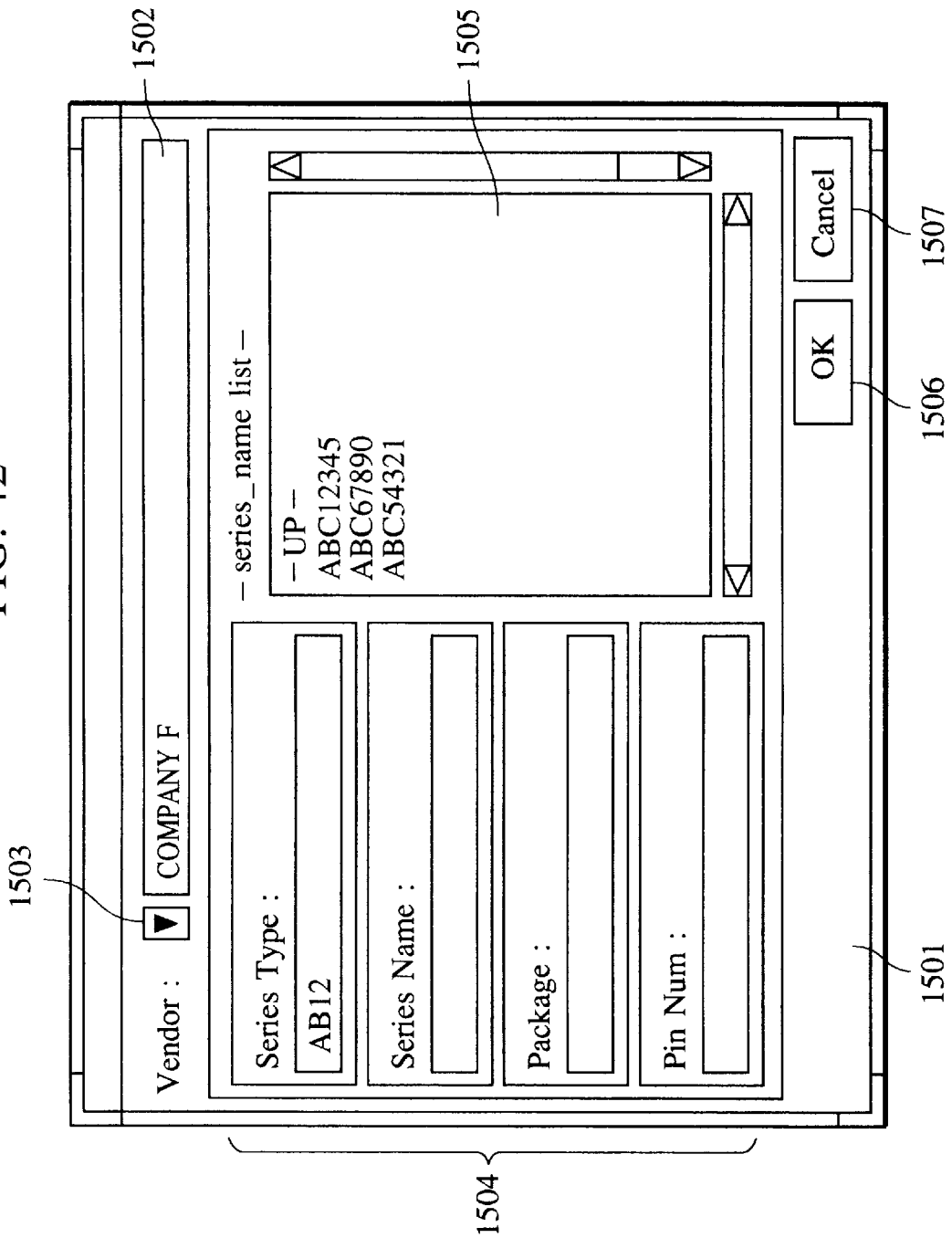
FIG. 42 is a diagram illustrating a target information setting panel after determining the Series Type.
Figure 43:
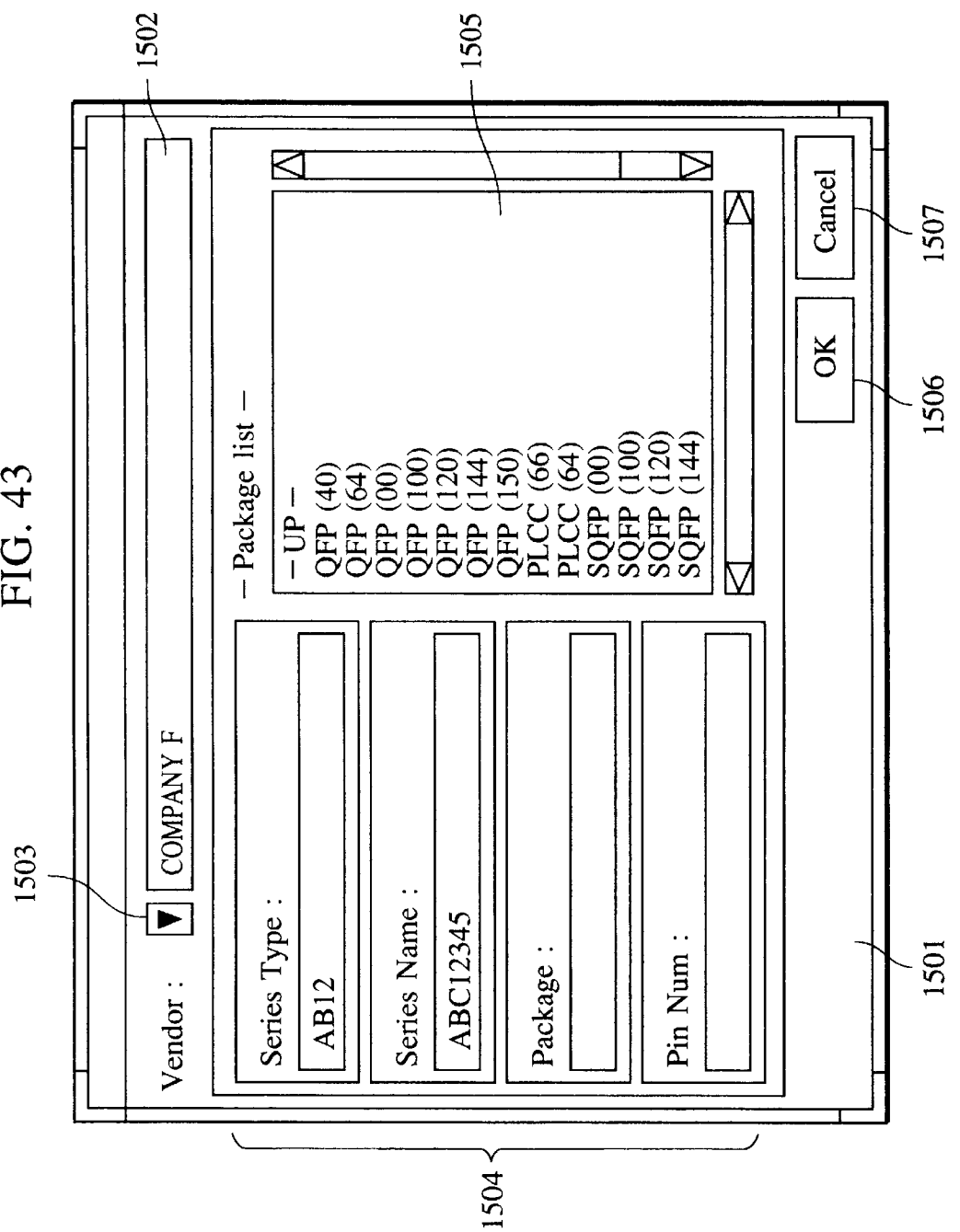
FIG. 43 is a diagram illustrating a target information setting panel after determining the Series Name.

Setting the vendor name brings up the next setting item on the candidate display area 1505, as shown in FIG. 41, i.e., the detailed items for "Series Type". The designer instructing the desired candidate using an input device such as a mouse 104 or the like determines "Series Type", the detailed items thereof are described in the detailed items display area 1504, and at the same time, the next detailed item following "Series Type", namely, "Series Name", is displayed in the candidate display area 1505 as shown in FIG. 42. At this time, the "Series Type" data in the hard disk 105 is read in and maintained on the data sorting device 110 so that information including the "Series Name" be freely extracted. The time of reading this information in is not restricted to the time of determining the "Series Type". Once "Series Type" is determined with the same method, the candidates for "Package" and "Pin Num" are displayed on the candidate display area 1505, as shown in FIG. 43. Once all items have been determined, the state is such as shown in FIG. 44.

After updating the determined contents as target information 803, the OK button 1506 is instructed with the mouse 104 or the like to end the operations. Conversely, in order to discard the set detailed items and end, the Cancel button 1507 is instructed with the mouse 104 or the like. Saving of target information 803 to the hard disk device 105 will be described later.

Figure 44:
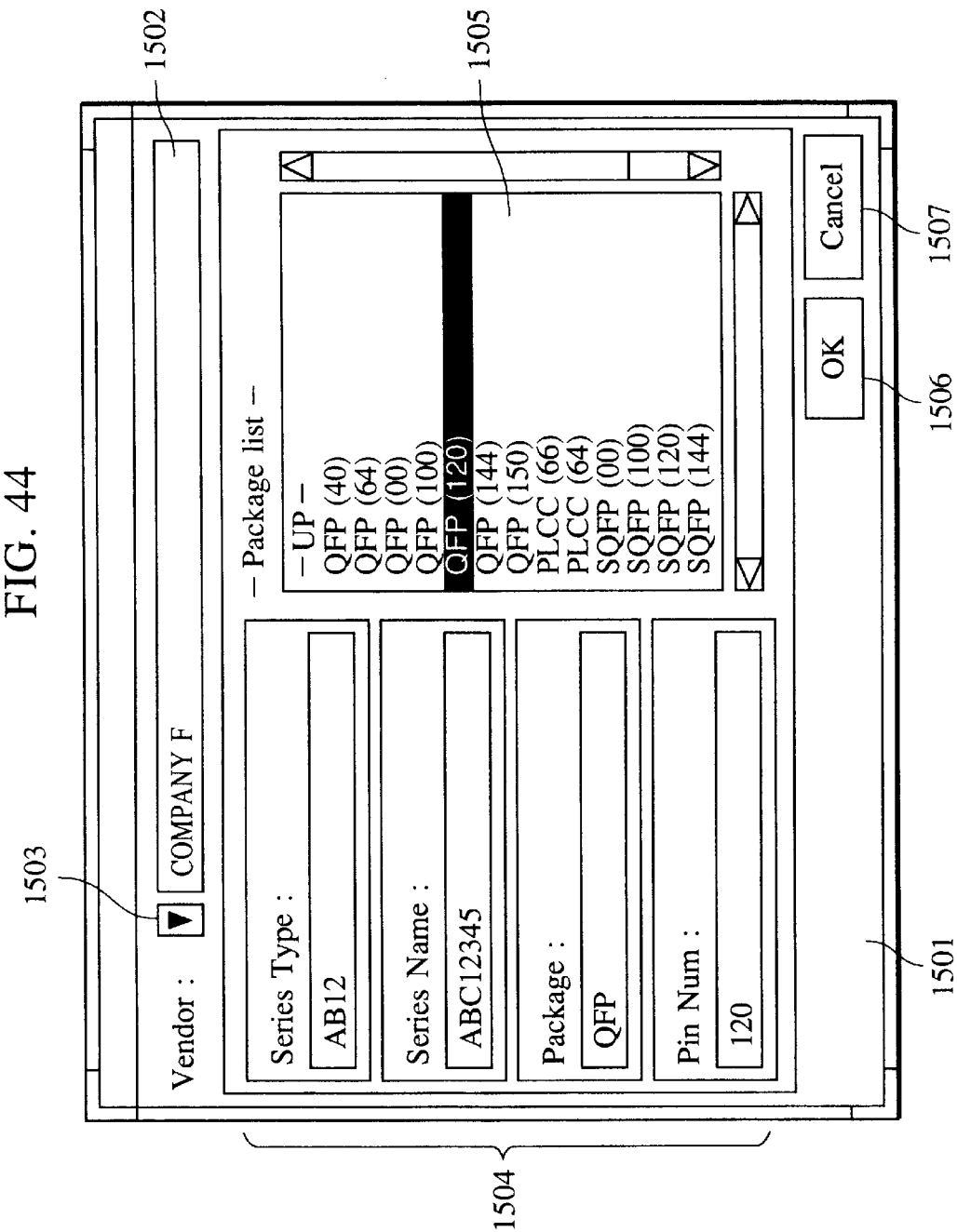
FIG. 44 is a diagram illustrating a target information setting panel after determining the Package/Pin Num.

Now, description will be made regarding processing the target information setting panel 1501 in the initial state as shown in FIG. 39 in a case wherein the target information 803 is already determined as shown in FIG. 44.

Generally, in the state of the target information 803 already having been determined as shown in FIG. 44, changing the "Package" and "Pin Num" can be done with the same method as above, simply by operating the candidate display area 1505 to the right of the panel.

Also, when changing the vendor name from the state of the target information setting panel 1501 as shown in FIG. 44, the sub-window display button 1503 to the right of "Vendor" in area 1502 is instructed using an input device such as a mouse 104, and the operation determining is the same as the above example. After determining the vendor, the other items which had been set are initialized, and determining is proceeded with from the state such as shown in FIG. 41.

Also, in the event that "-UP-" is selected from the candidate display area 1505 to the right of the panel from the state of the target information setting panel 1501 as shown in FIG. 44, the determining display of the items "Package" and "Pin Num" are initialized, and the previous detailed item "Series Name" is displayed in the candidate display area 1505. Then, the panel state is as shown in FIG. 42.

In the event that "-UP-" is selected once more, the determining operation goes back further, and selecting one of the candidates for "Series Name" causes the determining operation to proceed by one step to the state shown in FIG. 43. Incidentally, in the event that the "-UP-" element is determined when determining the "Series Type", the target information setting panel 1501 returns to the initial state.

Thus, already-existing setting contents can be changed.

Also, performing setting or changing of the target information 803 causes the set or changed target information 803 to be saved in the hard disk device 105. Here, "target information 803" is a generic term for values used to determine the target, and indicates the aforementioned five items ("Vendor" through "Pin Num"). These items of target information 803 update the contents of the setting change information 701 shown schematically in FIG. 8.

Figure 45:
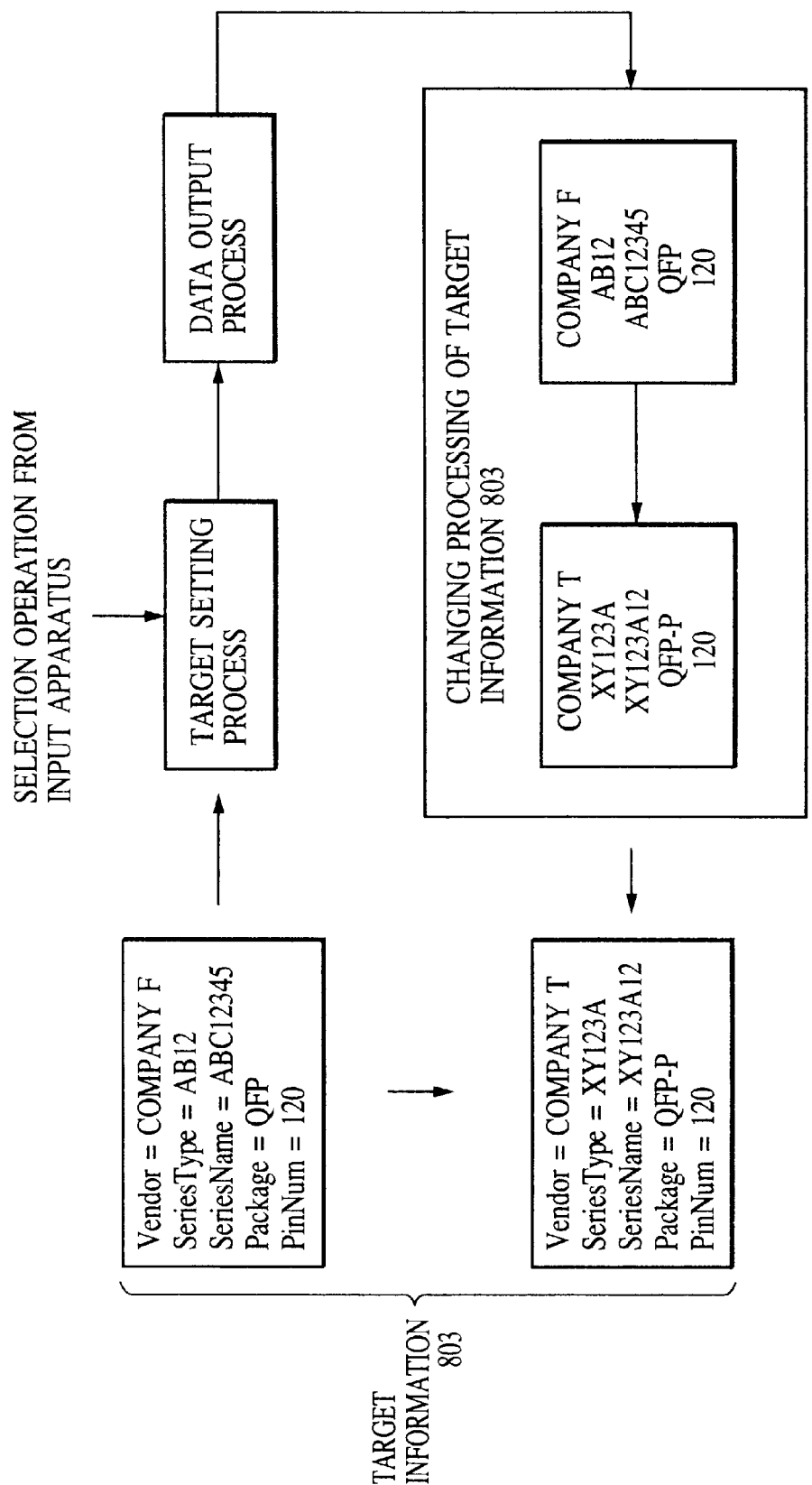
FIG. 45 is a diagram illustrating changing processing of target information.

FIG. 45 is a diagram schematically illustrating the flow of selecting and saving of target information 803.

New target information is determined as to the target information 803 before updating which is to the upper left of FIG. 45, by the detailed items setting process. Then, new target information is written to the hard disk device 105 changing the current target information into the new determined target information.

Determining or changing of the target information 803 requires re-inspection of the state of the steps. That is because there are cases in which the target information 803 is contained in the execution conditions for determining the states of the steps. For example, in the event of using a chip A, data A may be necessary as an executing condition, and in the event of using a chip B, data B may be necessary as an executing condition. The following is a description of such an example.

Figure 46:
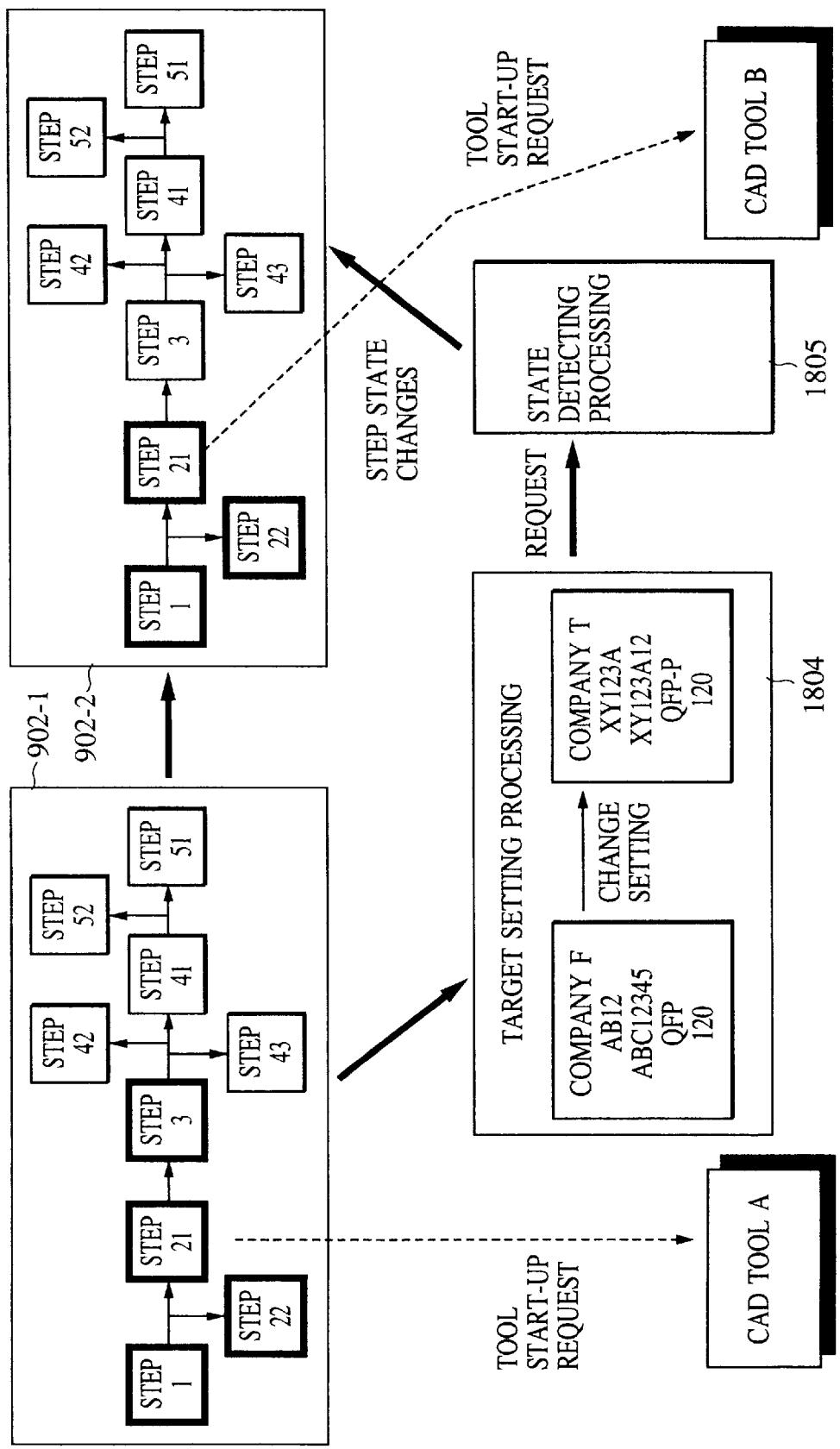
FIG. 46 is a diagram illustrating state inspection processing following target information setting.

FIG. 46 is a diagram illustrating state inspection processing following target information 803 setting.

In the state of the step to the upper left in FIG. 46 (902-1), the CAD tool started in step 21 is CAD tool A. step 3 requires data A generated by the CAD tool A in step 21 as a execution condition, so step 3 is in an executable state in the event that step 21 has generated data A.

Now, by performing setting changes to the target information 803 such as shown in boxes 1804 and 1805 in FIG. 46, the execution conditions of step 3 change from data A to data B. Performing state inspection once more from step 1 following this changing processing shows that data B has not been generated in step 21, is the execution conditions of step 3 cannot be met. Accordingly, step 3 changes to a non-executable state, as shown at the upper right of FIG. 46 (902-2).

However, change of the state of the step differs according to the execution conditions, so the above-described does not always hold true. That is to say, there may be cases wherein there is no change in the state of the step, and there may be cases wherein two or more step states may change.

Figure 48B:
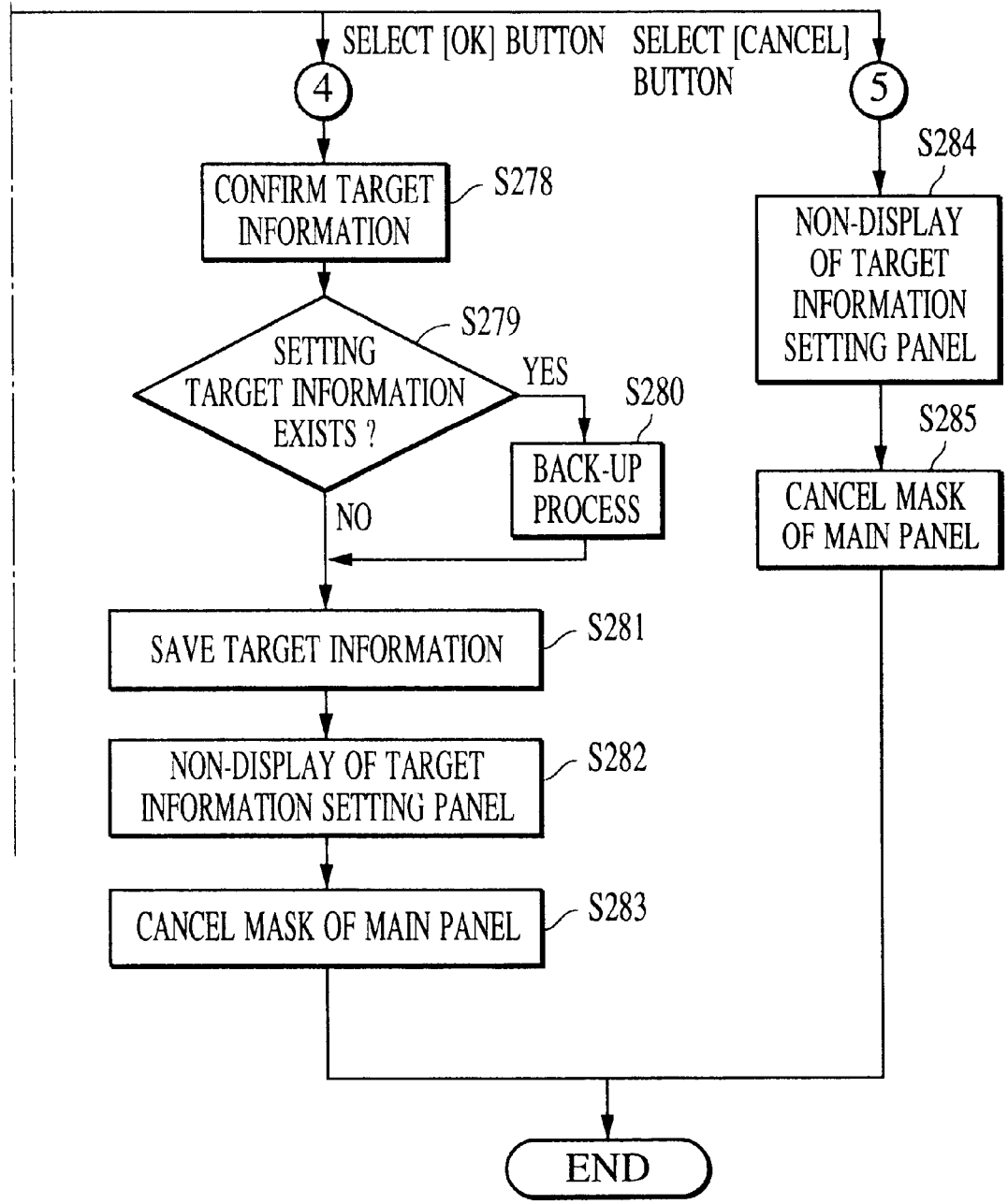
Figure 49:
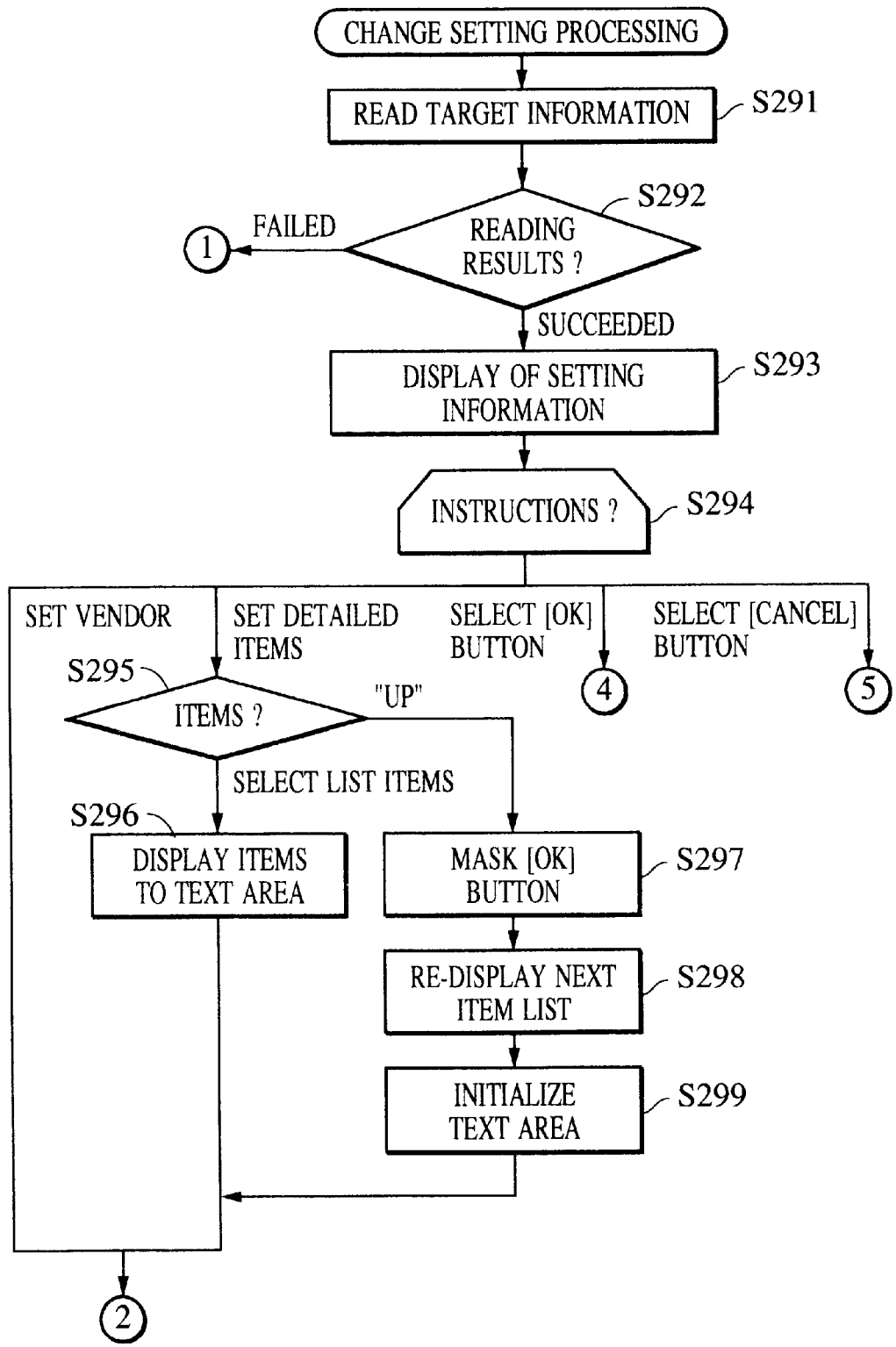
FIG. 49 is a flowchart of change setting processing.

Now, the flow of setting the target information 803 using the target information setting panel 1501 will be described in detail, with reference to FIG. 47, 48, and 49.

Figure 47:
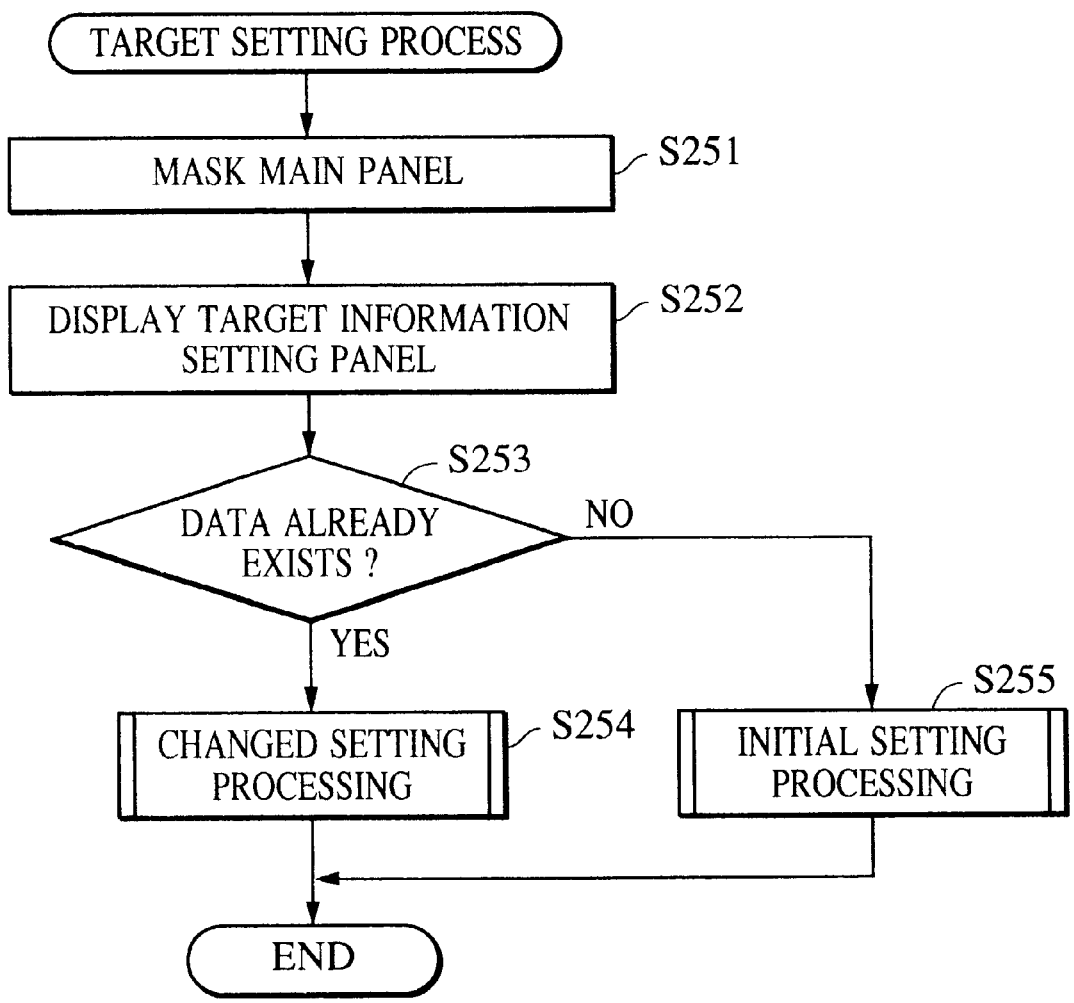
FIG. 47 is a flowchart of-target information setting processing.

FIG. 47 is a flowchart of target information 803 setting processing using the target information setting panel 1501.

In Step S251, the main panel 901 is masked. Then, in step S252, the target information setting panel 1501 is displayed, and in Step S253, judgment is made whether or not data already exists on the target information setting panel 1501. In the event that data exists, the flow proceeds to Step S254, performs change setting, and in the event that data does not exist, the flow proceeds to Step S255 and performs initial setting.

Next, a further detailed description of the flow of initial processing in Step S255 will be given with reference to the flowchart shown in FIGS. 48A and 48B.

Incidentally, this setting of target information 803 is always performed from the upper to the lower data. That is, once the upper data is determined, the candidates for the lower data can be decided, as well. This is the same in changing setting in Step S254, as well.

In Step S261, judgment is made regarding what sort of instruction was received. Now, in the event that instruction of the ASIC vendor name has been performed, the OK button 1506 is masked in Step S262, the detailed item display area 1504 is initialized in Step S263, and the instructed vendor name is identified in Step S264. Next, in Step S265, judgment is made regarding whether or not the specified vendor exists in the vendor data file 504 in which the vendor names to be used are registered, via the environment data management function 310. In the event that the vendor name is present, the vendor information is obtained in Step S266, following which the vendor name is displayed in Step S267, and a list of detailed items is displayed in the candidate area 1505 in Step S268. Once this processing is completed, the flow returns to the standby state in Step S261, waiting for instructions.

Also, in the event that setting of detailed items (here, information other than ASIC vendor name) is set in Step S261 following setting of the vendor name, judging is performed to select list items in Step S270. Now, in the event that "UP" which is a special character indicating returning the setting operation one step upwards is instructed in the candidate area 1505, the flow proceeds to Step S276, the next item list is displayed again in the candidate area 1505, the text area corresponding to the detailed item display area 1504 is initialized in Step S277, and the flow returns to Step S261. Also, in the event that a list item other than the above is instructed, the flow proceeds to Step S271, display of instructed items to the text area corresponding with the detailed item display area 1504 is performed and the next item list is displayed again in the candidate area 1505 in Step S273. Further, judgment is made in Step S274 whether the instructed detailed item is the final setting item or not, and in the event that the instructed detailed item is the final setting item, in Step S275 the detailed items are all considered to have been determined, so the mask of the OK button 1506 is canceled, and the flow returns to Step S261. In the event that there are detailed items left to set, the flow returns straight to Step S261.

Also, after completing setting of all detailed items, in the event that the OK button 1506 is selected in Step S261, the flow proceeds to Step S278, the set target information 803 is determined, and in Step S279, confirmation is made whether or not previous target information exists or not. In the event that such does exist, back-up processing is performed in Step S280, and the flow proceeds to Step S281. In the event that such does not exist, the flow proceeds straight to Step S281. In Step S281, the set target information 803 is saved in the hard disk device 105. In Step S282, the target information setting panel 1501 is hidden from view, and in Step S283, the mask of the main panel 901 is canceled, thus ending processing.

Also, following completion of setting of all detailed items, in the event that selection of the Cancel button 1507 is performed in Step S261, the flow proceeds to Step S284, the target information setting panel 1501 is hidden from view, and in Step S285 the mask on the main panel 901 is canceled, completing processing. In other words, the contents of setting are annulled and setting processing is ended.

Next, the flow of changing setting in Step S254 will be described in further detail, with reference to the flowchart in FIG. 49.

The following is a process for cases wherein already-set target information 803 exists.

First, reading of the set target information 803 is necessary, as compared with the case of initial setting. In Step S291, target information 803 is read. In Step S292, the reading results are judged, and in the event that reading has failed, the flow proceeds to the flow indicated by ① in FIG. 48. Also, in the case of successful reading, in Step S293, the vendor name within the read target information 803 is displayed in the text area 1502 for the vendor name, and the detailed items thereof are displayed in the detailed item display area 1504. Then, in Step S294, the type of instruction received is judged.

Now, in the event that the ASIC vendor name has been instructed, the flow proceeds to the flow indicated by ② in FIG. 48. In the event that the OK button has been selected, the flow proceeds to the flow indicated by ④ in FIG. 48, and in the event that the Cancel button 1507 has been selected, the flow proceeds to the flow indicated by ⑤ in FIG. 48.

Then, in the event that setting of detailed items is performed in Step S294, judging is performed in Step S295 regarding the items selected from the list. In the event that "UP" which is a special character indicating returning the setting operation one step upwards is instructed in the candidate area 1505, the flow proceeds to Step S297, where the OK button 1506 is masked. In Step S298, the next item list is displayed again in the candidate area 1505, and in Step S299 the text area corresponding with the detailed item display area 1504 is initialized, and the flow proceeds to the flow indicated by ② in FIG. 48. Also, in the event that any other list item is instructed in the candidate area 1505, the flow proceeds to Step S296 wherein the instructed items are displayed to the text area of the detailed item display area 1504, and the flow proceeds to the flow indicated by ② in FIG. 48.

Thus, according to the present embodiment, setting of target information can be performed in an extremely easy manner.

Also, the vendor name and detailed information can be selected in a hierarchical manner, so the designer can select information in stages.

Also, the desired item can be selected from a plurality of displayed candidates, so the efficiency of selecting is improved.

Further. the selection process can be returned to a higher hierarchical tier, so correction can be easily made in the event that an incorrect selection is made.

Further yet, the state of the steps is immediately verified following setting of the target information, so the designer can easily identify change in the states of the steps.

Moreover, the panel is masked during the selection process, thus preventing mistaken operation.

(Sixth Embodiment)

Next, a sixth embodiment will be described in detail, using step 1 and step 21 in FIG. 31 as an example.

Figure 31:
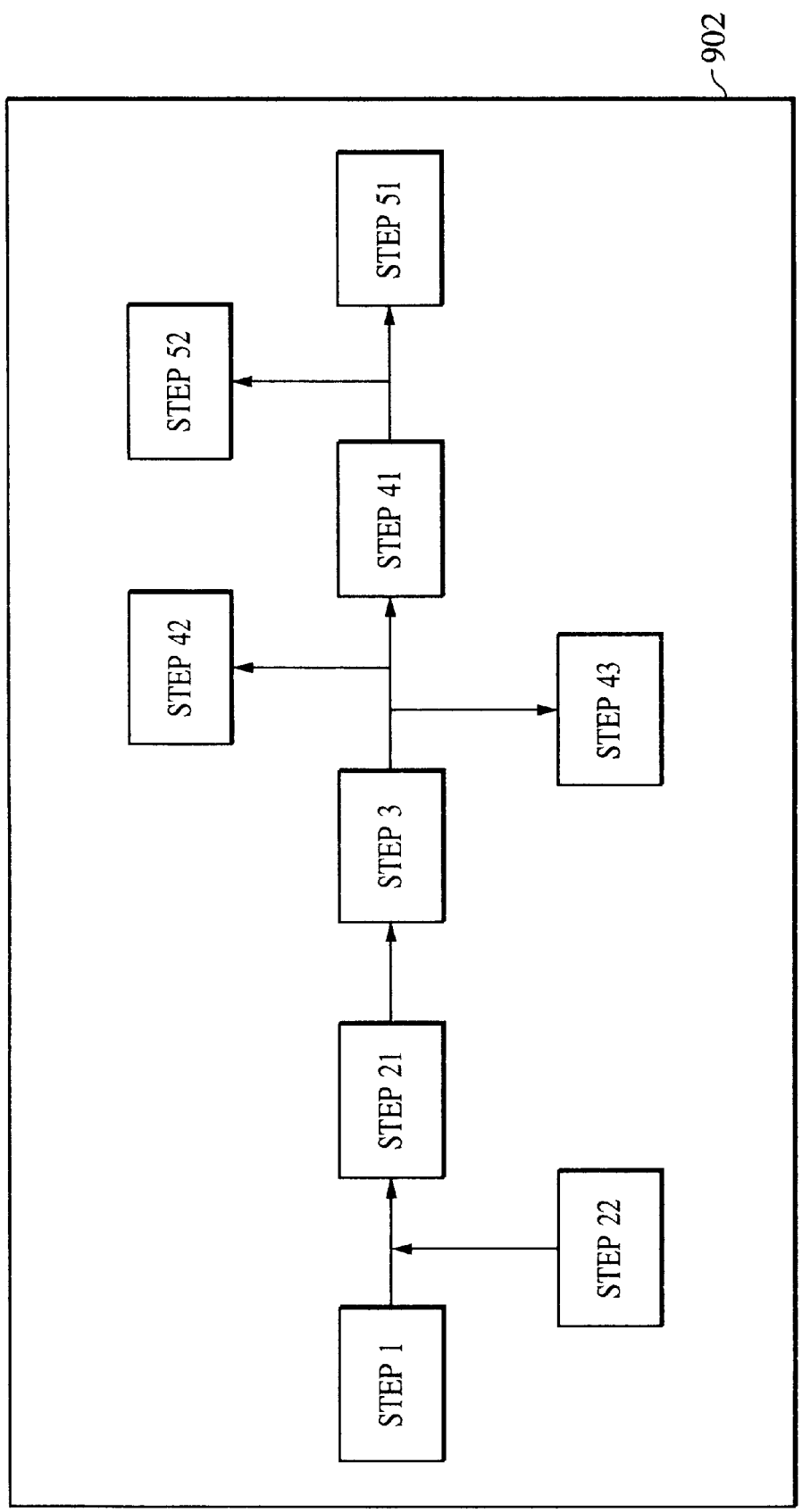
FIG. 31 is a step relation diagram used with a sixth embodiment.

FIG. 31 is an example of a step relation diagram in area 902.

In FIG. 31, all steps are enclosed in bold lines, indicating an executable state.

Here, the steps before step 21 are steps 1 and 22, the execution conditions of step 21 being the data generated by step 1. Thus, in the event that the designer desired to execute step 22, the state of step 21 does not change, so there is no change in the step relation diagram. This can be understood as a proper state.

However, in the event that data is not generated by execution of step 1, the steps following step 21 must be verified even though step 21 is in a non-executable state, because otherwise, the steps following step 21 will remain in a non-executable state, which is a contradictory state.

Accordingly, in order to solve this problem, the steps following the executed step must be verified sequentially (see FIG. 16 for verification in such a case).

In the case of performing such verification, in the event that data with differing versions is generated by step 1 which has changed in version due to being executed a plurality of times, the step 21 of which the executable conditions are data from step 1 is in an executable state, but the data generated by step 21 is data generated by data of an earlier version than that generated by step 1, so the data output from step 1 in this execution processing and the data generated in step 21 are not in a later-described derivative relation, and the subsequent step 3 and the following steps all become non-executable.

Incidentally, in the event that data is not generated in step 1, step 21 does not generate data either, so all steps following step 21 become non-executable. Further, executing step 22 has no effect on step 21, so even if verifying of all steps following step 21 is performed, all steps remain unchanged in the non-executable state.

Now, the aforementioned "derivative relation" will be briefly described. In the present design managing apparatus 101, the derivative management function 300-2 of the data management function 201 manages the "derivative relation".

In other terms, this deals with managing what data the generated data is based upon. So, in the above case, the data of the current step 21 is not being generated base on the data generated by the version-updated step 1, and execution is not permitted.

In the present embodiment, this "derivative relation" is also an executable condition.

Such "derivative relation" of data changes with version changes owing to processing by the steps. Make reference to the flowcharts in FIGS. 25 and 26 regarding the flow processing thereof, as these flowcharts describe version management processing in further detail.

Now, using the schematic diagram of FIG. 32, change in "derivative relation" of data will be described specifically and in detail, regarding a case wherein CAD tool selection processing described in the fourth embodiment has been performed.

Figure 32:
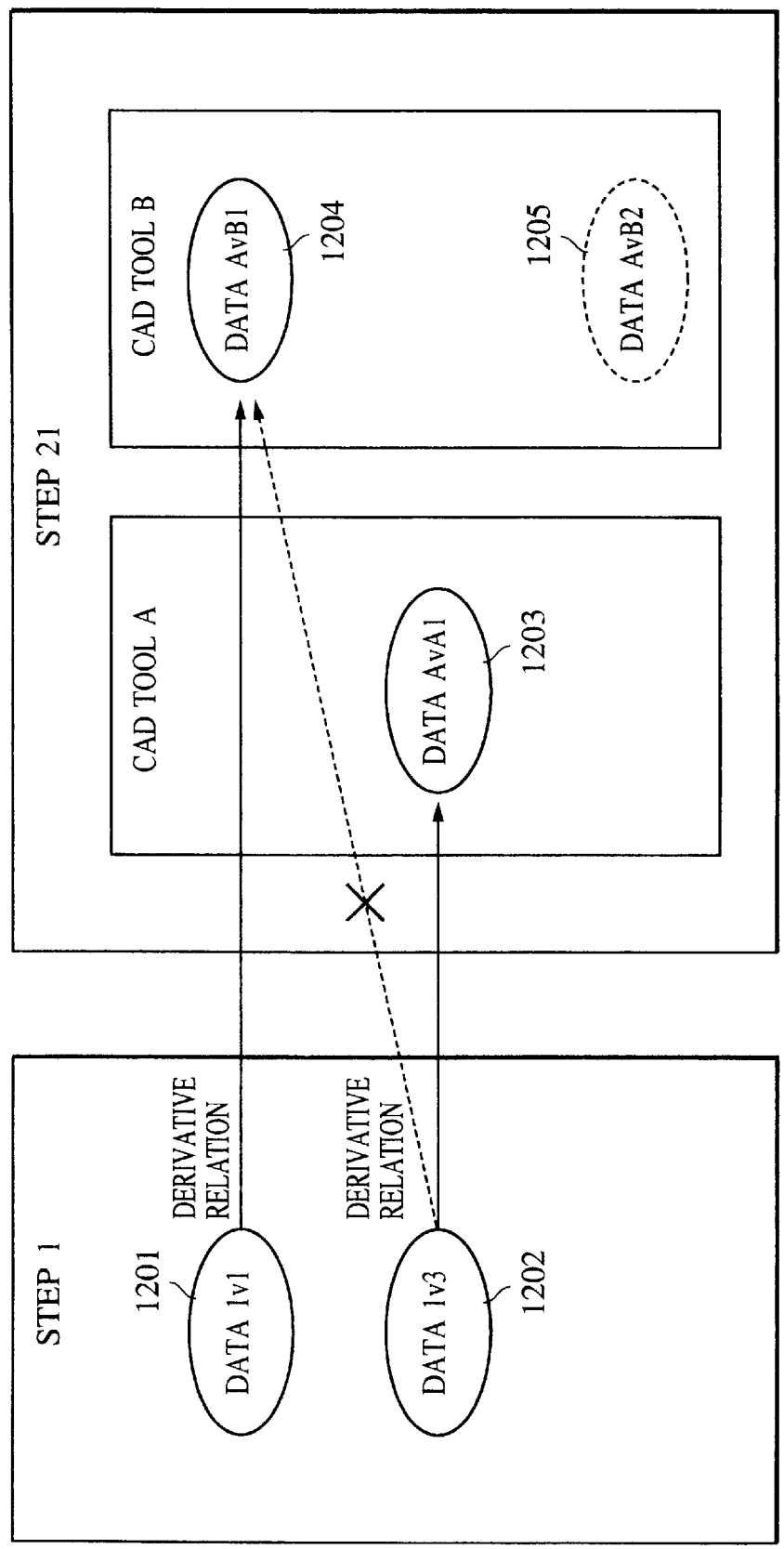
FIG. 32 is a diagram illustrating derivative relation of data.

First, in FIG. 32, in step 21, CAD tool B generates data A of a version vB1 (data AvB1-1204), based on data 1 of a version v1 generated in step 1 (data 1v1-1201). In such a case, there is a "derivative relation" between the two sets of data.

In this state, in the event that the CAD tool used in step 21 is changed from CAD tool B to CAD tool A by the CAD tool selecting process, there is no data A in the CAD tool A of step 21 at the point of change. Accordingly, at the point that the version of data output by executing the step 1 changes from version v1 to version v3, the CAD tool A generates version vA1 data A (data AvA1-1203) based on version v3 data 1 (data 1v3-1202). Thus, a "derivative relation" has been generated between the version v3 data 1 (data 1v3-1202) and the version vA1 data A (data AvA1-1203).

Further, the CAD tool of step 21 is changed back from CAD tool A to CAD tool B. At this point, the data held by step 1 is version v3 data 1 (data 1v3-1202), and the data held by step 21 is version vB1 data A (data AvB1-1204). There is no "derivative relation" generated between these two, so the CAD tool B must once more generate data based on version v3 data 1 (data 1v3-1202), i.e., version vB2 data A (data AvB2-1205), thereby creating a "derivative relation".

Following such a process flow, the state of the steps changes to the state to the upper right in FIG. 37 (902-2), by means of CAD tool selection processing. The change of the stage of the steps differs according to the execution conditions of the steps, so the results of the above-described does not always hold true. That is to say, there may be cases wherein there is no change in the state of the step, and there may be cases wherein two or more step states may change.

For example, in the event that all steps are in the executable state in FIG. 37, in the event that the CAD tool B does not have data A or in the event that there is no derivative relation with data 1 when the CAD tool of step 21 is changed from CAD tool A to CAD tool B, as described above, step 3 becomes non-executable. Also, the following steps all become non-executable as the result of the aforementioned state inspection processing.

Next, further detailed description will be made of the management method of information indicating derivative relation between data (hereafter referred to as "derivative relation information"), with reference to FIG. 71 through FIG. 75. In FIG. 71 through FIG. 75, a model is considered wherein three steps, step 1, step 2, and step 3, are simply sequentially processed in this order.

FIG. 71 through FIG. 74 are diagrams illustrating a method of managing information of a derivative relation between data.

Figure 71:
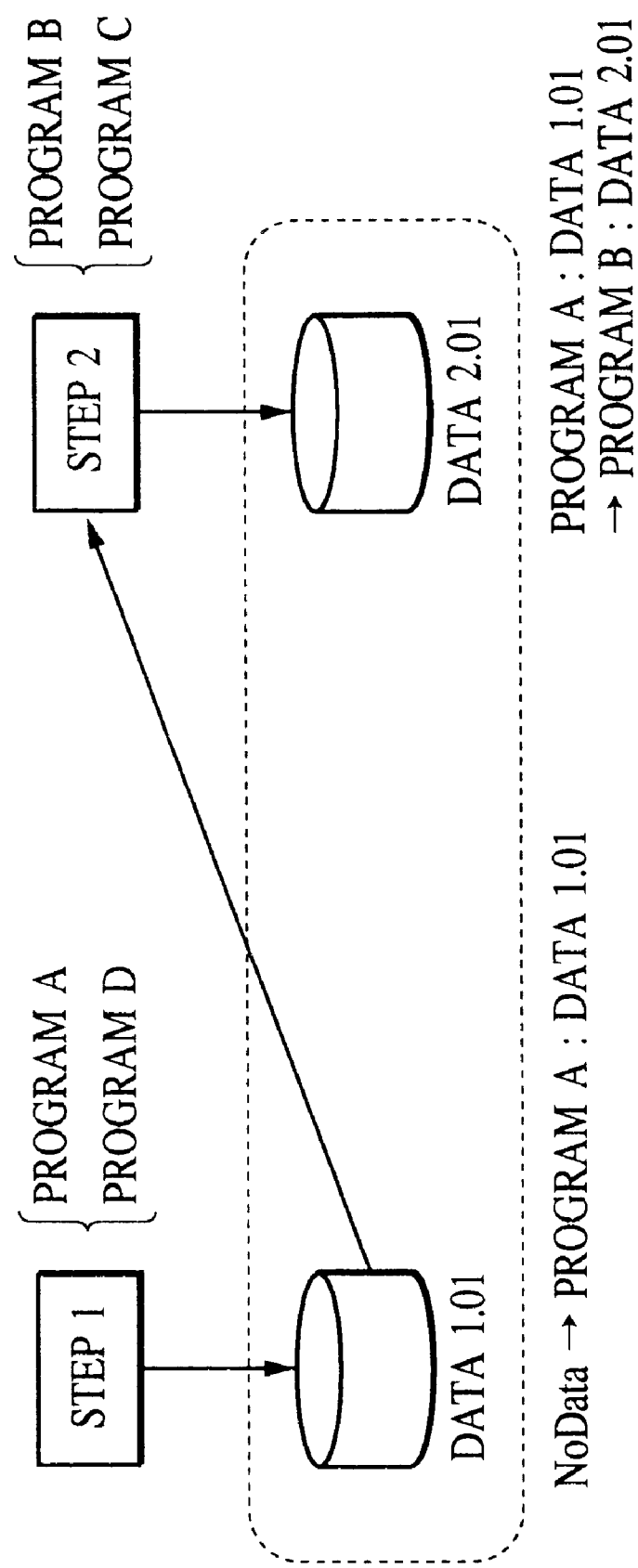
FIG. 71 is a diagram illustrating a method of managing information of a derivative relation between data.

In FIG. 71, program A is appropriated to step 1, and program B is appropriated to step 2. Data 1.01 is generated by executing the process of step 1 using program A. Also, Data 2.01 is generated by executing the process of step 2 using the program B as opposed to this Data 1.01 generated in step 1. At this time, a "derivative relation" holds between Data 1.01 and Data 2.01. In the present embodiment, this derivative relation information is stored in the data storing device 110 for each step.

First, in the case of step 1, no derivative source data exists, so the relation is identified as:

NoData→Program A: Data 1.01

In the case of step 2, Data 1.01 is the derivative source data, so the relation is identified as:

Program A: Data 1.01→Program B: Data 2.01

These expressions are only representations to serve for easy explanation, and do not represent the data configuration within the data storing device 110. Also, here, the CAD tools (programs) and the data generated by the execution thereof are the only objects identified, with the "derivative relation" thereof being expressed, but other conditions may be added, as a matter of course.

In the present embodiment, the existence or nonexistence of "derivative relation" is verified from the relation of this derivative relation information and the version information of the current data (newest data) generated in each step. For example, in FIG. 71, it can be said that there is a "derivative relation" between the Data 2.01 which is the current data of step 2, and the Data 1.01 which is the current data of step 1.

Figure 72:
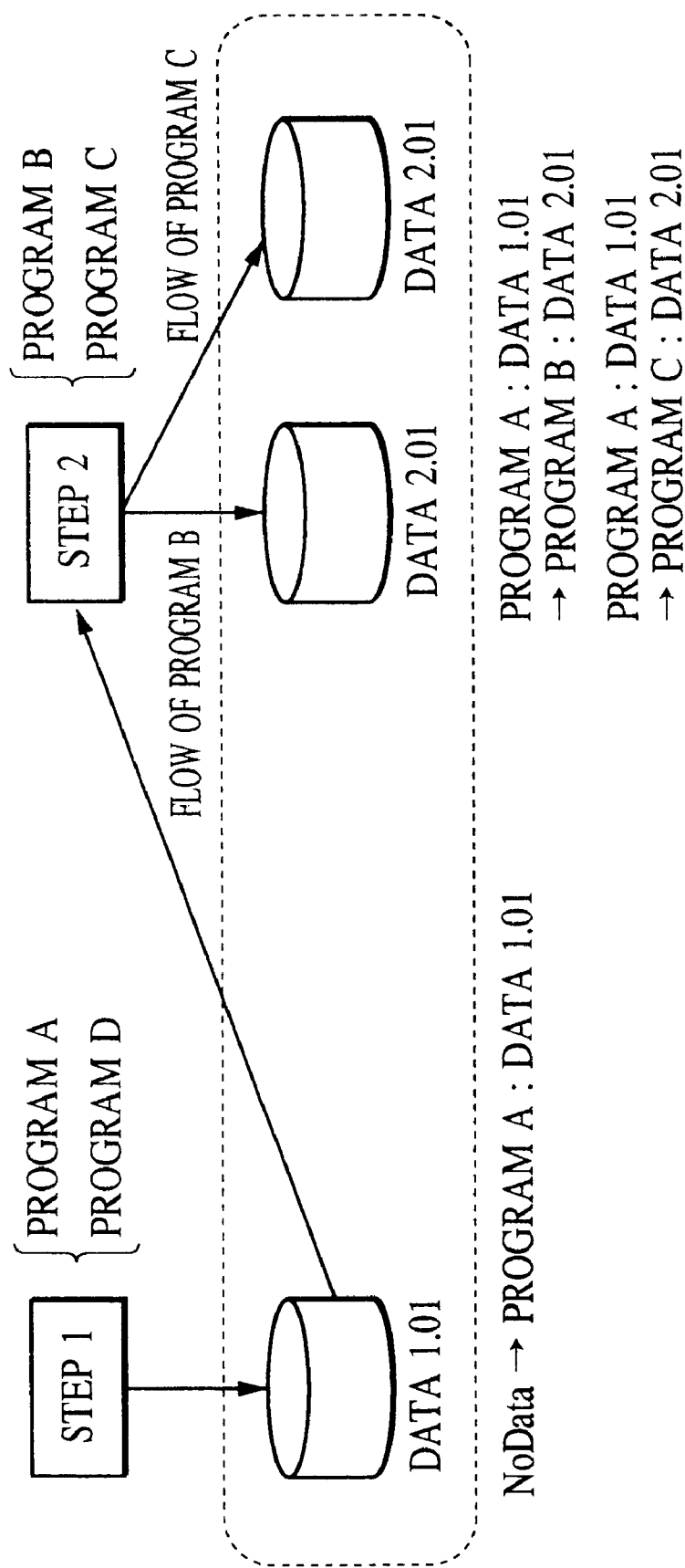
FIG. 72 is a diagram illustrating another method of managing information of a derivative relation between data.

Next, from the state in FIG. 71, changing the program appropriated to step 2 from program B to program C, as shown in FIG. 72, causes step 2 to hold two data flows. One is the flow of data being updated by program B, and the other is the flow of data being updated by program C. After changing the program appropriated to step 2, executing step 2 with program C causes Data 2.01 to be generated, and this data becomes the current data. Accordingly, the derivative relation is identified as:

Program A: Data 1.01→Program C: Data 2.01

Although the program which generated the data is not the same, the derivative source data is the same, so the version number 2.01 which belongs to the data is the same as with program B.

Although the above has been described as data flow of program B and program C, it is needless to say that the present invention is not restricted to two flows; rather, there may be many more flows.

Figure 73:
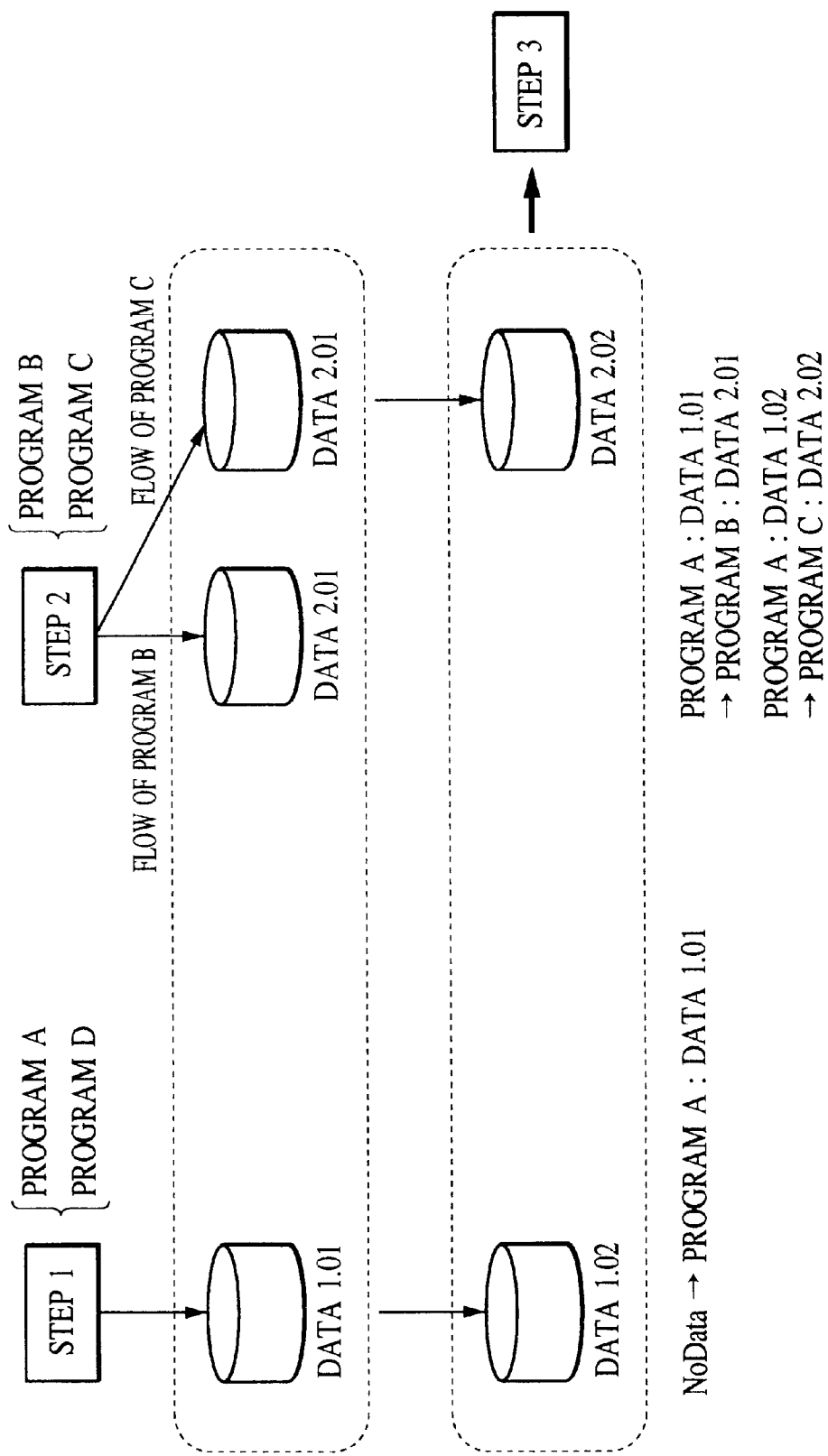
FIG. 73 is a diagram illustrating another method of managing information of a derivative relation between data.

Next, from the state in FIG. 72, data is regenerated again in each step in the order of step 1, step 2, and step 3, as shown in FIG. 73. Each data version is increased by 1 (hereafter referred to as "version update"). i.e., as shown in FIG. 73, there is a version update to Data 1.02 in step 1, and there is a version update to Data 2.02 in step 2. At this time, the derivative relation information of Data 2.02 which is the current data of step 2 is identified as:

Program A: Data 1.02→Program C: Data 2.02

As can be understood from this relation, it can be said that there is a "derivative relation" between the Data 2.02 which is the current data of step 2, and the Data 1.02 which is the current data of step 1.

Finally, from the state in FIG. 73, the CAD tool executed by step 2 is changed once more from program C to program B. In this case, the current data for step 1 remains Data 1.02, but the current data for step 2 returns to the data flow of program B, turning out to be Data 2.01. At this time, the derivative relation information of the Data 2.01 which is the current data of step 2 is:

Program A: Data 1.01→Program B: Data 2.01

In this case, the Data 2.01 can be said to have no "derivative relation" with the Data 1.02 which is the current data of step 1.

Figure 74:
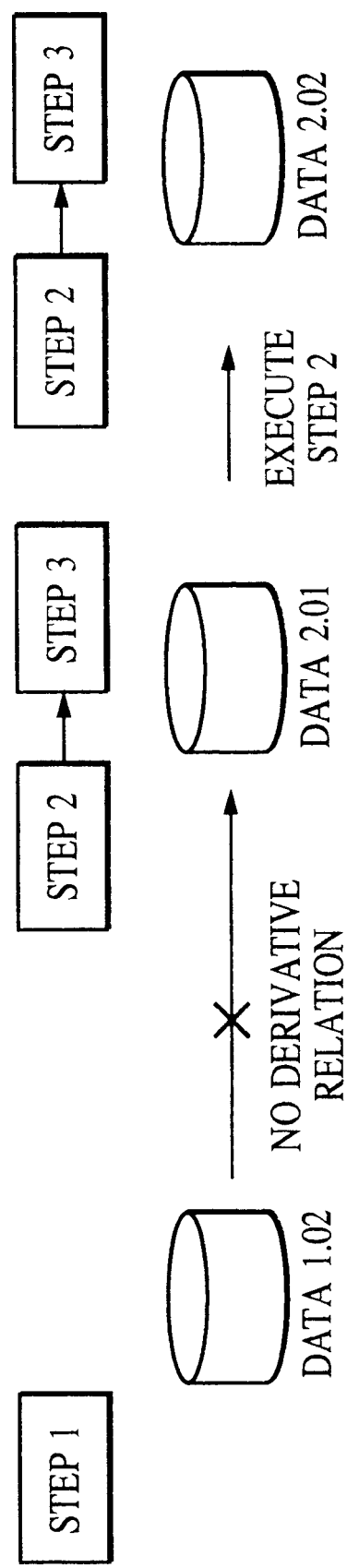
FIG. 74 is a diagram illustrating a further method of managing information of a derivative relation between data.

Hence, in order to allow for a derivative relation with the current data of step 1, the second step must be re-executed. As shown in FIG. 74, re-executing step 2 changes the current data of step 2 to Data 2.02, thus establishing a "derivative relation" with the Data 1.02 which is the current data of step 1.

Now, the change in the executable state of each of the steps step 1, step 2, and step 3, will be described in detail, with relation to this flow of step processing.

Figure 75:
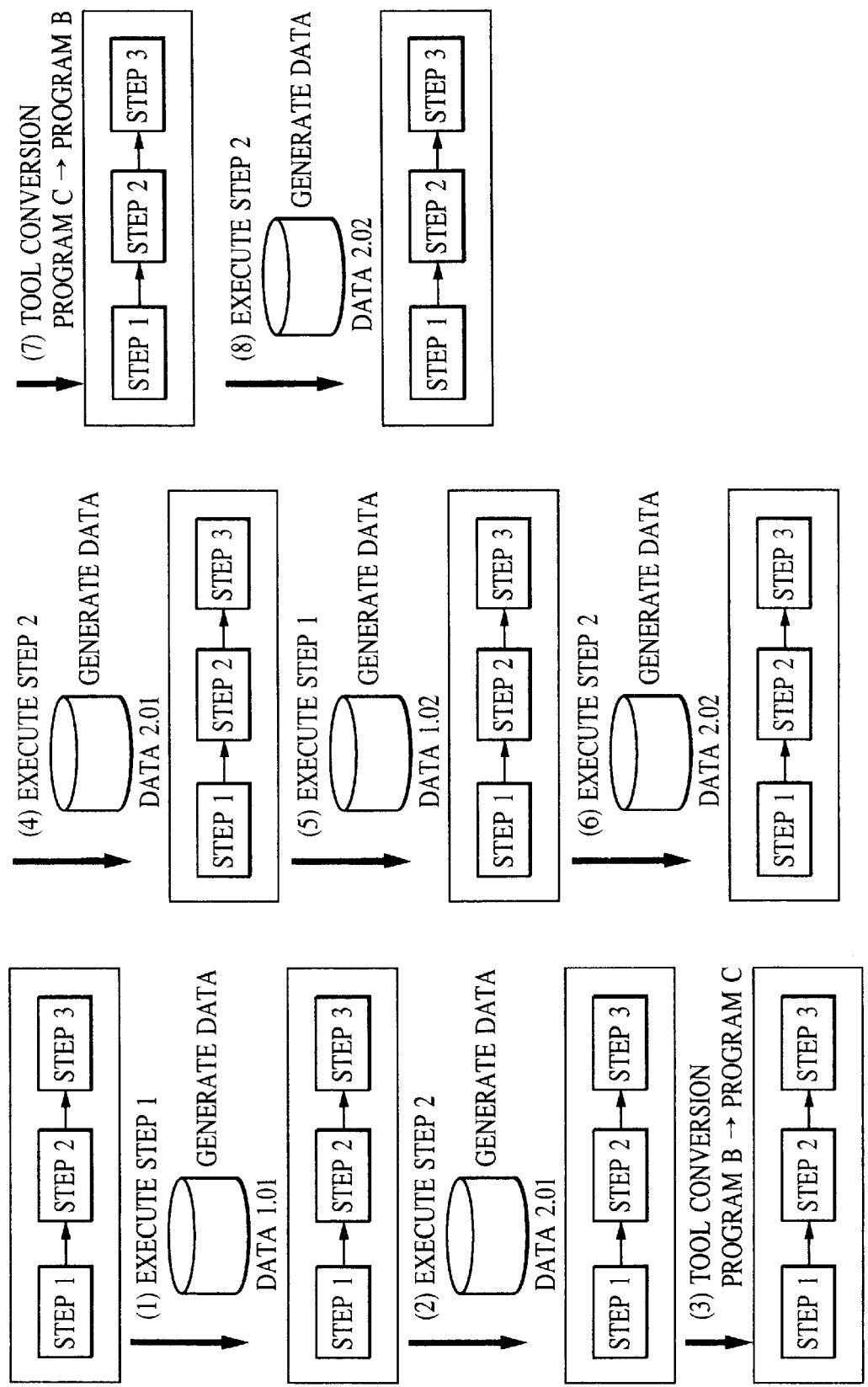
FIG. 75 is a diagram illustrating change in the state of the steps and change in the data version.

FIG. 75 is a diagram illustrating change in the state of the steps and change in the data version.

In FIG. 75, the executable conditions of step 2 are generation of Data 1.xx by step 1, and the executable conditions of step 3 are generation of Data 2.xx by step 2. Also, a state wherein data is not yet generated is the assumed initial state of each step.

Now, description will be made regarding the change in the "derivative relation" and the state of the steps in the following eight process.

(1) Step 1 is executed, and Data 1.xx is generated (hereafter, it is assumed that execution of the step always results in a normal ending, and that necessary data is generated).
(2) Step 2 is executed.
(3) The tool appropriated to step 2 is changed form program B to program C.
(4) Step 2 is executed.
(5) Step 1 is executed.
(6) Step 2 is executed.
(7) The tool appropriated to step 2 is changed form program C to program B.
(8) Step 2 is executed.

Now, first, only step 1 was executable, but this changes to a state wherein step 2 is also executable, due to (1). Next, step 3 also changes to an executable state due to (2). Next, due to (3), the "derivative relation" between the current data of step 1 and the current data of step 2 is lost, so step 3 becomes non-executable. Then, due to (4), a "derivative relation" between the current data of step 1 and the current data of step 2 is created, so step 3 becomes executable again.

Further, due to (5), the "derivative relation" between the current data of step 1 and the current data of step 2 is lost, so step 3 becomes non-executable again. Then, due to (6), the "derivative relation" between the current data of step 1 and the current data of step 2 is created, so step 3 becomes executable again. Next, due to (7), the "derivative relation" between the current data of step 1 and the current data of step 2 is lost, so step 3 becomes non-executable. Finally, due to (8), the "derivative relation" between the current data of step 1 and the current data of step 2 is created, so step 3 becomes executable once more.

Thus, according to the present embodiment, the difference in data versions has been taken into consideration as an executable condition, so inspection of the state of the steps can be performed in a more precise manner.

(Seventh Embodiment)

In order to perform changing processing of the input/output buffer information in the present embodiment, it is absolutely necessary to have the two following steps in the group of steps which are executed by the present design management program 112: a step for generating HDL (Hardware Description Language) including input/output buffer information, and a step for changing the input/output buffer information within the generated HDL. Also, the input/output buffer information in the present embodiment is to be used in ASICs which include FPGAs, and is the same as the input/output buffer information 801 shown in FIG. 8.

Description will now be made regarding the changing processing of this input/output buffer information, with reference to FIGS. 50 through 61.

Figure 50:
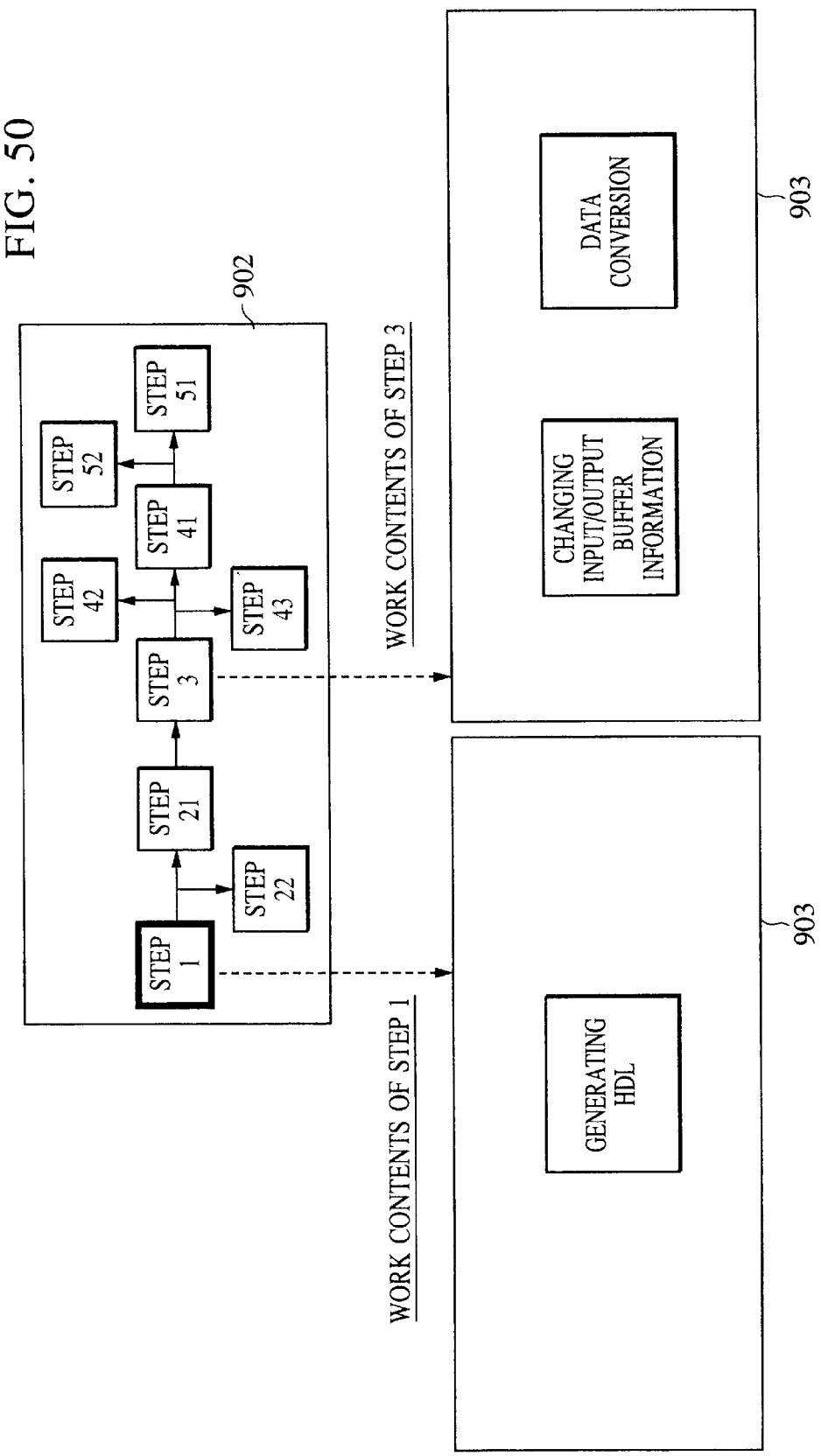
FIG. 50 is a diagram illustrating the work contents of step 1 and step 3 in the step relation diagram.

FIG. 50 is a diagram illustrating the work contents of step 1 and step 3 in the step relation diagram in the step group display area 902 being displayed in the work content display area 903.

In the step relation diagram in FIG. 50, an example is shown wherein, first, HDL generation is performed in step 1, and the input/output buffer information within the HDL generated in step 1 is changed in step 3, following which the HDL data is converted into other data. Incidentally, the other data created by conversion in step 3 may be used to change the input/output buffer information again.

Now, detailed description will be given regarding the work contents of step 1 and step 3 in FIG. 50.

First, regarding the HDL generation processing in step 1, data A which is an HDL file including input/output buffer information is generated according to an input instruction of the designer. This data A passes through step 21 and is used in step 3. In this step 1, data A may be generated by any method. For example, this may be a designing tool such as electric CAD vendors commercially sell, or a text editor. Also, HDL may be generated in other steps and not be restricted to step 1, but the generation processing of the HDL must always be performed before changing processing of the input/output buffer information. The reason is that HDL includes input/output buffer information.

Next, based on the data A generated in step 1, step 3 performs two pieces of work, i.e., changing the input/output buffer information within the data A according to instructions by the designer, and subsequently converting data A into data B so as to optimize the data for use in step 3 and the subsequent steps.

The work contents of step 3 indicated here are only an explanatory example, and in practice there may be other processes besides changing of the input/output buffer information and data conversion, and there is no restriction on the processing order thereof, either. With the present embodiment, no other processes besides changing of the input/output buffer information and data conversion have been conducted, and both processes have been performed with no change in order, to simplify the explanation.

Now, further detailed description will be made regarding the two work contents within step 3.

Figure 51:
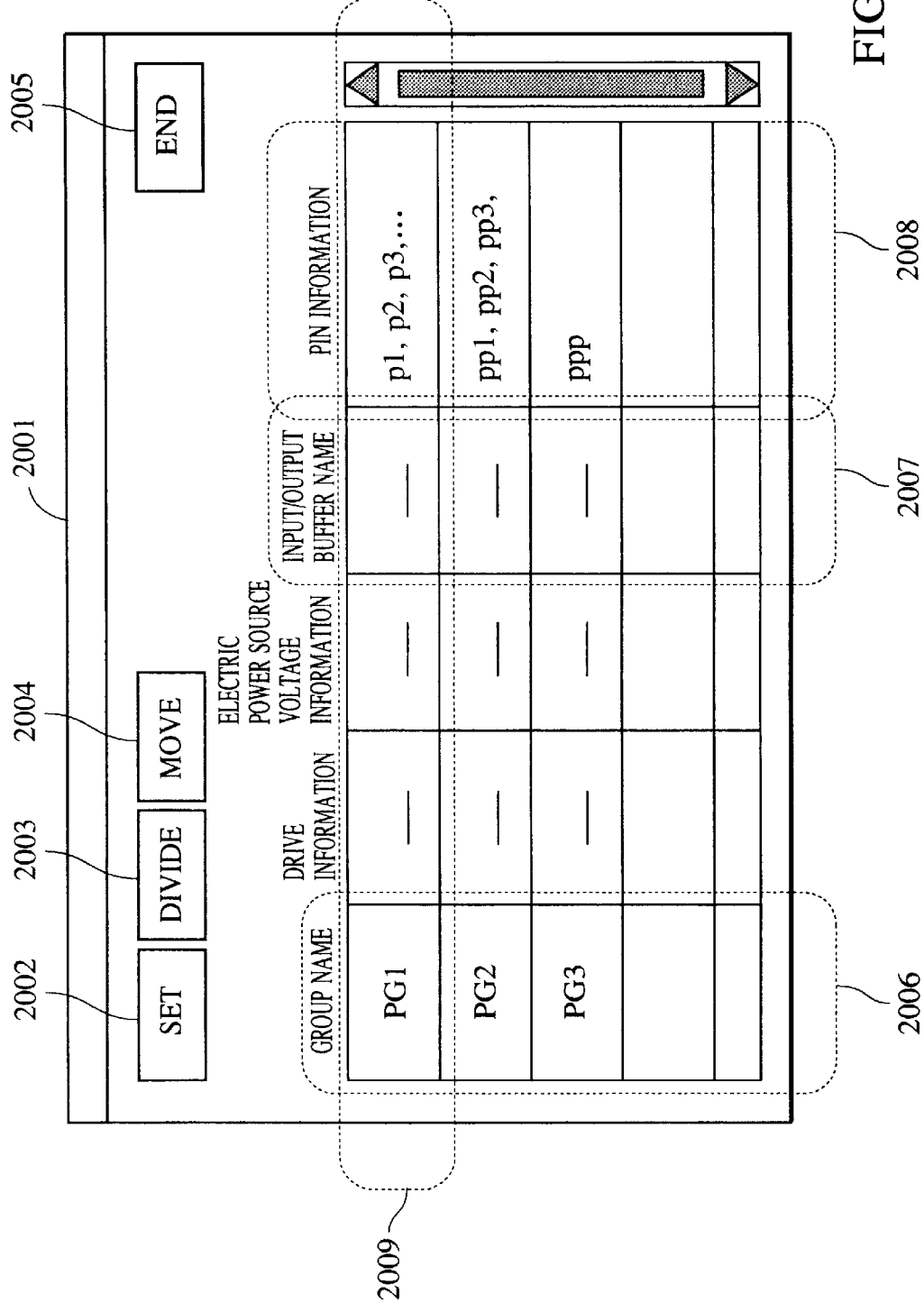
FIG. 51 is a diagram illustrating an input/output buffer information setting panel.

First, an input/output buffer information setting panel 2001 such as shown in FIG. 51 is displayed on the main panel 901 on the CRT display by instruction of an input device such as the keyboard 102 or mouse 104. The input/output buffer information is changed on this input/output buffer information setting panel 2001.

FIG. 51 is a diagram illustrating the input/output buffer information setting panel 2001 displayed on the main panel 901.

Button operation on this input/output buffer information setting panel 2001 enables switching from the initial default mode to three modes, i.e., item setting mode, group division mode, and pin moving mode.

In this FIG. 51, instructing the setting button 2002 using an input device such as the keyboard 102 or mouse 104 brings up the setting mode. Also, instructing the group division button 2003 brings up the group division mode, and instructing the pin moving button 2004 brings up the pin moving mode. Instructing the end button 2005 causes the input/output buffer information setting panel 2001 to close and end processing.

Also, in FIG. 51, 2006 denotes a column displaying group names, 2007 denotes a column displaying input/output buffer names, and 2008 denotes a column displaying pin information registered to each group.

Further, there are columns between the column 2006 and column 2007, displaying drive information and displaying electric power source voltage information. "Drive information" as referred to here means the amount of electrical current which can be applied to the input/output buffer, and "electric power source voltage information" indicates the voltage of the electric power source providing energy to the input/output buffer. The input/output buffer in the present invention includes all of the drive information, electric power source voltage information, and input/output buffer name (temperature information and so forth may be included, as well).

Also, 2009 is a row for displaying information relating to the group PG1, and rows for group PG2, group PG3, and so forth continue below. Thus, the pins are grouped in FIG. 51, but such pin grouping in the present invention is performed by the present step managing apparatus 101, based on difference in the types of pins, such as input, output, input/output, and so forth (judgment may be made by the pin names, or otherwise).

The designer instructing execution of step 3 by an input device such as the mouse 104 displays the input/output buffer information setting panel 2001. Detailed information read from data A is displayed on the input/output buffer information setting panel 2001 for each group, this information being drive information, electric power source voltage information, input/output buffer name, and so forth.

In FIG. 51, with group PG1, the pin information is determined beforehand such as p1, p2, p3, and so forth. However, the drive information, electric power source voltage information, and input/output buffer name is undetermined. This is because either there was no already-existing setting information, or any existing information did not match the grouped data. In other words, conversely, in the case that there is existing setting information, and this information matches the grouped data, detailed information is displayed on the input/output buffer information setting panel 2001, from the drive information column to the input/output buffer name column.

Also, in the event that the number of pins is large, as is true with the registered pins of PG1, only as much as can be displayed in the display area is displayed. Of course, the display area can be enlarged to show all of the registered pins, but here we shall take the visual effects of the display into consideration, and show up to three.

Also, in FIG. 51, there are two columns between the columns of group name 2006 and pin information 2008 for items to narrow down the candidates for input/output buffer names, and there is also a column for setting the input/output buffer name, making three such columns, but it is needless to say that the number of such columns is not restricted to three. Also, there are two general methods of setting the input/output buffer information. One is to specify the drive information and electric power source voltage information, thereby narrowing down the candidates for the input/output buffer name, and the other is to not narrow down the names, but to directly set the input/output buffer name.

Now, description will be made regarding setting of the input/output buffer information according to the former method.

Figure 52:
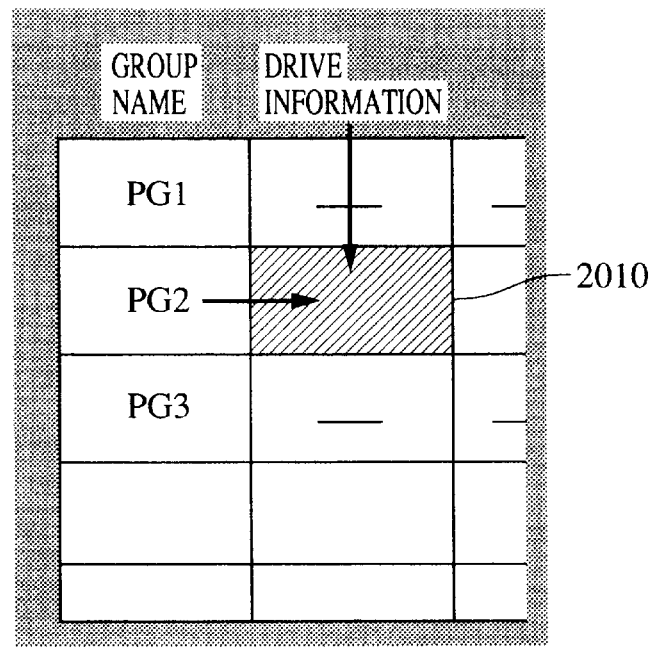
FIG. 52 is a diagram illustrating an instruction area on the input/output buffer information setting panel.
Figure 53:
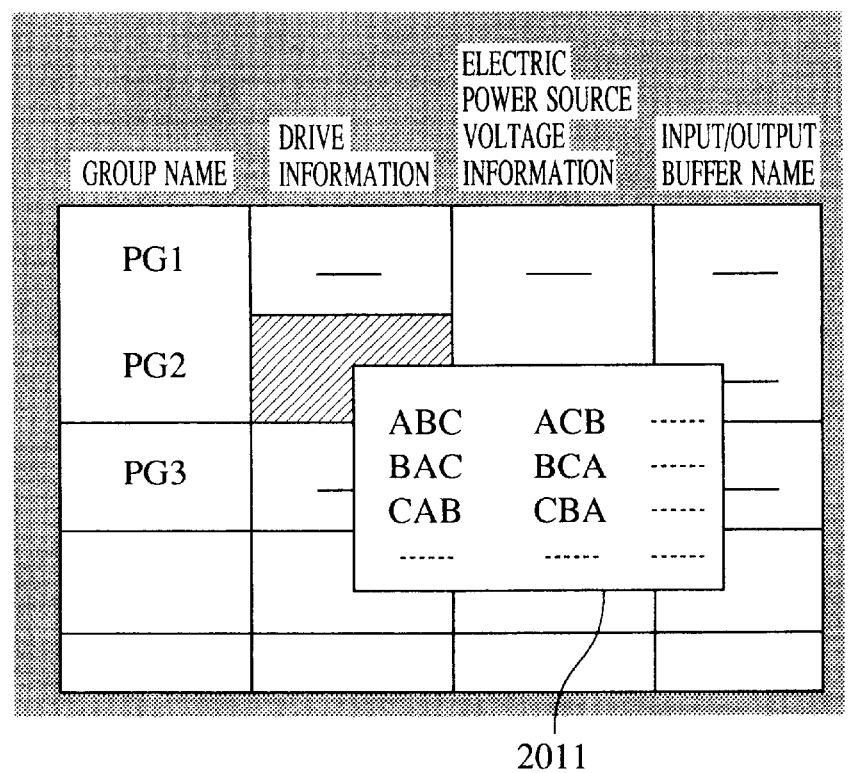
FIG. 53 is a diagram illustrating a sub-window on the input/output buffer information setting panel.

First, using an input device such as the mouse 104, the designer instructs the setting button 2002 toward the top of the input/output buffer information setting panel 2001, thus entering the item setting mode, enabling setting of items. Here, as shown in FIG. 52, instructing an area 2010 which is an overlapping area between the object group (PG2 here) and setting item (drive information here) using an input device such as the mouse 104 displays a sub-window 2011 showing a list of the item elements on the input/output buffer information setting panel 2001, as shown in FIG. 53. Now, by means of the designer selectively instructing a desired element thereof, the sub-window 2011 is closed, and the selectively instructed element is displayed in the area 2010.

Description of the processing which the APU 106 performs will now be made.

First, the APU 106 writes the selectively instructed drive information to the data storing device 110 which maintains group-related information. Then, in the event that judgment has been made that the candidates for the input/output buffer name have been sufficiently narrowed down, the designer is instructed to set the input/output buffer name next, and in the event that the narrowing down has been judged to be insufficient, the designer is instructed to set the electric power source voltage information, and when the designer sets the electric power source voltage information, further narrowing down of candidates is performed, and the designer is instructed at the end to set the input/output buffer name. Also, the arrangement may be such that the designer judges whether or not the narrowing down of the candidates for the input/output buffer name is sufficient or not, and performs further setting.

The setting of the input/output buffer name is the same as the case of setting the drive information and electric power source voltage information, in that the sub-window 2011 is opened, and instructing is performed with a input device such as the mouse 104 or the like. Now, when displaying the sub-window 2011, the candidates for the input/output buffer name have been narrowed down from the drive information and electric power source voltage information, so only the narrowed-down element are displayed.

Next, description will be made regarding the setting of the input/output buffer name using the later method.

In this case, there is no setting of drive information and electric power source voltage information, and the input/output buffer name is input directly, so there is no narrowing down of candidates. In the event of displaying the sub-window 2011, all of the candidates are displayed. However, this method is effective in the case where there are few elements for the input/output buffer name.

Also, the drive information, electric power source voltage information, and input/output buffer name displayed in the sub-window 2011 correspond with the target set in the fifth embodiment. In other words, setting the target information in the fifth embodiment already has narrowed down the input/output buffer information.

Next, group dividing on the input/output buffer information setting panel 2001 will be described in detail.

First, group dividing processing is a process which divides one group displayed on the input/output buffer information setting panel 2001 into a plurality of groups. Originally, setting of the input/output buffer information is more efficient when performed one group at a time, but in the event that there are pins within the same group each of which needs setting of different input/output buffer information, group division must be carried out.

The following is an example of group division.

First, using an input device such as the mouse 104, the designer instructs the group dividing button 2003, thus entering the group dividing mode. Then, instructing an area which is an intersecting area between a column displaying pin information and a group row which is the object of division displays a sub-window the same as 2011 showing the pins included in the instructed group. Next, the designer selectively instructs all of the pins which are the object of division, and presses the end button 2005, whereby the sub-window is hidden from view, and new group data based on the selected pins is structured within the data storing device 110, and the original group is divided into two. Following group division, the new group row is added to the input/output buffer information setting panel 2001, and the screen is displayed again.

For example, in the event that there are ten pins, p1 through p10 in the group PG1 shown in FIG. 51, and the designer instructs that the even-numbered pins be divided for group division, the group PG1 following division would have the even pins removed, and would be a group consisting of odd-numbered pins p1, p3, through p9. Also, the group generated by division and consisting of even-numbered pins p2, p4, through p10 is given a new different name PG1'. The different name PG1' is registered in the data storing device 110, thus completing group division. At this time, if there is input/output buffer information set within the group PG1, division is performed including the input/output buffer information, and the input/output buffer information of the group PG1' which is newly generated following group division has the same settings as the input/output buffer information of the group PG1. Incidentally, the input/output buffer information of the group PG1' can be changed according to the above-described setting processing.

Also, there are cases in which the designer may desire to return several of the pins to the original group, following group division. In such a case, processing is necessary to move pins between groups. The following is a detailed description of an example of a pin moving processing on the input/output buffer information setting panel 2001.

First, using an input device such as the mouse 104, the designer instructs the moving button 2004, thus entering the pin moving mode. Then, instructing an area which is an intersecting area between a row of the group to which the pins will be moved and a column displaying pin information a sub-window the same as 2011 is displayed, showing all of the pins capable of being moved to another group. Next, the designer selectively instructs all of the pins which are the object of moving, and presses the end button 2005, whereby the sub-window is hidden from view, and pin movement is performed within the data storing device 110, thereby restructuring the group data. After movement of the pins, pin information of the added pins is displayed on the pin information display area of the group to which the pins have been moved, on the input/output buffer information setting panel 2001, and pin information of the moved pins is deleted on the pin information display area of the group from which the pins have been moved.

For example, in the event that p1 and pp1 of group PG1 and group PG2 are each to be moved to a group PG3 show in FIG. 51, the designer instructs the pin information display area (the area where ppp is displayed) of the group PG3 using the mouse 104 or the like, an unshown sub-window resembling the sub-window 2011 is displayed, and further p1 and PP1 are instructed on that sub-window, following which the end button 2005 is pressed. The sub-window is hidden from view, the pin information display area of the group PG1 is changed to "p2, p3, p4, . . . " and so forth, the pin information display area of the group PG2 is changed to "pp2, pp3" and the pin information display area of the group PG3 is changed to "p1, pp1, ppp".

Also, after ending the changing processes of the input/output buffer information, instructing the end button 2005 closes the input/output buffer information setting panel 2001, whereupon output of buffer information is performed, and replacing of the input/output buffer information of data A and the set input/output buffer information is performed. The data A which has been changed according to the replacement results is further converted into data B, thus completing all work within the step 3.

Then, following ending of all operation in step 3, performing inspection of the state of the steps again from step 1 enables judgment to be made regarding the state of the subsequent steps, according to the results of the changing processing of the input/output buffer in step 3.

Now, the flow of changing processing of the input/output buffer information using the input/output buffer information setting panel 2001 will now be described in detail with reference to the flowcharts in FIGS. 54 through 61.

Figure 54:
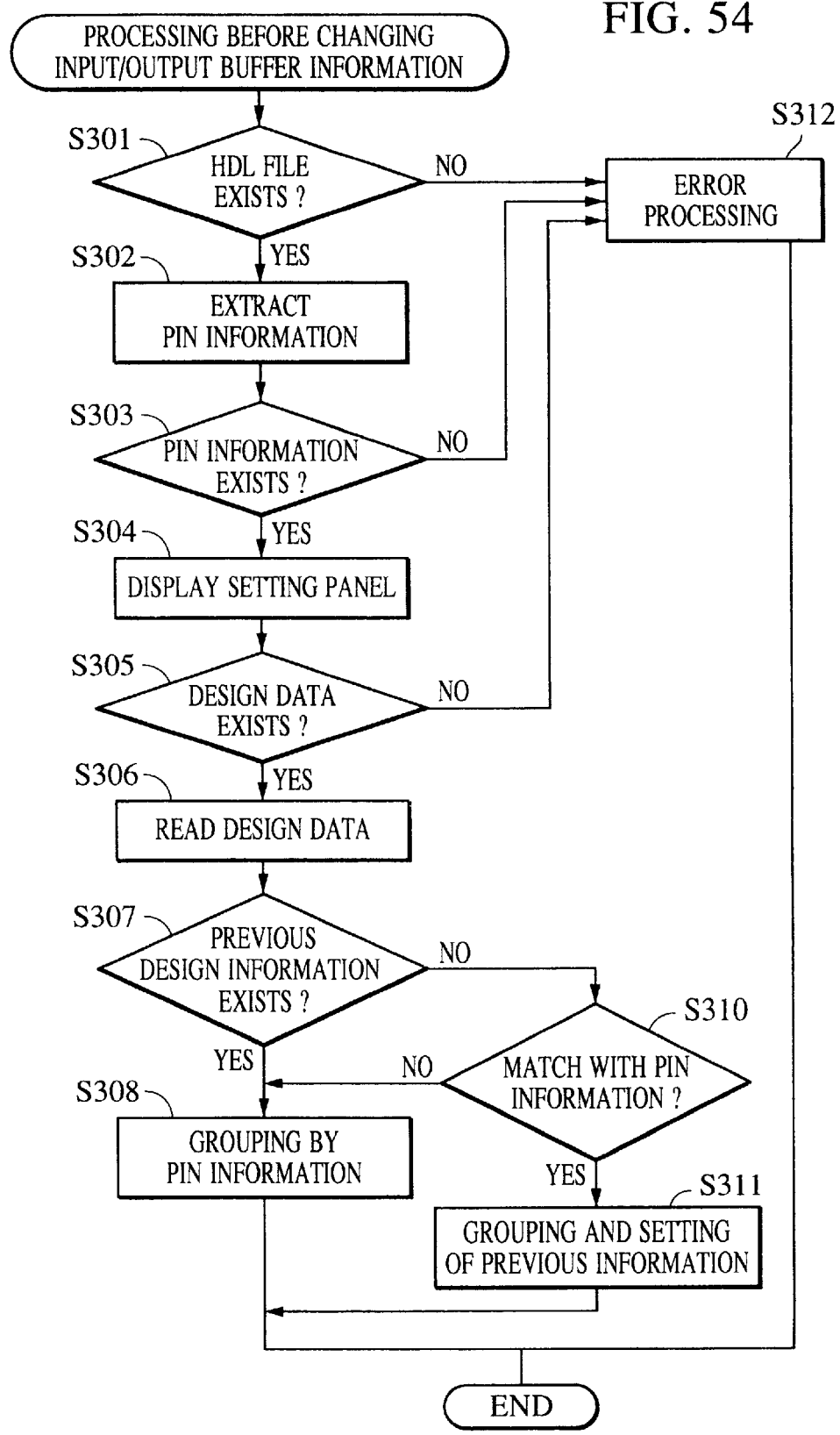
FIG. 54 is a flowchart for pre-processing of input/output buffer information.

FIG. 54 is a flowchart for pre-processing of input/output buffer information changing.

In Step S301, judgment is made whether an HDL file exists. In the event that the file does not exists, the flow proceeds to Step S312, where error processing is performed. With the error processing in Step S312, data is initialized and an error message is displayed. If the HDL file exists, the flow proceeds to step S302. In Step S302, pin information such as the names and types of pins connected to the uppermost ASIC block is extracted from the HDL file, and in Step S303, confirmation is made whether or not the extracted pin information exists. If the extracted pin information exists, the flow proceeds to Step S304, and in the case where this does not exist, the flow proceeds to error processing in Step S312.

Next, in Step S304, the input/output buffer information setting panel 2001 is displayed, and in Step S305, confirmation is made whether or not design data necessary for changing processing, including the pin data extracted in Step S302, exists. In the event that the design data exists, the flow proceeds to Step S306, and in the event that this does not exist, the flow proceeds to error processing in Step S312. Next, in Step S306, these design data are read, and the flow proceeds to Step S307.

Next, in Step 307, judgment is made whether or not prior set data exists, and in the event that the prior set exists, the flow proceeds to Step S310, and in the event that this does not exist, the flow proceeds to Step S308, wherein related information is grouped by pin information, and the series of processes ends. In Step S310, judgment is made whether or not the previously set information matches with the newly read pin information, i.e., whether these can be grouped into a single group, as described above, and in the case that these match, the flow proceeds to Step S311, wherein related information is grouped by the previously set information, and the series of processes ends. Also, in the event that these do not match, the flow proceeds to Step S308, wherein related information is grouped by pin information, and the series of processes ends.

Following ending of this flowchart, the flow enters a standby state waiting for operation by the designer.

Figure 55A:
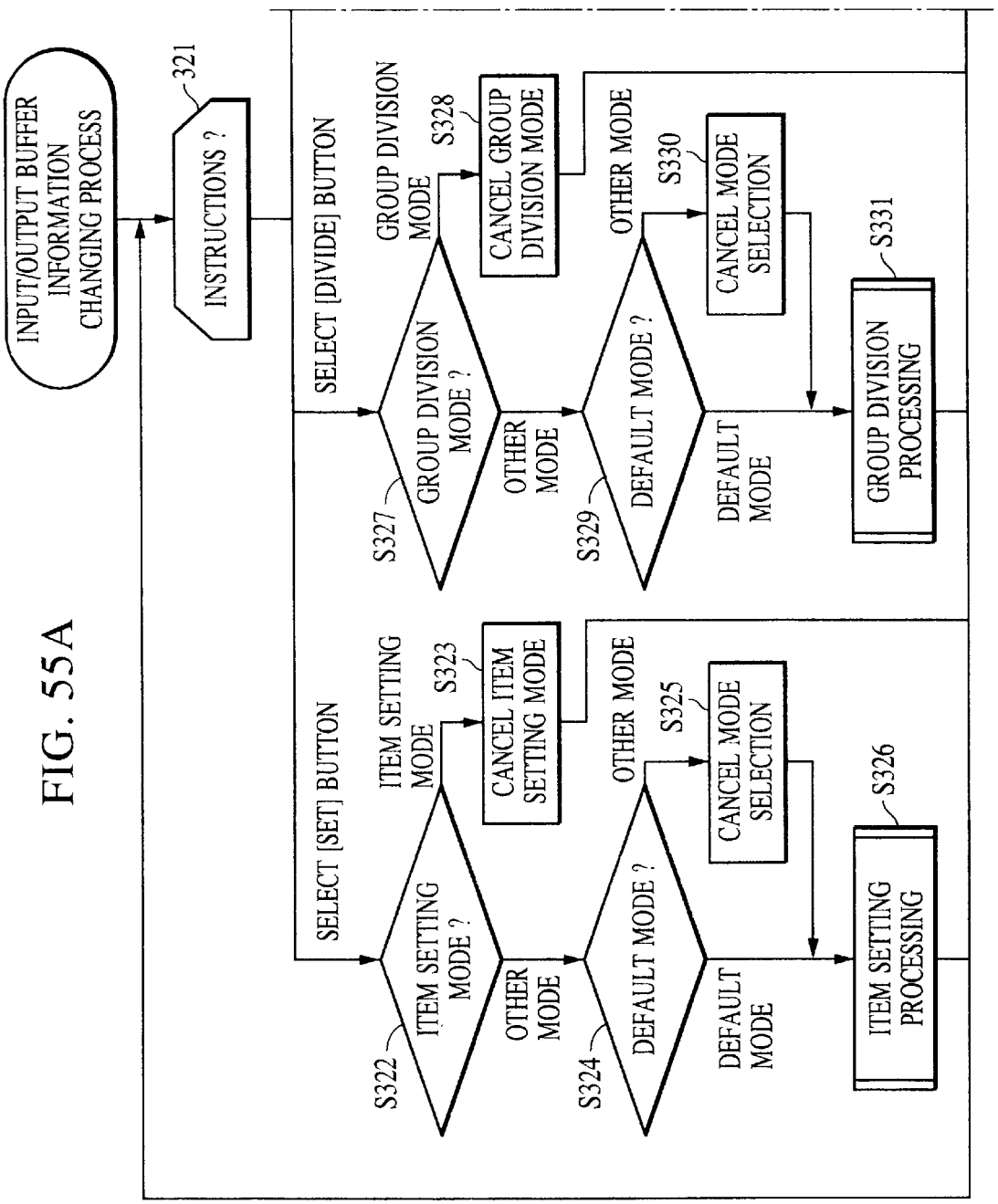

FIGS. 55A and 55B are flowcharts for changing processing of input/output buffer information, following the pre-processing shown in FIG. 54.

In Step S321, judgment is made regarding what sort of instructions have been received. Now, in the event that judgment is made that the setting button 2002 has been selected, judgment is made in Step S322 whether or not the mode is already the item setting mode, and in the even that the mode is already the item setting mode, the flow proceeds to Step S323, wherein the mode is canceled, and the flow returns to Step S321. Also, in the event that the mode is a different mode, the flow proceeds to Step S324 and judges whether or not the mode is the initial default mode. In the event that the mode is not the default mode, the selected mode is canceled in step 325, following which the flow proceeds to Step S326, and in the event that the mode is the default mode, the flow proceeds directly to Step S326. Then, item setting processing is performed in Step S326.

Also, in Step S321, in the event that judgment is made that the dividing button 2003 has been selected, judgment is made in Step S327 whether or not the mode is already the group dividing mode, and in the event that the mode is already the group dividing mode, the flow proceeds to Step S328, wherein the mode is canceled, and the flow returns to Step S321. Also, in the event that the mode is a different mode, the flow proceeds to Step S329 and judges whether or not the mode is the initial default mode. In the event that the mode is not the default mode, the selected mode is canceled in step 330, following which the flow proceeds to Step S331, and in the event that the mode is the default mode, the flow proceeds directly to Step S331. Then, group dividing processing is performed in Step S331.

Also, in Step S321, in the event that judgment is made that the moving button 2004 has been selected, judgment is made in Step S332 whether or not the mode is already the pin moving mode, and in the event that the mode is already the pin moving mode, the flow proceeds to Step S333, wherein the mode is canceled, and the flow returns to Step S321. Also, in the event that the mode is a different mode, the flow proceeds to Step S334 and it is judged whether or not the mode is the initial default mode. In the event that the mode is not the default mode, the selected mode is canceled in Step S335, following which the flow proceeds to Step S336, and in the event that the mode is the default mode, the flow proceeds directly to Step S336. Then, pin moving processing is performed in Step S336.

Further, in Step S321, in the event that judgment is made that the end button 2005 has been selected, judgment is made in Step S337 whether or not the mode is the initial default mode. In the event that the mode is not the default mode, the selected mode is canceled in step S338, following which the flow proceeds to Step S339, and in the event that the mode is the default mode, the flow proceeds directly to Step S339. Then, ending processing is performed in Step S339, thus ending the series of processes.

Figure 56:
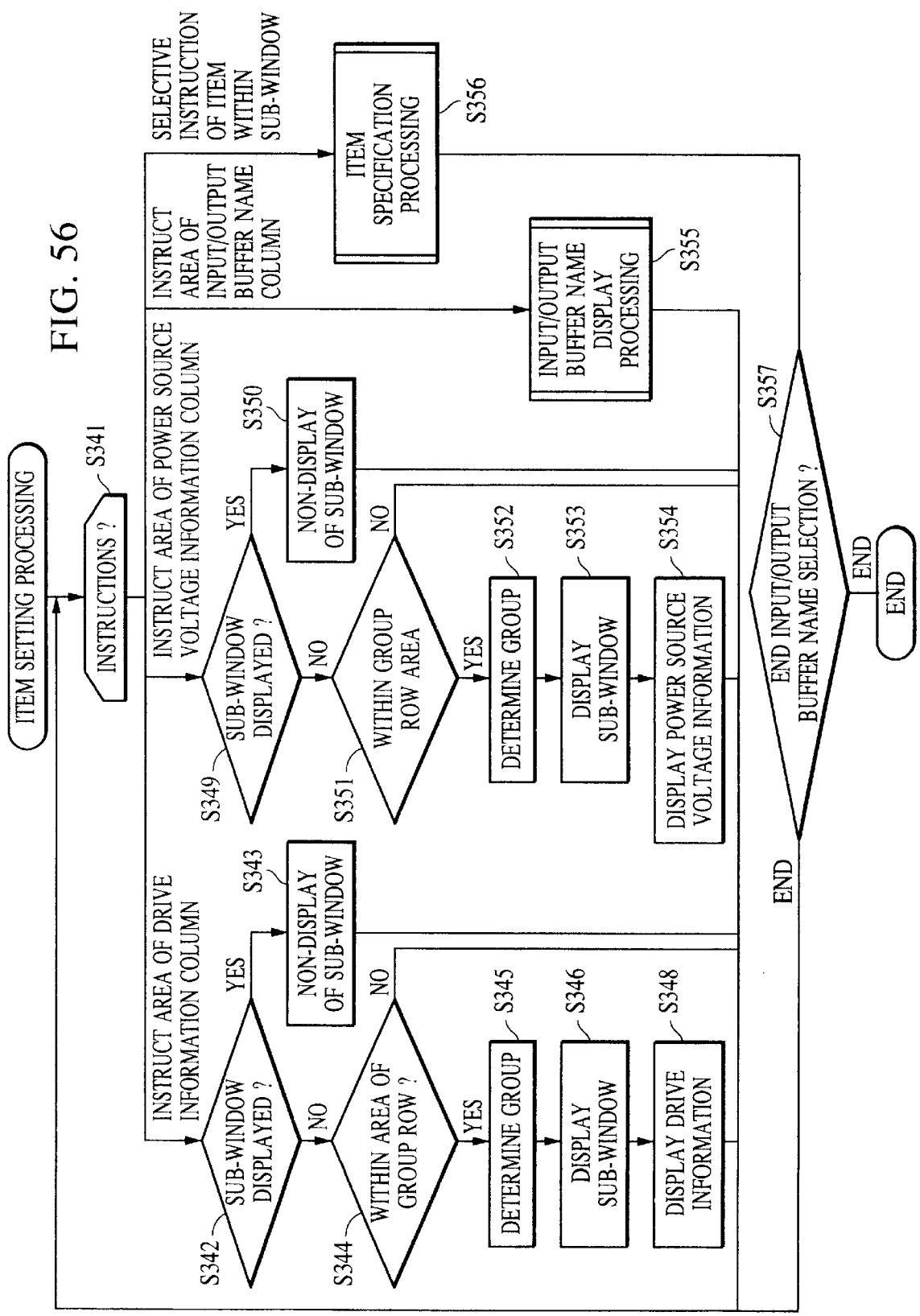
FIG. 56 is a flowchart for item setting processing.

Next, detailed description will be made regarding the flow of item selection processing in Step S326, with reference to the flowchart in FIG. 56.

In Step S341, judgment is made regarding what sort of instructions have been received. Now, in the event that judgment is made that the column area of drive information has been instructed, judgment is made in Step S342 whether or not a sub-window is already displayed or not. In the event that the sub-window is displayed, the sub-window is hidden from view in Step S343, and the flow returns to Step S341. Also, in the event that the sub-window is not displayed, the flow proceeds to Step S344, and judges whether the instructed position is within the group row area. If judgment is made that this is out of the area, the flow returns to Step S341, and in the event that judgment is made that this is in the area, the flow proceeds to Step S345 wherein the instructed group is determined. Then, in Step S346, the drive information of the instructed group is displayed in the sub-window, and then the flow returns to Step S341.

Also, in Step S341, in the event that judgment is made that the area of the column for electric power source voltage information has been instructed, judgment is made in Step S349 whether or not a sub-window is already displayed or not. In the event that the sub-window is displayed, the sub-window is hidden from view in Step S350, and the flow returns to Step S341. Also, in the event that the sub-window is not displayed, the flow proceeds to Step S351, and judges whether the instructed position is within the group row area. If judgment is made that this is out of the area, the flow returns to Step S341, and in the event that judgment is made that this is in the area, the flow proceeds to Step S352 wherein the instructed group is determined. Then, in Step S353, sub-window is displayed, and in Step S354, the electric power source voltage information of the instructed group is displayed in the sub-window, and then the flow returns to Step S341.

Also, in Step S341, in the event that judgment has been made that the area of the column for the input/output buffer name has been selectively instructed, input/output buffer name displaying processing is performed in Step S355, and the flow then returns to Step S341.

Also, in Step S341, in the event that judgment has been made that an item within the sub-window has been selectively instructed, item specifying processing is performed in Step S356. Then, in Step S357, judgment is made whether or not the selection instruction of the input/output buffer name has ended, and in the event that judgment is made that this has not ended, the flow returns to Step S341, and in the event that judgment is made that this has ended, the series of processes ends.

Figure 57:
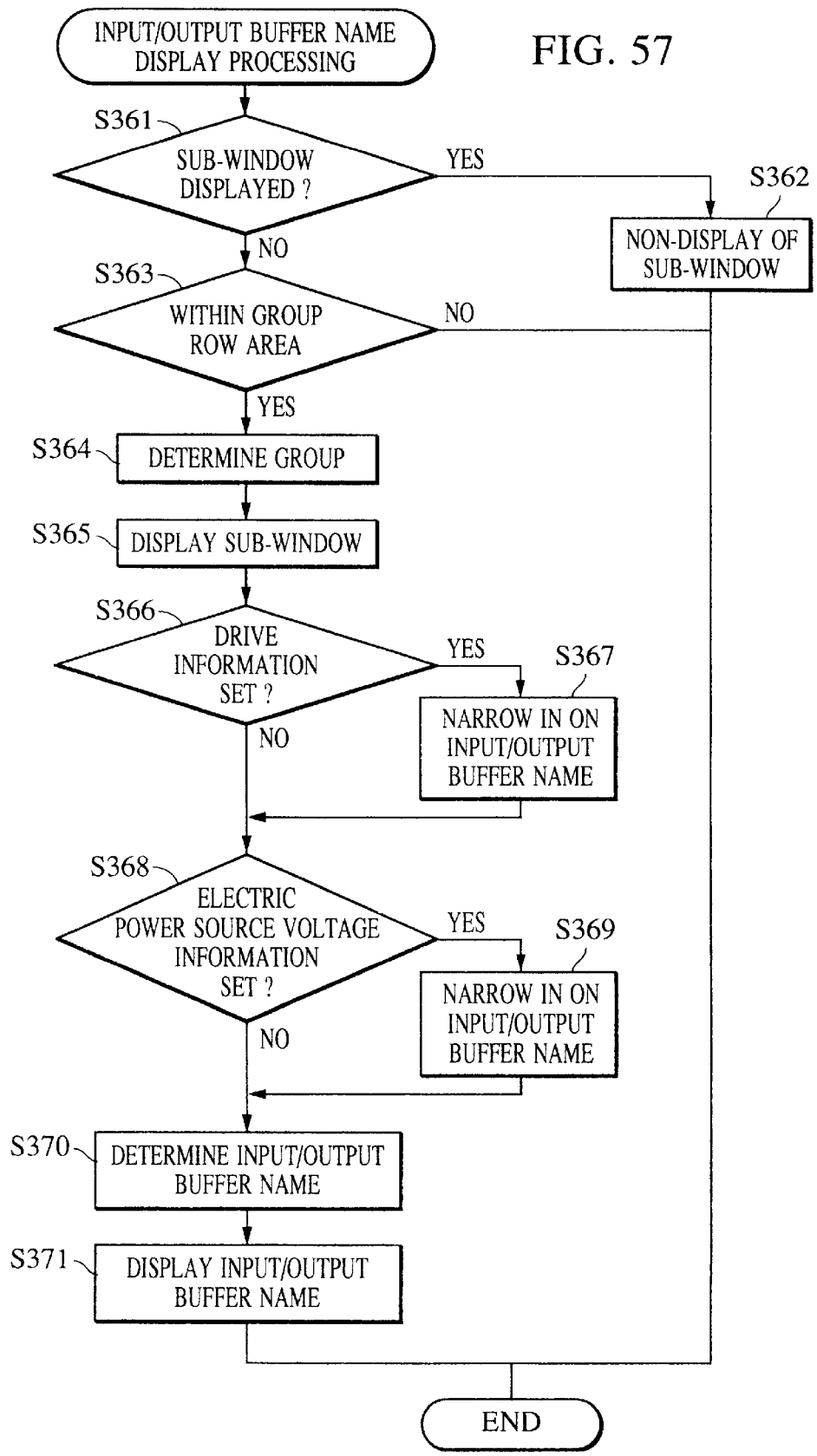
FIG. 57 is a flowchart for input/output buffer information name displaying processing.

Next, further detailed description will be made of the flow of display processing of input/output buffer names in Step S355, with reference to the flowchart shown in FIG. 57.

In Step S361, judgment is made whether or not the sub-window is already displayed. In the event that the sub-window is already displayed, the sub-window is hidden from view in Step S362, and the process is ended. On the other hand, in the event that the sub-window is not already displayed, the flow proceeds to Step S363, and judgment is made whether or not the indicated position is within the group row area. In the event that this is out of the area, the process is ended, and in the event that this is in the area, the flow proceeds to Step S364, thus determining the specified group.

Then, in Step S365, the sub-window is displayed, and in Step S366, judgment is made whether drive information is set or not. In the event that the setting is judged to be completed, narrowing down of the input/output buffer name is performed in Step S367, based on the set drive information, and the flow then proceeds to Step S368. In the event that the setting is judged to have not been performed, the flow proceeds straight to Step S368. Then, in Step S368, judgment is made whether electric power source voltage information is set or not. In the event that the setting is judged to be completed, narrowing down of the input/output buffer name is performed in Step S369, based on the set electric power source voltage information, and the flow then proceeds to Step S370. In the event that the setting is judged to have not been performed, the flow proceeds straight to Step S370. Then in Step S370, input/output buffer names to be displayed as candidates are determined, and in Step S371, these are displayed on the sub-window.

Figure 58:
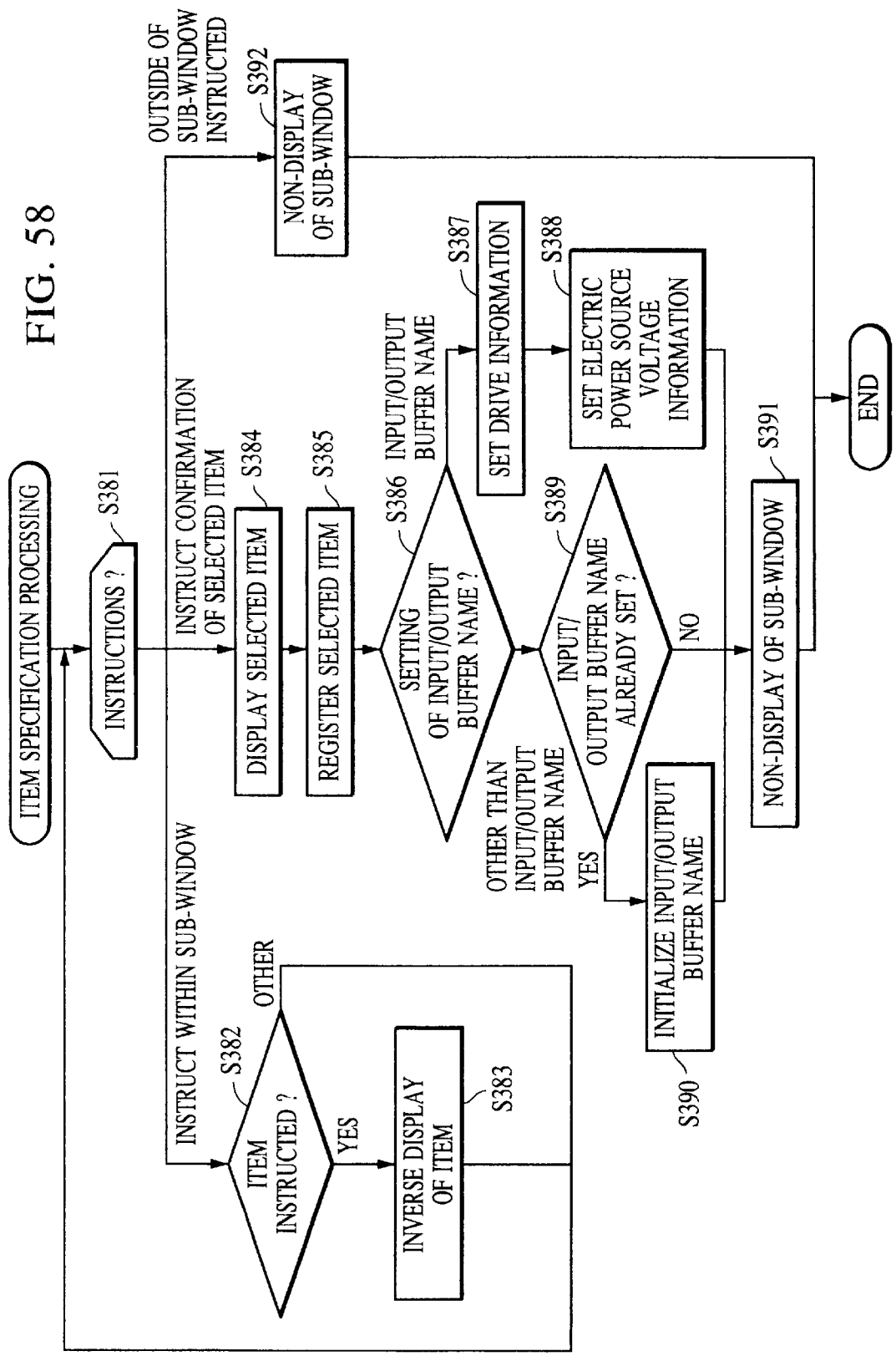
FIG. 58 is a flowchart for item specifying processing.

Next, further detailed description will be made of the flow of processing item specification in Step S356, with reference to the flowchart shown in FIG. 58.

In Step S381, judgment is made regarding what sort of instructions have been received. Now, in the event that judgment is made that an item within the sub-window has been instructed, judgment is made in Step S382 whether or not the item within the sub-window is already displayed or not. In the event that an area other than the item is instructed, the flow returns to Step S381, and in the event that the item is instructed, the instructed item is inversely displayed in Step S383, and the flow returns to Step S381.

Also, in Step S381, in the event that judgment has been made that instruction for determining the selected item inversely displayed has been made, the determined selected item is displayed in the instructed area on the input/output buffer information setting panel 2001, in Step S384. Then, in Step S385, the determined selected item is registered in the data storing device 110, and the flow proceeds to Step S386.

In Step S386, judgment is made whether or not the determined selected item is an input/output buffer name, and in the event that this is judged to be an input/output buffer name, regardless of the narrowing process so far, drive information corresponding to the selected input/output buffer name is set in Step S387, electric power source voltage information corresponding thereto is set in Step S388, and the flow proceeds to Step S391. Also, in the event that this is judged to be other than an input/output buffer name, the flow proceeds to Step S389, and it is judged whether or not the input/output buffer name has been set. In the event that the input/output buffer name is judged to have been set, the input/output buffer name is initialized in Step S390, the flow proceeds to Step S391, and in the event that this is judged to not be set yet, the flow proceeds straight to Step S391. Then, in Step S391, the sub-window is hidden from view, and the processing is ended.

Also, in Step S381, in the event that judgment is made that other than the sub-window has been instructed, the sub-window is hidden from view in Step S392, and the processing is ended.

Figure 59:
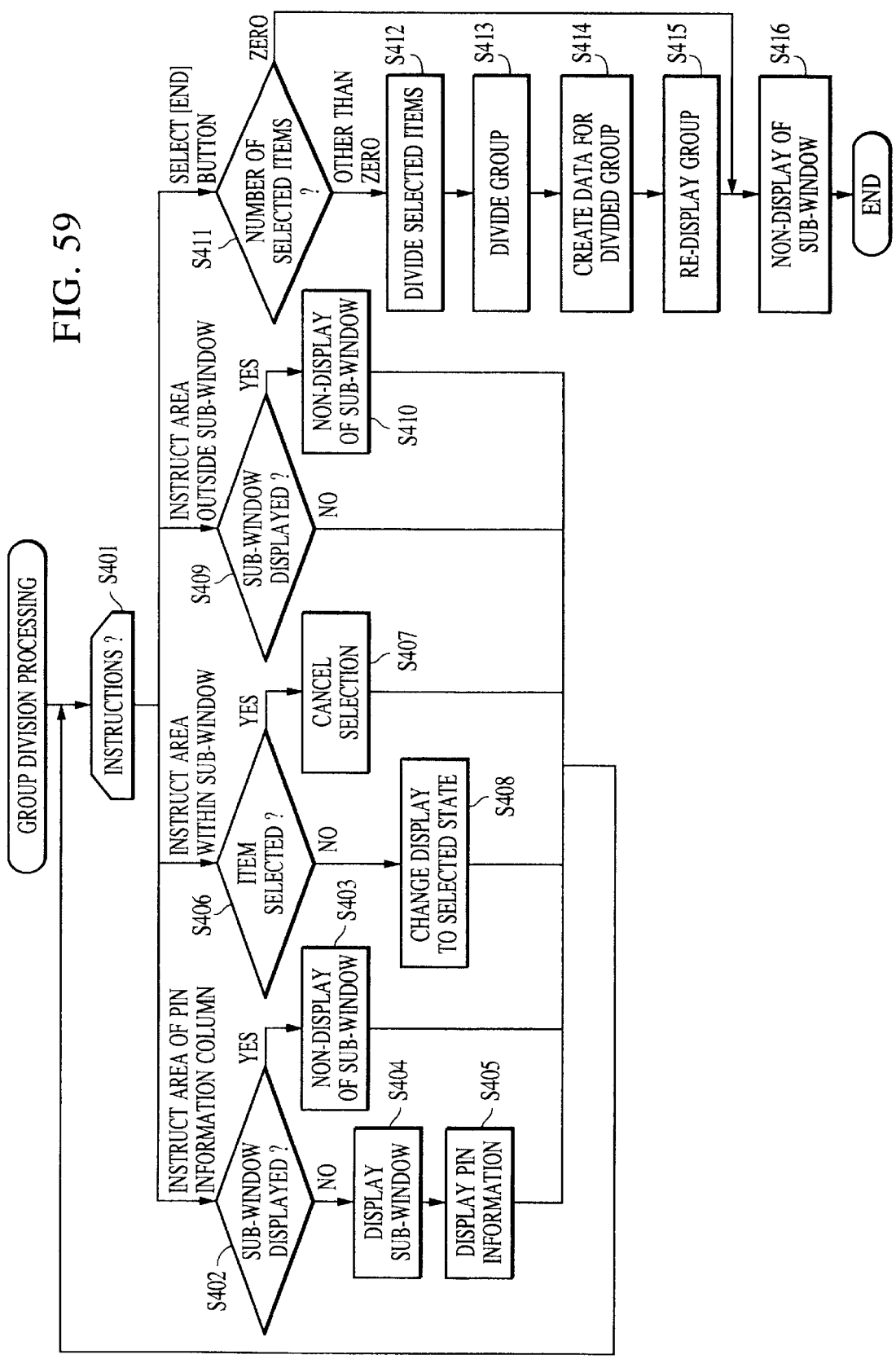
FIG. 59 is a flowchart for group division processing.

Next, further detailed description will be made of the flow of processing group division in Step S331, with reference to the flowchart shown in FIG. 59.

In Step S401, judgment is made regarding what sort of instructions have been received. Now, in the event that judgment is made that the column area of pin information has been instructed, judgment is made in Step S402 whether or not a sub-window is already displayed or not. In the event that the sub-window is displayed, the sub-window is hidden from view in Step S403, and the flow returns to Step S401. Also, in the event that the sub-window is not displayed, the flow proceeds to Step S404, displays the sub-window, and in Step S405 the pin information is displayed in the sub-window, and then the flow returns to Step S401.

Also, In Step S401, in the event that judgment is made that an item within the sub-window has been instructed, judgment is made in Step S406 whether or not the instructed item is in a selected state. In the event that this is in a selected state, the selected state of the item is canceled in Step S407, and the flow returns to Step S401. Also, in the event that the item is not selected, the instructed item is placed in the selected state and is inversely displayed in Step S408, and the flow returns to Step S401.

Also, in the event that judgment is made in Step S401 that an item outside of the sub-window has been instructed, judgment is made in Step S409 whether or not a sub-window is already displayed or not. In the event that the sub-window is displayed, the sub-window is hidden from view in Step S410, and the flow returns to Step S401. Also, in the event that the sub-window is not displayed, the flow returns straight to Step S401.

Also, in Step S401, in the event that judgment is made that the end button 2005 has been selected, judgment is made in Step S411 whether or not the number of items in the selected state within the sub-window is zero or not. Except for cases wherein the number of items is zero, the flow proceeds to Step S412, in which the items which are selected are divided, and in Step S413, the original group based on the state of selection is divided. Then, in Step S414, a new group is created based on the divided items, and the group of groups including the new group is re-displayed on the input/output buffer information setting panel 2001 in Step S415, and the sub-window is hidden from view in Step S416, thus ending the series of processes. On the other hand, in the event that the number of items in Step S411 is zero, the flow proceeds straight to Step S416, and the sub-window is hidden from view.

Figure 60:
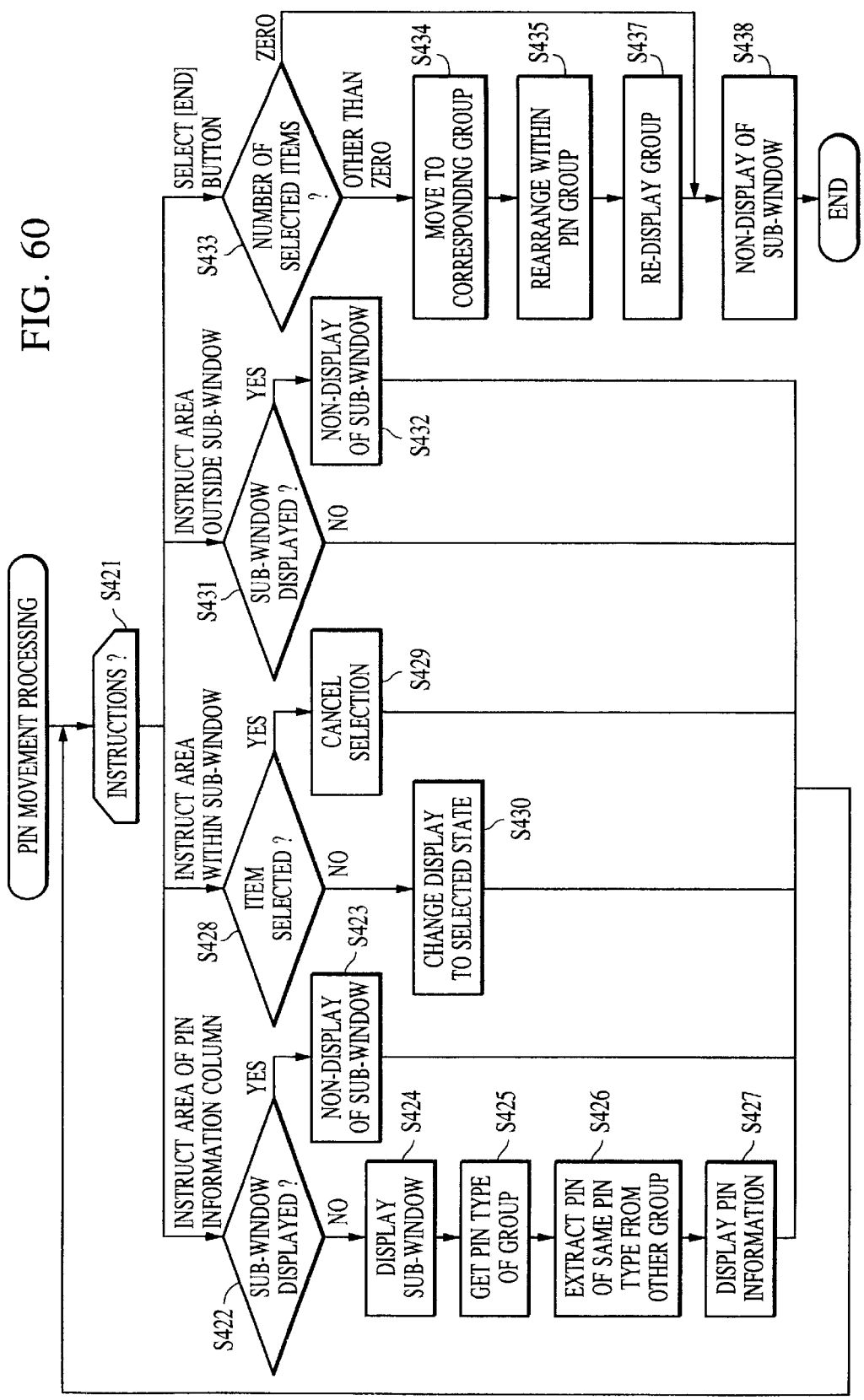
FIG. 60 is a flowchart for pin movement processing.

Next, further detailed description will be made of the flow of processing pin movement in Step S336, with reference to the flowchart shown in FIG. 60.

In Step S421, judgment is made regarding what sort of instructions have been received. Now, in the event that judgment is made that the column area of pin information has been instructed, judgment is made in Step S422 whether or not a sub-window is already displayed or not. In the event that the sub-window is displayed, the sub-window is hidden from view in Step S423, and the flow returns to Step S421. Also, in the event that the sub-window is not displayed, the flow proceeds to Step S424, in which the sub-window is displayed to, and Step S425, in which the pin type of the group which is the object of instruction is obtained. Then, in Step S426, the a pin of the same type as the obtained pin is extracted from a group other than that instructed. In Step S427, this extracted pin is displayed on the sub-window, and then the flow returns to Step S421.

Also, in the event that judgment is made in Step S421 that an item inside of the sub-window has been instructed, judgment is made in Step S428 whether or not the instructed item is in a selected state, and in the event that the instructed item is in a selected state, the selected state of the selected item is canceled in Step S429, and the flow returns to Step S421. In the case that the item is not selected, the selected item is placed in the selected state and inversely displayed in Step S430, and the flow returns to Step S421.

Also, in the event that judgment is made in Step S421 that an item outside of the sub-window has been instructed, judgment is made in Step S431 whether or not a sub-window is already displayed or not. In the event that the sub-window is displayed, the sub-window is hidden from view in Step S432, and the flow returns to Step S421. Also, in the event that the sub-window is not displayed, the flow returns straight to Step S421.

Also, in Step S421, in the event that judgment is made that the end button 2005 has been selected, judgment is made in Step S433 whether or not the number of items in the selected state within the sub-window is zero or not. Except for cases wherein the number of items is zero, the flow proceeds to Step S434 in which the items which are selected to the instructed object group are moved. In Step S435, the pins within the group from which the pins have been moved and the group to which the pins have been moved are rearranged, based on the moved items. Then, in Step S437, the group of groups which have had pins moved is re-displayed on the input/output buffer information setting panel 2001, and the sub-window is hidden from view in Step S438, thus ending the series of processes. On the other hand, in the event that the number of items in Step S433 is zero, the flow proceeds straight to Step S438, and the sub-window is hidden from view.

Figure 61:
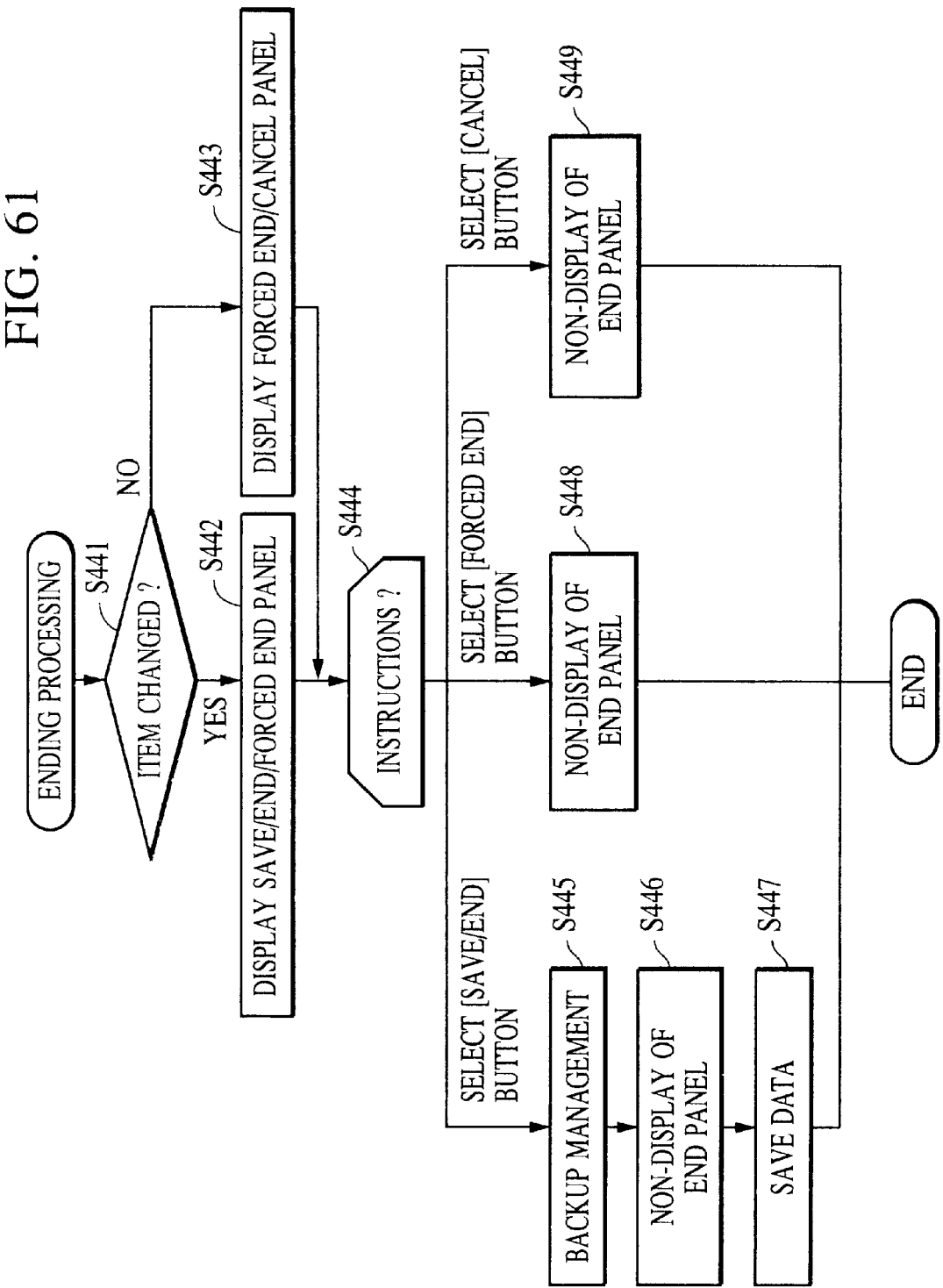
FIG. 61 is a flowchart for ending processing.

Next, further detailed description will be made of the flow of ending in Step S339, with reference to the flowchart shown in FIG. 61.

In Step S441, judgment is made (Step S441) whether a change of items has been made on the input/output buffer information setting panel 2001. In the event that the change has been made, an end panel is displayed in Step S442 including three buttons, "save/end", "forced end", and "cancel", after which the flow proceeds to Step S444. Also, in the event that change is not made, an end panel is displayed in Step S443 including two buttons, forced end" and "cancel", after which the flow proceeds to Step S444.

Then, in Step S444, judgment is made regarding what sort of instructions have been received. Now, in the event that judgment is made that the "save/end" button has been selected, back-up processing is performed in Step S445, the end panel is hidden from view in Step S446, the changed data is saved and updated in Step S447, thus ending processing. Also, in the event that judgment is made that the "forced end" button has been selected, the end panel is hidden from view in Step S448, and processing is ended. Further, in the event that judgment is made that the "cancel" button has been selected, the end panel is hidden from view in Step S449, and processing is ended.

Thus, according to the present embodiment, setting of input/output buffer information can be performed in an extremely easy manner.

Also, input/output buffer information setting is performed so that the input/output buffer name is determined by narrowing down using drive information and electric power source voltage information, so input/output buffer information setting can be performed in a more efficient manner.

Further, changing and dividing of pin groups and so forth can be performed in a more efficient manner.

Moreover, change in the input/output buffer information can be immediately reflected in the step relation diagram.
(Eighth Embodiment)

In the present embodiment, the design management program 112 uses a plurality of pieces of differing design data for executing a single project, and performs a plurality of processes in a parallel manner. In other words, a plurality of patterns of design data are used for a single specification. In the present embodiment, such processing is referred to as multiplex design processing.

First, in order to perform this multiplex design processing, there is the need to set information relating to the project as work units (hereafter referred to as "project information"). In the present embodiment, a project information setting panel 2101 is displayed on a display device such as a CRT display 103, and project information is set on this project information setting panel 2101.

This project information setting panel 2101 is displayed so as to overlap the main panel 901 on the CRT display 103, by means of the designer instructing a Project button provided to the left end of the button group 904 on the main panel 901 shown in FIG. 12, using an input device such as the mouse 104 or the like.

Figure 62:
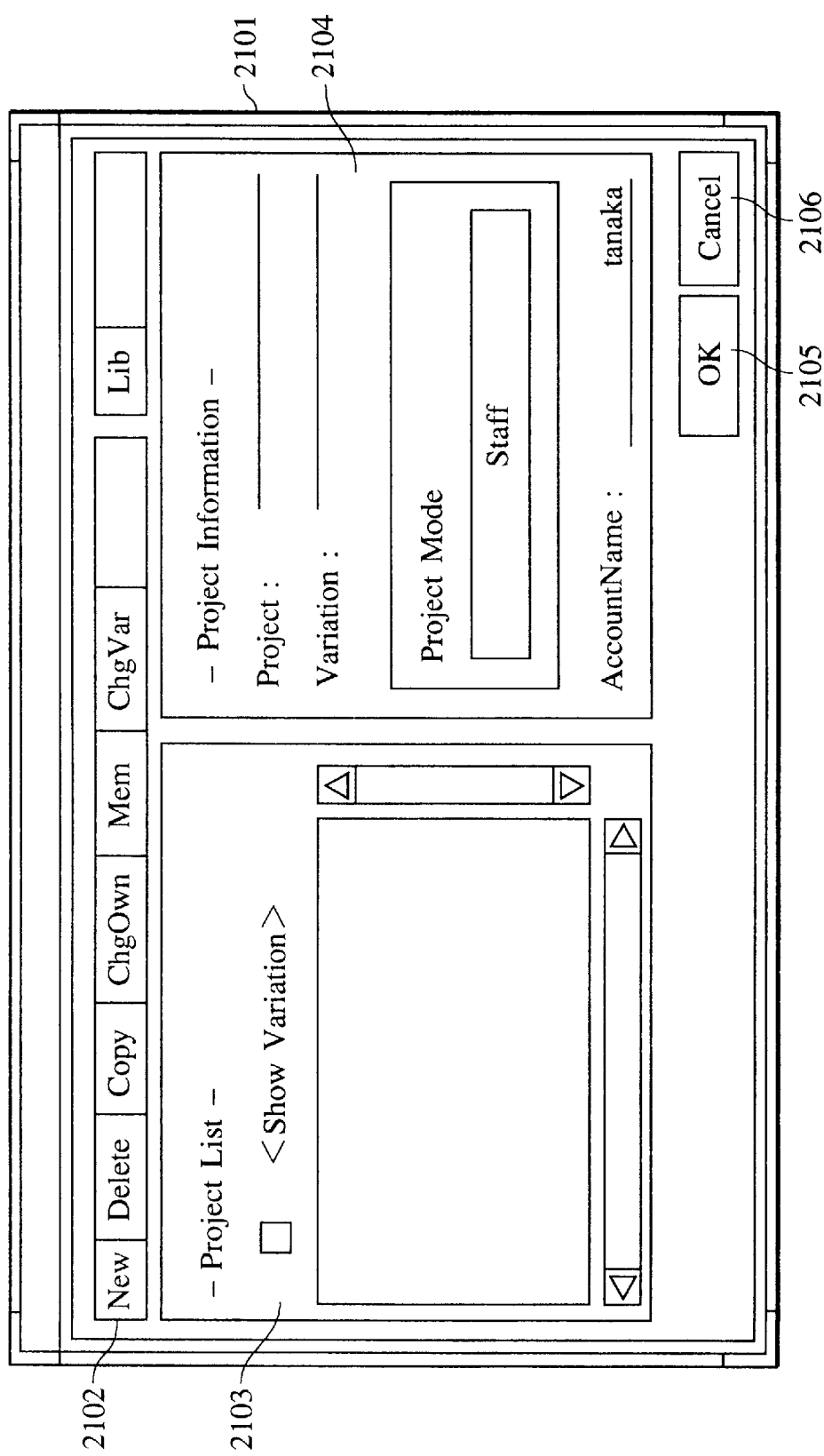
FIG. 62 is a diagram illustrating a project information setting panel.

FIG. 62 is a diagram illustrating the project information setting panel 2101 displayed on the main panel 901.

In FIG. 62, The series of buttons 2102 from New to Lib to the top of the project information setting panel 2101 are the process execution keys for the project information setting panel 2101. A list of names of projects registered in the data storing device 110 and so forth is displayed at the lower portion of the left area 2103 of the project information setting panel 2101. The toggle button thereupon is for switching the form of list display so as to display the names of design data relating to multiplex design processing simultaneously. Also, detailed project information selected with the list in the left area 2103, such as design data, is displayed at the right area 2104 of the project information setting panel 2101. Also, 2105 is an OK button, and 2106 is a Cancel button.

Regarding the project information setting panel 2101 shown in FIG. 62, project information has not been displayed yet. Incidentally, the setting processing for project information does not need to be started from an un-set state such as shown in FIG. 62, and can also be started from a state wherein project information is already set.

Description here will be made from an initial state such as shown in FIG. 62. for the sake of easily understood explanation of the process flow.

Figure 63:
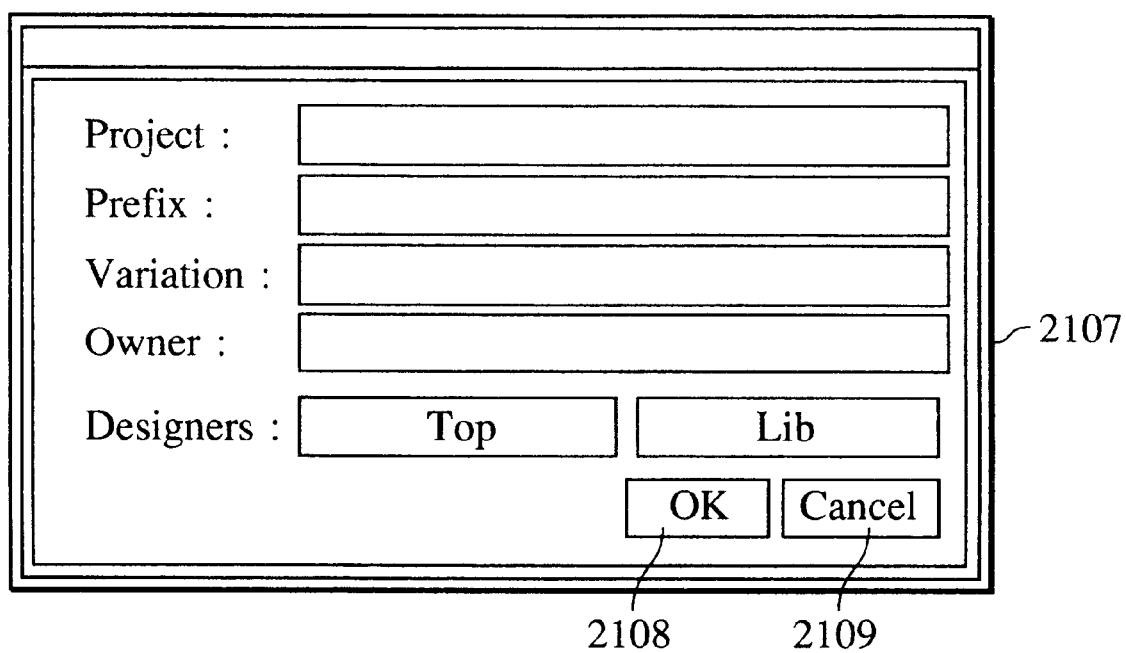
FIG. 63 is a diagram illustrating a project information input panel.

In order to set project information from the state shown in FIG. 62, first, five pieces of setting information, such as the project name, must be input using the project information input panel 2107 shown in FIG. 63. This project information input panel 2107 is displayed overlapping the project information setting panel 2101, by instructing the New button which is at the left edge of the button group 2102 at the top of the project information setting panel 2101.

In FIG. 63, there are two buttons beneath the five setting items, 2108 being the OK button, and 2109 the Cancel button.

The setting items on the project information input panel 2107 shown in FIG. 63 will now be described. First, the project name is input as the item with the "Project:" label. Also, when inputting the name of the design data, the prefix of the name is input in the item with the "Prefix:" label, and the "Variation:" label takes an input of the name of design data following the prefix which has been input in the "Prefix:" label item. Incidentally, the name of the owner is input in the item with the label "Owner:", and the type of designers is set in the item with the "Designers:" label.

In FIG. 63, "test" is input for the item with the "Project:" label as the name of the project, "ae" is input for the item with the "Prefix:" label as the name of design data, "ae-test" is input for the item with the "Variation:" label, "tanaka" is input for the item with the "Owner:" label, the Top button of the "Designers" label is instructed, and subsequently the OK button 2108 is selected, thereby registering the set items of this project information in the data storing device 110 as selection data 601 (see FIG. 6), and the project name "test" is registered in the group management data 505 (see FIG. 5). Then, as shown in FIG. 64, "test" is displayed as a candidate in the selected state in the left area 2103 of the project information setting panel 2101.

Now, this "test" is in a selected state, so the detailed information of this project "test" which is in the selected state in the left area 2103 is displayed in the right area 2104 of the project information setting panel 2101.

Figure 64:
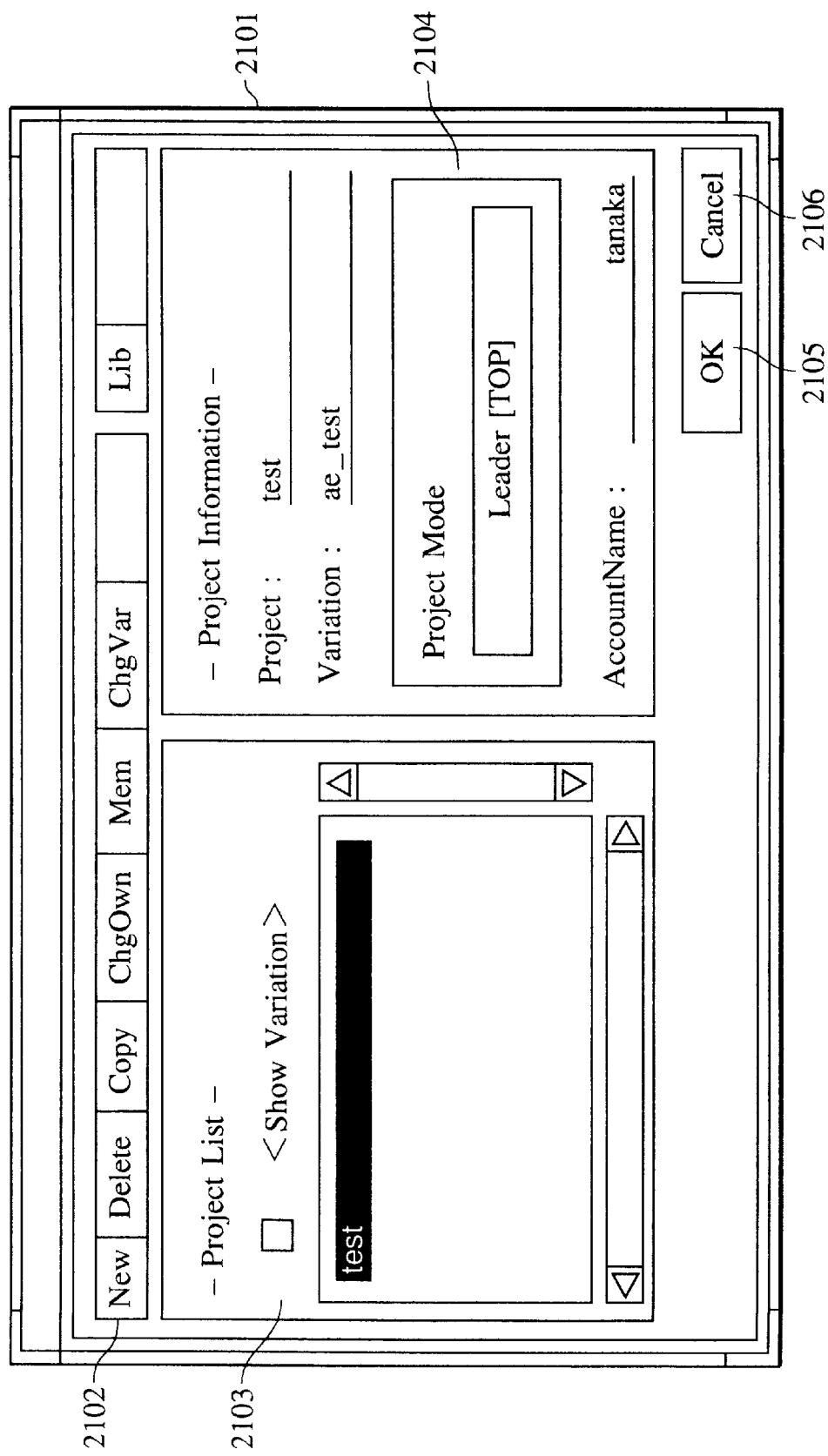
FIG. 64 is a diagram illustrating an example of display on a project information input panel.

Next, as shown in FIG. 64, processing for changing design data of a project will be described, in the case that detailed project information is displayed on the project information setting panel 2101.

In order to change the project design data from the state in FIG. 64, the project information input panel 2107 shown in FIG. 63 is used in this case as well. First, in the state of "test" in FIG. 64 being selected, the ChgOwn button of the button group 2102 at the top of the project information setting panel 2101 is instructed using an input device such as the mouse 104 or the like, and the project information input panel 2107 is displayed overlapping the main panel 901. Displayed in this project information input panel 2107 is the project name "test", and the detailed information thereof.

Now, with the project information input panel 2107 inputting a name which is different from the name of the design data of the project which is in the selected state in the item of the Variation: label determines new design data, and thus, the design data of the project "test" can be changed.

For example, in the event that the name of design data is to be changed from "ae_test" to "ae_test2" in the project information input panel 2107, in the state with the project information setting panel 2101 displayed such as shown in FIG. 64, the value of the item with the label Variation: which is in the right area 2104 of the project information setting panel 2101 is changed from ae_test to ae_test2.

Figure 65:
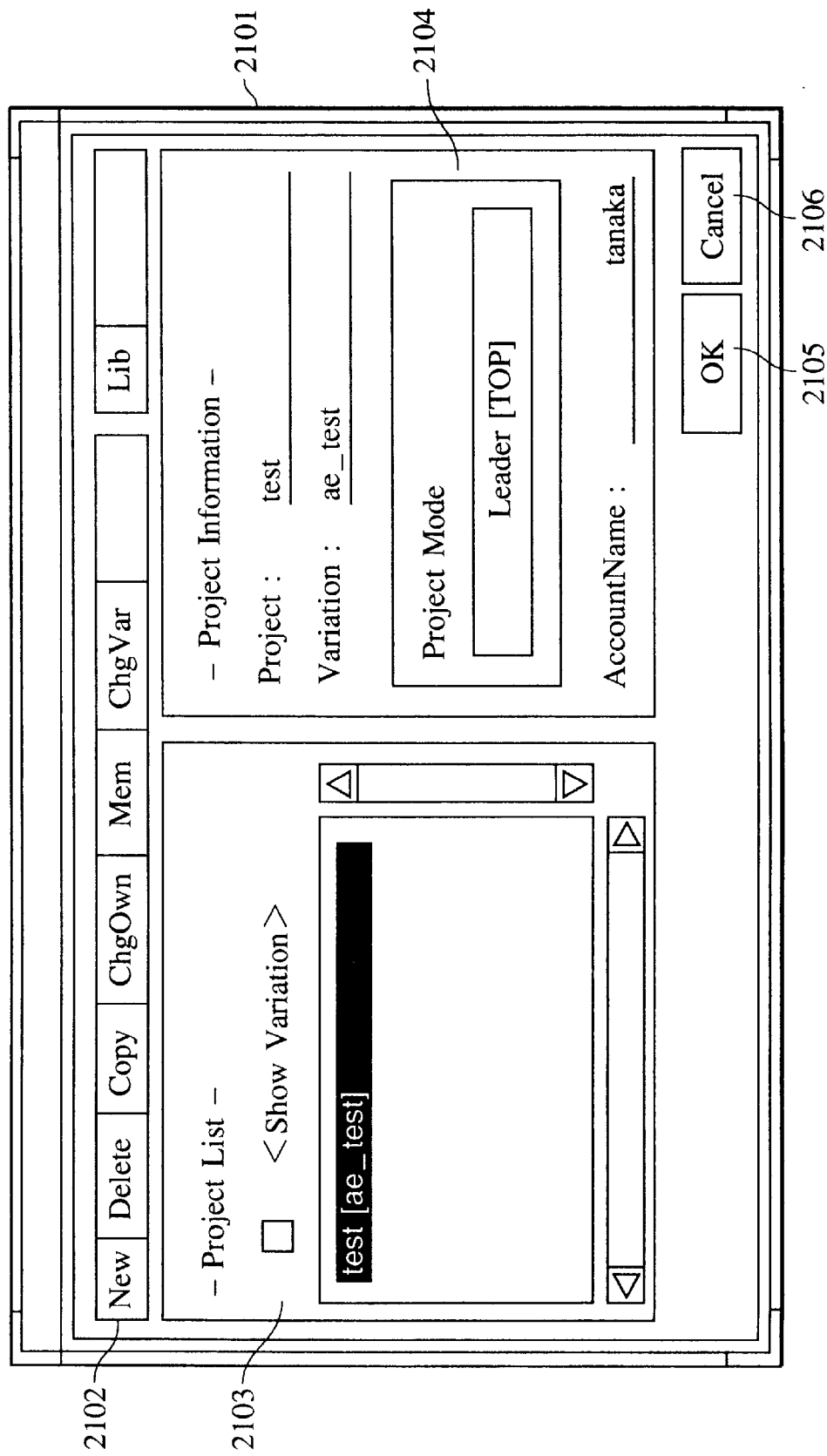
FIG. 65 is a diagram illustrating an example of display on a project information input panel.
Figure 66:
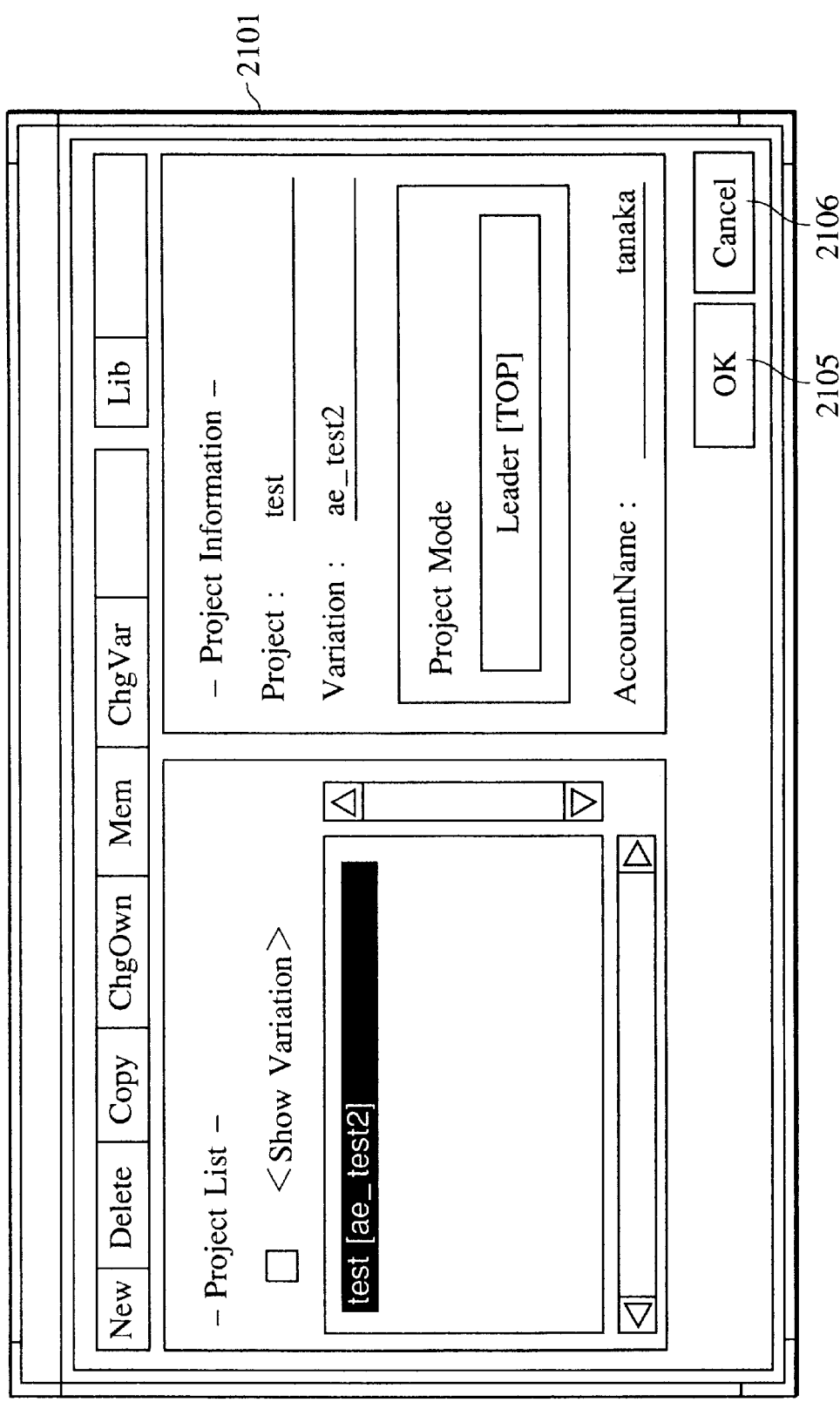
FIG. 66 is a diagram illustrating an example of display on a project information input panel.

Also, instructing the toggle button at the top of the left area 2103 of the project information setting panel 2101 shown in FIG. 64 changes the display contents of the list display area to the bottom of this left area 2103 to such as shown in FIG. 65. In FIG. 65, the names of the portions in brackets [ ] in the list correspond with the names of design data. In the event that the item with the Variation: label becomes ae_test2 due to a changing processing of the design data, the display is such as shown in FIG. 66. This toggle button is provided so that the designer can easily know what design data the selected project is using.

Also, with test being selected in the left area 2103 of the project information setting panel 2101 shown in FIG. 64, instructing the ChgVar button of the button group 2102 at the top of the project information setting panel 2101 using an input device such as the mouse 104 or the like displays a sub-window listing the design data candidates. In the event that there are a plurality of pieces of design data corresponding to the project "test", the designer can select the desired design data from the list of candidates.

The latter-described multiplex design processing is enabled by means of setting processing of such project information.

Next, description of the multiplex design processing according to the present embodiment will be described. The multiplex design processing performs switching of the plurality of created design data, and display of changing proceedings of the step relation diagrams based thereupon.

Figure 67:
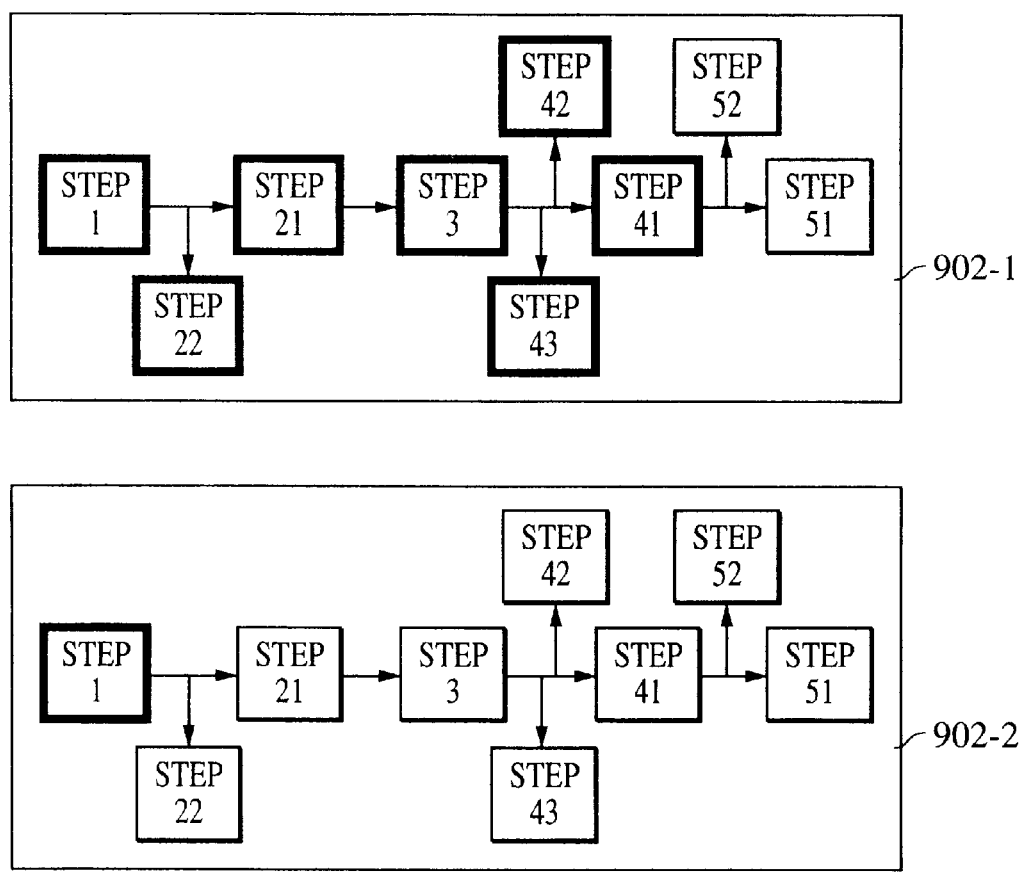
FIG. 67 is a diagram illustrating the state of a step relation diagram upon performing multiplex design processing.

First, in the event that the project "test" has two pieces of design data, ae_test and ae_test2, as in the example given above for setting of project information, and in the event the design data ae_test is selected, as shown in FIG. 65, the step relation diagram becomes as shown in the drawing at the top of FIG. 67 (902-1), and in the event the design data ae_test is selected, the step relation diagram becomes as the drawing at the bottom of FIG. 67 (902-2). This example will be used for this description.

As can be clearly understood from FIG. 67, in the event that the design data is ae_test, processing proceeds to steps 41, 42, and 43, and in the event that the design data is ae_test2, the processing only proceeds to step 1. What should be noted here is that in each of these two step relation diagrams, exactly the same data can be created at each step, or different data can be created.

For example, both design data ae_test and ae_test2 perform the same work in step 1, which is to generated data 1. In step 21 of the design data ae-test, the tool A generates data 2A from data 1, but in step 21 of the design data ae_test2, the tool B generates data 2B from data 1. In such cases, it can be understood that even if the design data ae_test and ae_test2 start the same way, processing in the subsequent steps differs (of course, there may or may not be difference in the processes of step 21 and the subsequent steps).

In other words, CAD tools may be changed according to the design data, the step execution conditions may be changed, and further, the number of steps themselves may be changed, as well.

Accordingly, in the event of executing a certain project, for example, in the case that the desired output data does exist, multiplex design processing can be performed for that project, so that a number of design method patterns regarding the way of processing, contents of processing, and the CAD tools used can be realized. Accordingly, the desired output data can be obtained in a more efficient manner. Of course, which pattern is proceeded with depends on the restrictions placed thereupon by the designer or the design management program 112.

Thus, according to the present embodiment, a plurality of differing methods can be executed regarding a single project, so that an optimal method can be determined for project execution, by the designer judging the processing results. Also, at that time, only the design data is changed, leaving the other information set at the beginning unchanged, so work efficiency can be improved.

Figure 69:
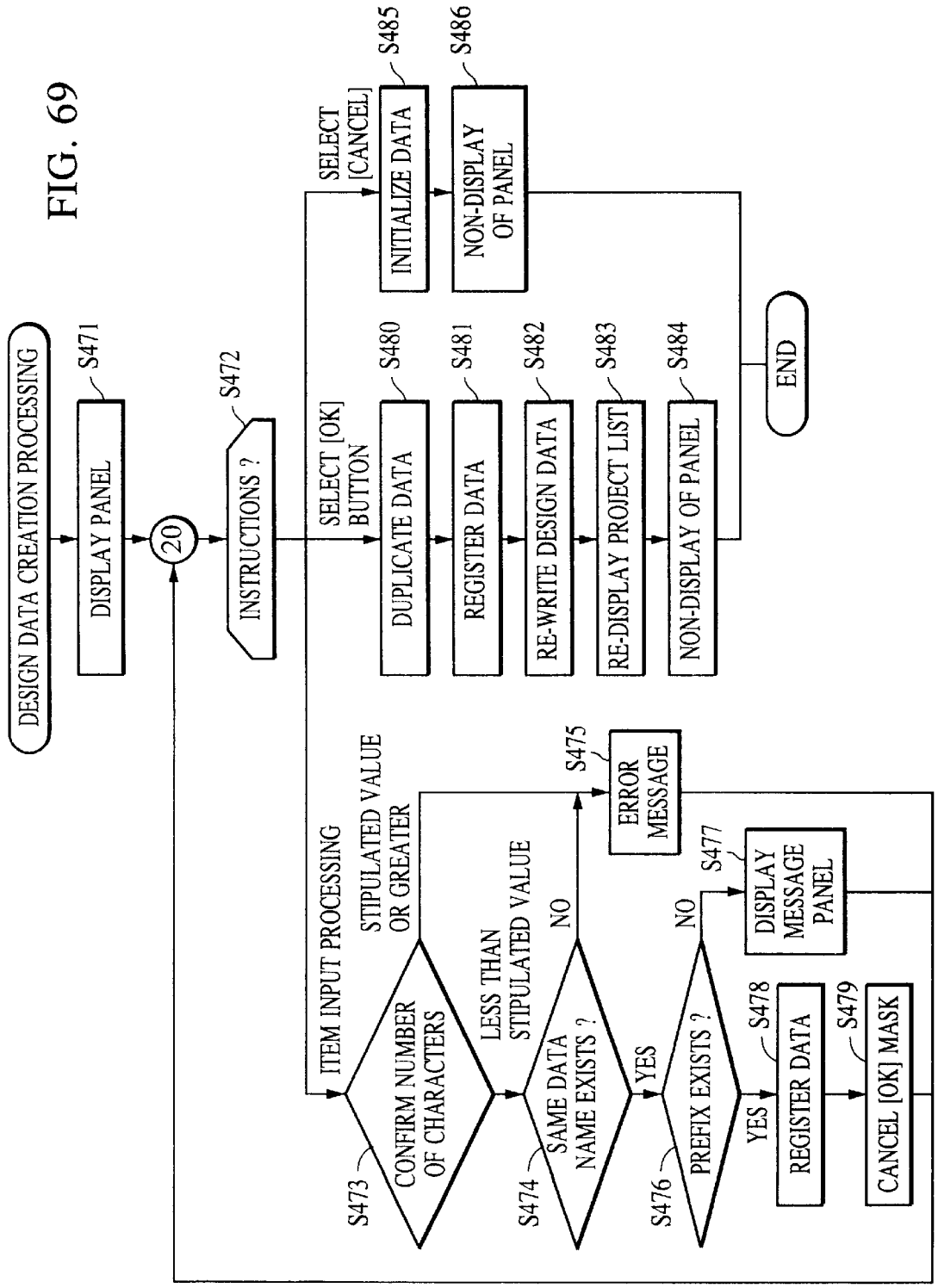
FIG. 69 is a flowchart for creation processing of design data.
Figure 70:
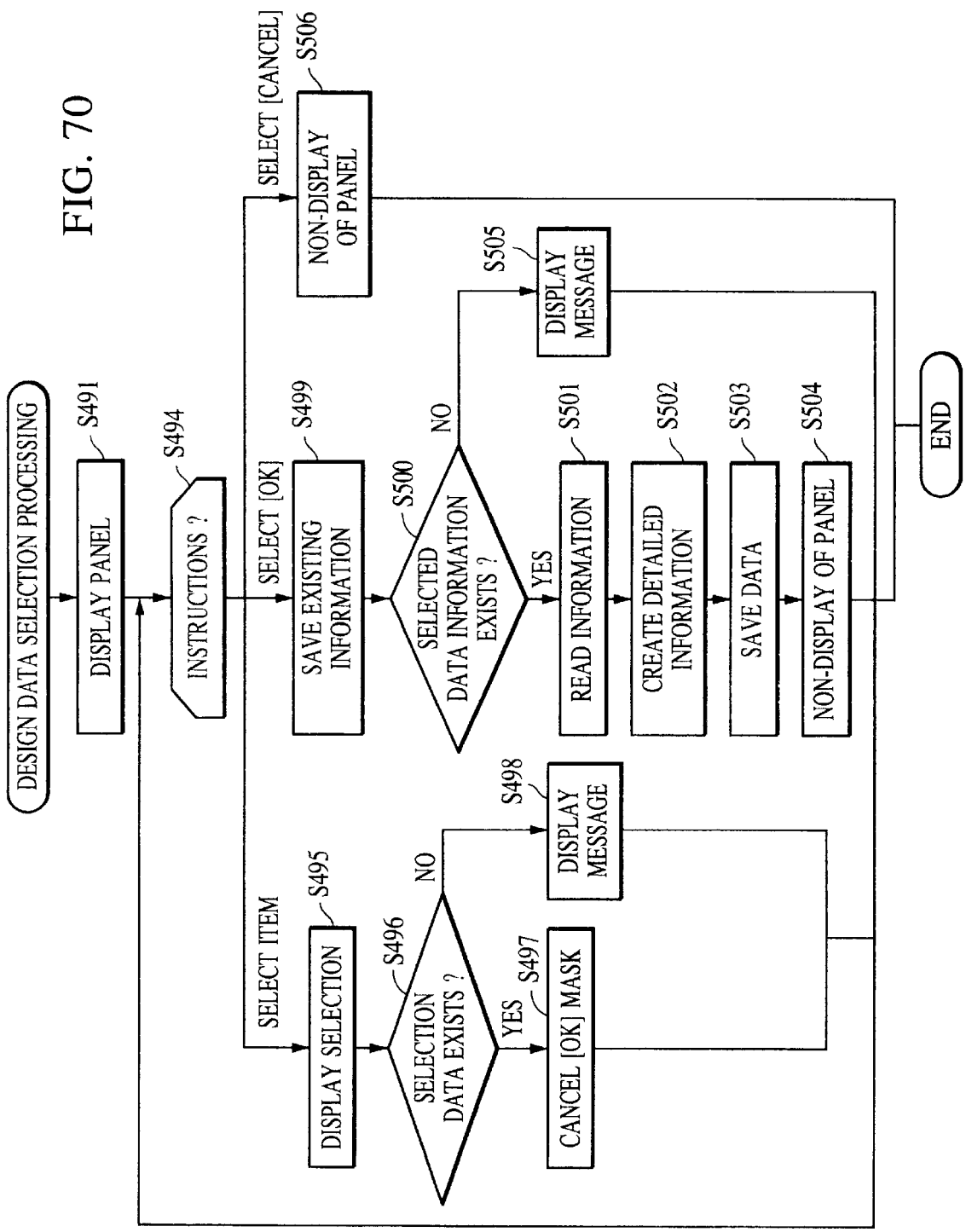
FIG. 70 is a flowchart for selection processing of design data.

Now, detailed description will be made regarding the flow of multiplex design processing using the project information setting panel 2101, with reference to the flowcharts in the FIGS. 68 through 70.

Figure 68:
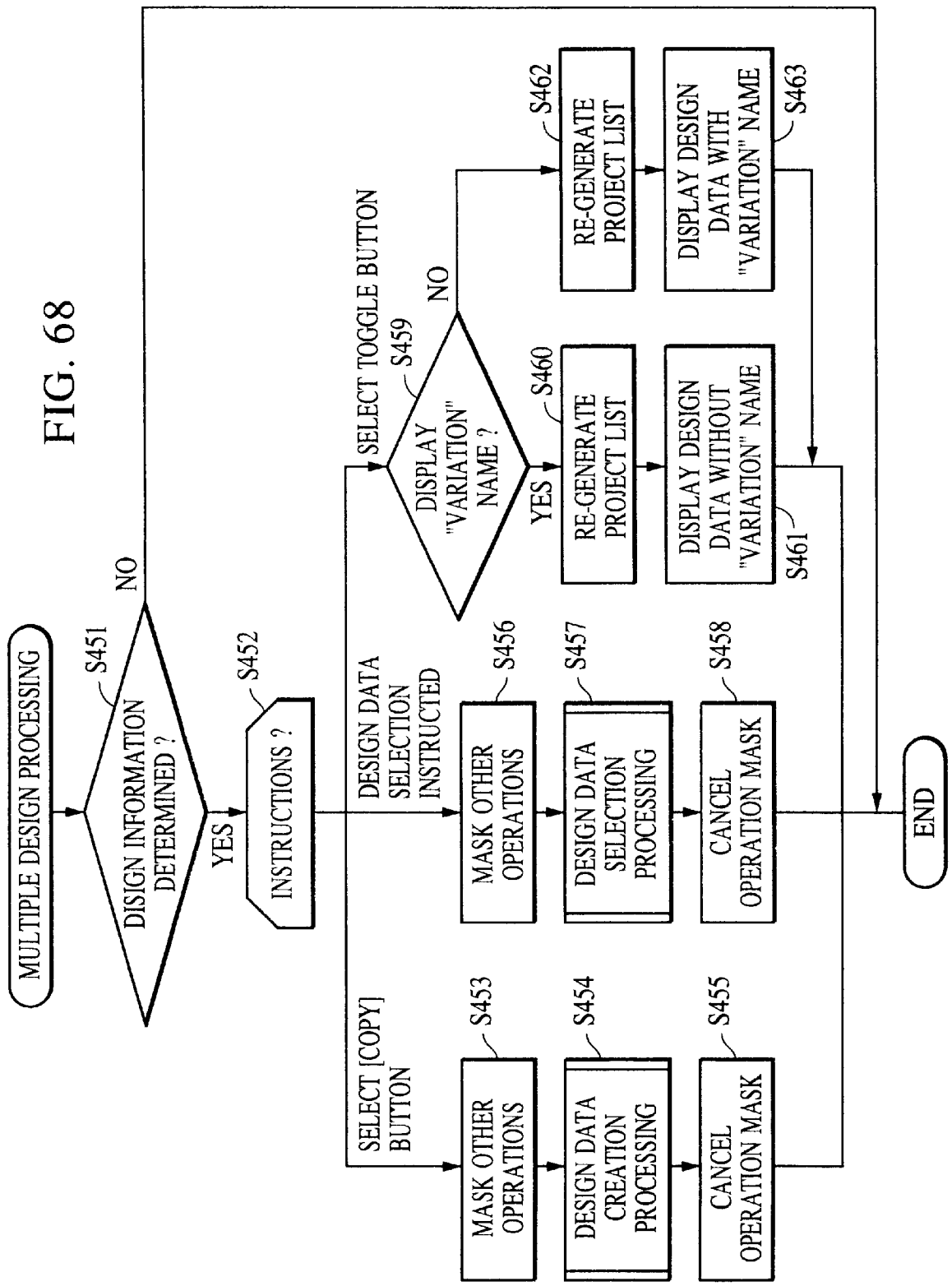
FIG. 68 is a flowchart for multiplex design processing.

FIG. 68 is a flowchart relating to multiplex design processing.

In Step S451, judgment is made whether information necessary for design is determined, such as step group, CAD tools to be used therein, and so forth. In the event that this is determined, the flow proceeds to Step S452, and in the event that this is not determined, the process is ended there. Next, in Step S452, judgment is made of what sort of instruction has been issued. In the event that judgment is made that the Copy button has been instructed, the flow proceeds to Step S453, masking of other operations is performed on the project information setting panel 2101, and in Step S454, design data creation is performed. Then, in Step S455, the masking of other operations performed on the project information setting panel 2101 is canceled, and the processing is ended.

Also, in the event that judgment is made in Step S452 that selection of design data has been instructed, the flow proceeds to Step S456, masking of operations on the project information setting panel 2101 is performed, and in Step S457, design data selection is performed. Then, in Step S458, the masking of other operations performed on the project information setting panel 2101 is canceled, and the processing is ended.

Also, in the event that judgment is made in Step S452 that the toggle button has been instructed, the flow proceeds to Step S459, and judgment is made whether the design data name is displayed with the Variation name in the list display area of the left area 2103 of the project information setting panel 2101. In the event that judgment is made that this is displayed, the flow proceeds to Step S460 in which the project list is regenerated so as to remove the Variation name, and the list is displayed in Step S461. Also, in the event that the variation name is judged to not be displayed, the flow proceeds to Step S462, the project list is regenerated so as to add the Variation name, and the list is displayed in Step S463.

Next, the flow of creation of design data in Step S454 will be described in further detail with reference to the flowchart in FIG. 69.

The project information input panel 2107 is displayed in Step S471, and judgment is made in Step S472 regarding what sort of instruction has been issued. In the event that input has been performed in an item, the flow proceeds to Step S473 in which the number of input characters is confirmed. In the event that the number of input characters is within the stipulated value within the frame, the flow proceeds to Step S474, and in the event that the number of input characters exceeds the stipulated value, the flow proceeds to Step S475 and displays an error message. In Step S474, confirmation is made regarding whether data with the same data name already exists within the item, and in the event that such does not exist, the flow proceeds to Step S476, and in the event that such does exist, the flow proceeds to Step S475 and displays an error message.

Next, in Step S476, confirmation is made whether there is a prefix in the input character line. In the event that there is a prefix, the input character line is registered in Step S478, the mask is canceled for the OK button 2108 in Step S479 and the flow returns to Step S472. In the event that there is no prefix, a message is displayed prompting re-entering in Step S477, and the flow returns to Step S472.

Also, in step S472, in the event that judgment is made that the OK button 2108 has been selected, the flow proceeds to Step S480 in which the design data selected in Step S457 is duplicated, and the duplicated data is registered with the data storing device 110 or the like in Step S481. However, the extent (up to which design step) of data to be duplicated here differs according to the design environment and operation thereof. In the present embodiment, the highest data in the design, i.e., the design data in "step 1" is duplicated.

Next, in Step S482, the original design data is rewritten with the new design data, and in Step S483, the name of the new design data and the project name are displayed in the list display area of the left area 2103 of the project information setting panel 2101. Then in Step S484, the project information input panel 2107 is hidden from view, thus ending the series of processes.

Also, in Step S472, in the event that judgment is made that the Cancel button 2109 has been selected, the flow proceeds to Step S485 in which the contents of the item are initialized, and the project information input panel 2107 is hidden from view in Step S486, thus ending the series of processes.

Next, the flow of selection of design data in Step S457 will be described in further detail with reference to the flowchart in FIG. 70.

In Step S491, a sub-window listing the set designed data is displayed. This sub-window also contains an OK button and a Cancel button. Next, in Step S494, judgment is made of what sort of instruction has been issued. In the event that judgment is made that selective processing of an item displayed in the list in the sub-window has been performed, the flow proceeds to Step S495, and the selected item is inversely displayed. Then, in Step S496, confirmation is made of whether the selected item exists. In the event that the selected item exists, the mask on the OK button is canceled in step S497, and the flow returns to Step S494. In the event that the selected item does not exist, a message is displayed indicating such in Step S498, and the flow returns to Step S494.

Also, in Step S494, in the event that judgment is made that the OK button on the sub-window has been selected, the flow proceeds to Step S499, and first the already existing information is saved. Next, in Step S500, judgment is made whether the selected item exists. In the event that judgment is made that the selected item exists, the flow proceeds to Step S501, and in the event that judgment is made that this does not exist, a message is displayed indicating such in Step S505, and the flow returns to Step S494. In Step S501, information regarding the selected design data is read in. In Step S502, detailed information is created based on the read information, and this detailed information is saved in Step S503. Then, in step S504, the sub-window is hidden from view, thus ending the series of processes.

Also, in Step S494, in the event that judgment has been made that the Cancel button on the sub-window has been selected, the flow proceeds to Step S506, the sub-window is hidden from view, thus ending the series of processes.

Thus, according to the present embodiment, a plurality of pieces of differing design data are used for executing a single project, and a plurality of processes are performed in parallel, so the designer can easily confirm the optimal design method by comparing the plurality of results.

Incidentally, the first through eighth embodiments need not be restricted to a singe apparatus; rather, the embodiments may be applied to a system including a plurality of apparatuses or devices connected to a network.

(Ninth Embodiment)
<Design managing apparatus connected to a network>

Figure 76:
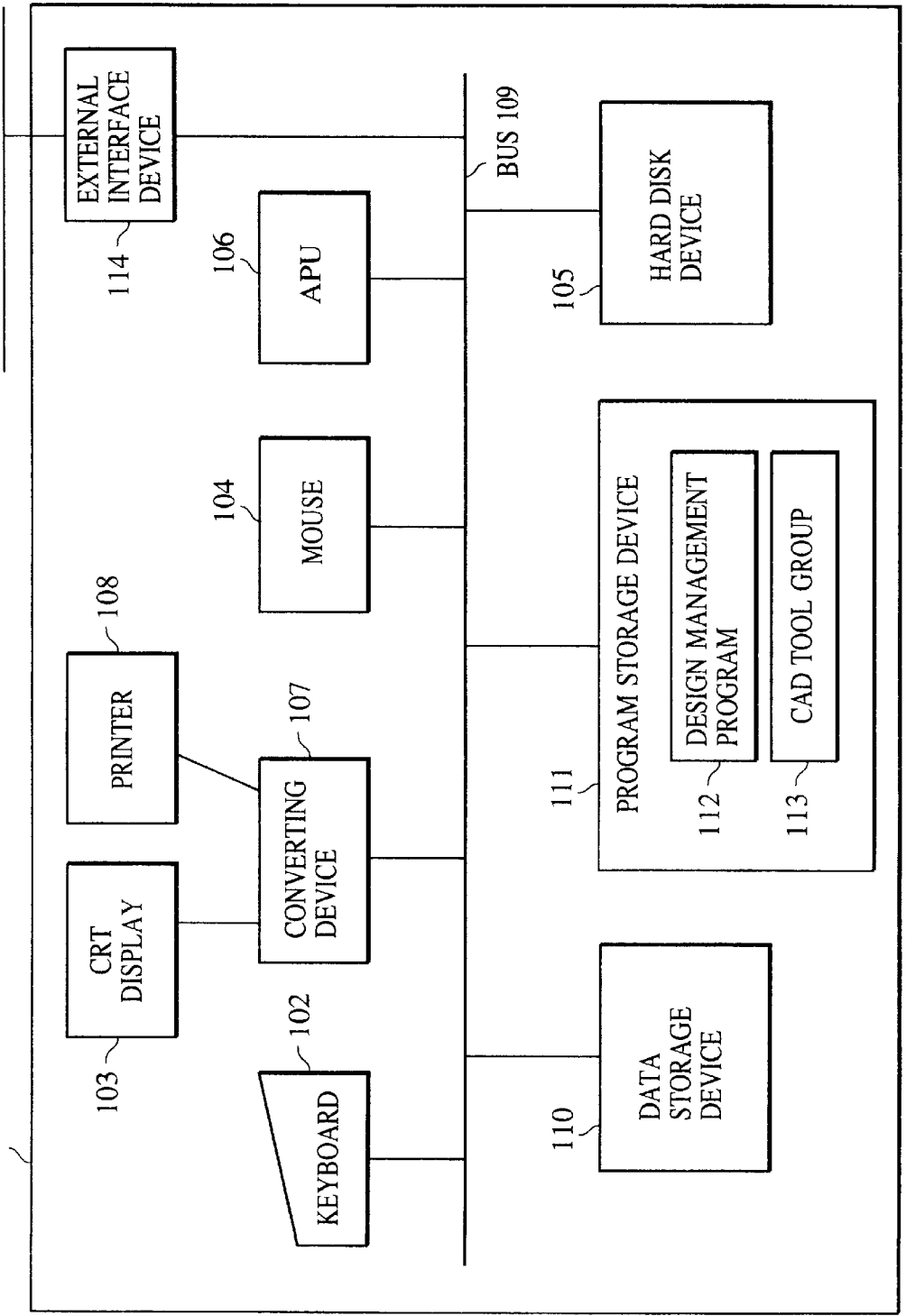
FIG. 76 is a constructional diagram of the hardware of a design managing apparatus with networking compatibility.

FIG. 76 is a constructional diagram of the hardware of the design managing apparatus 101 according to the present embodiment.

The design managing apparatus 101 according to the present embodiment differs from that shown in FIG. 1 in that this arrangement is provided with an external interface device 114. This external interface device 114 is connected to a network 9701, which enables exchange of information between the design managing apparatus 101 and other entities.

The following is a description of an example of operation of a plurality of such design managing apparatuses 101 interconnected to a network 9701.

Figure 77:
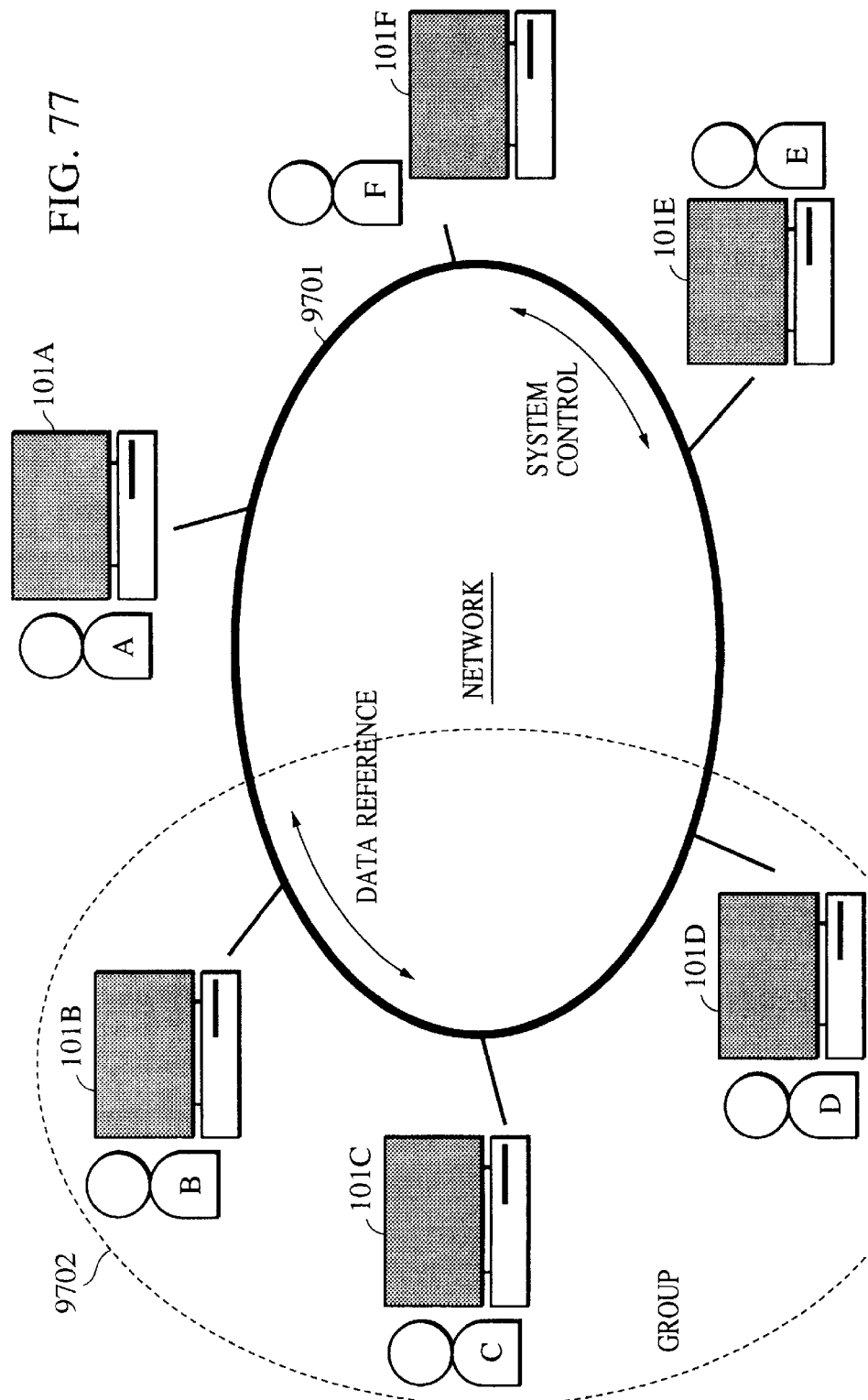
FIG. 77 is a network configuration diagram with a plurality of design management device mutually connected.

FIG. 77 is a network configuration diagram with a plurality of design managing apparatuses 101 mutually connected to a network 9701.

In FIG. 77, there are six system users (hereafter referred to as "users") A through F, with each user having a design managing apparatus 101 mutually connected to a network 9701, and with each design managing apparatus 101 having a number with the user name added thereto, such as 101A, 101B, 101C, and so forth, thus distinguishing between the users. Also, the network 9701 shown in FIG. 77 is a network having a LAN, WAN, or public telephone lines. The number of users is not restricted to six as shown in FIG. 77; there is no particular limit on the number of users. Further, the area 9702 defined by dotted lines is a designing group (hereafter referred to simply as "group") having three design managing apparatuses 101B, 101C, and 101D. There is no restriction on the number in this group; the number may be one, ten, or whatever.

With the present embodiment, a group is formed of the design managing apparatuses 101 connected to the network 9701 such as shown in FIG. 77, and the management thereof is also realized.

Figure 78:
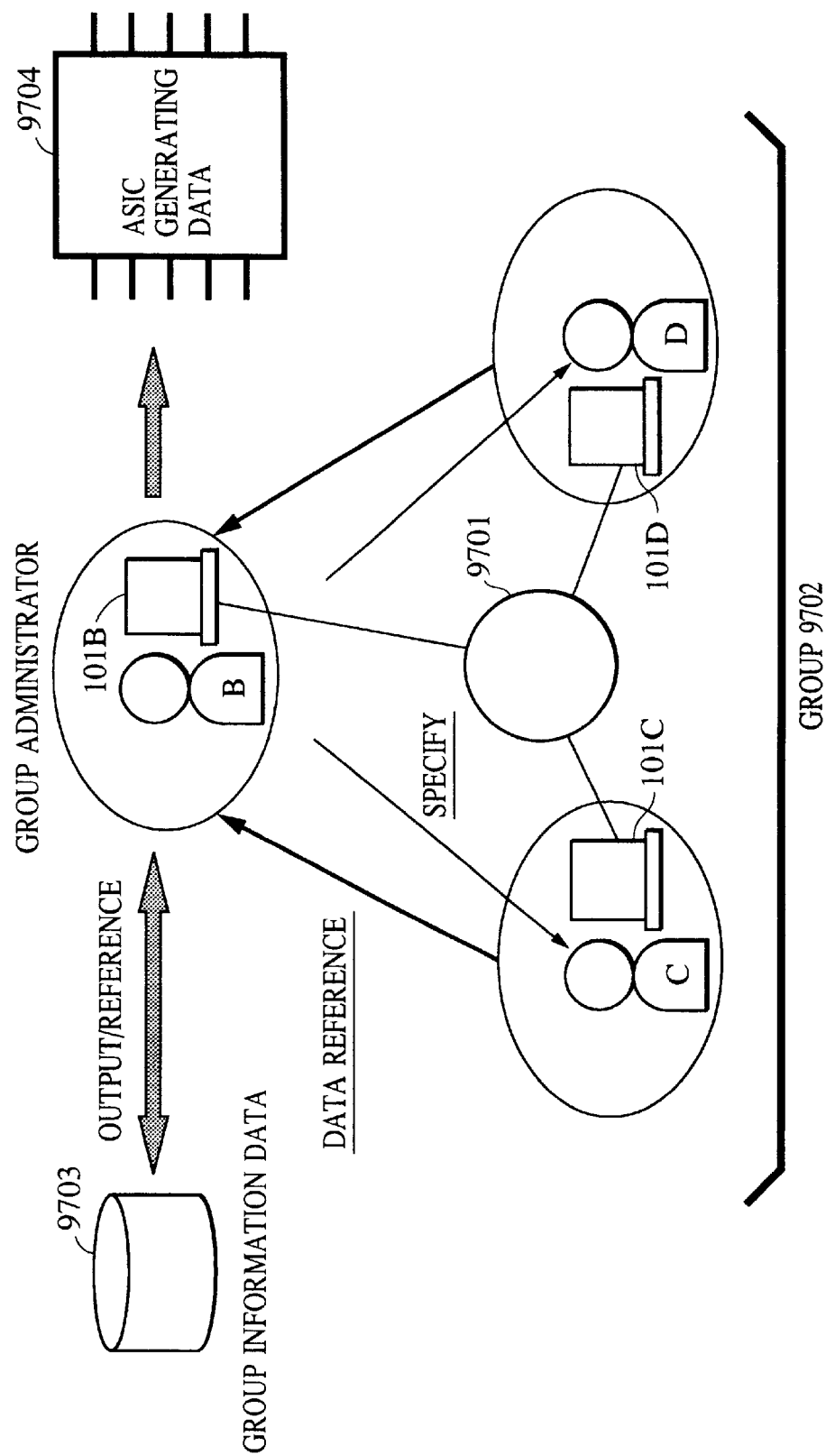
FIG. 78 is a conceptual diagram relating to group management.

FIG. 78 is a conceptual diagram relating to management of the group 9702 shown in FIG. 77.

In FIG. 78, the design managing apparatus forming a group are the following three: the design managing apparatus 101B owned by a user B, the design managing apparatus 101C owned by a user C, and the design managing apparatus 101D owned by a user D.

Also, the user B in the upper tier is a group manager which oversees the entire group, and the users C and D to the lower tiers are group task workers (constituents of the group other than the group manager). The group manager can make reference to the data generated using the design managing apparatus owned by a group task worker specified by the group manager via the network 9701. Accordingly, the group manager is capable of centralizing the data generated by each of the group task workers, and proceeding with design.

9704 is ASIC generating data generated as a product of processing within such a group (design data to be provided to an ASIC vendor for generating ASICs), and 9703 is group information data indicating the relation of the users therein. Now, the ASIC generating data 9704 is stored within the hard disk devices 105 in each of the design managing apparatuses 101B, 101C, and 101D, and the group information data 9703 is stored within the group information data file 502 (see FIG. 5) in the hard disk devices 105 in each of the design managing apparatuses 101B, 101C, and 101D.

Also, even in the event that the number of individuals comprising the group increases, there is only one group manager at any time, so only the group task workers increase. Also, exchange of data between the group task workers can be conducted, as well.

Figure 79:
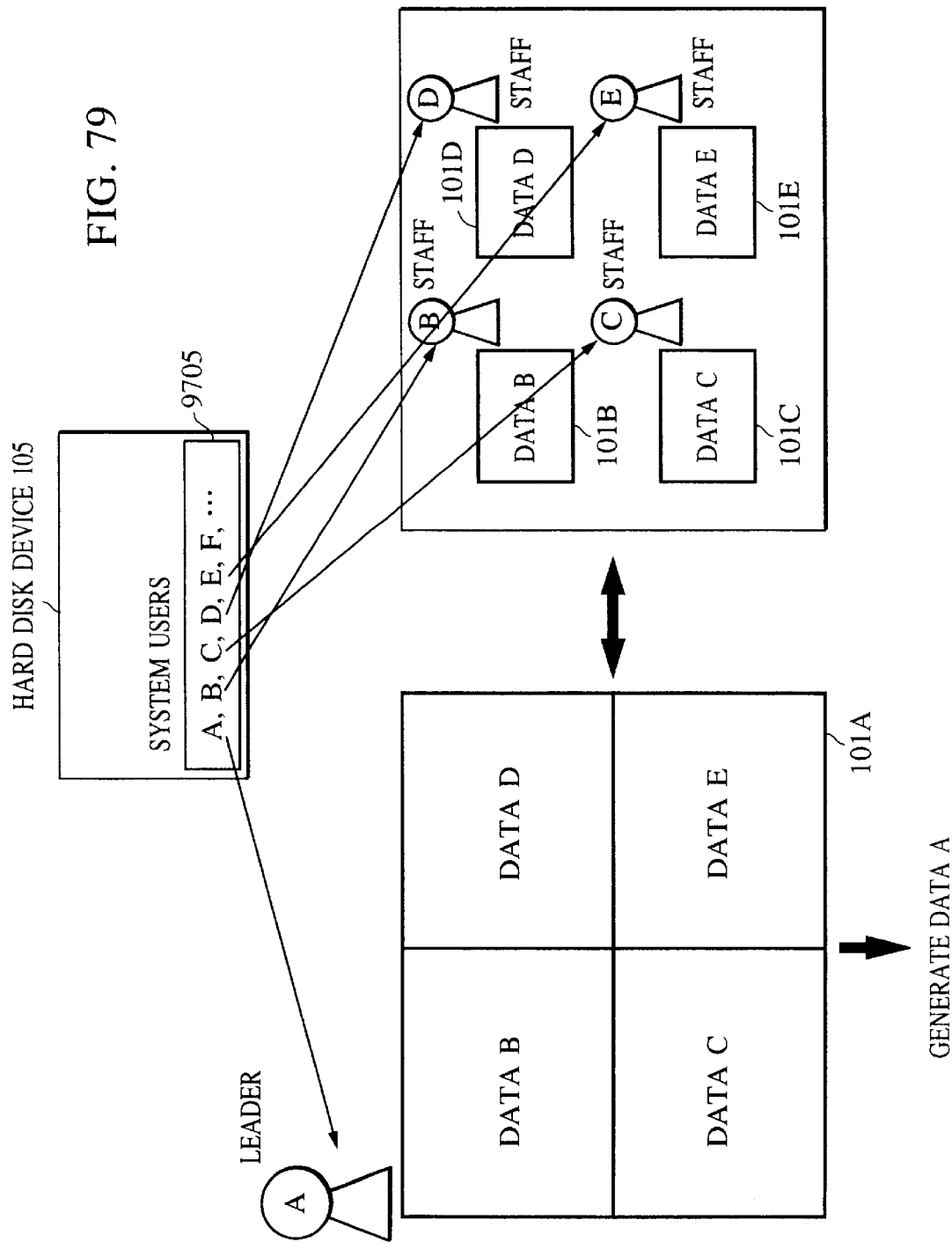
FIG. 79 is a diagram illustrating an image of group processing.

FIG. 79 is a diagram illustrating an image of group processing of a group of five design managing apparatuses 101A through 101E.

In FIG. 79, the storage device such as the hard disk devices 105 within each of the design managing apparatuses 101A through 101E have stored within information 9705 relating to the users of the group. Now, the information 9705 relating to the users of the group is made of units which indicate collection of individuals for executing a certain process, and of course, this may be one individual or a plurality of individuals.

Also, the group manager will hereafter be referred to as the "leader", and the group task workers will be referred to as "staff". In other terms, within the group shown in FIG. 79, the user A is the leader (leader A), and the users B through E are staff (Staff B through E). The leader A specifies the users B through E as staff and registers them in the group information data 9703. Data A is generated by means of the leader A making reference to the data that each of the staff B through E has generated. This flow is the basis of group processing in the present embodiment.

The following is a description of data referencing relations within the group, with reference to detailed examples.

For example, in the event of solving the mathematical expression (1+2)+(3+4)+(5+6)+(7+8)= staff B is assigned the calculation processing of the first block (1+2), and in the same way, staff C is assigned the calculation processing of the second block (3+4), staff D is assigned the calculation processing of the third block (5+6), and staff E is assigned the calculation processing of the fourth block (7+8). Each of the individuals is aware of this allotment of processing beforehand. Then, the leader A performs processing to solve this mathematical expression in the end, based on the calculation results calculated by each of the staff. The design managing apparatuses owned by each of the staff each generate the solutions "3", "7", "11", and "15", i.e., data, based on execution of calculating processing. The leader A makes reference to the data generated by each of the design managing apparatuses, and executes calculating processing based on the reference data thereof. Consequently, the solution "36" is obtained as data A.

Incidentally, in practice, the staff may make reference to the data which the leader A has generated partway, and the staff may make reference to the data of one another. Further the processing of the data is by no means restricted to calculation of data; rather, this may include moving data as well. Also, there are innumerable combinations of users for realizing group processing, and the combinations change according to the users or the work contents to be processed. In the present embodiment, the above description has been given as an easily understandable example.

<Setting of project information in one design managing apparatus>

First, description will be made regarding setting of information relating to a project in work units (hereafter referred to as "project information").

In the present embodiment, as with the example of multiplex design processing in the eighth embodiment, a project information setting panel 2101 is displayed on a display device such as a CRT display 103, and project information setting is performed in this project information setting panel 2101.

The method of setting project information in the present embodiment is basically the same as that of the eighth embodiment. However, in the present embodiment, the name of the group leader is input into the item of the Owner: label on the project information input panel 2107 shown in FIG. 63. Now, in the event that there is only one user in the group, the name of this user is input. Also, input in the item of the Owner: label cancels the masking on the two buttons, Top and Lib on the Designer: label, and the designer is determined by selecting one of these two buttons.

<Registering group members>

Next, description will be made regarding the registration process of group members in the event that there are a plurality of users in the group.

First, project information setting such as described above is performed with the design managing apparatus 101 owned by the leader, and the contents thereof are stored in the hard disk device 105 as the leader's group information data 9703.

Figure 80:
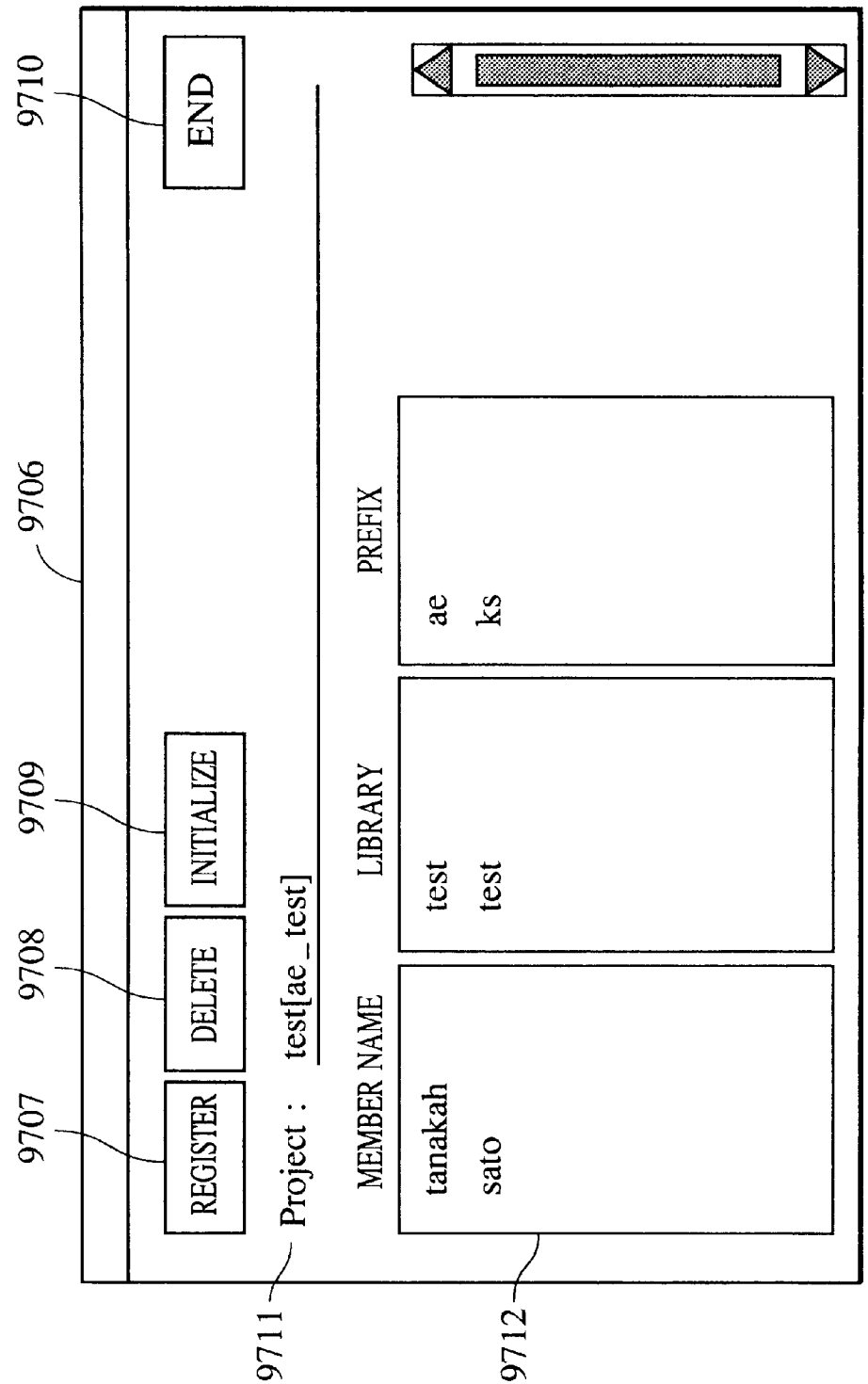
FIG. 80 is a diagram illustrating a member registration panel.

Next, in order for the leader to specify the staff, the leader instructs the Mem button in the button group 2102 at the top of the project information setting panel 2101 in the state of a certain project having been selected, such as shown in FIG. 64, whereby a member registration panel 9706 is displayed overlapping the project information setting panel 2101, as shown in FIG. 80.

FIG. 80 is a diagram illustrating a member registration panel 9706 for registering group members.

In this FIG. 80, 9707 is a register button for instructing registration of new members, 9708 is a delete button for deleting members, 9709 is an initialize button for initializing the panel state, and 9710 is an end button for instructing ending of the process. Also, 9711 is a project display area for displaying the name of the selected project and the name of the design data thereof, and 9712 is a member information display area for displaying detailed information about the registered members.

The information about the leader is already displayed on the member registration panel 9706 shown in FIG. 80. This member registration panel 9706 is used for registering the staff undertaking the selected project. It should be noted though, that users not included in the information 9705 relating to the users of the group cannot be registered in the group as staff.

Next, the staff registration process will be described in detail.

Figure 81:
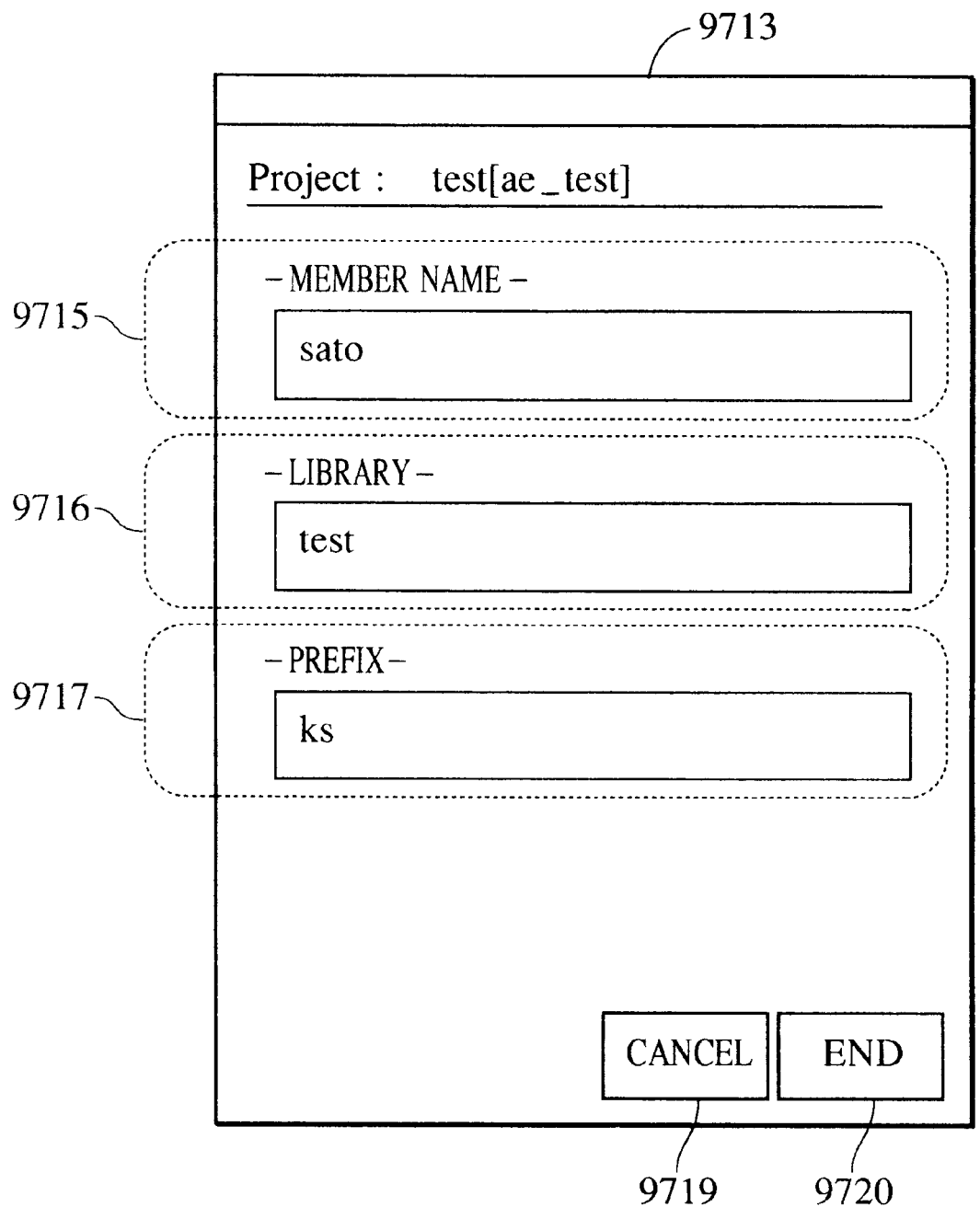
FIG. 81 is a diagram illustrating a member setting panel.

First, instructing the register button 9707 to the top of the member registration panel 9706 displays the member setting panel 9713 shown in FIG. 81 overlapping the member registration panel 9706. There are four input items on the member setting panel 9713.

In FIG. 81, 9715 is a member name input area, the term "member name" here referring to the staff registration name. In the case of UNIX systems, the account name is used as this member name, but it goes without saying that verification can be made with other personal names. With the present embodiment, an account name "sato" is used, for easy identification.

Also, 9716 is an input area for library names, the term "library name" here being a name of a library used by the staff making reference to data. 9717 is an input area for input of prefixes, the term "prefix" here being a prefix of a library name. The library name and prefix are connected to form the name of "Variation" for setting the project information.

Also, the cancel button 9719 cancels the input contents on the member setting panel 9713, and the end button 9720 determines the contents set on the member setting panel 9713.

Also, in the event that the end button 9720 is instructed, the staff names are checked and also a check is performed to confirm that the name equivalent to the Variation name is not the same as an already-existing name. The staff name check is performed by inspecting whether or not an identical staff name is registered in the hard disk device 105. For example, in the event that the user C is not yet registered on the hard disk device 105, the user C cannot be registered as a "member name" in the member setting panel 9713. Thus, an error message is output in the event that registration cannot be performed, and the member setting panel 9713 returns to the state of staff setting again.

When the registration ends in a normal manner, the new registration contents are displayed on the member information display area 9712 on the member registration panel 9706, and the registration content is inversely displayed, to indicate a selected state. At this time, all items in the horizontal direction from the new registration contents are in the selected state. Also, the list order is re-ordered alphabetically. Of course, the list may be ordered by other methods, instead.

Further, description will be made regarding the various processes of the staff registered in such a manner.

First, in the event that a certain staff member is selected on the member registration panel 9706, the registration of that staff member may be canceled, as well. Selecting the staff member which to be deleted (at this time, all items in the horizontal direction corresponding to the selected item are in the selected state, whichever item is selected), and then instructing the delete button 9708 after selecting the staff hides the selectively displayed staff member, and the group information data 9703 of this staff member is deleted from the hard disk device 105. Incidentally, "tanaka" is the leader, and cannot be deleted. Any attempt to delete the leader will result in an error message.

Also, there is a process for initializing the member information display area 9712. In the event that at least one staff member is registered in the member registration panel 9706, all registered staff members can be canceled by instruction of the initialize button 9709, returning to the state where only the leader information is displayed. In this case, the display form on the member registration panel 9706 and the staff deletion procedures from the hard disk device 105 are processed in the same manner as if the delete button 9708 had been pressed.

Thus, once registration, deletion, and initializing processes and so forth have been completed, and the end button 9710 is pressed, the member registration panel 9706 is closed, and the staff registration by the leader is completed. Hence, data relating to the staff members is registered in a file in the group information data 9703 within the hard disk device 105 of the design managing apparatus owned by the leader.

<setting of project information by the staff>

Next, description will be made regarding setting of project information within the design managing apparatus owned by the staff specified by the leader according to the above method. Setting of project information by the staff is enabled by ending of the staff registration at the design managing apparatus owned by the leader.

A point that should be noted here is that in the event that a certain user performs setting of the project information as the leader within the group, that user becomes the leader, and other users become staff. In other words, users within the group may be either a leader or staff. That is, the difference between the leader and staff depends on the contents of the set project information.

Also, in the event of setting project information as a staff member, there is the need to set the project information under the same project name as the leader. If this is not the same, this individual must be registered in the group as the leader instead of staff, necessitating setting of new project information.

For example, description will be made regarding a case wherein the leader "tanaka" registers a user "sato" as a staff member on the member setting panel 9713 shown in FIG. 81, and the staff member "sato" is to set for project information.

First, the staff member "sato" brings up the project information setting panel 2101 such as shown in FIG. 64 on the CRT display 103 of his/her own design managing apparatus 101, and first instructs the New button within the button group 2102. This brings up the project information input panel 2107 on the project information setting panel 2101.

Now, in the project information input panel 2107, setting test in the item with the label Project:, ks to the item with the label Prefix:, ks_test in the item with the label Variation:, tanaka in the item with the label Owner:, and further instructing the OK button 2108, determines the set contents. The reason that tanaka is set in the item with the label Owner: is that the user tanaka is the leader of the project test.

Also, in the case of setting project information on the side of the staff such as described above, registration is executed only if confirmation of the staff names registered on the side of the leader, the project name, Variation name, and so forth all match. In the event that these do not match, the problematic portion is displayed in the CRT display 103 with a message, prompting either to reset the project information, to abort setting, or to register that staff member anew as the leader. In the case of resetting, the aforementioned setting and confirmation work is repeated; in the case of aborting, the data is discarded and then the project information input panel 2107 is closed. In the event that the user is to be registered as the leader, the same process is performed as in the above-described setting of project information.

Once the project information has been set, the leader and the staff proceed with the work that has been allotted to each. At this time, using a later-described library enables the users to make reference to the data of other members in the same group.

The above case involves the leader tanaka first performing the project information setting and staff registration setting, following which the staff member sato performs processing, but if there is a case where the leader tanaka is absent for some reason, the staff member sato may perform processing before the leader tanaka. The following is a description of the procedures for the staff member sato performing project information setting processing before the leader tanaka.

In this case, the leader tanaka has set nothing, so the staff member sato must initiate setting of the project information himself/herself. Accordingly, sato is input to the item with the Owner: label, requiring sato to serve as a pseudo-leader. Then, following the various settings made as the leader, sato is able to proceed with the allotted work as the staff member sato recognized by the group members.

Following setting of the project information by the staff member sato, the user tanaka needs to perform processing as the leader, so tanaka must be input in the item with the Owner: label at the time of setting the project information. After setting the project information, the leader tanaka uses the member registration panel 9706 in the same manner as above, and registers the staff member sato. However, in the case of this registration, the setting contents must be the same as the Variation name and so forth of the staff member sato. In the event that this is not the same, tanaka must continue re-entering until these are the same, or discard the information which the staff member sato has set.

Even after member registration processing by the leader tanaka is completed, the design managing apparatus 101 owned by the staff member sato still has sato registered as the leader, so the staff member sato must change the leader to tanaka.

In this case, the staff member sato brings up the project information setting panel 2101 such as shown in FIG. 64 on the CRT display 103 of his/her own design managing apparatus 101, and instructs the ChgOwn button within the button group 2102, so as to display on the project information setting panel 2101 the project information input panel 2107 displaying detailed information of the project which is already selected, and then changes the information sato in the item with the Owner: label to the original tanaka.

Now, in the above example, there was only staff member sato registered as to the leader tanaka, but the basic operations do not change even if there are two or more, as a matter of course. Each staff member creates project information which corresponds with the project name and Variation name set by the leader. Subsequent processing is the same as that described above.

<Changing the leader>

Next, description will be made regarding the processing in the case of changing the leader of a created group.

Here, an example will be given regarding changing the leader of a project created by the above procedures from tanaka to sato.

The staff member sato who is attempting to be the new leader brings up the project information setting panel 2101 such as shown in FIG. 64 on the CRT display 103 of his/her own design managing apparatus 101, and first instructs the ChgOwn button within the button group 2102. The project information input panel 2107 displaying detailed information of the project which is already selected is displayed upon the project information setting panel 2101.

Now, changing the information tanaka in the item with the Owner: label to sato makes sato the group leader. Now that sato is the leader, tanaka is registered as a staff member. The member setting panel 9713 is used for setting members.

Once member registration by sato of tanaka as a staff member is completed, in order to match information within the group, tanaka must also instruct the ChgOwn button on the project information setting panel 2101, open the project information input panel 2107, and change the information tanaka in the item with the Owner: label to sato. Also, in the event that there are other registered staff members in the group, each of these staff members must perform change of leader.

A point of caution in changing the leader is that in the event that staff members have made reference to data before the contents of the item with the Owner: label are changed, data reference is performed according to the settings of the leader before that change. Also, in the event that the new leader has not set new members within the group, other members cannot change Owner:.

<Library registration>

In order for the members of a group to make reference to the design data of one another, there is a method of having a common "library". The term "library" used here indicates individual pieces of design data or a database thereof generated out of design data generated in another device and stored in the design managing apparatuses of each member, so that design data generated in the design managing apparatus owned by a certain member can be referred to by other members. In order to use such a library, registration of the library must be made.

Figure 82:
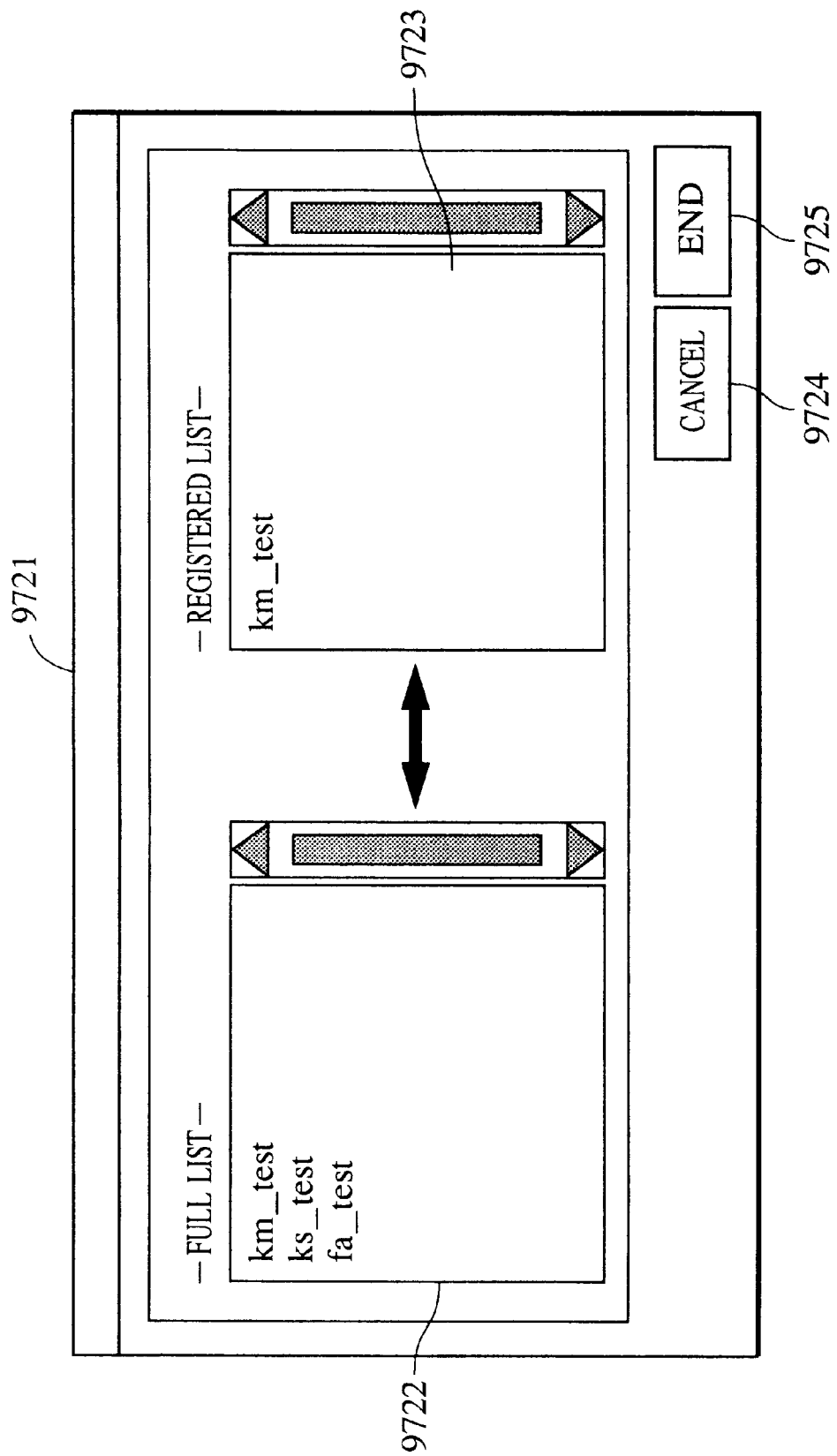
FIG. 82 is a diagram illustrating a library registration panel.

FIG. 82 is a diagram illustrating a library registration panel 9721.

In this FIG. 82, 9722 is a total list of the library names of each member, and in the figure, the library name shaded gray indicates that library registration thereof has already been performed. Also, 9723 is a registration list indicating registered libraries, corresponding with the library name shaded gray in 9722 (here, km__test). Also, 9724 is an cancel button, for discarding the setting contents and ending the panel. Also, 9725 is an end button for saving the setting contents and ending the panel.

Now, an example of registering the library name km__test as shown in FIG. 82 will be described.

First, km__test on the full list 9722 is indicated by means of an input device such as the mouse 104 or other device. This changes km__test on the total list 9722 to gray, and km__test is registered on the registration list 9723. Conversely, when removing an item from the registration list, instructing km__test on the registration list 9723 deletes km__test from the registration list 9723, and km__test on the full list 9722 is changed back from gray to black.

Also, it is difficult to visually grasp how the library actually operates. As an example, assuming that design data which is the same as that generated by program A is a type called xxx.tst, for example, and that data can be referred to as a library, setting xxx.tst which has been registered with that library at the time of starting the program A enables usage of xxx.tst without troublesome procedures of the user making reference to other design managing apparatuses.

That is to say, owing to library registration functions, work which originally would have been performed by the user can be omitted, thus improving operability.

<Lock management>

Lock management is a function for protecting the library used by a group-registered member. This is the same as the lock management function 310-4 (see FIG. 5), and the lock data 9726 which is library data subjected to lock management in FIG. 83 is stored in the lock information data file 508 within each of the design managing apparatuses 101.

Now, the lock management relating to the present embodiment will be described in further detail, with reference to FIG. 83.

Figure 83:
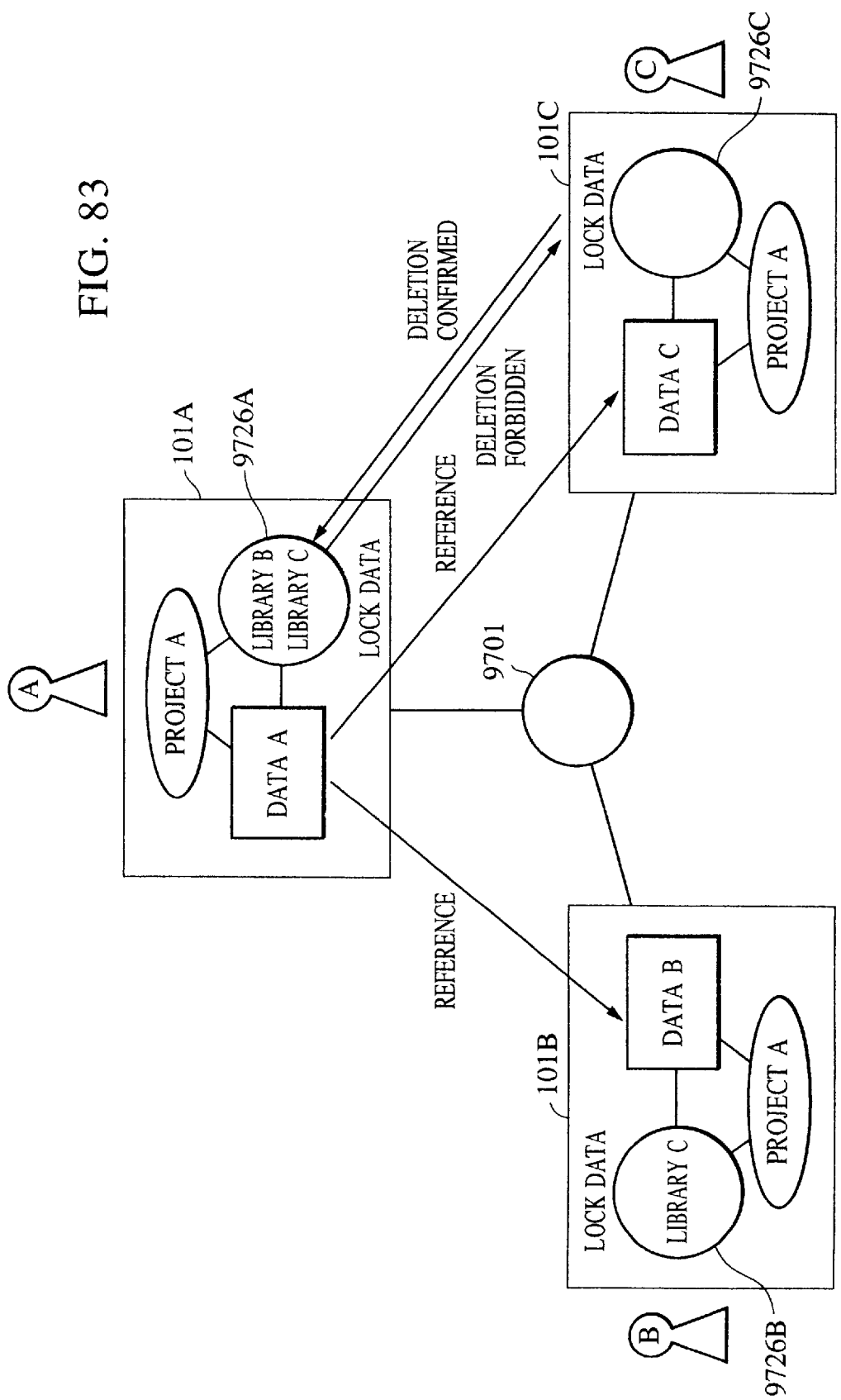
FIG. 83 is a diagram describing lock management.

In FIG. 83, the project name is project A, the user A is the leader on the network 9701, and users B and C are staff members. The design managing apparatus 101A owned by the leader A has the data B generated from the design managing apparatus 101B registered in the lock data 9726A as library B, and the data C generated from the design managing apparatus 101C registered therein as library C. In the same way, the design managing apparatus 101B owned by the staff member B has the data C generated from the design managing apparatus 101C registered in the lock data 9726B as library C, and the design managing apparatuses 101A and 101B are performing some sort of processing.

Under such conditions, in the event that the design managing apparatus 101C attempts to delete its own project A, first, confirmation is made with the members of the project A within the design managing apparatus 101A of the leader A. From there, confirmation is made whether there is a library C within the locked data of each of the members. In the case shown in FIG. 83, there is a library C in the locked data of the design managing apparatus 101A and 101B, so deletion cannot be performed, and thus an error message is displayed.

In the same way, in the event that the design managing apparatus 101A attempts to delete the staff member C from the group, confirmation is made with the members including the leader A, whether there is user C to be deleted, i.e., a library C of the design managing apparatus 101C, within the locked data of each of the members. In the case shown in FIG. 83, library C is locked in the design managing apparatus 101A and 101B, so deletion cannot be performed.

In this way, the lock management function acts to protect the data created using libraries. If this function did not exist, such deleting operations such as described above would actually be carried out, possibly harming processing of the data.

Also, this lock management is effective after performing processing for determining the project in the project information setting panel 2101 (i.e., pressing the OK button 2105 in the project information setting panel 2101). An error message will be displayed each time deletion of a project or member registered in the library is attempted, until the lock is canceled.

<Flowcharts and description thereof>

Now, the processes relating to the present embodiment will be described in detail, using the flowcharts from FIG. 84 through FIG. 87.

Figure 84:
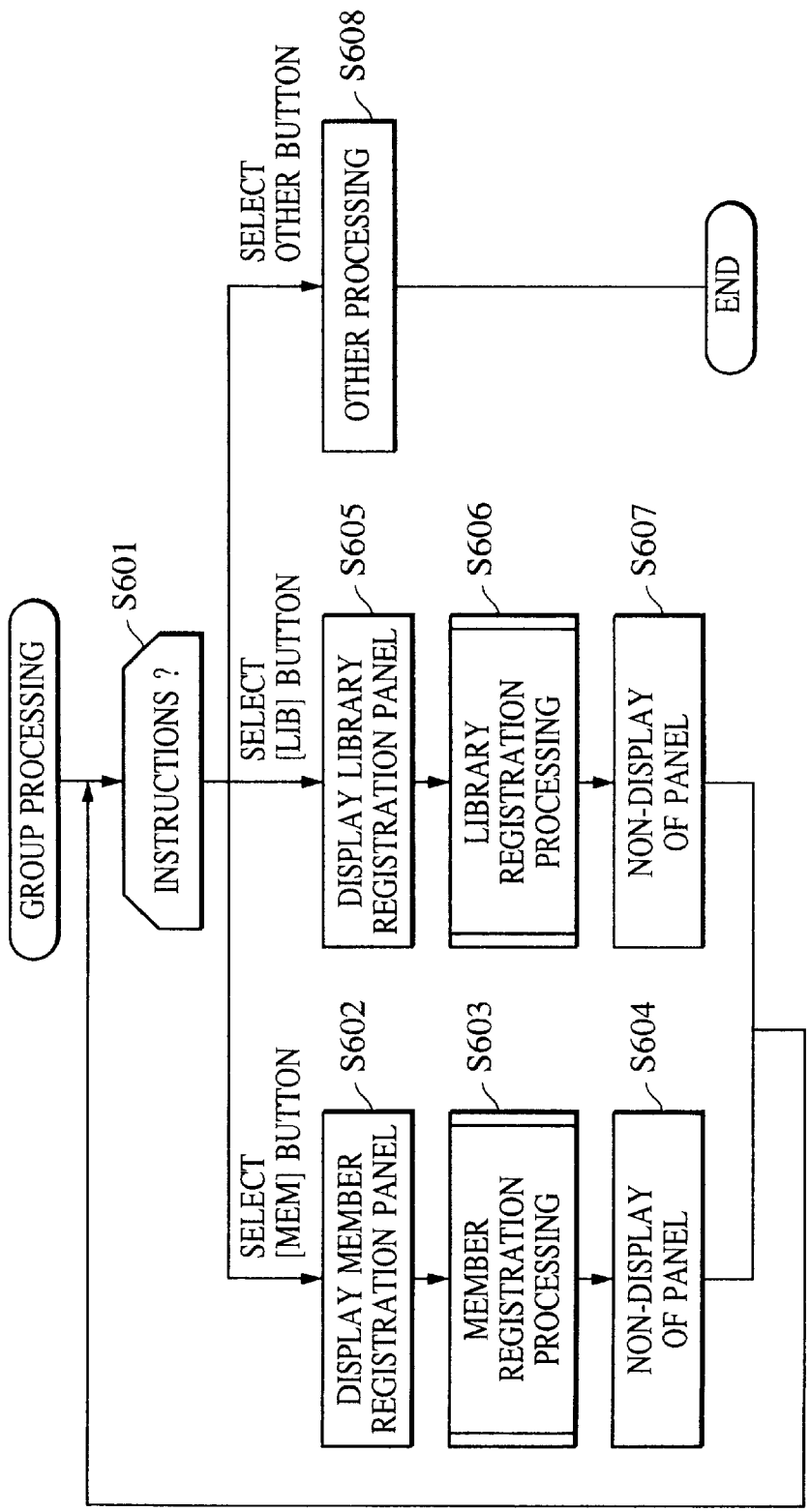
FIG. 84 is a flowchart for group processing.

FIG. 84 is a flowchart relating to group processing in the state that the project information setting panel 2101 is open.

In Step S601, judgment is made of what sort of instruction has been issued. In the event that judgment is made that the Mem button has been instructed, the flow proceeds to Step S602, and displays the member registration panel 9706. Then, in Step S603, member registration processing is performed, and in Step S604 the member registration panel 9706 is hidden from view, and the flow returns to Step S601.

In Step S601, in the event that judgment is made that the Lib button has been instructed, the flow proceeds to Step S605, which displays the library registration panel 9721. Then, in Step S606, library registration processing is performed, and in Step S607 the library registration panel 9721 is hidden from view, and the flow returns to Step S601.

In Step S601, in the event that judgment is made that another button has been instructed, the flow proceeds to Step S608, performs that other processing, and the series of processes ends.

Figure 85:
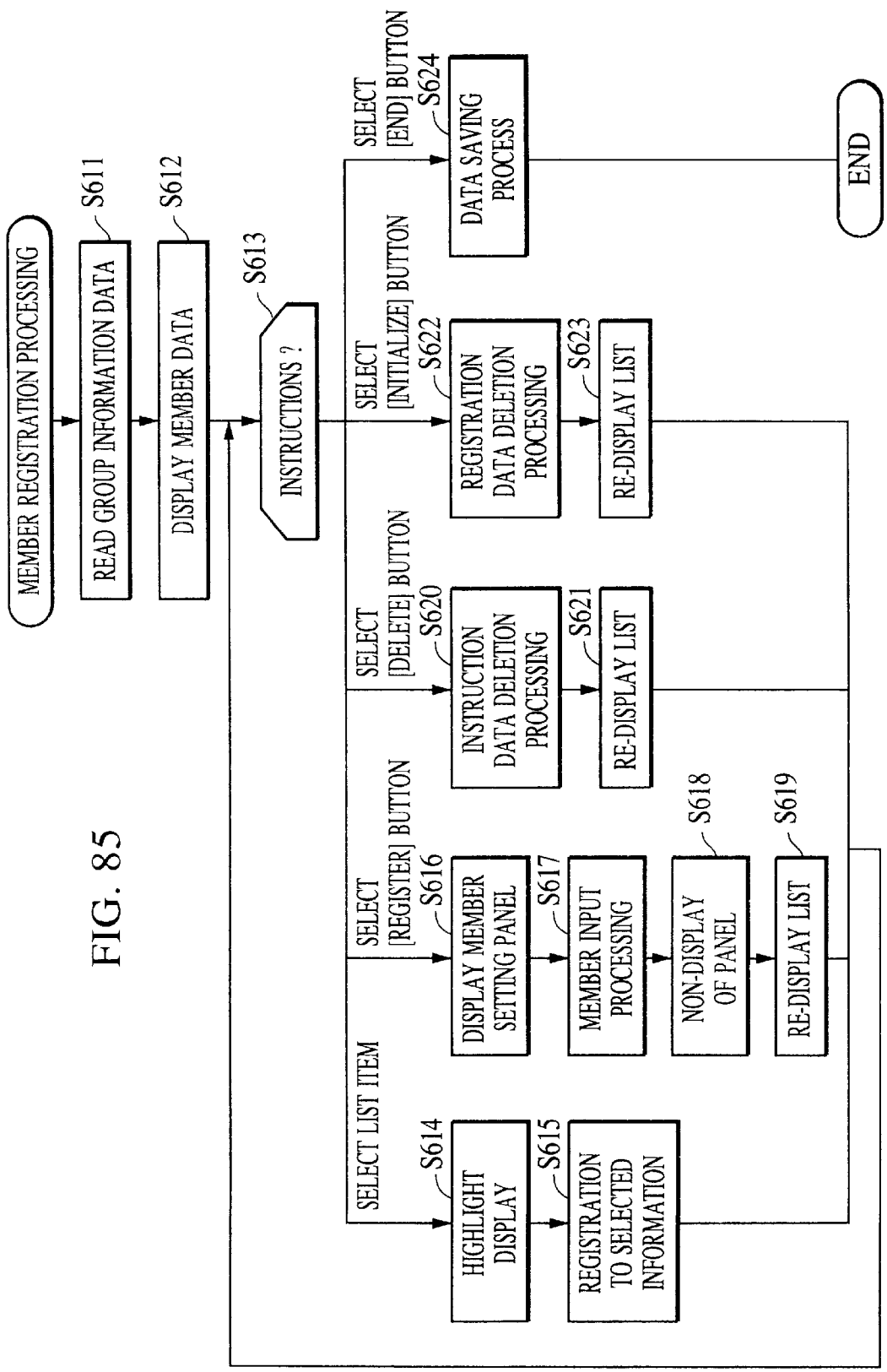
FIG. 85 is a flowchart for member registration processing.

Next, further detailed description will be made regarding the flow of member registration processing on the member registration panel 9706 in Step S603 with reference to FIG. 85.

In Step S611, group information data 9703 is read from the hard disk device 105. Then, in step S612, the data of the already-registered members is displayed on the member registration panel 9706. Then, in Step S613, judgment is made of what sort of instruction has been issued. In the event that judgment is made that an item within the member information display area 9712 has been instructed, the flow proceeds to Step S614 which highlights the selected item. The selected item is registered in the data storing device 110 in Step S615, and the flow returns to Step S613.

In Step S613, in the event that judgment is made that the register button 9707 has been instructed, the flow proceeds to Step S616 which displays the member setting panel 9713. Then in Step S617, input processing of member information is performed, and in Step S618, the member setting panel 9713 is hidden from view. Then, in Step S619, the list of the member information display area 9712 is displayed again, and the flow returns to Step S613.

In Step S613, in the event that judgment is made that the delete button 9708 has been instructed, the flow proceeds to Step S620 in which the item in the selected state is deleted from the group. In Step S621, based on the deletion results, the list of the member information display area 9712 is displayed again, and the flow returns to Step S613.

In Step S613, in the event that judgment is made that the initialize button 9709 has been instructed, the flow proceeds to Step S622 in which the registered data is all deleted. In Step S623, based on the deletion results, the list of the member information display area 9712 is displayed again, and the flow returns to Step S613.

In Step S613, in the event that judgment is made that the end button 9710 has been instructed, the contents set on the member registration panel 9706 are saved to the data storing device 110 in Step S624, and the series of processes is ended.

Figure 86:
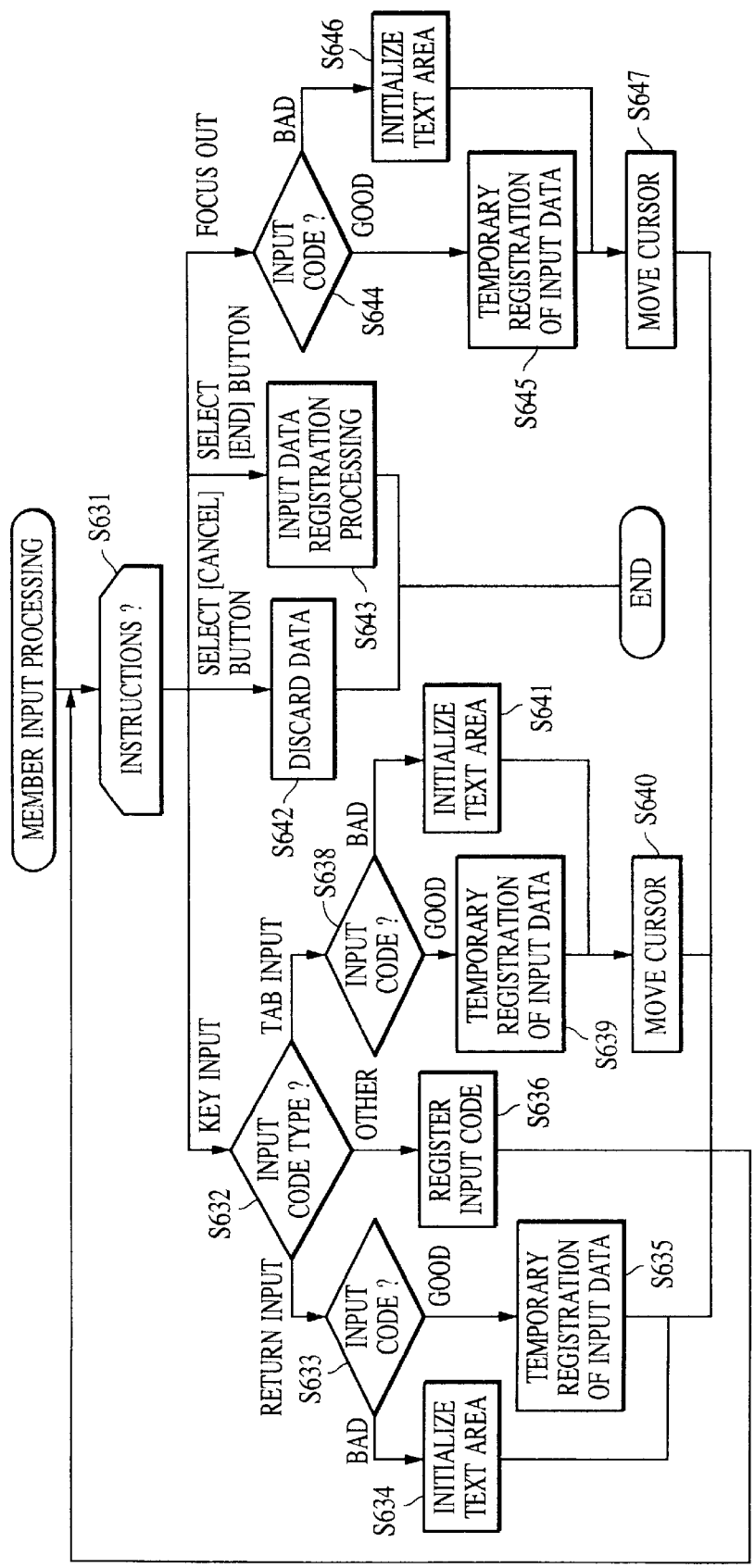
FIG. 86 is a flowchart for member input processing.

Next, further detailed description will be made regarding the flow of member input processing on the member setting panel 9713 in Step S617, with reference to the flowchart in FIG. 86.

In Step S631, judgment is made of what sort of instruction has been input. In the event that judgment is made that key input has been performed, the flow proceeds to Step S632, and judgment is made as to which code has been input. In the event that judgment is made that the return code has been input, the flow proceeds to Step S633, checking is performed whether the input data meets the conditions such as character restriction and difference with already-existing names and so forth, and in the event that the conditions are met, the flow proceeds to Step S635 which performs temporary registration. In the event that the conditions are not met, the flow proceeds to Step S634, where the text area is initialized. Then, the flow returns to Step S631.

Also, in Step S632, in the event that judgment is made that a tab code has been input, the flow proceeds to Step S638, checking is performed whether the input data meets the conditions such as character restriction and difference with already-existing names and so forth. In the event that the conditions are met, the flow proceeds to Step S639 which performs temporary registration. In the event that the conditions are not met, the flow proceeds to Step S641, where the text area is initialized. Then, in Step S640, the cursor is automatically inserted into the text area of the next item, following which the flow returns to Step S631.

Also, in Step S632, in the event that judgment is made that a code which is neither a return code nor a tab code has been input, the input code is registered in Step S636, and the flow returns to Step S631.

Also, in Step S631, in the event that judgment is made that the cancel button 9719 has been instructed, the flow proceeds to Step S642 in which all of the data set to the member setting panel 9713 is discarded, and the series of processes ends.

Also, in Step S631, in the event that judgment is made that the end button 9720 has been instructed, the flow proceeds to Step S643 in which the data set to the member setting panel 9713 is registered in the data storing apparatus 110, and the series of processes ends.

Also, in Step S631, in the event that judgment is made that focus is off due to movement of the focus position by the mouse 104, the flow proceeds to Step S644 in which checking is performed as to whether the input data meets the conditions such as character restriction and difference with already-existing names and so forth. In the event that the conditions are met, the flow proceeds to Step S645 which performs temporary registration. In the event that the conditions are not met, the flow proceeds to Step S646, where the text area is initialized. Then, in Step S647, the focus position is moved, following which the flow returns to Step S631.

Figure 87:
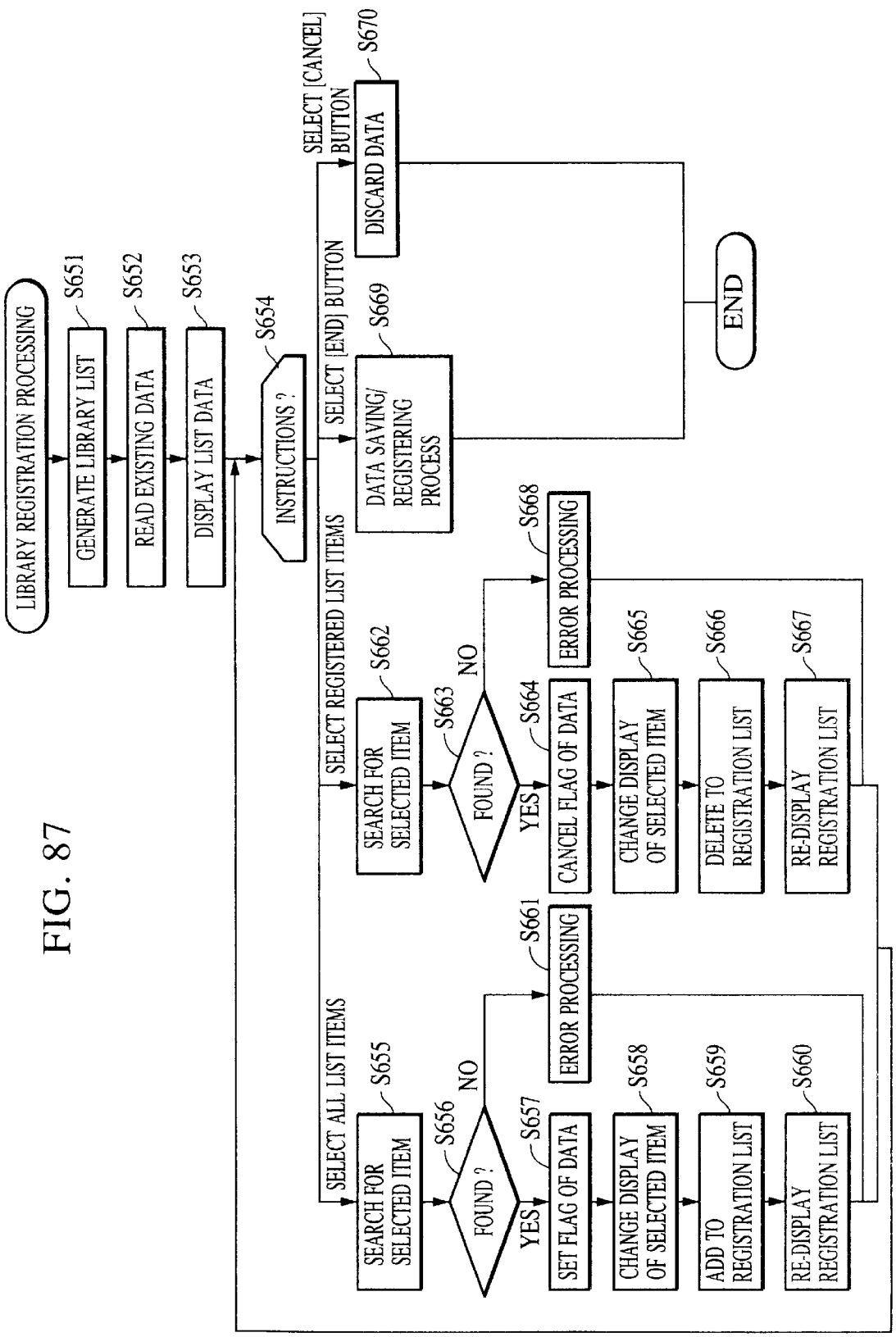
FIG. 87 is a flowchart for library registration processing.

Next, further detailed description will be made regarding the flow of registration processing on the library registration panel 9721 in Step S606 with reference to FIG. 87.

In Step S651, library list data (total list data) is generated and in Step S652 reading of already-existing registration data (registration list data) is performed. In Step S653 the generated full list data is displayed as a full list 9722, and the registration list data is displayed as a registration list 9723. Then, in Step S654, judgment is made of what sort of instruction has been input.

In the event that judgment is made in Step S654 that an item within the full list 9722 has been selected, the flow proceeds to Step S655, in which the selected item is searched for from the total list data. In Step S656, judgment is made whether or not the item being searched for has been found, and in the event that the item has not been found, error processing is performed in Step S661, and the flow returns to Step S654.

Also, in the event that the item has been found, the flow proceeds to Step S657, in which a flag is set for that data. Then, in step S658, the display of the selected item is changed, and in Step S659, processing is performed to add the selected item to the registration list data. Then, in Step S660, the newly generated registration list 9723 is displayed upon the library registration panel 9721, and the flow returns to Step S654. Accordingly, temporary registration of the library is completed.

In the event that judgment is made in Step S654 that an item within the registration list 9723 has been selected, the flow proceeds to Step S662, and the selected item is searched for in the registration list data. In Step S663, judgment is made whether or not the item being searched for has been found, and in the event that the item has not been found, error processing is performed in Step S668, and the flow returns to Step S654.

Also, in the event that the item has been found, the flow proceeds to Step S664, and a flag is canceled for that data. Then, in step S665, the display of the selected item is changed, and in Step S666, processing is performed to delete the selected item from the registration list data. Then, in Step S667, the newly generated registration list 9723 is displayed upon the library registration panel 9721, and the flow returns to Step S654. Accordingly, the registered item in the library is temporarily deleted.

In Step S654, in the event that judgment is made that the end button 9725 has been instructed, the flow proceeds to Step S669, the data registered on the library registration panel 9721 is stored in the group information data 9703 within the hard disk device 105 of the data storing apparatus 110, the panel 9721 is closed, and the series of library registration processes ends.

In Step S654, in the event that judgment is made that the cancel button 9724 has been instructed, the flow proceeds to Step S670, the data created on the library registration panel 9721 is deleted, the panel 9723 is closed, and the series of library registration processes ends.

Thus, according to the present invention, a plurality of users can perform processing together via a network, so work can be conducted from mutually remote locations, and also the work becomes more efficient and the time required for designing can be reduced.

Also, the leader can perform addition and deletion of members in the group, so centralization under the command of the leader can be realized.

Also, the leader can be set and then later changed, allowing for increased freedom in the design work.

Further, the design data of the members within the group can be registered as libraries, so there is no need to receive unnecessary data.

Moreover, locking the libraries protects the data within the group, so destruction of data due to human error in the course of work in the group can be done away with, and provision of accurate data can be expected at all times.

(Tenth Embodiment)
<Step management in group designing>

In accordance with expanding design scales and scattering of design sites, electric design is requiring group design with several designers. In order to implement this group design, known design systems have used single accounts (registration names to a computer), or have processed design data by hand.

The design managing apparatus 101 according to the present invention is provided with functions for performing group design, and is also provided with functions which allow design to be performed via a network. Also, an arrangement has been employed wherein each designer holds data designed by the designer himself/herself, so as to not allow freedom in design to deteriorate from the complete sharing of design data.

By means employing such functions and form, a design form with great freedom is realized, and also, centralized group design in which each design step is managed, is provided for.

Now, what sort of procedures execute the steps using the step relation diagram in the case of performing group design will be clearly laid out. However, even with group design, in cases where there is only one designer and there are no libraries to use, this is the same as designing alone, so the present embodiment is restricted to cases wherein design is performed by a plurality of members.

Now, description will be made regarding the design procedures of the leader and staff which are identified as designers within the group.

First, description will be made of the design procedures for staff members.

Each staff member determines a project with the same procedures as the case of designing alone, and decides on a step relation diagram. However, in the case of design by staff, the object is to design data for reference by the leader, so there is no need for the staff member to use the same step relation diagram as the leader performing design. Thus, a step relation diagram which has been shortened as compared to the step relation diagram of the leader performing design (hereafter referred to as "shortened relation diagram") is displayed on the main panel 902 of the design managing apparatus 101 owned by the staff member.

To what extent the step relation diagram is to be shortened depends on the design environment (development style, method of operation) and so forth. The staff may use exactly the same step relation diagram as the leader, although this is not a very efficient arrangement.

Figure 88:
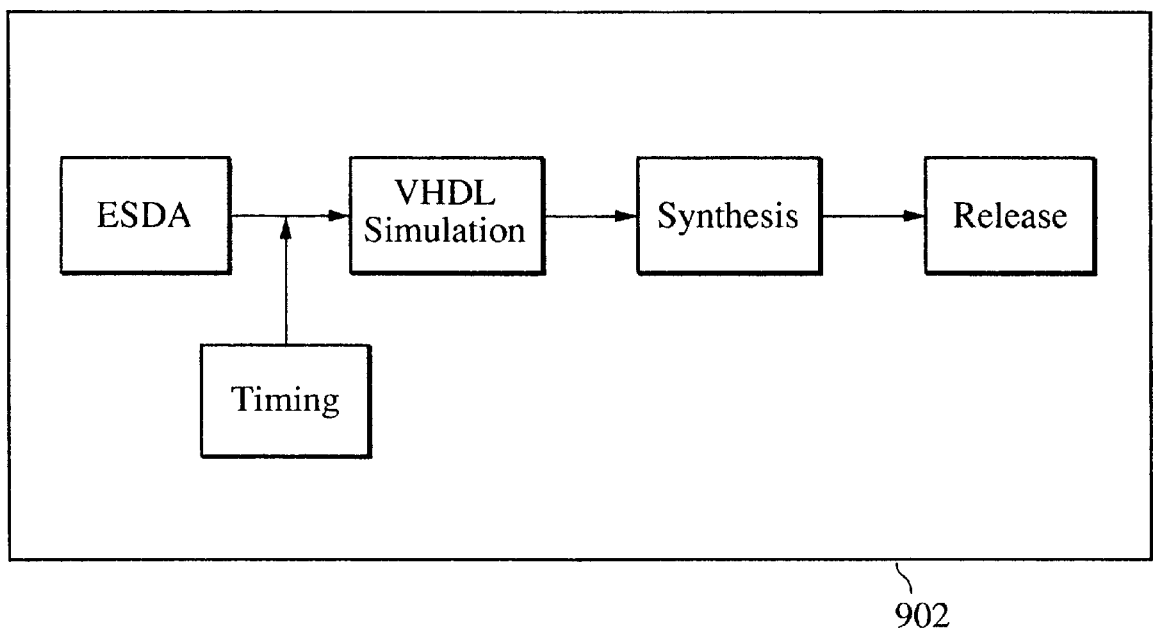
FIG. 88 is a diagram illustrating an example of a compacted relation diagram.

With the present embodiment, the step relation diagram for the leader to perform designing is shown in FIG. 13, and the staff used a shortened relation diagram such as shown in FIG. 88, for the sake of efficiency in design and simplification. FIG. 88 is the same as the step relation diagram shown in FIG. 13, except that the steps between the step "Synthesis" to the step "Release" have been omitted. In FIG. 88, the reason that the steps between the step "Synthesis" and the step "Release" have been omitted is that generally, the data within the group has been synthesized by the step "Synthesis" in FIG. 13, and the reason that the last step "Release" has been left is because the staff need a step which includes the work of determining data reference permission. The manner of operation and so forth in each step within the shortened relation diagram in FIG. 88 is the same as the step relation diagram in FIG. 13.

Next, description will be made of the design procedures of the leader.

After the leader has registered the library with the procedures of the first embodiment, the step relation diagram can be determined by indicating the OK button 2105 on the project information setting panel 2101. The step relation diagram determined here is the same as that for a single designer performing designing alone. Of course, changes can be made if necessary.

After displaying the step relation diagram, the design managing apparatus 101 following the step execution instructions of the leader executes the instructed steps with the determined procedures. At this time, a design environment is built, and a library is set up as data within the design environment.

Of course, in the event that this setting encounters a fatal error (e.g., a configuration file describing the library location could not be generated, etc.), the step is aborted and error processing is performed.

Also, the design data on the side of the leader after execution of the step is handled by common data of the entire group, by means of the leader making reference of the library.

Also, reference to the library by the leader is not done at every step; rather, this is done only in steps which have work which can aggregate data as a library.

Next, a specific operational example of step management by both the leader and staff in performing group design will be described.

Figure 89:
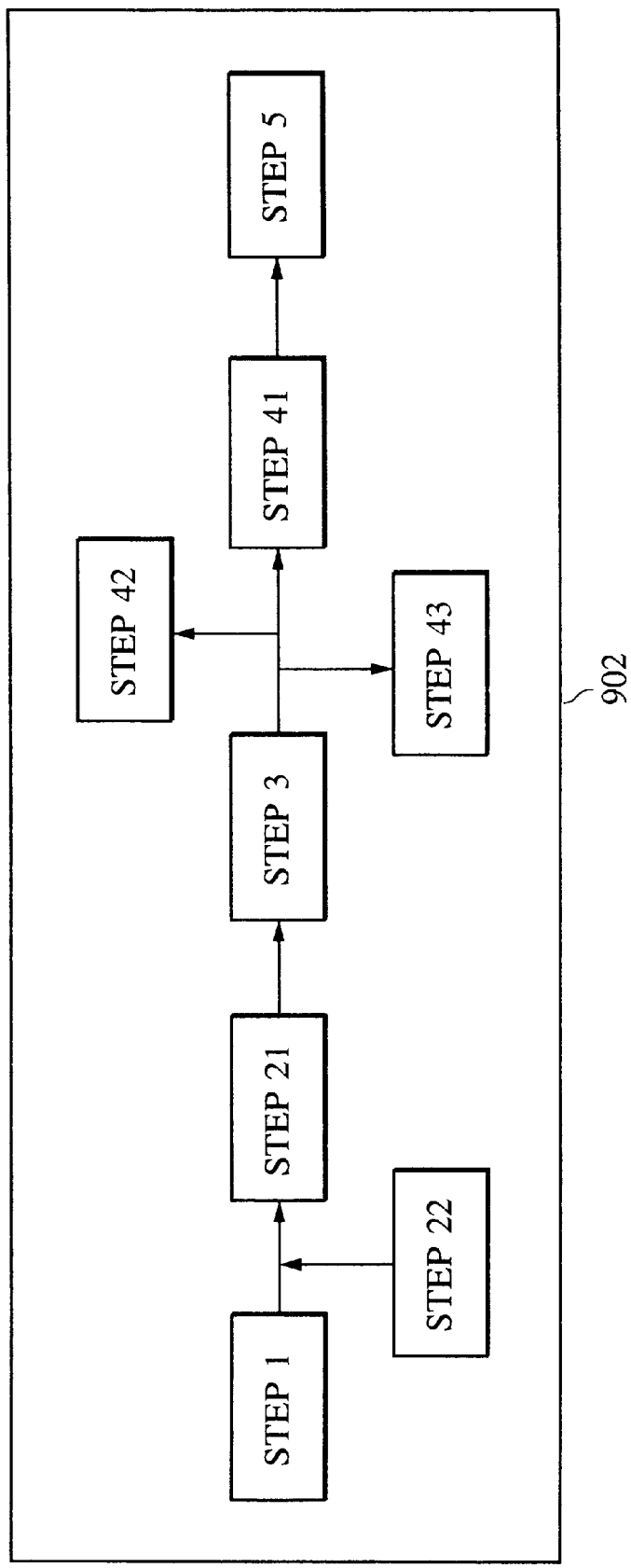
FIG. 89 is a step relation diagram for Reader X.

Here, the project name is AAA, the group is comprised of two individuals, the leader X and staff member Y, and member registration has already been completed. The step relation diagram of the leader X is shown in FIG. 89, and the shortened step relation diagram of the staff X is shown in FIG. 90, with the design data of both the leader X and staff Y to be synthesized in step 3.

First, the action on the side of the staff member Y will be described.

Figure 90:
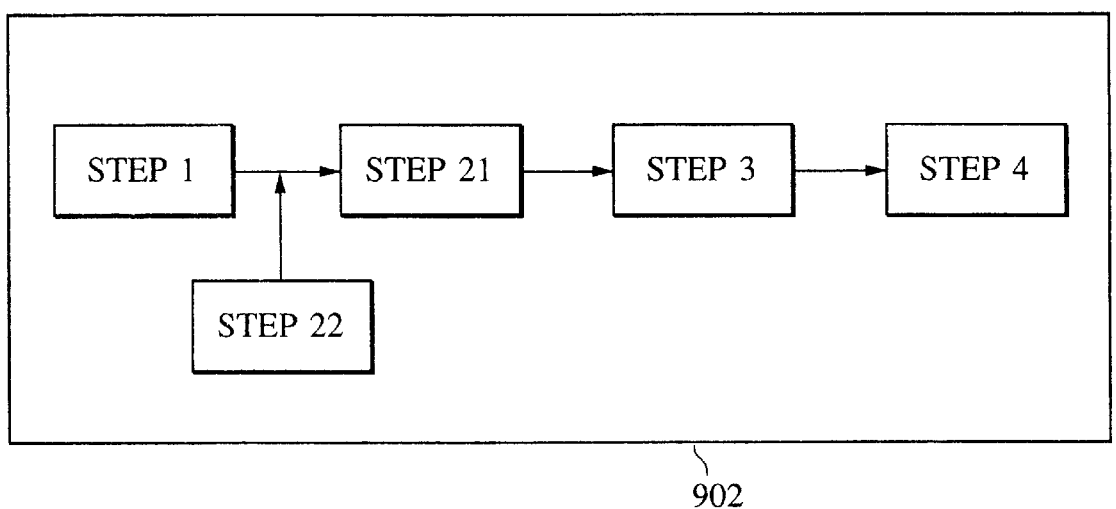
FIG. 90 is a step relation diagram for Staff Y.

Instructing step 1 in FIG. 90 executes the predetermined CAD tool and certain design data is generated. Performing verification following the generation of the design data places both step 21 and step 22 in executable states. Next, step 21 and step 22 are executed, and when certain data is generated, step 3 becomes executable following execution of step 21. Further, step 3 is executed, and this generates certain data. Step 4 is placed in an executable state following generation of design data. Finally, reference of the data designed by the staff Y is permitted by the leader X by means of execution of step 4, and thus the leader X can make reference to the data designed by the staff Y.

Next, the action on the side of the leader X will be described.

The leader X also executes step 1 through step 22 as with the case of the staff member Y, each step enabling execution of the next step. At the time of executing step 3, a design environment is built, including reference to the data designed internally by the staff Y. There are several ways to make reference at this time, depending on the CAD tools to be used in the steps. For example, there is a method of directly specifying design data, a method of setting a path (where data is), and so forth. Then, by execution of step 3, the data of the leader X and the staff Y is synthesized, outputting certain design data. Thus, step 41, step 42, and step 43 are put in an executable state.

At this time, it is required that staff Y always complete step 4 and for step 4 to be in a referable state in order for step 3 to be executed. If staff Y is not in a referable state, error processing will be performed regarding the reference method. Taking the above into consideration, with the method of directly specifying data, execution is terminated, and with the method of specifying a path, the CAD tools will be executed without making reference to design data. In the case of the latter, design can be terminated, but such restrictions would lower the degree of freedom in design, so execution of CAD tools here is permitted.

Also, in the event that the leader Y desires to execute a further step without making reference to the design data generated by the staff Y, this can be done by canceling the library setting.

After step 3 is executed, step 41 is executed, thus generating certain data. After generating design data, step 5 becomes executable. Finally, step 5 is executed, the design data is released, and all of the steps are completed.

Now, since the data of the leader X and staff Y are synthesized in step 3, the design of the steps step 1 through step 22 up to that point can be conducted in a parallel manner between the leader X and staff Y.

Also, an arrangement is also possible wherein the leader X does not register the library, and continues with design to step 4, and then proceeds with synthesis processing of the design data after all of the steps of the staff Y.

Also, depending on the description method of the rule file used by the staff Y, the reference design data may be released at the point that step 3 is completed.

Thus, according to the present embodiment, in the case that a plurality of users execute a single process together via a network for designing of an object of design such as ASICs, appropriate step management can be realized at the terminal owned by any user.

Further, according to the present embodiment, description has been made with the leader and the staff performing one process together, but arrangements are also possible wherein the leader and staff perform completely separate processes, or wherein the leader and staff perform processes alternately. In such cases, appropriate step management can be realized on both the side of the leader and of the staff, so processing can be done in an effective manner.

As described above, according to the present invention, the extremely complex design steps of objects of design which are increasing in complexity and size, particularly ASICs, can be managed in a centralized manner, thus enabling more effective design.

The present invention is also advantageous in that setting and changing of objects to which design is to be performed upon which the objects of design are based, and processing programs started with the steps, can be performed in an extremely easy manner.

Also, each step is displayed in a color according to the state thereof, and with each change in the state thereof owing to execution of a process, or setting or change of a processing program or object which is to be designed, the color indicating the state thereof is changed accordingly, so the designer can easily known the state of the step and the change thereof.

Also, the present invention is advantageous in that change of information regarding the objects to be designed which the objects of design are based can be performed during designing.

Also, the present invention is advantageous in that a plurality of different design processed can be performed in parallel, when designing objects to which design is to be performed upon which the objects of design are based.

Also, the present invention is advantageous in that a plurality of users can perform processing together via a network, so processing can be made even if the plurality of users are in remote locations with respect to each other, thus increasing efficiency and reducing processing time.

It is also an advantage of the present invention that an appropriate process administration can be implemented when a plurality of users execute a processing in cooperation through a network.

Also, the present invention is advantageous in that the above advantages facilitate marked improvement in the efficiency of work, with the load on the designer being lightened, and design errors being reduced.

What is claimed is:

1. A step managing apparatus for managing a plurality of steps, comprising:

first displaying means for displaying said plurality of steps as symbols;

judging means for judging a state of at least a portion of said plurality of steps;

second displaying means for displaying said plurality of steps in an identifiable manner based on the state judged by said judging means;

execution instructing means for instructing the execution of one of said plurality of steps;

executing means for executing a step instructed by said execution instructing means in the event that said step has been judged by said judging means to be a step which is executable; and notifying means for notifying that the step instructed by said execution instructing means is not executable, in the event that said step has been judged by said judging means to be a step which is not executable.

2. A step managing apparatus according to claim 1, wherein said first displaying means displays in an identifiable manner an order of execution of said plurality of steps.

3. A step managing apparatus according to claim 1, wherein said judging means judges at least whether or not said plurality of steps are executable.

4. A step managing apparatus according to claim 3, wherein said judging means judges the state of said plurality of steps, based on an order of execution of the plurality of steps.

5. A step managing apparatus according to claim 4, wherein said judging means judges the state, based on whether or not data used for executing a step which is an object of the judging has been generated in a preceding step in the order of execution.

6. A step managing apparatus according to claim 5, wherein the data generated with execution of each of said plurality of steps has version information indicating a generation of the data;

and wherein said judging means judges the state based on whether or not the version information of the data used for executing the step which is the object of the judging matches the version information of the data generated in the preceding step, in the event that the data used for executing the step which is the object of judging has been generated in the preceding step.

7. A step managing apparatus according to claim 4, wherein said judging means judges the state, based on whether or not a step prior to a step which is an object of the judging is executable or not.

8. A step managing apparatus according to claim 1, wherein said second displaying means displays each of said plurality of steps with colors, based on the state judged by said judging means.

9. A step managing apparatus according to claim 1, further comprising:

storing means for storing each of said plurality of steps and processing programs started when executing the steps, in a manner relating one to another;

relational displaying means for displaying the relation between each of the plurality of steps and the processing programs, stored in said storing means;

first changing means for changing one of the processing programs in the relation displayed by said relational displaying means; and second changing means for changing the relation between each of the plurality of steps and the processing programs, stored in said storing means, based on the changes made to the one of the processing programs by said first changing means;

wherein said judging means judges state changes of the steps due to relation changes by said second changing means, and wherein said second displaying means changes a display form of a step the state of which has been judged to change by said judging means.

10. A step managing apparatus according to claim 1, further comprising changing means for changing the display form of a step judged to be changed to said judging means, as a result of execution by said executing means.

11. A step managing apparatus according to claim 1, wherein each of said plurality of steps includes a further plurality of steps.

12. A step managing apparatus according to claim 11, further comprising:

instructing means for instructing one of said plurality of steps; and third displaying means for displaying the further plurality of steps included in the step instructed by said instructing means.

13. A step managing apparatus according to claim 12, further comprising:

control means for controlling a number of steps displayed by said third displaying means.

14. A step managing apparatus according to either claim 1 or claim 12, wherein said plurality of steps comprises steps for designing an object.

15. A step managing apparatus for managing a plurality of steps according to claim 1 wherein said plurality of steps comprises steps for designing an object, said apparatus further comprising:

storing means for storing information used for said designing;

displaying means for displaying information stored in said storing means;

first changing means for changing the information displayed by said information displaying means; and second changing means for changing the information stored in said storing means based on a change of the displayed information by said first changing means;

wherein said judging means judges a change in state due to a change of the stored information by said second changing means, and wherein said second displaying means changes a display form of a step the state of which has been judged to change by said judging means.

16. A step managing apparatus for managing a plurality of steps for designing an object, comprising:

storing means for storing information used for said designing;

displaying means for displaying information stored in said storing means;

first changing means for changing the information displayed by said information displaying means; and second changing means for changing information stored in said storing means based on a change of information by said first changing means.

17. A step managing apparatus for managing a plurality of steps according to claim 16, wherein said first changing means comprises:

instructing means for instructing first information of the information displayed on said information displaying means;

first list displaying means for displaying a list of candidates for said first information, based on the instruction of said instructing means;

first selecting means for selecting a desired first information from the list of candidates displayed by said first list displaying means;

second list displaying means for displaying a list of second information in a tier lower than the first information selected by said first selecting means; and second selecting means for selecting a desired second information from a list of candidates displayed by said second list displaying means.

18. A step managing apparatus for managing a plurality of steps according to claim 17, wherein said first information is a name of a manufacturer of the object which is a basis for design, and said second information is restricting information for restricting the object manufactured by said manufacturer.

19. A step managing apparatus for managing a plurality of steps according to claim 16 or 15, wherein said designing of the object comprises ASIC circuit designing.

20. A step managing apparatus for managing a plurality of steps according to either of the claim 16 or 15, wherein said information used for designing comprises ASIC circuit information corresponding to specified manufacturing processes.

21. A step managing apparatus, comprising:

storing means for storing each of a plurality of steps and processing programs started when executing the steps, in a manner relating one to another;

relational displaying means for displaying a relation between each of the plurality of steps and the processing programs, stored in said storing means;

first changing means for changing one of the processing programs in the relation displayed by said relational displaying means; and second changing means for changing the relation between each of the plurality of steps and the processing programs, stored in said storing means, based on the changes made to the one of the processing programs by said first changing means.

22. A step managing apparatus according to claim 21, wherein said plurality of steps comprises main steps and auxiliary steps;

and wherein said relational displaying means separately displays said main steps and said auxiliary steps.

23. A step managing apparatus according to claim 21, further comprising:

first selecting means for selecting one of the plurality of steps displayed by said relational displaying means;

list displaying means for displaying a list of processing programs capable of handling the step selected by said first selecting means; and second selecting means for selecting a program of the processing programs displayed by said list displaying means.

24. A step managing apparatus for managing a plurality of steps, comprising:

input means;

storing means;

displaying means;

printing means;

first control means for performing control such that said plurality of steps stored in said storing means are displayed on said displaying means as symbols, based on input instructions by said input means;

judging means for judging a state of said plurality of steps; and second control means for performing control such that said plurality of steps displayed on said displaying means are displayed in an identifiable manner based on the state judged by said judging means; and third control means for performing control such that said printing means prints said plurality of steps displayed on said displaying means.

25. A step managing apparatus, comprising:

managing means for unified management of a group of steps including a first step which performs design of an ASIC function level, a second step which performs verification of said function level, a third step for creating a circuit diagram based on results of said verification, and a fourth step which performs verification of the created circuit diagram, and of data which is used in each of the steps of the group;

first displaying means for displaying the first, second, third and fourth steps managed by said managing means as four symbols, so as to identify an order of execution;

judging means for judging whether or not at least part of said four steps are executable, based on a usage relation between the data managed by said managing means and data between processes based on said execution order; and second displaying means for displaying each of said four steps in an identifiable manner, based on a state judged by said judging means.

26. A step managing method for managing a plurality of steps, comprising:

a first displaying step for displaying said plurality of steps by symbols;

a judging step for judging a state of at least a portion of said plurality of steps; and a second displaying step for displaying said plurality of steps in an identifiable manner based on the state judged in said judging step.

27. A step managing method according to claim 26, wherein said first displaying step displays in an identifiable manner an order of execution of said plurality of steps.

28. A step managing method according to claim 26, wherein said judging step judges at least whether or not said plurality of steps are executable.

29. A step managing method according to claim 28, wherein said judging step judges the state of said plurality of steps, based on an order of execution of the plurality of steps.

30. A step managing method according to claim 29, wherein said judging step judges the state, based on whether or not data used for executing a step which is an object of judging has been generated in a preceding step in the order of execution.

31. A step managing method according to claim 30, wherein the data generated with execution of each of said plurality of steps has version information indicating a generation of the data;

and wherein said judging step judges the state based on whether or not the version information of the data used for executing the step which is the object of the judging matches the version information of the data generated in the preceding step, in the event that the data used for executing the step which is the object of judging has been generated in the preceding step.

32. A step managing method according to claim 29, wherein said judging step judges the state, based on whether or not a step prior to a step which is an object of the judging is executable or not.

33. A step managing method according to claim 26, wherein said second displaying step displays each of said plurality of steps with colors, based on the state judged in said judging step.

34. A step managing method according to claim 26, further comprising:

an execution instructing step for instructing the execution of one of said plurality of steps;

an executing step for executing a step instructed in said execution instructing step in the event that said step has been judged in said judging step to be a step which is executable; and a notifying step for notifying that the step instructed in said execution instructing step is not executable, in the event that said step has been judged in said judging step to be a step which is not executable.

35. A step managing method according to claim 34, further comprising a changing step for changing a display form of a step the state of which changes due to a judgment in said judging step, as a result of execution in said executing step.

36. A step managing method according to claim 26, wherein each of said plurality of steps includes a further plurality of steps.

37. A step managing method according to claim 36, further comprising:

an instructing step for instructing one of said plurality of steps; and a third displaying step for displaying the plurality of steps included in the step instructed in said instructing step.

38. A step managing method according to claim 37, further comprising:

a control step for controlling a number of steps displayed in said third displaying step.

39. A step managing method for managing a plurality of steps, comprising:

a relational displaying step for displaying a relation between each of the plurality of steps and processing programs, stored in storing means;

a first changing step for changing one of the processing programs in the relation displayed in said relational displaying step; and a second changing step for changing the relation between each of the plurality of steps and the processing programs, stored in said storing means, based on the changes made to the one of the processing programs in said first changing step.

40. A step managing method according to claim 39, wherein said plurality of steps comprises main steps and auxiliary steps;

and wherein said relational displaying step separately displays said main steps and said auxiliary steps.

41. A step managing method according to claim 39, further comprising:

a first selecting step for selecting one of the plurality of steps displayed in said relational displaying step;

a list displaying step for displaying a list of processing programs capable of handling the step selected in said first selecting step; and a second selecting step for selecting a program of the processing programs displayed in said list displaying step.

42. A step managing method according to claim 26, further comprising:

a relational displaying step for displaying a relation between each of the plurality of steps and the processing programs, stored in storing means;

a first changing step for changing one of the processing programs in the relation displayed in said relational displaying step; and a second changing step for changing the relation between each of the plurality of steps and the processing programs, stored in said storing means, based on the changes made to the one of the processing programs in said first changing step;

wherein said judging step judges state changes of the steps due to relational changes in said second changing step, and wherein said second displaying step changes a display form of a step the state of which has been judged to change in said judging step.

43. A step managing method according to either claim 26 or claim 37, wherein said plurality of steps comprises steps for designing an object.

44. A step managing method for managing a plurality of steps for designing an object, comprising:

a displaying step for displaying information stored in storing means;

a first changing step for changing the information displayed in said information displaying step; and a second changing step for changing information stored in said storing means based on a change of information in said first changing step.

45. A step managing method for managing a plurality of steps according to claim 44, wherein said first changing step comprises:

an instructing step for instructing first information of the information displayed in said information displaying step;

a first list displaying step for displaying a list of candidates for said first information, based on the instruction of said instructing step;

a first selecting step for selecting a desired first information from the list of candidates displayed in said first list displaying step;

a second list displaying step for displaying a list of second information in a tier lower than the first information selected in said first selecting step; and a second selecting step for selecting a desired second information from the list of candidates displayed in said second list displaying step.

46. A step managing method for managing a plurality of steps according to claim 45, wherein said first information is a name of the manufacturer of the object which is a basis for design, and said second information is restricting information for restricting the object manufactured by said manufacturer.

47. A step managing method for managing a plurality of steps according to claim 26 wherein said plurality of steps comprises steps for designing an object, said method further comprising:

a displaying step for displaying information stored in storing means;

a first changing step for changing the information displayed in said information displaying step; and a second changing step for changing the information stored in said storing means based on a change of the displayed information in said first changing step, wherein said judging step judges a change in state due to a change of the stored information in said second changing step, and wherein said second displaying step changes a display form of a step the state of which has been judged to change in said judging step.

48. A step managing method for managing a plurality of steps according to claim 44 or 47, wherein said designing of an object comprises ASIC circuit designing.

49. A step managing method for managing a plurality of steps according to either of the claims 44 or 47, wherein said information used for designing comprises ASIC circuit information corresponding to specified manufacturing processes.

50. A step managing method, comprising:

a managing step for unified management of a group of steps including a first step for designing an ASIC function level, a second step for verifying said function level, a third step for creating a circuit diagram based on said verification results, and a fourth step for verifying the created circuit diagram and data which is used in each of the steps of the group;

a first displaying step for displaying the four steps managed in said managing step as four symbols, so as to allow identification of an order of execution;

a judging step for judging whether or not at least a part of said four steps is executable, based on a usage relation between data managed in said managing step and data between processes based on said executing order; and a second displaying step for displaying each of said four steps in an identifiable manner, based on a judgment in said judging step.

51. A storage medium storing programs for causing a computer to execute the following procedures for managing a plurality of steps:

a procedure for displaying said plurality of steps as symbols;

a procedure for judging a state of at least a portion of said plurality of steps; and a procedure for displaying said plurality of steps in an identifiable manner based on said judged state.

52. A storage medium storing programs for causing a computer to execute the following procedures for managing a plurality of steps:

a procedure for displaying said plurality of steps as symbols;

a procedure for displaying a relation between each of the plurality of steps stored in storing means and processing programs started when executing the steps;

a procedure for changing the processing programs in said displayed relation;

a procedure for changing the relation between each of the plurality of steps stored in said storing means and the processing programs, based on the changes made to said processing programs; and a procedure for changing a display form of a step a state of which is judged to change as a result of a change in the relation.

53. A storage medium storing programs for causing a computer to execute the following procedures for managing a plurality of steps for designing an object:

a procedure for displaying said plurality of steps as symbols;

a procedure for displaying information on information display means, the information being used for said designing and being stored in storing means;

a procedure for changing the information displayed by said information displaying means;

a procedure for changing the information stored in said storing means based on said change of the displayed information; and a procedure for changing a display form of a step a state of which is judged to change by judging means, as a result of the change in the information in said storing means.

54. A step managing apparatus for managing a plurality of steps for designing an object, comprising:

storing means for storing information used for said designing;

execution instructing means for instructing the execution of a step for changing the information stored in said storing means, in the event that the step is included in said plurality of steps;

information displaying means for displaying the information stored in said storing means, according to instructions by said execution instructing means;

first changing means for changing the information displayed by said information displaying means; and second changing means for changing the information stored in said storing means based on a change of the displayed information by said first changing means.

55. A step managing apparatus according to claim 54, said first changing means comprises:

instructing means for instructing first information out of the information displayed on said information displaying means;

first list displaying means for displaying a list of candidates for said first information, based on the instruction of said instructing means;

first selecting means for selecting the first information from the list of candidates displayed by said first list displaying means;

narrowing means for narrowing down candidates for second information out of the information displayed by said information displaying means, based on the selection results by said first selecting means;

second list displaying means for displaying a list of second information narrowed down by said narrowing means; and second selecting means for selecting the second information from the list of candidates displayed by said second list displaying means.

56. A step managing apparatus according to claim 54, wherein the information used for said designing is described in a Hardware Description Language (HDL).

57. A step managing apparatus according to claim 54, wherein the information used for said designing includes information of an input/output buffer of said object of designing.

58. A step managing apparatus according to claim 57, further comprising grouping means for grouping information to be used for said designing, based on pin information of said input/output buffer of said object to be designed.

59. A step managing apparatus according to claim 58, wherein said first changing means comprises pin information moving means for moving pin information of the input/output buffer of said object to be designed.

60. A step managing apparatus according to claim 58, wherein said first changing means includes:

division instructing means for instructing division of pin information within one group out of grouped information; and group dividing means for dividing said one group based on the pin information divided by said division instructing means.

61. A step managing apparatus according to claim 55, wherein said first information comprises drive information of said object of designing or electric power source voltage information, and the second information comprises information of an input/output buffer of said object of designing.

62. A step managing apparatus for managing a plurality of steps for designing an object, comprising:

symbol displaying means for displaying said plurality of steps as symbols;

storing means for storing information used for said designing;

execution instructing means for instructing the execution of a step for changing the information stored in said storing means, in the event that the step is included in said plurality of steps;

information displaying means for displaying the information stored in said storing means, according to instructions by said execution instructing means;

first changing means for changing the information displayed by said information displaying means;

second changing means for changing the information stored in said storing means based on a change of displayed information by said first changing means;

judging means for judging a step a state of which changes due to the information change by said second changing means; and display form changing means for changing a display form of the step the state of which has been judged to change by said judging means.

63. A step managing apparatus for managing a plurality of steps for designing an object, comprising:

first displaying means for displaying said plurality of steps as symbols;

storing means for storing names of work units of said designing and first design data used by the work units;

second displaying means for displaying the names of the work units stored in said storing means;

changing means for changing the first design data stored in said storing means into second design data;

judging means for separately judging a state of a step upon using said first design data and the state of the step upon using said second design data; and third displaying means for displaying each of said plurality of steps in an identifiable manner, separately for the case in which said first design data is used and the case in which said second design data is used.

64. A step managing apparatus for managing a plurality of steps according to any of the claim 54, 62, or 63, wherein said designing of an object comprises ASIC circuit designing.

65. A step managing apparatus for managing a plurality of steps for designing an object according to claim 63, further comprising input means for inputting the names of work units of said designing and the first design data used by the work units.

66. A step managing apparatus for managing a plurality of steps for designing an object according to claim 63, wherein said second displaying means displays design data used by said work units, as well as the names of work units stored in said storing means.

67. A step managing method for managing a plurality of steps for designing an object, comprising:

an execution instructing step for instructing execution of a step for changing information stored in storing means, in the event that the step is included in said plurality of steps;

an information displaying step for displaying the information stored in said storing means, according to instructions by said execution instructing step;

a first changing step for changing the information displayed in said information displaying step; and a second changing step for changing the information stored in said storing means based on a change of displayed information by said first changing step.

68. A step managing method according to claim 67, said first changing step comprises:

an instructing step for instructing first information of the information displayed on said information displaying step;

a first list displaying step for displaying a list of candidates for said first information, based on the instruction of said instructing step;

a first selecting step for selecting the first information from the list of candidates displayed in said first list displaying step;

a narrowing step for narrowing down candidates for second information of the information displayed by said information displaying means, based on selection results in said first selecting step;

a second list displaying step for displaying a list of candidates for the second information narrowed down by said narrowing step; and second selecting step for selecting the second information from the list of candidates displayed by said second list displaying step.

69. A step managing method according to claim 67, wherein the information used for said designing is described in a Hardware Description Language (HDL).

70. A step managing method according to claim 67, wherein the information used for said designing includes information of an input/output buffer of said object of designing.

71. A step managing method according to claim 70, further comprising a grouping step for grouping information to be used for said designing, based on pin information of said input/output buffer of said object to be designed.

72. A step managing method according to claim 71, wherein said first changing step comprises a pin information moving step for moving the pin information of the input/output buffer of said object to be designed.

73. A step managing method according to claim 71, wherein said first changing step includes:

a division instructing step for instructing division of the pin information within one group out of grouped information; and a group dividing step for dividing said group based on the pin information divided by said division instructing step.

74. A step managing method according to claim 68, wherein said first information comprises drive information of said object of designing or electric power source voltage information, and the second information comprises information of an input/output buffer of said object of designing.

75. A step managing method for managing a plurality of steps for designing an object, comprising:
  a symbol displaying step for displaying said plurality of steps as symbols;
  an execution instructing step for instructing the execution of a step for changing information stored in storing means, in the event that the step is included in said plurality of steps;
  an information displaying step for displaying the information stored in said storing means, according to instructions by said execution instructing step;
  a first changing step for changing the information displayed by said information displaying step;
  a second changing step for changing the information stored in said storing means based on a change of information in said first changing step;
  a judging step for judging a step a state of which changes due to information change by said second changing step; and
  a display form changing step for changing a display form of the step the state of which has been judged to change by said judging step.

76. A step managing method for managing a plurality of steps for designing an object, comprising:
  a first displaying step for displaying said plurality of steps as symbols;
  a second displaying step for displaying names of work units stored in storing means;
  a changing step for changing first design data stored in said storing means into second design data;
  a judging step for separately judging a state of a step upon using said first design data and the state of the step upon using said second design data; and
  a third displaying step for displaying each of said plurality of steps in an identifiable manner, separately for the case in which said first design data is used and the case in which said second design data is used.

77. A step managing method for managing a plurality of steps according to any of the claim 67, 75, or 76, wherein said designing of an object comprises ASIC circuit designing.

78. A step managing method for managing a plurality of steps for designing an object according to claim 76, further comprising an input step for inputting the names of work units of said designing and the first design data used by the work units.

79. A step managing method for managing a plurality of steps for designing an object according to claim 76, wherein said second displaying step displays design data used by said work units, as well as the names of work units stored in said storing means.

80. A storage medium storing programs for causing a computer to execute the following processes upon managing a plurality of steps for designing an object:
  a process for displaying said plurality of steps as symbols;
  a process for instructing execution of a step for changing information stored in storing means, in the event that the step is included in said plurality of steps;
  a process for displaying the information stored in said storing means, according to said instructions;
  a process for changing displayed information;
  a process for changing information stored in said storing means based on said change of the displayed information; and
  a process for judging a step a state of which changes due to the stored information change and changing a display form of the step upon the state changing.

81. A storage medium storing programs for causing a computer to execute the following processes upon managing a plurality of steps for designing an object:
  a process for displaying said plurality of steps as symbols;
  a process for displaying names of work units stored in storing means;
  a process for changing first design data stored in said storing means into second design data;
  a process for separately judging a state of a step upon using said fist design data and the state of the step upon using said second design data; and
  a process for displaying each of said plurality of steps in an identifiable manner, separately for the case in which said first design data is used and the case in which said second design data is used.

* * * * *

UNITED STATES PATENT AND TRADEMARK OFFICE
CERTIFICATE OF CORRECTION

PATENT NO. : 6,115,034

DATED : September 5, 2000

INVENTOR(S): HIROTA TANAKA, ET AL.

Page 1 of 9

It is certified that error appears in the above-identified patent and that said Letters Patent is hereby corrected as shown below:

SHEET NO. 4:
Figure 4, "INFORMATIONDATA" should read --INFORMATION DATA--.

SHEET NO. 13:
Figure 13, "gate" should read --Gate--.

SHEET NO. 47:
Figure 48A, "INTEXT" should read --IN TEXT--.

SHEET NO. F62:
Figure 62, "AccountName:" should read --Account Name:--.

SHEET NO. 64:
Figure 64, "AccountName" should read --Account Name:--.

SHEET NO. 65:
Figure 65, "AccountName" should read --Account Name:--.

SHEET NO. 66:
Figure 66, "AccountName" should read --Account Name:--.

COLUMN 2:
Line 16, "undertaking" should read --undertakes--; and "performing" should read --performs--.
Line 39, "the event" should read --in the event--.
Line 62, "change" should read --change to--.

UNITED STATES PATENT AND TRADEMARK OFFICE
CERTIFICATE OF CORRECTION

PATENT NO. : 6,115,034

DATED : September 5, 2000

INVENTOR(S): HIROTA TANAKA, ET AL.

It is certified that error appears in the above-identified patent and that said Letters Patent is hereby corrected as shown below:

COLUMN 3:
Line 1, "invention" should read --invention to--.
Line 27, "which" should read --which of--.
Line 30, "the" ($2^{nd}$ occurrence) should be deleted.
Line 44, "the" ($1^{st}$ occurrence) should be deleted.
Line 61, "the" should be deleted.
Line 64, "the" should be deleted.

COLUMN 7:
Line 3, "be" should read --been--.

COLUMN 9:
Line 19, "of-target" should read --of target--.

COLUMN 10:
Line 10, "device" should read --devices--.

COLUMN 11:
Line 8, "a APU," should read --an APU,--.

COLUMN 12:
Line 33, "include" should read --includes--.

COLUMN 13:
Line 17, "in formation" should read --information--.
Line 30, "is a" should be deleted.

UNITED STATES PATENT AND TRADEMARK OFFICE
CERTIFICATE OF CORRECTION

PATENT NO. : 6,115,034

DATED : September 5, 2000

INVENTOR(S): HIROTA TANAKA, ET AL.

It is certified that error appears in the above-identified patent and that said Letters Patent is hereby corrected as shown below:

COLUMN 14:
Line 34, "process ing" should read --processing--.
Line 39, "function" should read --functions--.
Line 40, "s" should be deleted.
Line 52, "functio n 330-3" should read --function 330-3--.

COLUMN 15:
Line 18, "refer ence" should read --reference--.
Line 28, "relating" should read --relating to--.

COLUMN 16:
Line 66, "design managing program" should read --design management program--.

COLUMN 17:
Line 2, "design managing program 112" should read --design management program--.
Line 4, "design managing program 112" should read --design management program--.
Line 10, "s elects" should read --selects--.
Line 23, "design managing program 12" should read --design management program 112--.
Line 26, "design managing program 112" should read --design management program 112--.
Line 28, "managing program 112" should read --management program 112--.

UNITED STATES PATENT AND TRADEMARK OFFICE
CERTIFICATE OF CORRECTION

PATENT NO. : 6,115,034

DATED : September 5, 2000

INVENTOR(S): HIROTA TANAKA, ET AL.

It is certified that error appears in the above-identified patent and that said Letters Patent is hereby corrected as shown below:

COLUMN 17 CONT.:
Line 31, "design managing" should read --design management--.
Line 34, "design managing" should read --design management--.
Line 61, "indicates" should read --indicate--.

COLUMN 18:
Line 44, "ca se" should read --case--.
Line 53, "color s" should read --colors--.
Line 59, "blacks" should read --blocks--.

COLUMN 20:
Line 25, "901 First," should read --901. First,--.

COLUMN 21:
Line 9, "visa" should read --vice--.
Line 45, "is" should read --are--.
Line 53, "is the step" should read --are the steps--.
Line 54, "portions" should read --which are a portion--.
Line 58, "indicate" should read --indicated--.

COLUMN 22:
Line 2, "to "work"" should read --to as "work"--.
Line 22, "abovedescribed" should read --above-described--.

UNITED STATES PATENT AND TRADEMARK OFFICE
CERTIFICATE OF CORRECTION

PATENT NO. : 6,115,034

DATED : September 5, 2000

INVENTOR(S): HIROTA TANAKA, ET AL.

It is certified that error appears in the above-identified patent and that said Letters Patent is hereby corrected as shown below:

COLUMN 24:
Line 33, "data to be" should read --data is to be--.
Line 34, "design" should read --design data--.

COLUMN 26:
Line 34, "box 10024." should read --box 1002-4.--.

COLUMN 27:
Line 37, 'The" should read --the--.
Line 67, "is" should read --are--.

COLUMN 28:
Line 40, "a-certain" should read --a certain--.

COLUMN 29:
Line 16, "the" (2$^{nd}$ occurrence) should read --then--.
Line 17, "a wait" should read --await--.
Lien 44, "are" should read --is--.

COLUMN 30:
Line 7, "1501, by" should read --150. By--.

COLUMN 31:
Line 58, "step 3" should read --Step 3--.
Line 60, "a" should read --an--.
Line 67, "is" should read --so--.

UNITED STATES PATENT AND TRADEMARK OFFICE
CERTIFICATE OF CORRECTION

PATENT NO. : 6,115,034

DATED : September 5, 2000

INVENTOR(S): HIROTA TANAKA, ET AL.

Page 6 of 9

It is certified that error appears in the above-identified patent and that said Letters Patent is hereby corrected as shown below:

COLUMN 32:
Line 11, "FIG." should read --FIGS.--.

COLUMN 34:
Line 53, "base" should read --based--.

COLUMN 35:
Line 29, "does" should read --do--.

COLUMN 37:
Line 10, "process." should read --processes.--.
Line 15, "form" should read --from--.
Line 20, "form" should read --from--.

COLUMN 40:
Line 24, "element" should read --elements--.

COLUMN 41:
Line 42, "show" should read --shown--.
Line 63, "operation" should read --operations--.

COLUMN 42:
Line 8, "exists," should read --exist,--.

COLUMN 46:
Line 13, "displayed to," should read --displayed,--.
Line 63, "forced end"", should read --"forced end"--.

UNITED STATES PATENT AND TRADEMARK OFFICE
CERTIFICATE OF CORRECTION

PATENT NO. : 6,115,034

DATED : September 5, 2000

INVENTOR(S): HIROTA TANAKA, ET AL.

It is certified that error appears in the above-identified patent and that said Letters Patent is hereby corrected as shown below:

COLUMN 48:
Line 24, ""ae-test"", should read --"ae_test"--.

COLUMN 49:
Line 43, "generated" should read --generate--.
Line 44, "ae-test," should read --ae_test--.

COLUMN 52:
Line 47, "to" should read --in--.

COLUMN 55:
Line 27, "which" should be deleted.
Line 54, "<setting" should read --<Setting--.

COLUMN 58:
Line 11, "an" should read --a--.

COLUMN 60:
Line 53, "to" ($2^{nd}$ occurrence) should read --on--.

COLUMN 63:
Line 22, "of" ($2^{nd}$ occurrence) should read --to--.
Line 47, "of" ($2^{nd}$ occurrence) should read --to--.

UNITED STATES PATENT AND TRADEMARK OFFICE
CERTIFICATE OF CORRECTION

PATENT NO. : 6,115,034

DATED : September 5, 2000

INVENTOR(S): HIROTA TANAKA, ET AL.

It is certified that error appears in the above-identified patent and that said Letters Patent is hereby corrected as shown below:

COLUMN 64:
Line 56, "known" should read --know--.
Line 60, "based" should read --based on--.
Line 63, "processed" should read --processes--.

COLUMN 65:
Line 1, "made" should read --done--.

COLUMN 67:
Line 33, "claim" should read --claims--.

COLUMN 68:
Line 36, "are" should read --is--.

COLUMN 73:
Line 65, "claim" should read --claims--.

COLUMN 74:
Line 45, "second" should read --a second--.

UNITED STATES PATENT AND TRADEMARK OFFICE
CERTIFICATE OF CORRECTION

PATENT NO. : 6,115,034

DATED : September 5, 2000

INVENTOR(S): HIROTA TANAKA, ET AL.

It is certified that error appears in the above-identified patent and that said Letters Patent is hereby corrected as shown below:

<u>COLUMN 76</u>:
Line 41, "fist" should read --first--.

Signed and Sealed this

Twenty-ninth Day of May, 2001

Attest:

NICHOLAS P. GODICI

Attesting Officer        Acting Director of the United States Patent and Trademark Office